(12) United States Patent
Kim et al.

(10) Patent No.: US 12,369,461 B2
(45) Date of Patent: Jul. 22, 2025

(54) DISPLAY APPARATUS AND METHOD OF MANUFACTURING THE SAME

(71) Applicant: SAMSUNG DISPLAY CO., LTD., Yongin-si (KR)

(72) Inventors: Seulki Kim, Yongin-si (KR); Seungha Choi, Yongin-si (KR); Seungrae Kim, Yongin-si (KR); Hyun Kim, Yongin-si (KR); Kapsoo Yoon, Yongin-si (KR); Kwangsoo Lee, Yongin-si (KR); Jaehyun Lee, Yongin-si (KR); Jungkyoung Cho, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 215 days.

(21) Appl. No.: 17/246,827

(22) Filed: May 3, 2021

(65) Prior Publication Data

US 2021/0343811 A1 Nov. 4, 2021

(30) Foreign Application Priority Data

| May 4, 2020 | (KR) | 10-2020-0053386 |
| Jul. 6, 2020 | (KR) | 10-2020-0083046 |
| Aug. 12, 2020 | (KR) | 10-2020-0101402 |

(51) Int. Cl.
*H10K 59/124* (2023.01)
*H10K 59/122* (2023.01)
(Continued)

(52) U.S. Cl.
CPC ......... *H10K 59/124* (2023.02); *H10K 59/122* (2023.02); *H10K 59/131* (2023.02); *H10K 59/873* (2023.02)

(58) Field of Classification Search
CPC ............ H10K 59/1201; H10K 59/124; H10K 59/131; H10K 59/122
See application file for complete search history.

(56) References Cited

U.S. PATENT DOCUMENTS

| 6,980,268 B2 | 12/2005 | You |
| 8,017,950 B2 | 9/2011 | Joo |

(Continued)

FOREIGN PATENT DOCUMENTS

| KR | 10-2007-0071083 | 7/2007 |
| KR | 10-0858297 | 9/2008 |

(Continued)

*Primary Examiner* — Vongsavanh Sengdara
(74) *Attorney, Agent, or Firm* — F. CHAU & ASSOCIATES, LLC

(57) ABSTRACT

A display apparatus includes a substrate with a display area and a peripheral area surrounding the display area, a thin-film transistor disposed on the display area of the substrate, a pad unit disposed on the peripheral area of the substrate, a first insulating layer disposed on the display area of the substrate and exposing the pad unit, the first insulating layer including a first portion disposed on the thin-film transistor, a second portion, and a third portion between the first portion and the second portion, and a light-emitting device disposed on the first portion of the first insulating layer and electrically connected to the thin-film transistor. A top surface of the first insulating layer includes a first top surface of the first portion, a second top surface of the second portion, and a connecting surface of the third portion. The first top surface of the first portion is higher than the second top surface of the second portion. The connecting surface connects the first top surface and the second top surface with each other and is sloped.

11 Claims, 78 Drawing Sheets

(51) Int. Cl.
*H10K 59/131* (2023.01)
*H10K 59/80* (2023.01)

(56) References Cited

U.S. PATENT DOCUMENTS

| | | | |
|---|---|---|---|
| 8,871,590 | B2 | 10/2014 | Choi et al. |
| 9,153,605 | B2 | 10/2015 | Kim et al. |
| 9,184,188 | B2 | 11/2015 | Park et al. |
| 9,257,494 | B2 | 2/2016 | Park et al. |
| 9,508,782 | B2 | 11/2016 | Park et al. |
| 10,177,206 | B2 | 1/2019 | Jung et al. |
| 10,686,027 | B2 | 6/2020 | Jo et al. |
| 2013/0001564 | A1 | 1/2013 | Choi et al. |
| 2016/0351651 | A1* | 12/2016 | Jang ................ H10K 59/80518 |
| 2017/0054113 | A1* | 2/2017 | Lee .................... H10K 59/805 |
| 2017/0170246 | A1* | 6/2017 | Im .................... H10K 59/80522 |
| 2018/0090699 | A1* | 3/2018 | Shin ................... H10K 59/873 |
| 2018/0097047 | A1* | 4/2018 | Jung ................ H10K 59/80522 |
| 2018/0123078 | A1* | 5/2018 | Byun ................ H10K 59/1315 |
| 2019/0198782 | A1* | 6/2019 | Kim .................... H01L 27/1248 |
| 2021/0036076 | A1 | 2/2021 | Kim et al. |
| 2021/0091163 | A1 | 3/2021 | Son et al. |

FOREIGN PATENT DOCUMENTS

| | | |
|---|---|---|
| KR | 10-2014-0137948 | 12/2014 |
| KR | 10-2015-0033444 | 4/2015 |
| KR | 10-2016-0033296 | 3/2016 |
| KR | 10-1801974 | 11/2017 |
| KR | 10-1815256 | 12/2017 |
| KR | 10-2018-0013227 A | 2/2018 |
| KR | 10-2018-0036434 A | 4/2018 |
| KR | 10-1881895 | 7/2018 |
| KR | 10-2019-0036008 A | 4/2019 |
| KR | 10-2077143 | 2/2020 |
| KR | 10-2021-0014233 | 2/2021 |

* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Applications Nos. 10-2020-0053386, filed on May 4, 2020, 10-2020-0083046, field on Jul. 6, 2020, and 10-2020-0101402, filed on Aug. 12, 2020 in the Korean Intellectual Property Office, the disclosures of which are incorporated by reference herein in their entirety.

BACKGROUND

1. Field

The present inventive concept relates to a display apparatus and a method of manufacturing the same.

2. Description of Related Art

Display apparatuses visually display data. A display apparatus is used as a display for a small product such as a mobile phone or is used as a display for a large product such as a television.

A display apparatus includes a substrate divided into a display area and a non-display area, and a gate line and a data line are formed in the display area to be insulated from each other. A plurality of pixel regions are defined in the display area, and pixels respectively located in the plurality of pixel regions receive electrical signals from the gate line and the data line intersecting each other and emit light, thereby displaying an image to the outside. A thin-film transistor and a pixel electrode electrically connected to the thin-film transistor are provided in each of the pixel regions, and a counter electrode is commonly provided over the pixel regions. Various wirings for transmitting an electrical signal to the pixels in the display area, a gate driver, and pads to which a data driver and a controller may be connected may be provided in the non-display area.

Recently, display apparatuses have been used for various purposes. As thicknesses and weights of display apparatuses have decreased, the range of applications of display apparatuses has increased. Various attempts have been made to improve the quality of display apparatuses.

SUMMARY

One or more embodiments include a display apparatus and a method of manufacturing the same which may prevent damage to a surface of an encapsulation layer on which a pixel electrode is located, may prevent degradation of a light-emitting device due to such damage to the encapsulation layer, and may protect a surface of a pad unit and prevent damage to the surface of the pad unit by forming an opening through which the pad unit is exposed after an etching process for forming the pixel electrode. However, the embodiments are examples, and do not limit the scope of the present disclosure.

Additional aspects will be set forth in the description which follows and will be apparent from the description, or may be learned by practice of the presented embodiments.

According to an embodiment of the present inventive concept, a display apparatus includes a substrate comprising a display area and a peripheral area surrounding the display area, a thin-film transistor disposed on the display area of the substrate, a pad unit disposed on the peripheral area of the substrate, a first insulating layer disposed on the display area of the substrate and exposing the pad unit, the first insulating layer including a first portion disposed on the thin-film transistor, a second portion, and a third portion between the first portion and the second portion, and a light-emitting device disposed on the first portion of the first insulating layer and electrically connected to the thin-film transistor. A top surface of the first insulating layer comprises a first top surface of the first portion, a second top surface of the second portion, and a connecting surface of the third portion. The first top surface of the first portion is higher than the second top surface of the second portion. The connecting surface connects the first top surface and the second top surface with each other and is sloped.

A vertical distance between the substrate and the first top surface of the first portion is greater than a vertical distance between the substrate and the second top surface of the second portion.

The display apparatus further includes a second insulating layer disposed on the peripheral area and being formed of the same material as a material of the first insulating layer. The pad unit comprises a pad electrode, and a pad connection electrode disposed on the pad electrode and at least partially contacting the pad electrode. The second insulating layer is disposed between the pad electrode and the pad connection electrode and at least partially overlaps the pad connection electrode.

The pad connection electrode of the pad unit includes a first part which contacts the pad electrode, and a second part which is spaced apart from the pad electrode. The second insulating layer is disposed between a top surface of the pad electrode and a bottom surface of the second part of the pad connection electrode. A top surface of the second insulating layer contacts the bottom surface of the second part of the pad connection electrode, and is inclined along the bottom surface of the second part of the pad connection electrode.

The display apparatus further includes a third insulating layer disposed between a bottom surface of the second insulating layer and the top surface of the pad electrode and having a contact hole through which the first part of the pad connection electrode contacts a part of the pad electrode. The second part of the pad connection electrode is outside the contact hole of the third insulating layer.

A width of the pad connection electrode in one direction is greater than a width of the pad electrode exposed through the contact hole.

The pad unit further includes a pad protective layer disposed between the pad electrode and the pad connection electrode.

The light-emitting device includes a pixel electrode, an intermediate layer, and a counter electrode, and the pad connection electrode is formed of the same material as that of at least a part of the pixel electrode.

The pixel electrode includes three films, and the pad connection electrode is formed of a single film.

The pixel electrode overlaps only the first portion of the first insulating layer.

According to an example embodiment of the present inventive concept, a method of manufacturing a display apparatus includes preparing a substrate including a display area and a peripheral area surrounding the display area, forming a thin-film transistor in the display area, forming a pad electrode in the peripheral area, forming an inorganic protective layer and a first insulating layer to cover the thin-film transistor and the pad electrode, patterning the first insulating layer by using a first mask, forming a first contact hole through which a part of the thin-film transistor is exposed and a second contact hole through which a part of the pad electrode is exposed in the inorganic protective layer by using the first insulating layer, forming a pixel electrode layer electrically connected to the thin-film transistor through the first contact hole, on a first portion of the first insulating layer, forming a first photoresist pattern on the pixel electrode layer, etching the pixel electrode layer by using the first photoresist pattern, and partially etching a second portion extending from the first portion of the first insulating layer by using the first photoresist pattern.

The first mask is a half-tone mask or a slit mask.

The method further includes forming a pad connection electrode electrically connected to the pad electrode through the second contact hole, forming a second photoresist pattern on the pad connection electrode, and etching the pad connection electrode by using the second photoresist pattern.

The method further includes partially etching a third portion of the first insulating layer corresponding to the peripheral area by using the second photoresist pattern.

The method further includes removing the second photoresist pattern, wherein the removing of the second photoresist pattern and the partially etching of the third portion are simultaneously performed.

A surface of a portion other than an etched portion of the third portion of the first insulating layer is inclined.

The forming of the first photoresist pattern and the forming the second photoresist pattern are simultaneously performed by using a second mask.

The second mask is a half-tone mask or a slit mask.

A thickness of the first photoresist pattern is greater than a thickness of the second photoresist pattern.

The pad connection electrode includes three films, and the method further includes removing two films other than a film adjacent to the pad electrode from among the three films of the three-layer structure of the pad connection electrode.

According to one or more embodiments, a display apparatus includes a substrate including a display area and a peripheral area surrounding the display area, a thin-film transistor disposed on the display area of the substrate, a pad unit disposed on the peripheral area of the substrate, a first insulating layer covering the thin-film transistor and exposing the pad unit, a light-emitting device disposed on the first insulating layer, electrically connected to the thin-film transistor, and including a pixel electrode, an intermediate layer, and a counter electrode, and a pixel-defining film located on the first insulating layer and covering an edge of the pixel electrode. A side surface of the first insulating layer and a side surface of the pixel-defining film are coplanar with each other.

The first insulating layer includes a first portion, a second portion, and a third portion between the first portion and the second portion. A top surface of the first insulating layer includes a first top surface of the first portion, a second top surface of the second portion, and a connecting surface of the third portion. The first top surface of the first portion is higher than the second top surface of the second portion. The connecting surface connects the first top surface and the second top surface with each other and is sloped.

A vertical distance between the substrate and a top surface of the first portion is greater than a vertical distance between the substrate and a top surface of the second portion.

A side surface of the first portion of the first insulating layer and the side surface of the pixel-defining film are coplanar with each other.

The pixel electrode and the pixel-defining film may be disposed on the first top surface of the first portion of the first insulating layer.

The pad unit includes a pad electrode, and a pad connection electrode located on the pad electrode and at least partially contacting the pad electrode.

The display apparatus further includes a second insulating layer disposed on the peripheral area and including or being formed of the same material as that of the first insulating layer. The second insulating layer is disposed between the pad electrode and the pad connection electrode and at least partially overlaps the pad connection electrode.

The pad connection electrode of the pad unit includes a first part which contacts the pad electrode, and a second part which is spaced apart from the pad electrode. The second insulating layer is disposed between a top surface of the pad electrode and a bottom surface of the second part of the pad connection electrode. A top surface of the second insulating layer contacts the bottom surface of the second part of the pad connection electrode, and is inclined along the bottom surface of the second part of the pad connection electrode.

The display apparatus further include a third insulating layer disposed on the pad electrode and having a contact hole through which the first part of the pad connection electrode contacts a part of the pad electrode. The first part of the pad connection electrode contacts a portion of the third insulating layer which is exposed by the contact hole.

A width of the pad connection electrode is greater than a width of the pad electrode exposed through the contact hole. The second part of the pad connection electrode is outside the contact hole of the third insulating layer.

The pixel electrode includes three films, and the pad connection electrode is formed of a single film.

The display apparatus may further include a dam portion disposed on the peripheral area, and including a first peripheral insulating layer, a second peripheral insulating layer disposed on the first peripheral insulating layer, and a peripheral electrode layer disposed between the first peripheral insulating layer and the second peripheral insulating layer.

A side surface of the first peripheral insulating layer and a side surface of the second peripheral insulating layer are coplanar with each other.

According to an embodiment of the present inventive concept, a method of manufacturing a display apparatus includes preparing a substrate including a display area and a peripheral area surrounding the display area, forming a thin-film transistor in the display area, sequentially forming a first insulating layer, a pixel electrode material layer, and a pixel-defining film material layer on the thin-film transistor, forming a pre-pixel-defining film on a first portion of the first insulating layer by patterning the pixel-defining film material layer by using a first mask, forming a pixel electrode by etching the pixel electrode material layer by using the pre-pixel-defining film, and partially etching a second portion extending from the first portion of the first insulating layer by using the pre-pixel-defining film.

The method further includes forming a pad electrode in the peripheral area, forming an inorganic protective layer having a contact hole through which a part of the pad electrode is exposed on the pad electrode, and forming a pad connection electrode electrically connected to the pad electrode through the contact hole.

The forming of the pad connection electrode includes forming a pad connection electrode material layer on the pad electrode, forming a photoresist pattern on the pad connection electrode material layer, and etching the pad connection electrode material layer by using the photoresist pattern.

The photoresist pattern is formed by patterning the pixel-defining film material layer corresponding to the peripheral area by using the first mask.

A thickness of the pre-pixel-defining film is greater than a thickness of the photoresist pattern.

The method further includes partially etching a third portion of the first insulating layer corresponding to the peripheral area by using the photoresist pattern.

The method further includes removing the photoresist pattern, wherein the removing of the photoresist pattern and the partially etching of the third portion are simultaneously performed.

The pad connection electrode includes three films, and the method further includes removing two films other than a film adjacent to the pad electrode from among the three films of the three-layer structure of the pad connection electrode.

The pre-pixel-defining film includes a first pre-pixel-defining film covering an edge of the pixel electrode and a second pre-pixel-defining film surrounded by the first pre-pixel-defining film. A thickness of the first pre-pixel-defining film is greater than a thickness of the second pre-pixel-defining film.

The method further includes forming a pixel-defining film by removing the second pre-pixel-defining film.

The method further includes forming the pre-pixel-defining film to contact a side surface of the pixel electrode.

The first mask is a half-tone mask or a slit mask.

According to an embodiment of the present inventive concept, a display apparatus includes a substrate including a display area and a peripheral area surrounding the display area, a thin-film transistor disposed on the display area of the substrate, a pad unit disposed on the peripheral area of the substrate, an inorganic insulating layer disposed on the thin-film transistor and the pad unit, the inorganic insulating layer being provided with an opening which exposes a top surface of the pad unit, and a light-emitting device disposed on the inorganic insulating layer, electrically connected to the thin-film transistor, and including a pixel electrode, an intermediate layer, and a counter electrode.

A width of the top surface of the pad unit in one direction is equal to or less than a width of the opening of the inorganic insulating layer.

The pad unit may include a pad electrode and a pad protective layer located on the pad electrode. A top surface of the pad protective layer is exposed through the opening of the inorganic insulating layer.

A width of the top surface of the pad protective layer in one direction is equal to or less than a width of the opening of the inorganic insulating layer.

A side surface of the pad electrode and a side surface of the pad protective layer may be coplanar with each other.

A side surface of the pad electrode is partially exposed through the opening of the inorganic insulating layer.

The display apparatus further includes an electrode layer disposed on the thin-film transistor and electrically connected to the thin-film transistor. The inorganic insulating layer is provided with a first contact hole through which a part of the electrode layer is exposed.

The display apparatus may further include an insulating layer disposed on the inorganic insulating layer and having a second contact hole connected to the first contact hole, and a pixel-defining film disposed on the insulating layer with the pixel electrode therebetween. The pixel electrode is electrically connected to the electrode layer through the first contact hole and the second contact hole.

A side surface of the insulating layer and a side surface of the pixel-defining film adjacent to the peripheral area is coplanar with each other.

The insulating layer is disposed on the display area of the substrate and includes a first portion, a second portion, and a third portion between the first portion and the second portion. A top surface of the insulating layer includes a first top surface of the first portion, a second top surface of the second portion, and a connecting surface of the third portion. The first top surface of the first portion is higher than the second top surface of the second portion. The connecting surface connects the first top surface and the second top surface with each other and is sloped.

A vertical distance between the substrate and a top surface of the first portion is greater than a vertical distance between the substrate and a top surface of the second portion.

The display apparatus may further include a dam portion disposed on the peripheral area, and including a first peripheral insulating layer and a second peripheral insulating layer disposed on the first peripheral insulating layer.

A side surface of the first peripheral insulating layer and a side surface of the second peripheral insulating layer are coplanar with each other.

According to an embodiment of the present inventive concept, a method of manufacturing a display apparatus includes preparing a substrate including a display area and a peripheral area surrounding the display area, forming a thin-film transistor in the display area, forming a pad unit in the peripheral area, forming an inorganic insulating layer on the pad unit, forming a pre-pixel-defining film having a first opening through which at least a part of the inorganic insulating layer is exposed on the pad unit, on the inorganic insulating layer, and etching a first portion of the inorganic insulating layer exposed through the first opening by using the pre-pixel-defining film.

The forming of the pad unit includes forming a pad electrode in the peripheral area, and forming a pad protective layer on the pad electrode.

The etching of the first portion of the inorganic insulating layer includes exposing a top surface of the pad protective layer.

The method further includes removing the pre-pixel-defining film corresponding to the peripheral area.

The method further includes forming an electrode layer located on the thin-film transistor and electrically connected to the thin-film transistor, forming a pre-insulating layer located between the electrode layer and the pre-pixel-defining film and having a first contact hole corresponding to a portion of the electrode layer, and etching a second portion of the inorganic insulating layer corresponding to the first contact hole by using the pre-insulating layer.

The method further includes removing the pre-insulating layer corresponding to the peripheral area.

The method further includes removing the pre-pixel-defining film corresponding to the peripheral area, wherein the removing of the pre-pixel-defining film corresponding to the peripheral area and the removing of the pre-insulating layer corresponding to the peripheral area are simultaneously performed.

Other aspects, features, and advantages of the present disclosure will become more apparent from the drawings, the claims, and the detailed description.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
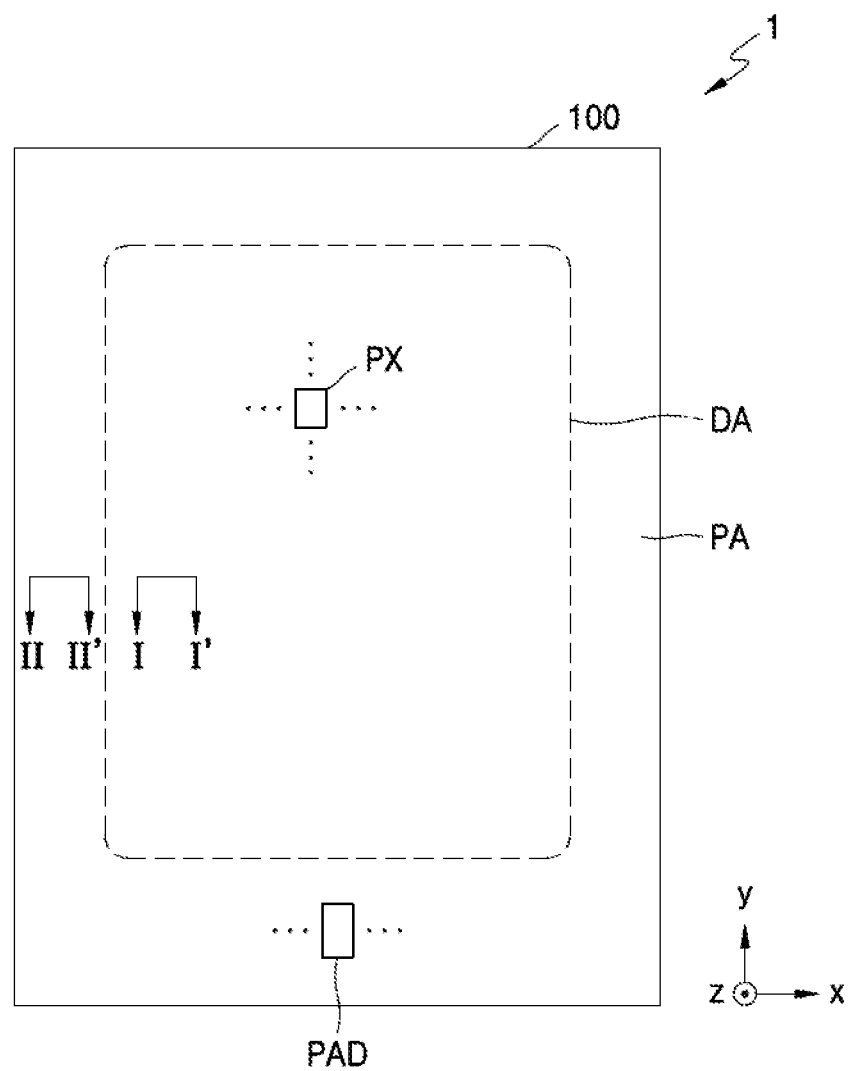
FIG. 1 is a plan view of a display apparatus 1 according to an embodiment of the present inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the detailed description. Effects and features of the present disclosure, and methods for achieving them will be clarified with reference to embodiments described below in detail with reference to the drawings. However, the present disclosure is not limited to the following embodiments and may be embodied in various forms.

Hereinafter, embodiments will be described in detail with reference to the accompanying drawings, wherein like elements are denoted by like reference numerals throughout and a repeated description thereof is omitted.

While such terms as "first," "second," etc., may be used to describe various elements, such elements are not to be limited to the above terms. The above terms are used only to distinguish one elements from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be understood that when a layer, an area, or an element is referred to as being "on," or "directly on," another layer, area, or element, it may be directly on or may be directly located on the other layer, area, or element, or intervening layers, areas, or elements may be present therebetween.

Sizes of elements in the drawings may be exaggerated or contracted for convenience of explanation. For example, because sizes and thicknesses of elements in the drawings are arbitrarily illustrated for convenience of explanation, the present disclosure is not limited thereto.

When a certain embodiment may be implemented differently, a specific process order may be different from the described order. For example, two consecutively described processes may be performed substantially at the same time or performed in an order opposite to the described order.

In the specification, the phrase "A and/or B" denotes A, B, or A and B. "At least one of A and B" is used to select only A, select only B, or select both A and B.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when layers, areas, or elements or the like are referred to as being "electrically connected," they may be directly electrically connected, or may be indirectly electrically connected with intervening layers, areas, or elements therebetween.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view of a display apparatus according to an embodiment.

Referring to FIG. 1, a display apparatus 1 may include a display area DA where an image is displayed, and a peripheral area PA located around the display area DA. The display apparatus 1 may provide an image to the outside by using light emitted from the display area DA. The display apparatus 1 includes a substrate 100 with portions corresponding to the display area DA and the peripheral area PA.

The substrate 100 may include or may be formed of any of various materials, for example, glass, metal, or plastic. According to an embodiment, the substrate 100 may include or may be formed of a flexible material. The flexible material refers to a substrate that is well bendable, foldable, or rollable. The substrate 100 including the flexible material may include or may be formed of ultra-thin glass, metal, or plastic.

Pixels PX including various display elements such as an organic light-emitting diode (OLED) may be disposed on the display area DA of the substrate 100. The pixels PX may include a plurality of pixels, and the plurality of pixels PX may be arranged in any of various patterns such as a stripe pattern, a pentile pattern, or a mosaic pattern to form an image.

In a plan view, the display area DA may have a rectangular shape as shown in FIG. 1. In another embodiment, the display area DA may have a polygonal shape (e.g., a triangular shape, a pentagonal shape, or a hexagonal shape), a circular shape, an elliptical shape, or an irregular shape.

The peripheral area PA of the substrate 100 located around the display area DA may be an area where an image is not displayed. The peripheral area PA may entirely or partially surround the display area DA. Various wirings for transmitting electric signals to be applied to the display area DA, and a pad unit PAD to which a printed circuit board (PCB) or a driver integrated circuit (IC) chip is attached may be disposed on the peripheral area PA.

Figure 2:
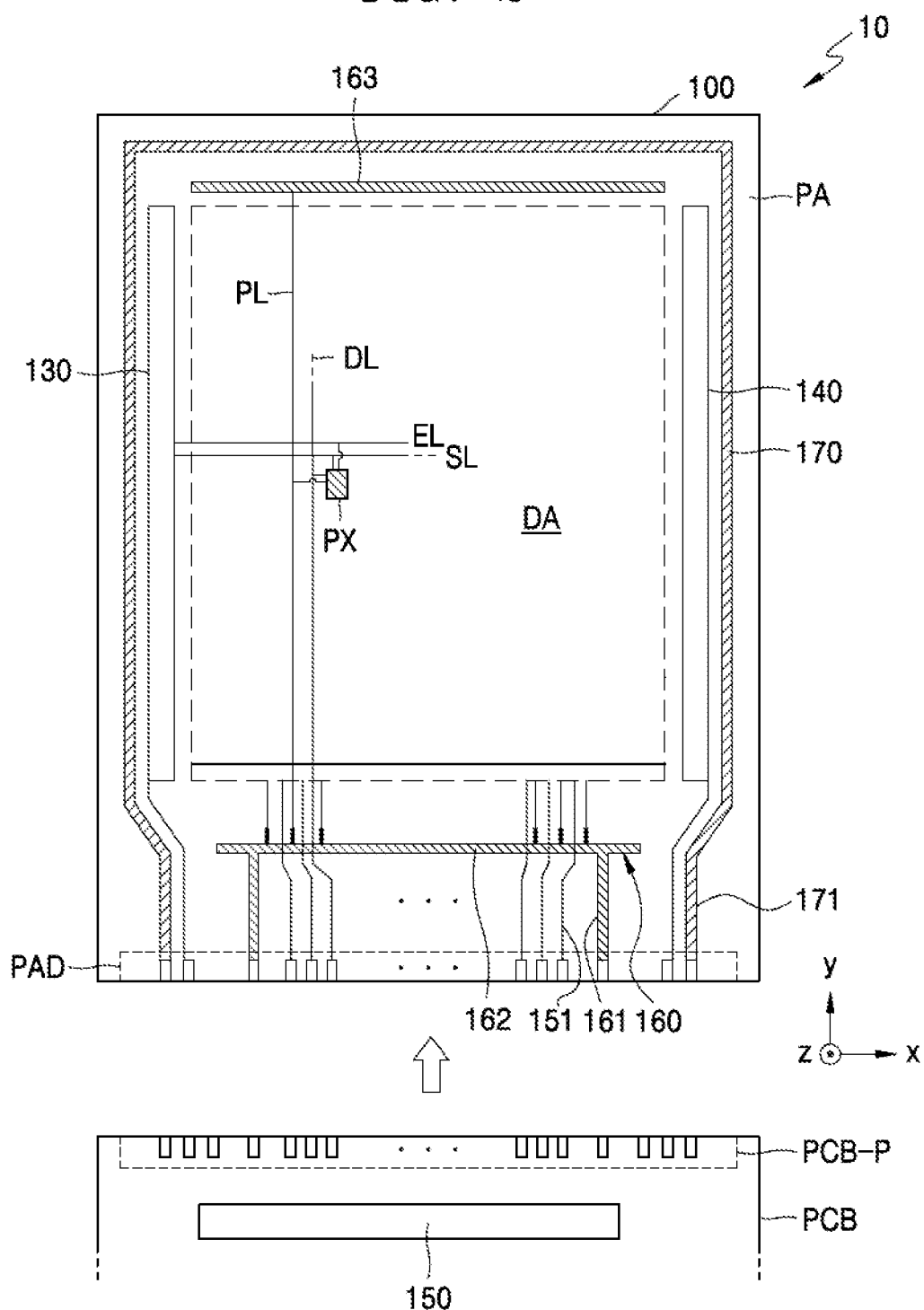
FIG. 2 is a plan view of a display panel according to an embodiment of the present inventive concept.

FIG. 2 is a plan view of a display panel 10 according to an embodiment.

Referring to FIG. 2, the display panel 10 includes the display area DA and the peripheral area PA, and includes the plurality of pixels PX disposed on the display area DA. Each of the plurality of pixels PX may include a display element such as an organic light-emitting diode (OLED). Each pixel PX may emit light, for example, red light, green light, blue light, or white light, from the OLED. The pixels PX refer to sub-pixels that emit light of different colors, and each pixel PX may be one of, for example, a red (R) sub-pixel, a green (G) sub-pixel, and a blue (B) sub-pixel. The display area DA may be covered with an encapsulation member to be protected from external air or moisture.

Each pixel PX may be electrically connected to outer circuits arranged in the peripheral area PA. A first gate driving circuit 130, a second gate driving circuit 140, the pad unit PAD, a data driving circuit 150, a first power supply wiring 160, and a second power supply wiring 170 may be disposed on the peripheral area PA.

Each of the first gate driving circuit 130 and the second gate driving circuit 140 may include a scan driving circuit and an emission control driving circuit. The scan driving circuit included in each of the first gate driving circuit 130 and the second gate driving circuit 140 may apply a scan signal to each pixel PX through a scan line SL. The emission control driving circuit included in each of the first gate driving circuit 130 and the second gate driving circuit 140 may apply an emission control signal to each pixel PX through an emission control line EL.

The second gate driving circuit 140 and the first gate driving circuit 130 may be parallel to each other with the display area DA therebetween. Some of the pixels PX which are disposed on the display area DA may be electrically connected to the first gate driving circuit 130, and the other ones of the pixels PX may be connected to the second gate driving circuit 140. In another embodiment, the second gate driving circuit 140 may be omitted.

The pad unit PAD may be located on a side of the substrate 100. The pad unit PAD may be exposed without being covered by an insulating layer, and may be electrically connected to a printed circuit board PCB. A terminal portion PCB-P of the printed circuit board PCB may be electrically connected to the pad unit PAD of the display panel 10. The printed circuit board PCB transmits a signal or power of a controller (not shown) to the display panel 10.

A control signal generated by the controller may be transmitted to the first and second gate driving circuits 130 and 140 through the printed circuit board PCB. The controller may respectively provide first and second power supply voltages to the first and second power supply wirings 160 and 170 through first and second connection wirings 161 and 171. The first power supply voltage may be provided to each pixel PX through a driving voltage line PL connected to the first power supply wiring 160, and the second power supply voltage may be provided to a counter electrode 330 (see FIG. 4 to be described below) of each pixel PX connected to the second power supply wiring 170.

The data driving circuit 150 is electrically connected to a data line DL. A data signal of the data driving circuit 150 may be applied to each pixel PX through a connection wiring 151 connected to the pad unit PAD and the data line DL connected to the connection wiring 151. Although the data driving circuit 150 is located on the printed circuit board PCB in FIG. 2, in another embodiment, the data driving circuit 150 may be on the substrate 100. For example, the data driving circuit 150 may be located between the pad unit PAD and the first power supply wiring 160.

The first power supply wiring 160 may include a first sub-wiring 162 and a second sub-wiring 163 that extend parallel to each other in an x-direction with the display area DA therebetween. The second power supply line 170 may partially surround the display area DA in a loop shape having one open side.

Figure 3:
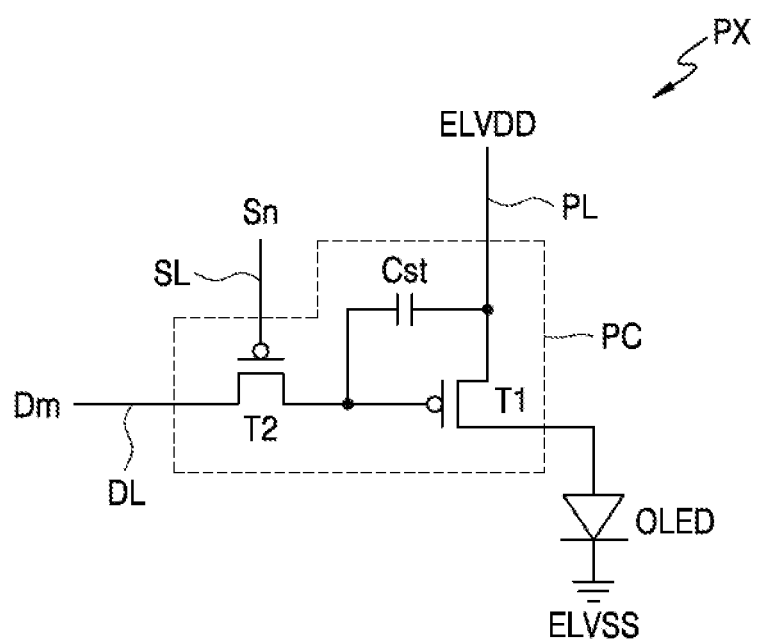
FIG. 3 is an equivalent circuit diagram illustrating a pixel of a display panel according to an embodiment of the present inventive concept.

FIG. 3 is an equivalent circuit diagram illustrating a pixel of a display panel according to an embodiment.

Referring to FIG. 3, each pixel PX includes a pixel circuit PC connected to the scan line SL and the data line DL, and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL, and transmits a data signal Dm input through the data line DL to the driving thin-film transistor T1 according to a scan signal Sn input through the scan line SL.

The storage capacitor Cst is connected to the switching thin-film transistor T2 and the driving voltage line PL, and stores a voltage corresponding to a difference between a voltage received from the switching thin-film transistor T2 and a driving voltage ELVDD supplied to the driving voltage line PL.

The driving thin-film transistor T1 is connected to the driving voltage line PL and the storage capacitor Cst, and may control driving current flowing from the driving voltage line PL to the organic light-emitting diode OLED according to a value of the voltage stored in the storage capacitor Cst. The organic light-emitting diode OLED may emit light having a certain luminance according to the driving current.

Although the pixel circuit PC includes two thin-film transistors and one storage capacitor in FIG. 3, the present disclosure is not limited thereto. For example, the pixel circuit PC may include three or more thin-film transistors and/or two or more storage capacitors. In an embodiment, the pixel circuit PC may include seven thin-film transistors and one storage capacitor.

Figure 4:
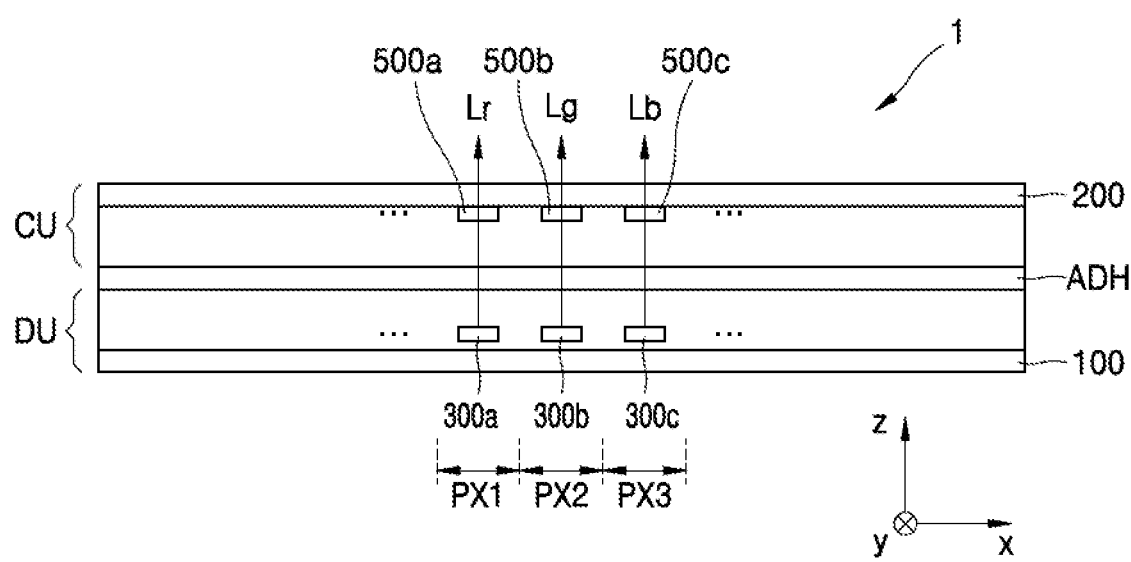
FIG. 4 is a cross-sectional view of a display apparatus according to an embodiment of the present inventive concept.

FIG. 4 is a cross-sectional view of a display apparatus according to an embodiment.

Referring to FIG. 4, the display apparatus 1 (see FIG. 1) includes a display unit DU and a color filter unit CU facing the display unit DU. The display unit DU may include a first pixel PX1, a second pixel PX2, and a third pixel PX3 located on the substrate 100 (hereinafter, referred to as lower substrate). The first pixel PX1, the second pixel PX2, and the third pixel PX3 may be pixels that emit light of different colors on the lower substrate 100. For example, the first pixel PX1 may emit red light Lr, the second pixel PX2 may emit green light Lg, and the third pixel PX3 may emit blue light Lb.

The first pixel PX1, the second pixel PX2, and the third pixel PX3 may respectively include a first light-emitting device 300*a*, a second light-emitting device 300*b*, and a third light-emitting device 300*c* each including an organic light-emitting diode OLED. In an embodiment, the first light-emitting device 300*a*, the second light-emitting device 300*b*, and the third light-emitting device 300*c* may emit blue light. In another embodiment, the first light-emitting device 300*a*, the second light-emitting device 300*b*, and the third light-emitting device 300*c* may respectively emit the red light Lr, the green light Lg, and the blue light Lb.

The color filter unit CU may include filter portions 500*a*, 500*b*, and 500*c*. Light emitted from the first light-emitting device 300*a*, the second light-emitting device 300*b*, and the third light-emitting device 300*c* may pass through the filter portions 500*a*, 500*b*, and 500*c* and then may be emitted as the red light Lr, the green light Lg, and the blue light Lb.

The filter portions 500*a*, 500*b*, and 500*c* may be located on an upper substrate 200. The filter portions 500*a*, 500*b*, and 500*c* may respectively include a first quantum dot layer 220*a* and a first filter layer 210*a*, a second quantum dot layer 220*b* and a second filter layer 210*b*, and a transmitting layer 220*c* and a third filter layer 210*c* of FIG. 18 which will be described below.

When the filter portions 500*a*, 500*b*, and 500*c* are located on the upper substrate 200', it may mean that the first through third filter layers 210*a*, 210*b*, and 210*c* are formed on the upper substrate 200 to manufacture the color filter unit CU. Next, the display unit DU and the color filter unit CU may be adhered to each other, so that the first through third filter layers 210*a*, 210*b*, and 210*c* respectively face the first pixel PX1, the second pixel PX2, and the third pixel PX3.

In FIG. 4, the display unit DU and the color filter unit CU are adhered to each other through an adhesive layer ADH. The adhesive layer ADH may include, for example, but not limited to, an optical clear adhesive (OCA). In another embodiment, the adhesive layer ADH may be omitted.

Although the filter portions 500*a*, 500*b*, and 500*c* are located on the upper substrate 200 in FIG. 4, the filter portions 500*a*, 500*b*, and 500*c* may be located on the display unit DU.

For example, the filter portions 500*a*, 500*b*, and 500*c* may be located on a thin-film encapsulation layer 400 of FIG. 18 which will be described below. The first quantum dot layer 220*a*, the second quantum dot layer 220*b*, the transmitting layer 220*c*, the first filter layer 210*a*, the second filter layer 210*b*, and the third filter layer 210*c* may be located on the thin-film encapsulation layer 400. First, the first quantum dot layer 220*a*, the second quantum dot layer 220*b*, and the transmitting layer 220*c* may be located on the thin-film encapsulation layer 400, and then the first filter layer 210*a*, the second filter layer 210*b*, and the third filter layer 210*c* may be respectively located on the first quantum dot layer 220*a*, the second quantum dot layer 220*b*, and the transmitting layer 220*c*.

The display apparatus 1 may include the lower substrate 100 and the upper substrate 200 as shown in FIG. 4. The number of substrates included in the display apparatus 1 may be 2. Alternatively, the display apparatus 1 does not include the upper substrate 200 and may include only the lower substrate 100. The filter portions 500*a*, 500*b*, and 500*c* may be located on the lower substrate 100. The number of substrates included in the display apparatus 1 may be 1.

Figure 5:
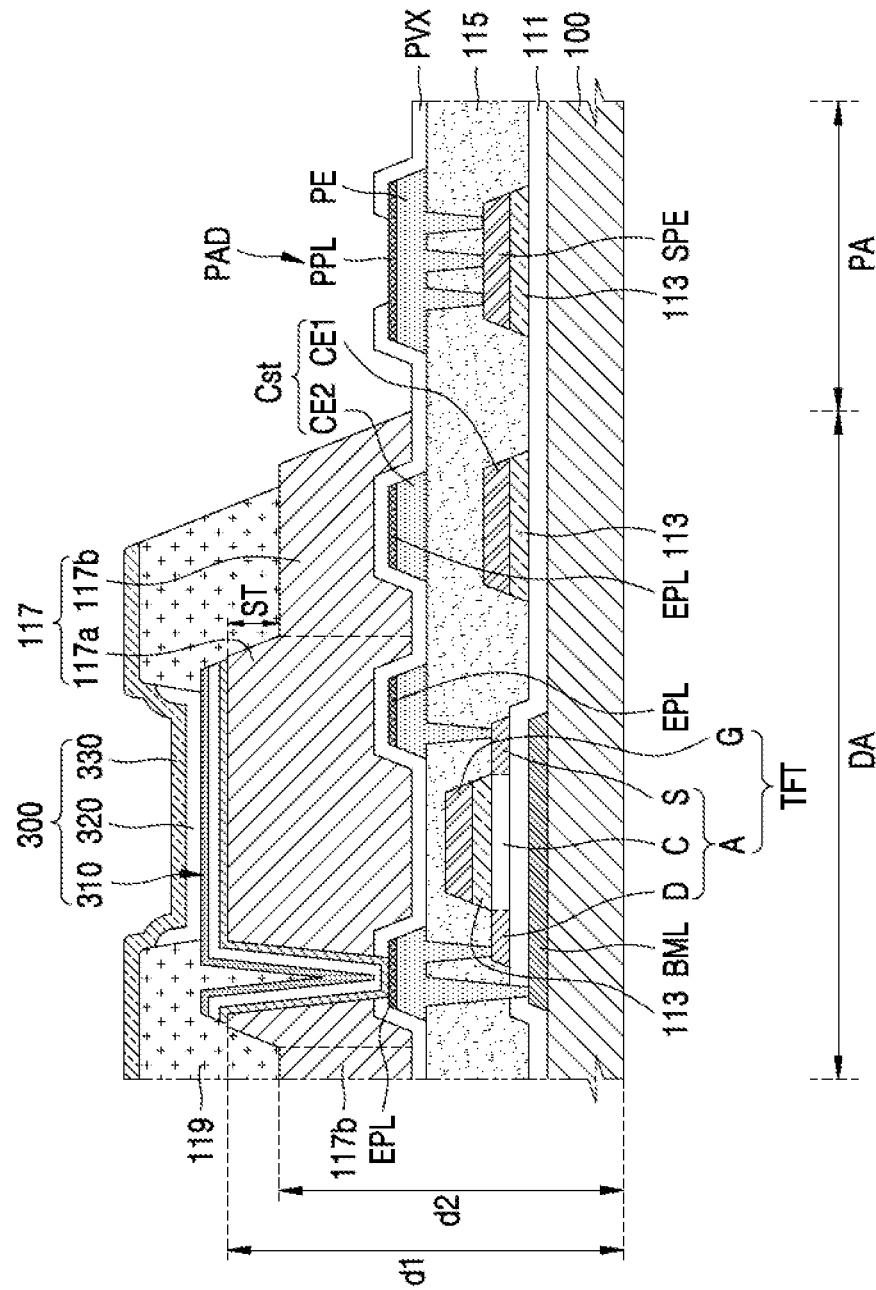
FIG. 5 is a cross-sectional view of a display apparatus according to an embodiment of the present inventive concept.

FIG. 5 is a cross-sectional view of a display apparatus according to an embodiment.

Referring to FIG. 5, the display apparatus 1 (see FIG. 1) includes a thin-film transistor TFT which is located on the display area DA of the substrate 100 and the pad unit PAD which is located on the peripheral area PA of the substrate 100. The display apparatus 1 includes a planarization layer 117 as an insulating layer located on the thin-film transistor TFT and exposing the pad unit PAD, and the planarization layer 117 includes a first portion 117*a*, a second portion 117*b*, and a third portion between the first portion 117*a* and the second portion 117*b*. A top surface of the planarization layer 117 may have a stepped portion ST between the first portion 117*a* and the second portion 117*b*. For example, the top surface of the planarization layer 117 includes a first top surface of the first portion 117a, a second top surface of the second portion 117b, and a connecting surface of the third portion. The connecting surface of the third portion may connect the first top surface of the first portion 117a and the second top surface of the second portion 117b. The first top surface of the first portion of may be higher than the second top surface of the second portion, and the connecting surface is sloped.

Elements included in the display apparatus 1 will be described in more detail according to a stacked structure with reference to FIG. 5.

The substrate 100 may include a glass material, a ceramic material, a metal material, or a flexible or bendable material. When the substrate 100 is flexible or bendable, the substrate 100 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single or multi-layer structure including the above material. When the substrate 100 has a multi-layer structure, the substrate 100 may further include an inorganic layer. In some embodiments, the substrate 100 may have a structure including an organic material, an inorganic material, and an organic material.

A buffer layer 111 may reduce or block penetration of a foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single or multi-layer structure including an inorganic material and an organic material.

A barrier layer (not shown) may be further provided between the substrate 100 and the buffer layer 111. The barrier layer may prevent or minimize impurities from the substrate 100, etc. from penetrating into a semiconductor layer A. The barrier layer may include an inorganic material such as oxide or nitride, an organic material, or a combination of an organic material and an inorganic material, and may have a single or multi-layer structure including an inorganic material and an organic material.

The semiconductor layer A may be located on the buffer layer 111. The semiconductor layer A may include an oxide semiconductor material. The semiconductor layer A may include an oxide of at least one material selected from the group consisting of, for example, indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer A may be an InSnZnO (ITZO) semiconductor layer or an InGaZnO (IGZO) semiconductor layer. Because an oxide semiconductor has a wide band gap (of about 3.1 eV), a high carrier mobility, and low leakage current, a voltage drop is not large even when a driving time is long. Accordingly, a luminance change due to a voltage drop is not large even during low-frequency operation.

The semiconductor layer A may include a channel region C, and a source region S and a drain region D respectively located on opposite sides of the channel region C. The semiconductor layer A may have a single or multi-layer structure.

A conductive layer BML may be located between the substrate 100 and the buffer layer 111. The conductive layer BML may overlap the channel region C of the semiconductor layer A. The conductive layer BML may include a conductive material including molybdenum (Mo), aluminum (Al), copper (Cu), or titanium (Ti), and may have a single or multi-layer structure including the above material. For example, the conductive layer BML may have a multi-layer structure including Ti/Al/Ti.

The conductive layer BML may overlap the semiconductor layer A including an oxide semiconductor material. Because the semiconductor layer A including the oxide semiconductor material is vulnerable to light, the conductive layer BML may prevent device characteristics of the thin-film transistor TFT including an oxide semiconductor material from being changed due to photocurrent occurring on the semiconductor layer A due to external light incident on the substrate 100. The conductive layer BML may be connected to the drain region D. Although the conductive layer BML is connected to the drain region D in FIG. 5, the conductive layer BML may be connected to the source region S.

A gate insulating layer 113 may be located on the semiconductor layer A. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

As shown in FIG. 5, the gate insulating layer 113 may be patterned to overlap a part of the semiconductor layer A. The gate insulating layer 113 may be patterned to expose the source region S and the drain region D.

A portion of the semiconductor layer A overlapping the gate insulating layer 113 may be the channel region C. The source region S and the drain region D may be subjected to a conductivity increasing process such as plasma treatment, and a portion of the semiconductor layer A overlapping the gate insulating layer 113 (i.e., the channel region C) is not exposed to the plasma treatment and thus has properties different from those of the source region S and the drain region D. Using a gate electrode G located on the gate insulating layer 113 as a self-alignment mask during the plasma treatment of the semiconductor layer A, the channel region C that is not subjected to the plasma treatment may be formed at a position overlapping the gate insulating layer 113 and the source region S and the drain region D that are subjected to the plasma treatment may be respectively formed on opposite sides of the channel region C.

In another embodiment, the gate insulating layer 113 is not patterned to overlap a part of the semiconductor layer A, and may be located on an entire surface of the substrate 100 to cover the semiconductor layer A.

The gate electrode G may be located on the gate insulating layer 113 to at least partially overlap the semiconductor layer A. A first electrode CE1 of the storage capacitor Cst and an auxiliary pad electrode SPE may be located on the gate insulating layer 113. Each of the gate electrode G, the first electrode CE1 of the storage capacitor Cst, and the auxiliary pad electrode SPE may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li) calcium (Ca), molybdenum (Mo), titanium (Ti), tungsten (W), and copper (Cu).

In an embodiment, the storage capacitor Cst may include the first electrode CE1 and a second electrode CE2, without overlapping the thin-film transistor TFT, and may be separately located as shown in FIG. 5. Alternatively, the storage capacitor Cst may overlap the thin-film transistor TFT. For example, the gate electrode G of the thin-film transistor TFT may function as the first electrode CE1 of the storage capacitor Cst.

An interlayer insulating layer 115 may cover the semiconductor layer A, the gate electrode G, the first electrode CE1 of the storage capacitor Cst, and the auxiliary pad electrode SPE. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A source electrode, a drain electrode, a data line (not shown), the second electrode CE2 of the storage capacitor Cst, and a pad electrode PE may be located on the interlayer insulating layer 115.

Each of the source electrode, the drain electrode, the data line, the second electrode CE2 of the storage capacitor Cst, and the pad electrode PE may include a conductive material including molybdenum (Mo), aluminum (Al), copper (Cu), or titanium (Ti), and may have a single or multi-layer structure including the above material. For example, each of the source electrode, the drain electrode, the data line, the second electrode CE2 of the storage capacitor Cst, and the pad electrode PE may have a multi-layer structure including Ti/Al/Ti. Alternatively, each of the source electrode, the drain electrode, the data line, the second electrode CE2 of the storage capacitor Cst, and the pad electrode PE may have a multi-layer structure including Ti/Cu.

Each of the source electrode and the drain electrode may be connected to the source region S or the drain region D of the semiconductor layer A through a contact hole. The conductive layer BML and the source region S or the drain region D of the semiconductor layer A may be connected through a contact hole formed in the buffer layer 111 and the interlayer insulating layer 115.

The second electrode CE2 and the first electrode CE1 of the storage capacitor Cst overlap each other with the interlayer insulating layer 115 therebetween to form a capacitance. The interlayer insulating layer 115 may function as a dielectric layer of the storage capacitor Cst.

The pad electrode PE may be connected to the auxiliary pad electrode SPE through a contact hole formed in the interlayer insulating layer 115. Although three contact holes are used to connect the pad electrode PE to the auxiliary pad electrode SPE in FIG. 5, more or fewer contact holes may be used. Although the auxiliary pad electrode SPE is illustrated in FIG. 5, the auxiliary pad electrode SPE may be omitted.

An electrode protective layer EPL may be located on the source electrode, the drain electrode, and the second electrode CE2 of the storage capacitor Cst, and a pad protective layer PPL may be located on the pad electrode PE.

Each of the electrode protective layer EPL and the pad protective layer PPL may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The source electrode, the drain electrode, the second electrode CE2 of the storage capacitor Cst, and the pad electrode PE may be patterned along with the electrode protective layer EPL and the pad protective layer PPL. Accordingly, because a separate mask for patterning the electrode protective layer EPL and the pad protective layer PPL is not required, the number of masks may be reduced.

The source electrode, the drain electrode, the second electrode CE2 of the storage capacitor Cst, and the pad electrode PE may be covered by an inorganic protective layer PVX. The inorganic protective layer PVX may be an inorganic insulating film formed of an inorganic material. Polysiloxane, silicon nitride, silicon oxide, or silicon oxynitride may be used as the inorganic material. The inorganic protective layer PVX may be formed of a single layer of silicon nitride ($SiN_x$) or silicon oxide ($SiO_x$) or may have a multi-layer structure including silicon nitride ($SiN_x$) and silicon oxide ($SiO_x$). The inorganic protective layer PVX may be employed to cover and protect some wirings located on the interlayer insulating layer 115.

The planarization layer 117 is located to cover the source electrode, the drain electrode, the data line, and the second electrode CE2 of the storage capacitor Cst, and the planarization layer 117 has a contact hole for connecting the thin-film transistor TFT to a pixel electrode 310.

The planarization layer 117 may have a single or multi-layer structure including an organic material, to provide a flat top surface. The planarization layer 117 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The planarization layer 117 may include the first portion 117a located on the thin-film transistor TFT, the second portion 117b, and the third portion between the first portion 117a and the second portion 117b. A top surface of the planarization layer 117 may have the stepped portion ST between the first portion 117a and the second portion 117b. For example, the top surface of the planarization layer 117 includes a first top surface of the first portion 117a, a second top surface of the second portion 117b, and a connecting surface of the third portion. The connecting surface of the third portion may connect the first top surface of the first portion 117a and the second top surface of the second portion 117b. The first top surface of the first portion of may be higher than the second top surface of the second portion, and the connecting surface is sloped. A vertical distance d1 between the substrate 100 and a top surface of the first portion 117a may be different from a vertical distance d2 between the substrate 100 and a top surface of the second portion 117b. For example, as shown in FIG. 5, the vertical distance d1 between the substrate 100 and the top surface of the first portion 117a is greater than the vertical distance d2 between the substrate 100 and the top surface of the second portion 117b.

The planarization layer 117 may expose the pad unit PAD. For example, the planarization layer 117 is not dispose on the peripheral area PA so that the planarization layer 117 does not overlap the pad unit PAD.

As a comparative example, a planarization layer may remain on an outer portion of a display panel. The planarization layer remaining on the outer portion of the display panel may act as an external moisture penetration path, thereby causing a reliability problem such as degradation of a light-emitting device.

A light-emitting device 300 is located on the planarization layer 117. The light-emitting device 300 includes the pixel electrode 310, an intermediate layer 320 including an organic emission layer, and a counter electrode 330.

The pixel electrode 310 may be a (semi-)transmissive electrode or a reflective electrode. In some embodiments, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, as shown in FIG. 5, the pixel electrode 310 may include three films. For example, the three films of the pixel electrode 310 may be formed of ITO/Ag/ITO.

In some embodiments, the pixel electrode 310 may overlap only the first portion 117a of the planarization layer 117. As described above, the top surface of the planarization layer 117 may have the stepped portion ST between the first portion 117a and the second portion 117b extending from the first portion 117a. As shown in FIG. 5, the stepped portion ST may be formed not only between the first portion 117a and the second portion 117b extending to the peripheral area PA but also between the first portion 117a and the second portion 117b extending to the display area DA. The first portion 117a may correspond to a portion of the planarization layer 117 having a relatively large vertical distance between the substrate 100 and the top surface of the planarization layer 117, and the pixel electrode 310 may be located on the first portion 117a.

A pixel-defining film 119 may be located on the planarization layer 117. The pixel-defining film 119 may increase a distance between an edge of the pixel electrode 310 and the counter electrode 330 over the pixel electrode 310 to prevent an arc or the like from occurring on the edge of the pixel electrode 310.

The pixel-defining film 119 may be formed of at least one organic insulating material selected the group consisting of polyimide, polyamide, an acrylic resin, benzocyclobutene, and a phenolic resin by spin coating or the like.

The intermediate layer 320 may be located in an opening formed by the pixel-defining film 119, and may include the organic emission layer. The organic emission layer may include an organic material including a fluorescent or phosphorescent material emitting red light, green light, blue light, or white light. The organic emission layer may be formed of a low-molecular-weight organic material or a high-molecular-weight organic material. A functional layer such as a hole transport layer (HTL), a hole injection layer (HIL), an electron transport layer (ETL), or an electron injection layer (EIL) may be selectively further located under or over the organic emission layer.

The counter electrode 330 may be a light-transmitting electrode or a reflective electrode. In some embodiments, the counter electrode 330 may be a transparent or semi-transparent electrode, and may include a metal thin film having a low work function including Li, Ca, LiF/Ca, LiF/Al, Al, Ag, Mg, or a compound thereof. A transparent conductive oxide (TCO) film including ITO, IZO, ZnO, or $In_2O_3$ may be further located on the metal thin film. The counter electrode 330 may be located over the display area DA, and may be located on the intermediate layer 320 and the pixel-defining film 119. The counter electrode 330 may be integrally formed with a plurality of organic light-emitting devices 300 to correspond to a plurality of pixel electrodes 310.

Because an organic light-emitting device may be easily damaged by external moisture or oxygen, an encapsulation layer (not shown) may cover and protect the organic light-emitting device. The encapsulation layer may include a first inorganic encapsulation layer, an organic encapsulation layer, and a second inorganic encapsulation layer.

Figure 6A:
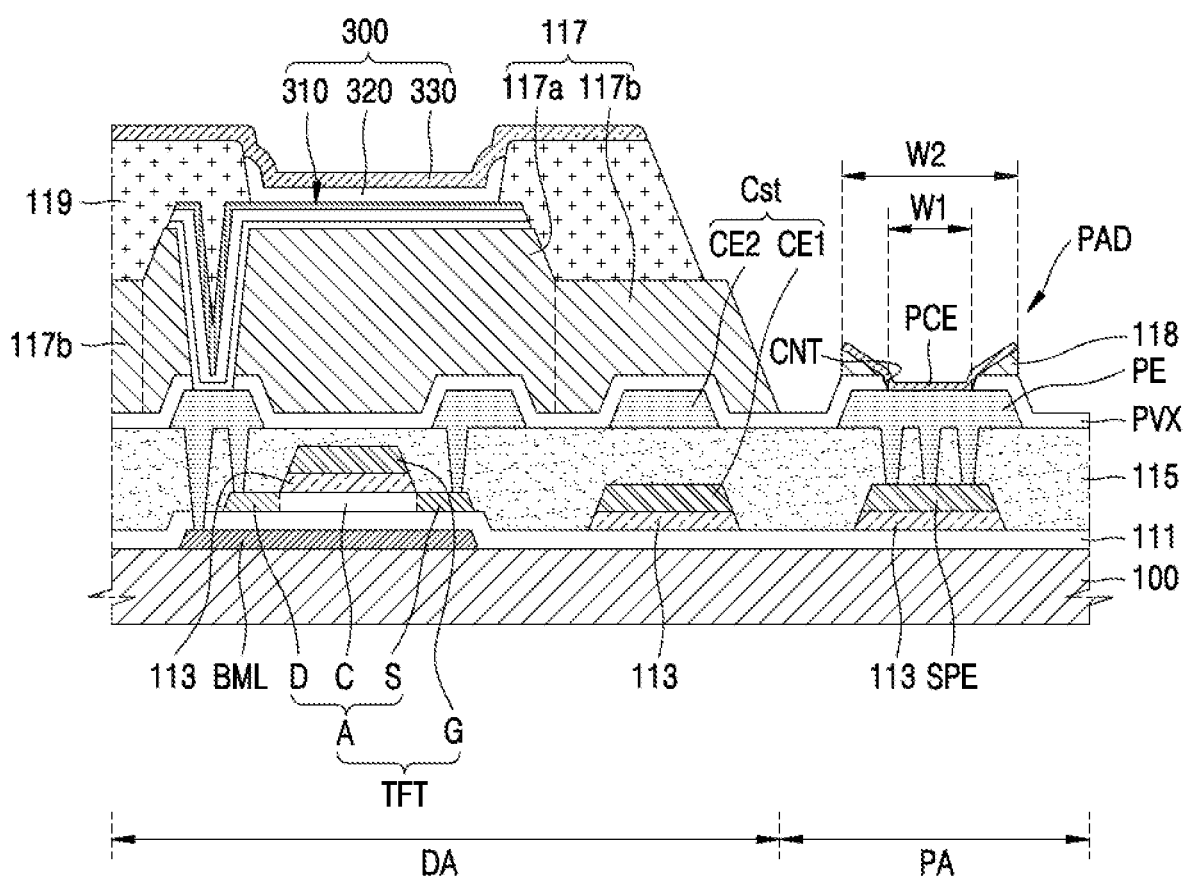
FIG. 6A is a cross-sectional view of a display apparatus according to an embodiment of the present inventive concept.
Figure 6B:
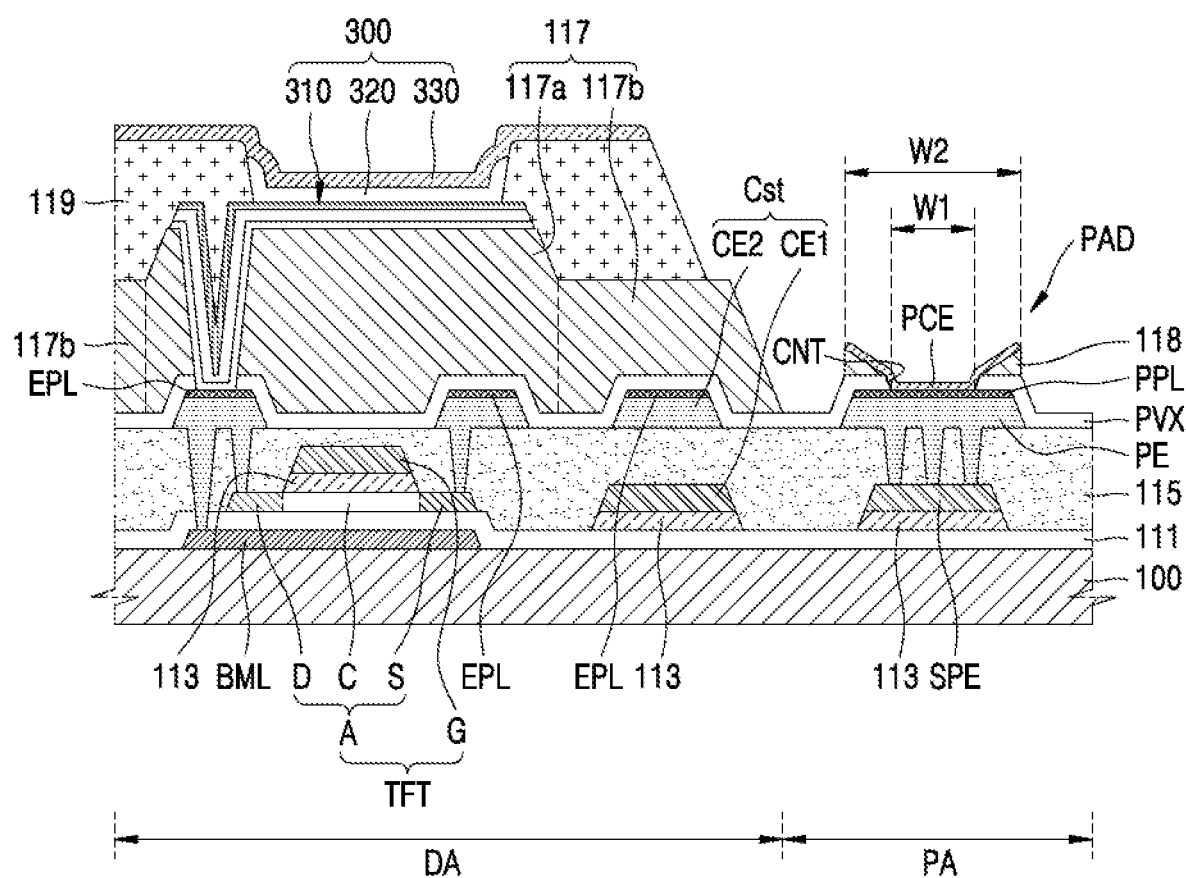
FIG. 6B is a cross-sectional view of a display apparatus according to an embodiment of the present inventive concept.

FIGS. 6A and 6B are cross-sectional views of a display apparatus according to an embodiment. In FIGS. 6A and 6B, the same elements as those in FIG. 5 are denoted by the same reference numerals, and thus a repeated description thereof will be omitted.

Referring to FIG. 6A, the display apparatus 1 includes the thin-film transistor TFT and the storage capacitor Cst which is located on the display area DA of the substrate 100, and the pad unit PAD which is located on the peripheral area PA of the substrate 100.

Unlike in FIG. 5, as shown in FIG. 6A, a pad connection electrode PCE may be located on the pad electrode PE. The pad connection electrode PCE may include or may be formed of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pad connection electrode PCE may include or may be formed of the same material as that of at least a part of the pixel electrode 310. In an embodiment, the pixel electrode 310 may include three films, and the pad connection electrode PCE may be formed of a single film. For example, the three films of the pixel electrode 310 may be formed of ITO/Ag/ITO, and the single film of the pad connection electrode PCE may be formed of ITO.

The pad connection electrode PCE may at least partially contact the pad electrode PE. A contact hole CNT through which at least a part of the pad electrode PE is exposed may be formed in the inorganic protective layer PVX, and a part of the pad connection electrode PCE may contact the pad electrode PE in the contact hole CNT. In an embodiment, as shown in FIG. 6A, a width W2 of the pad connection electrode PCE in one direction may be greater than a width W1 of the pad electrode PE exposed through the contact hole CNT. In an embodiment, the pad connection electrode PCE may include a first part which contacts the pad electrode PE, and a second part which is spaced apart from the pad electrode PE. The second part of the pad connection electrode PCE may be outside the contact hole CNT of the inorganic protective layer PVX.

As described with reference to FIG. 2, the pad unit PAD and the terminal portion PCB-P of the printed circuit board PCB may be electrically connected. A contact width between the pad unit PAD and the terminal portion PCB-P increases from the width W1 of the pad electrode PE exposed through the contact hole CNT to the width W2 of the pad connection electrode PCE. A contact area between the pad unit PAD and the terminal portion PCB-P increases. Accordingly, poor contact between the pad unit PAD and the terminal portion PCB-P may be reduced, and the risk of defects during operation of the display apparatus 1 may be reduced.

The display apparatus 1 may further include an insulating layer 118 located on the inorganic protective layer PVX corresponding to the peripheral area PA and including or being formed of the same material as that of the planarization layer 117.

The insulating layer 118 may be located between the pad electrode PE and the pad connection electrode PCE, and may at least partially overlap the pad connection electrode PCE. A surface of the insulating layer 118 overlapping the pad connection electrode PCE may be inclined. A surface of the inorganic protective layer PVX and the surface of the insulating layer 118 parallel to the substrate 100 may have a certain angle therebetween. A surface of the pad connection electrode PCE overlapping the insulating layer 118 may be inclined along the insulating layer 118. In an embodiment, the insulating layer 118 may be disposed between a top surface of the pad electrode PE and a bottom surface of the second part of the pad connection electrode PCE. A top surface of insulating layer 118 may contact the bottom surface of the second part of the pad connection electrode PCE, and may be inclined along the bottom surface of the second part of the pad connection electrode PCE.

Although the electrode protective layer EPL and the pad protective layer PPL are not shown in FIG. 6A, as described with reference to FIG. 5, referring to FIG. 6B, the pad unit PAD may further include the pad protective layer PPL located between the pad electrode PE and the pad connection electrode PCE. The electrode protective layer EPL may be located on a source electrode, a drain electrode, and the second electrode CE2 of the storage capacitor Cst.

Although only the display apparatus 1 has been mainly described, the present disclosure is not limited thereto. For example, a method of manufacturing the display apparatus 1 may also fall within the scope of the present disclosure.

FIGS. 7A through 7G are cross-sectional views sequentially illustrating a method of manufacturing a display apparatus according to an embodiment. In detail, FIGS. 7A through 7G are cross-sectional views sequentially illustrating a method of manufacturing a display apparatus according to an embodiment based on FIG. 5. In FIGS. 7A through 7G, the same elements as those in FIG. 5 are denoted by the same reference numerals, and thus a repeated description thereof will be omitted.

Figure 7A:
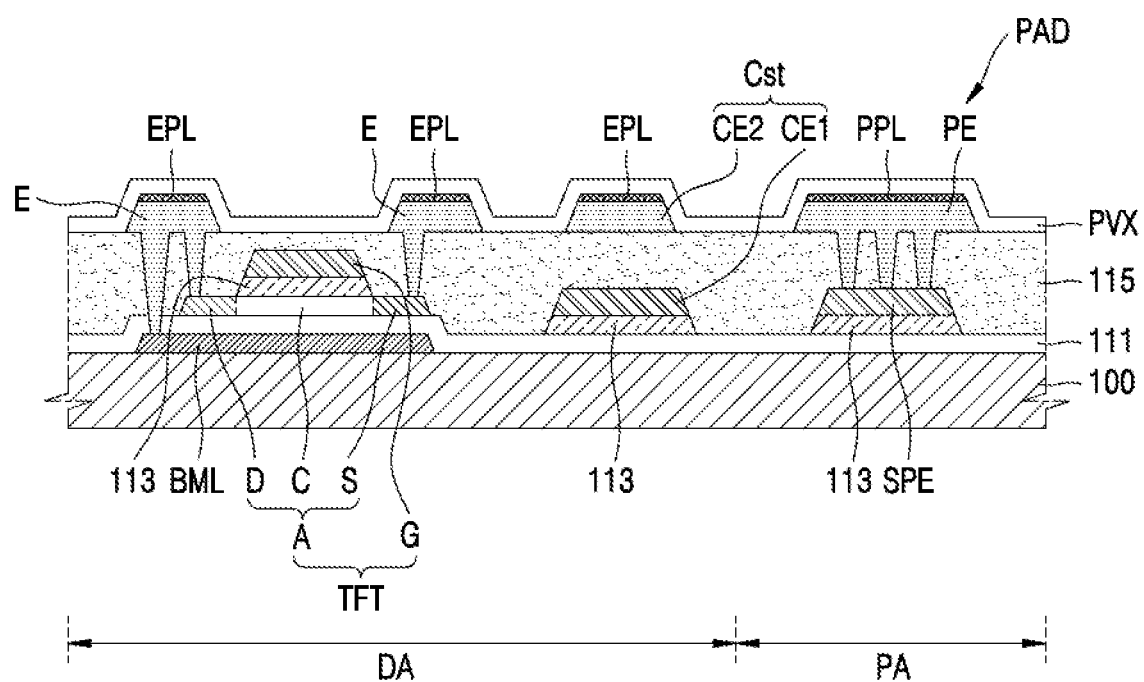
FIGS. 7A through 7G are cross-sectional views sequentially illustrating a method of manufacturing a display apparatus according to an embodiment of the present inventive concept.

Referring to FIG. 7A, first, the conductive layer BML, the buffer layer 111, the semiconductor layer A, the gate insulating layer 113, the gate electrode G, the first and second electrodes CE1 and CE2 of the storage capacitor Cst, the auxiliary pad electrode SPE, the interlayer insulating layer 115, an electrode layer E, the pad electrode PE, the electrode protective layer EPL, the pad protective layer PPL, and the inorganic protective layer PVX are sequentially formed on the substrate 100.

The conductive layer BML may be formed by patterning a pre-conductive layer (not shown). The pre-conductive layer may include a conductive material including molybdenum (Mo), aluminum (Al), copper (Cu), or titanium (Ti), and may have a single or multi-layer structure including the above material.

The buffer layer 111 may include silicon oxide ($SiO_2$) or silicon nitride ($SiN_x$), and may be formed by using a deposition method such as chemical vapor deposition (CVD) or sputtering.

The semiconductor layer A may be located on the buffer layer 111. The semiconductor layer A may be formed by patterning a pre-semiconductor layer (not shown). The pre-semiconductor layer may include an oxide semiconductor, and may be deposited by using CVD.

The gate insulating layer 113 and the gate electrode G may be located on the semiconductor layer A, and the gate insulating layer 113, the first electrode CE1 of the storage capacitor Cst, and the auxiliary pad electrode SPE may be located on the buffer layer 111.

The gate insulating layer 113, the gate electrode G, the first electrode CE1 of the storage capacitor Cst, and the auxiliary pad electrode SPE may be formed by patterning a pre-gate insulating layer (not shown) and a pre-metal layer (not shown).

The pre-gate insulating layer may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by using a deposition method such as, but not limited to, CVD or sputtering.

The pre-metal layer may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, plasma-enhanced CVD (PECVD), low-pressure CVD (LPCVD), physical vapor deposition (PVD), sputtering, or atomic layer deposition (ALD).

Plasma treatment is performed when the pre-gate insulating layer is patterned, and a portion of the semiconductor layer A exposed without overlapping the gate electrode G is subjected to a conductivity increasing process during the plasma treatment. As a result, the source region S and the drain region D exposed during the plasma treatment become conductive, and the channel region C overlapping the gate electrode G has properties different from those of the source region S and the drain region D.

The interlayer insulating layer 115 is formed on the gate electrode G, the first electrode CE1 of the storage capacitor Cst, and the auxiliary pad electrode SPE. After the interlayer insulating layer 115 is formed, contact holes passing through the interlayer insulating layer 115 and respectively exposing parts of the conductive layer BML, the semiconductor layer A, and the auxiliary pad electrode SPE are formed.

The electrode layer E, the second electrode CE2 of the storage capacitor Cst, and the pad electrode PE are formed on the interlayer insulating layer 115. The electrode protective layer EPL and the pad protective layer PPL are formed on the electrode layer E, the second electrode CE2 of the storage capacitor Cst, and the pad electrode PE. The electrode layer E, the second electrode CE2 of the storage capacitor Cst, the pad electrode PE, the electrode protective layer EPL, and the pad protective layer PPL may be formed by sequentially depositing a pre-electrode layer (not shown) and a pre-protective layer (not shown) on an entire top surface of the interlayer insulating layer 115 and performing a mask process and an etching process. The electrode layer E, the second electrode CE2 of the storage capacitor Cst, and the pad electrode PE may be patterned along with the electrode protective layer EPL and the pad protective layer PPL. Accordingly, because a separate mask for patterning the electrode protective layer EPL and the pad protective layer PPL is not required, the number of masks may be reduced.

The inorganic protective layer PVX is formed on the electrode layer E, the second electrode CE2 of the storage capacitor Cst, and the pad electrode PE. The inorganic protective layer PVX may be an inorganic insulating film formed of an inorganic material, and may be formed by using a deposition method such as, but not limited to, CVD, PECVD, LPCVD, PVD, sputtering, or ALD.

Figure 7B:
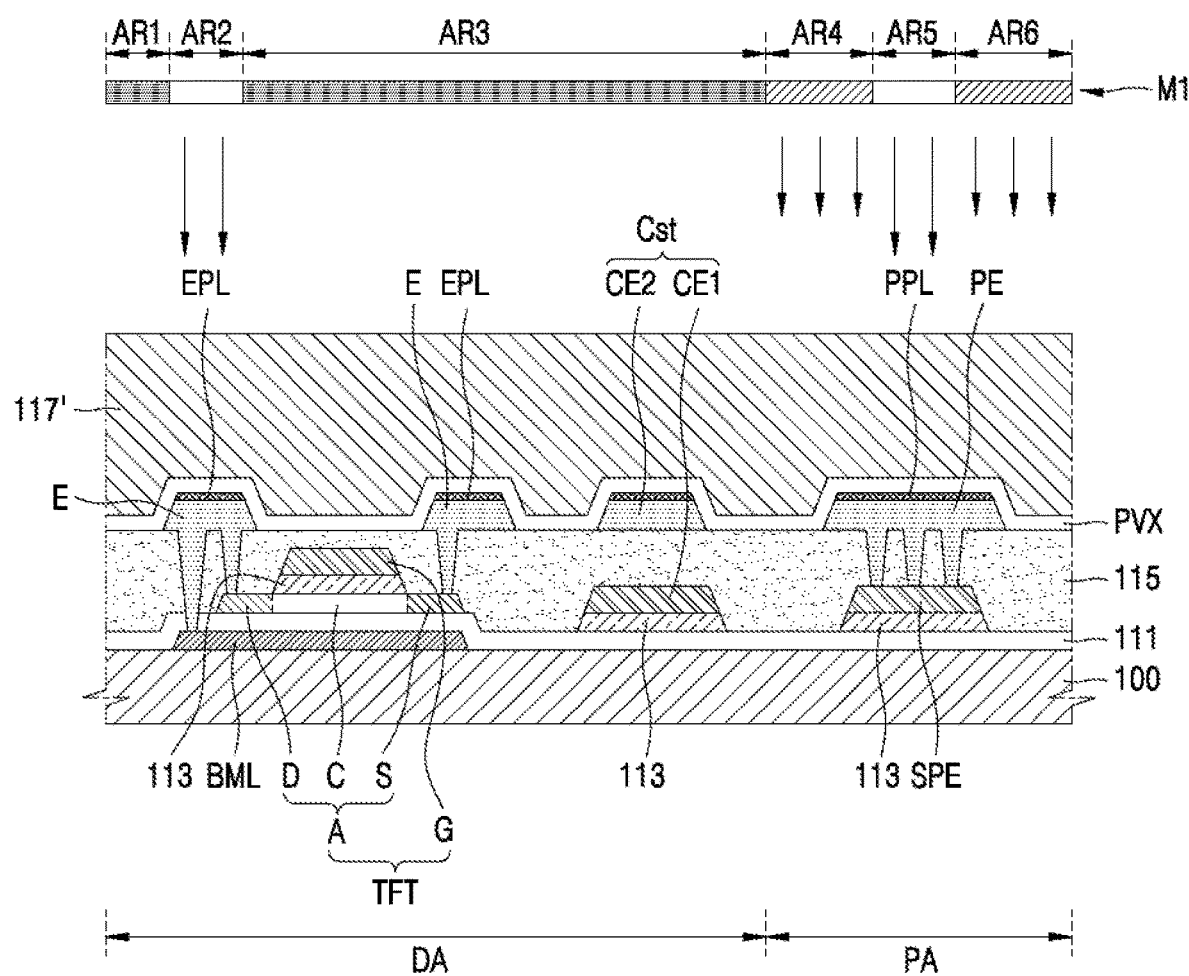

Referring to FIG. 7B, a planarization material layer 117' is located on the inorganic protective layer PVX. The planarization material layer 117' may have or may be formed of a single or multi-layer structure including an organic material or an inorganic material. After the planarization material layer 117' is formed, chemical mechanical polishing may be performed to provide a flat top surface.

The planarization material layer 117' may include or may be formed of a positive photoresist, and may be formed by applying a positive photoresist solution (not shown) to the inorganic protective layer PVX by using any of various methods such as spin coating, spraying, or dipping. Before the planarization material layer 117' is applied to a top surface of the inorganic protective layer PVX, a process of polishing the top surface of the inorganic protective layer PVX to which the planarization material layer 117' is to be applied may be additionally performed.

A first mask M1 may be located over the planarization material layer 117'. The first mask M1 may adjust the amount of light exposure of the planarization material layer 117' in each area. For example, the amount of light exposure of the planarization material layer 117' in a fourth area AR4 of the first mask M1 may be adjusted to be less than that in a second area AR2 and a fifth area AR5 of the first mask M1. The amount of light exposure of the planarization material layer 117' in a sixth area AR6 of the first mask M1 may be adjusted to be less than that in the second area AR2 and the fifth area AR5 of the first mask M1. For example, the first mask M1 may be a half-tone mask or a slit mask. In some embodiments, a first area AR1 and a third area AR3 of the first mask M1 may be shielded so that the planarization material layer 117' is not exposed to light.

Figure 7C:
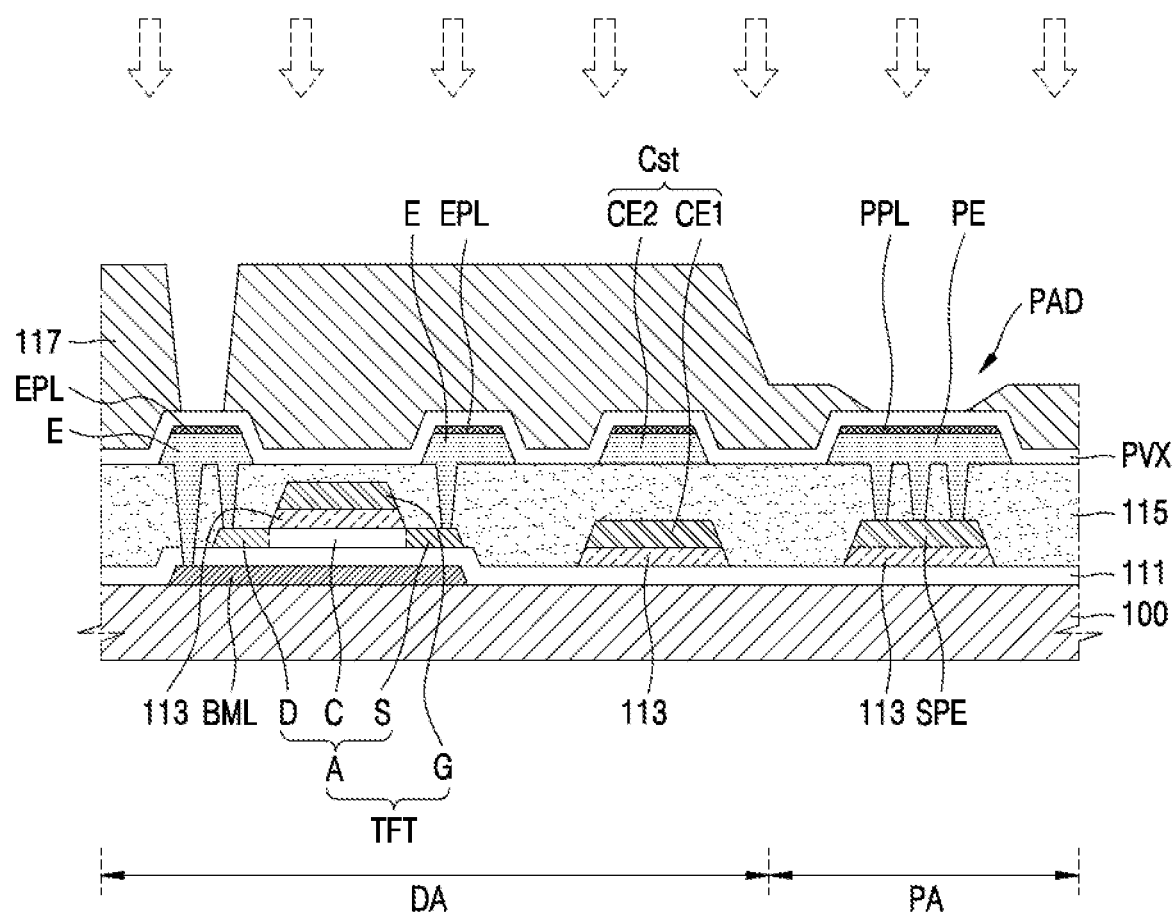

The planarization material layer 117' may be exposed at different amounts of light exposure according to areas through the first mask M1, and a part of the planarization material layer 117' may be removed by using a developing process. Because the amount of the planarization material layer 117' that is removed varies according to the amount of light exposure, the planarization layer 117 having different thicknesses according to areas may be formed at one time. As shown in FIG. 7C, a thickness of the planarization layer 117 which is disposed on the display area DA may be greater than a thickness of the planarization layer 117 which is disposed on the peripheral area PA. Next, a degree of adhesion of the planarization layer 117 to the inorganic protective layer PVX may be increased through a curing and drying process. The curing and drying process may include a heat treatment process.

Although the planarization material layer 117' includes the positive photoresist in FIG. 7B, the planarization material layer 117' may include or may be formed a negative photoresist. Unlike in a case where the planarization material layer 117' includes the positive photoresist, a thickness of the planarization layer 117 remaining after a developing process increases as the amount of light exposure of the planarization material layer 117' increases.

Figure 7D:
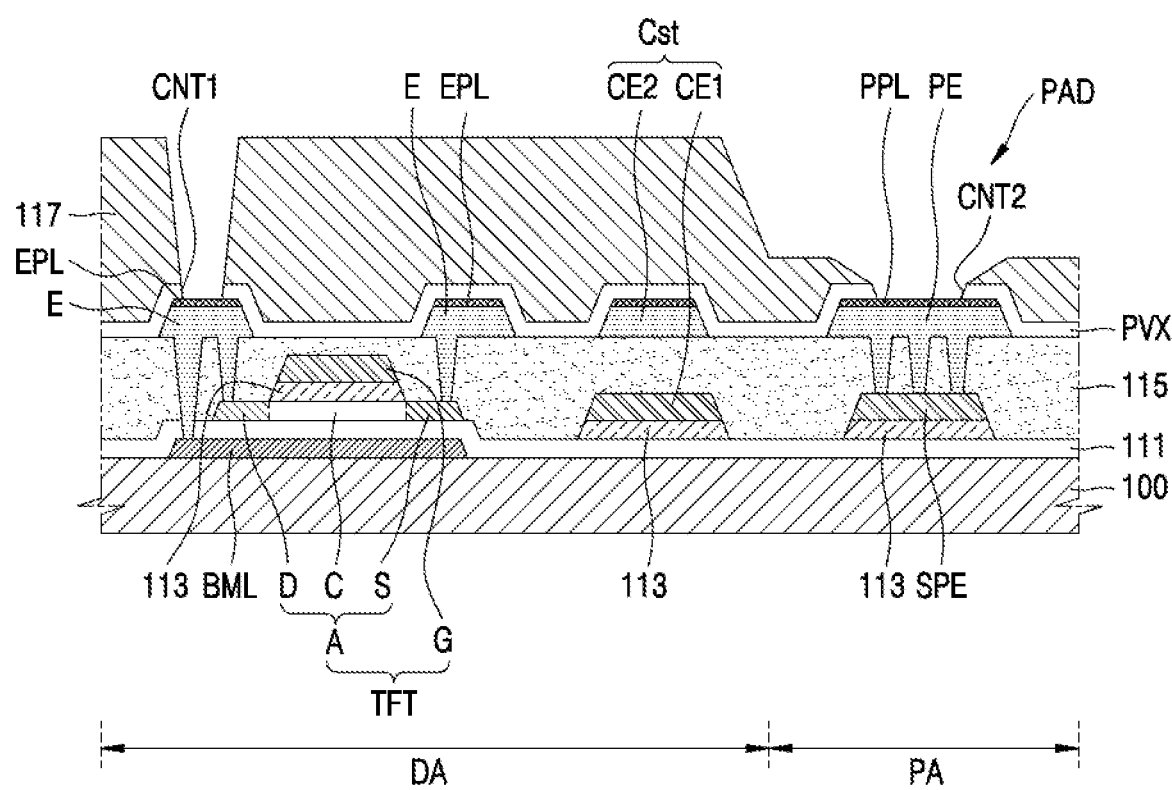

Referring to FIGS. 7C and 7D, a first contact hole CNT1 through which a part of the electrode layer E is exposed and a second contact hole CNT2 through which a part of the pad electrode PE is exposed are formed in the inorganic protective layer PVX by using the patterned planarization layer 117. The first contact hole CNT1 and the second contact hole CNT2 are formed by using an etching process of partially etching the inorganic protective layer PVX. For example, the etching process of partially etching the inorganic protective layer PVX may be a dry etching process. Although not shown in FIG. 7D, a part of the planarization layer 117 may also be removed, thereby reducing a thickness of the planarization layer 117. In an embodiment, a width of a top surface of the pad unit PAD in one direction may be equal to or less than a width of the second contact hole CNT2 of the inorganic protective layer PVX. In an embodiment, a side surface of the pad electrode PE may be at least partially exposed through the second contact hole CNT2 of the inorganic protective layer PVX.

Figure 7E:
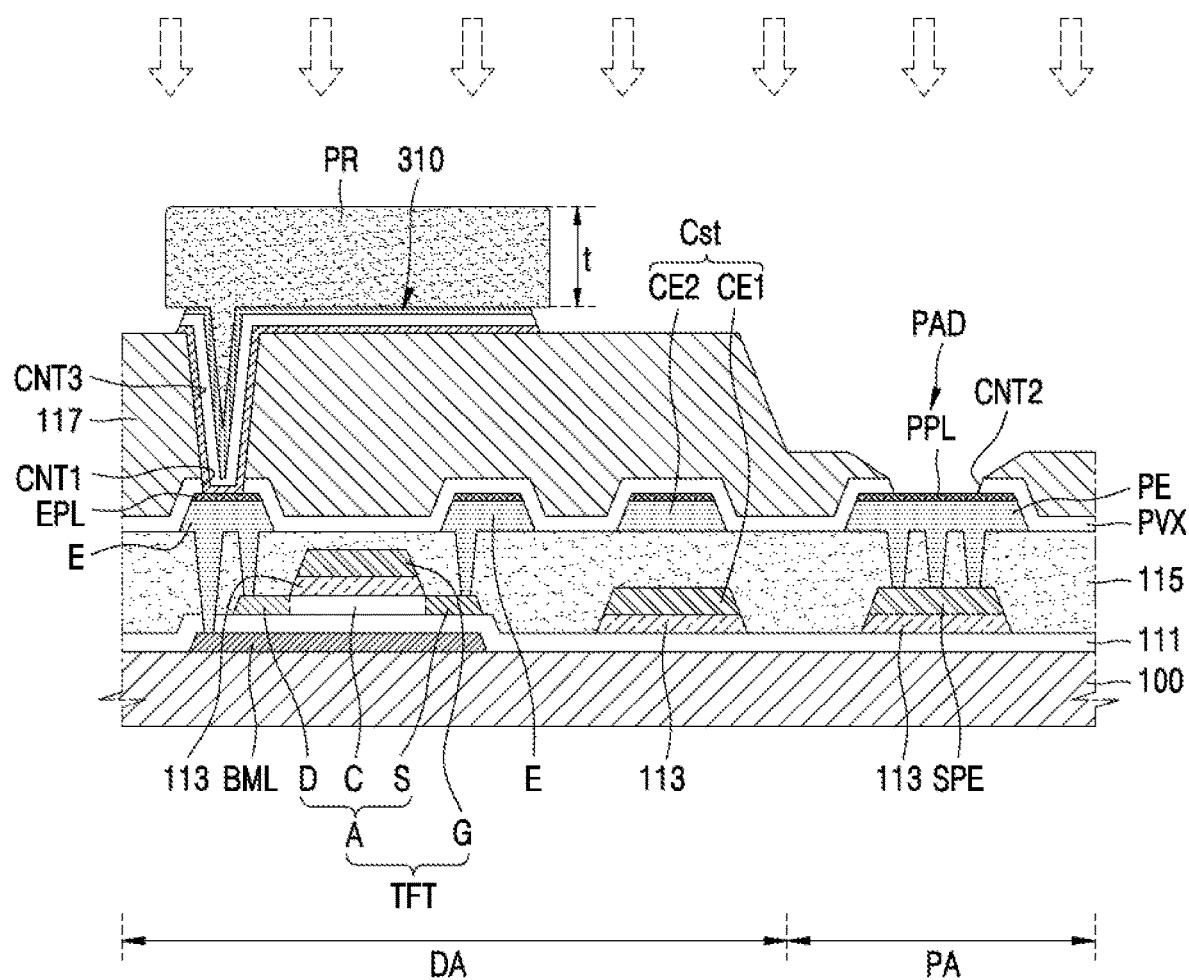

Referring to FIG. 7E, the pixel electrode 310 is formed on the planarization layer 117. The pixel electrode 310 may be formed by patterning a pre-pixel electrode layer 310' (see FIG. 8B). After the pre-pixel electrode layer 310' is deposited on an entire top surface of the planarization layer 117 and a photoresist pattern PR is formed on the pre-pixel electrode layer 310', the pre-pixel electrode layer 310' may be etched by using the photoresist pattern PR. The pixel electrode 310 may be formed by depositing the pre-pixel electrode layer 310' and performing a mask process and an etching process. For example, the etching process may be a wet etching process.

Because a third contact hole CNT3 through which a part of the electrode layer E is exposed is formed in the planarization layer 117, the pixel electrode 310 may be connected to the thin-film transistor TFT through the first contact hole CNT1 and the third contact hole CNT3.

After the pixel electrode 310 is formed, the photoresist pattern PR is not removed, and an etching process for removing the planarization layer 117 which is disposed the peripheral area PA may be performed by using the photoresist pattern PR. For example, the etching process may be a dry etching process.

Figure 7F:
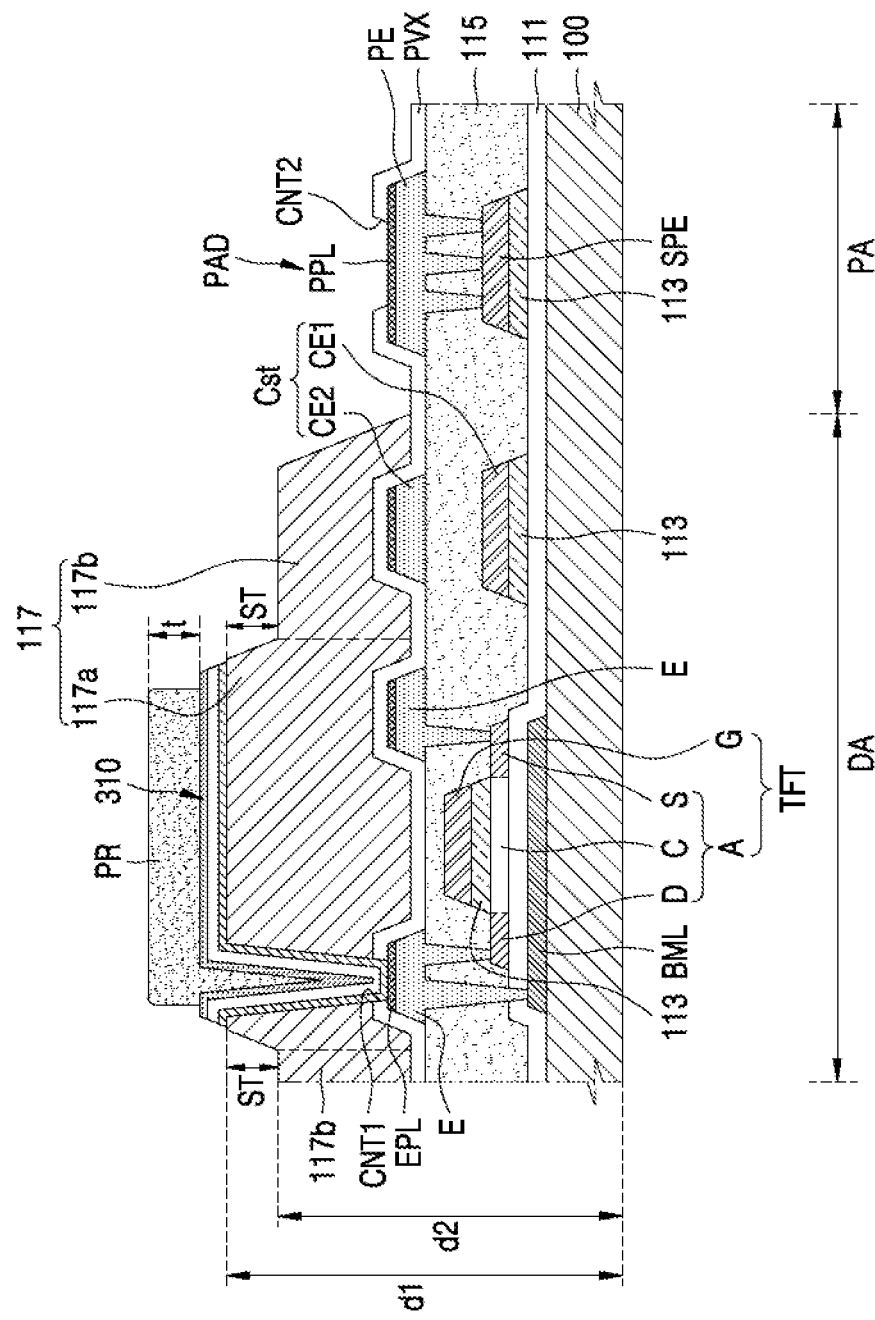

Referring to FIG. 7F, the first portion 117a of the planarization layer 117 may correspond to a portion protected by the photoresist pattern PR during the etching process, and the second portion 117b of the planarization layer 117 may correspond to a portion not protected by the photoresist pattern PR during the etching process. A top surface of the planarization layer 117 may have the stepped portion ST between the first portion 117a and the second portion 117b due to the photoresist pattern PR. A vertical distance d1 between the substrate 100 and a top surface of the first portion 117a may be greater than a vertical distance d2 between the substrate 100 and a top surface of the second portion 117b. A part of the photoresist pattern PR may be etched during the etching process, and thus a thickness t of the photoresist pattern PR may also be reduced.

Because the pixel electrode 310 is formed by using the photoresist pattern PR as an etch mask as shown in FIG. 7E and the first portion 117a of the planarization layer 117 is formed by using the photoresist pattern PR as an etch mask as shown in FIG. 7F, a planar shape of the photoresist pattern PR may be transferred to a planar shape of the pixel electrode 310 and a planar shape of the first portion 117a. As shown in FIG. 7F, an edge of the pixel electrode 310 and a side wall of the first portion 117a may be coplanar with each other. In an embodiment, the edge of the pixel electrode 310 and the side wall of the first portion 117a may be connected to each other, and the connected edge of the pixel electrode 310 and the side wall of the first portion 117a may form a plane which is inclined relative a top surface of the photoresist pattern PR.

As a comparative example, an etching process for removing a planarization layer corresponding to a peripheral area may be performed before a pixel electrode is formed. When a foreign material exists on a surface of the planarization layer, a stepped portion may be formed between a portion on which the foreign material exists and a portion on which the foreign material does not exist during the etching process. When a light-emitting device is located on the surface of the planarization layer having the stepped portion, a short may occur between the pixel electrode and a counter electrode, thereby resulting in dark spots on a display panel. Because the surface of the planarization layer is not protected during the etching process, a surface roughness of the planarization layer may be increased. When the pixel electrode is disposed on the surface of the planarization layer having the increased surface roughness, a reflectance of external light may be reduced, and luminous efficiency may be reduced.

However, according to an embodiment, after the pixel electrode 310 is formed, the photoresist pattern PR is not removed, and an etching process for removing the planarization layer 117 which is disposed on the peripheral area PA may be performed. A surface of the planarization layer 117 on which the pixel electrode 310 is located may be protected by the photoresist pattern PR. Accordingly, a stepped portion due to a foreign material is not formed on the surface of the planarization layer 117, and a surface roughness of the planarization layer 117 is not increased. Dark spots are not formed on a display panel, a reflectance of external light is not reduced, and luminous efficiency is not reduced. Because there is no planarization layer 117 remaining in the peripheral area PA due to the etching process, an external moisture penetration path is blocked, thereby reducing the risk of a reliability problem such as degradation of the light-emitting device.

Figure 7G:
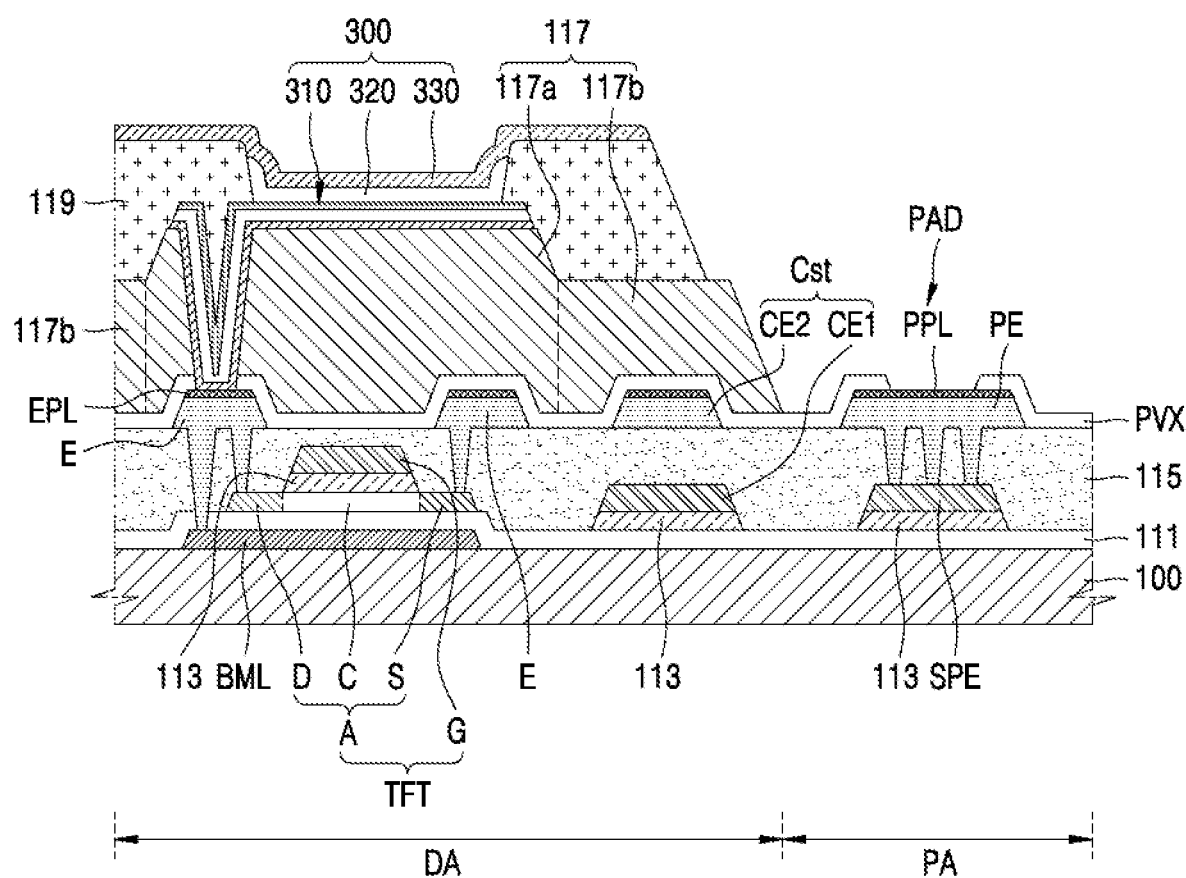

Referring to FIG. 7G, after the photoresist pattern PR is removed, the pixel-defining film 119 covering an edge of the pixel electrode 310 and having an opening through which a central portion of the pixel electrode 310 is exposed is formed on an entire top surface of the planarization layer 117. The pixel-defining film 119 may be formed of at least one organic insulating material selected from the group consisting of polyimide, polyamide, an acrylic resin, benzocyclobutene, and a phenolic resin by using spin coating or the like.

The intermediate layer 320 is formed on the pixel electrode 310, that is, in the opening of the pixel-defining film 119. The intermediate layer 320 may include a low-molecular-weight material or a high-molecular-weight material. The intermediate layer 320 may be formed by using vacuum deposition, screen printing, inkjet printing, or laser-induced thermal imaging (LITI).

The intermediate layer 320 of the light-emitting device 300 may include an organic emission layer. The organic emission layer may include an organic material including a fluorescent or phosphorescent material emitting red light, green light, blue light, or white light. The organic emission layer may be formed of a low-molecular-weight organic material or a high-molecular-weight organic material. A functional layer such as a hole transport layer (HTL), a hole injection layer (HIL), an electron transport layer (ETL), or an electron injection layer (EIL) may be selectively further located under or over the organic emission layer. The intermediate layer 320 may be disposed on each of a plurality of pixel electrodes 310. However, the present disclosure is not limited thereto. Various modifications may be made. For example, the intermediate layer 320 may include an integrated layer over the plurality of pixel electrodes 310.

Next, the counter electrode 330 is formed to correspond to the plurality of light-emitting devices 300. The counter electrode 330 may be formed to cover the display area DA of the substrate 100 through an open mask. The counter electrode 330 may be formed by using a deposition method such as CVD, PECVD, LPCVD, PVD, sputtering, or ALD.

FIGS. 8A through 8G are cross-sectional views sequentially illustrating a method of manufacturing a display apparatus according to an embodiment. In detail, FIGS. 8A through 8G are cross-sectional views sequentially illustrating a method of manufacturing a display apparatus according to an embodiment based on FIG. 5. In FIGS. 8A through 8G, the same elements as those in FIGS. 7A through 7G are denoted by the same reference numerals, and thus a repeated description thereof will be omitted.

Figure 8A:
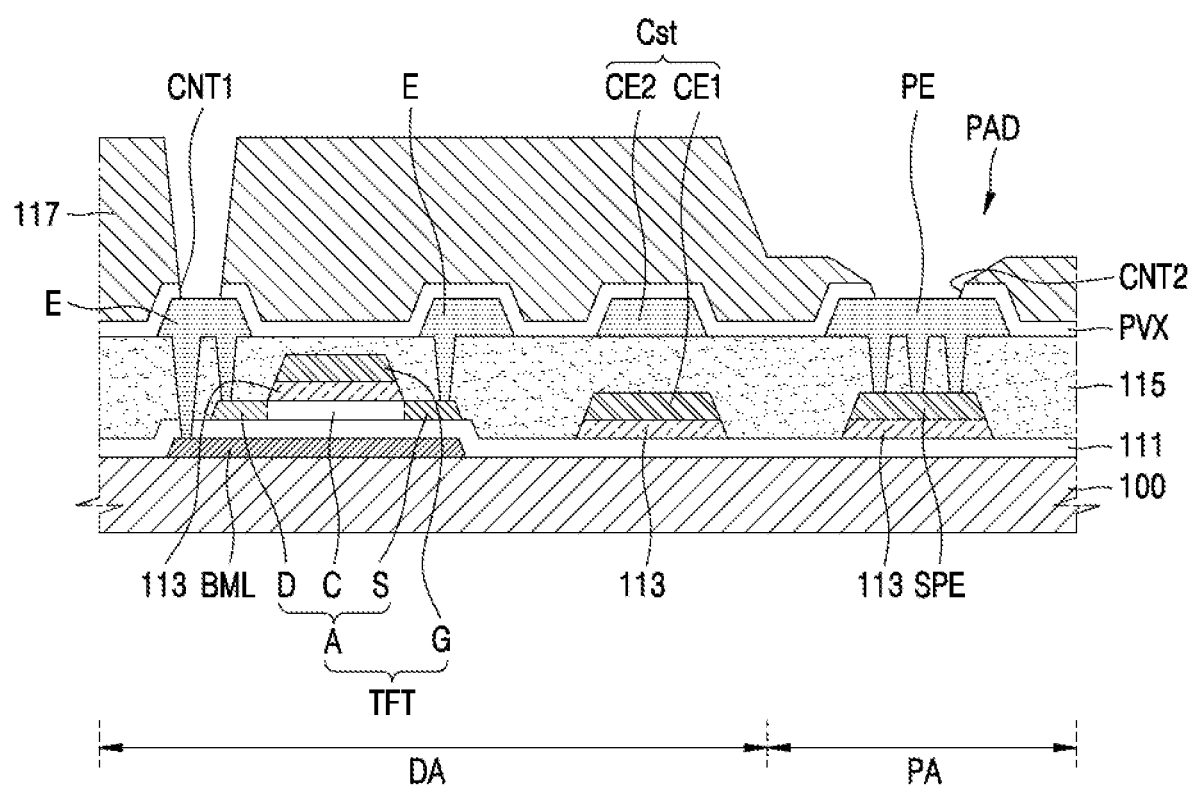
FIGS. 8A through 8G are cross-sectional views sequentially illustrating a method of manufacturing a display apparatus according to an embodiment of the present inventive concept.

Referring to FIG. 8A, as described with reference to FIG. 7B, the planarization material layer 117' may be exposed at different amounts of light exposure according to areas through the first mask M1, and a part of the planarization material layer 117' may be removed by using a developing process. Because the amount of the planarization material layer 117' that is removed varies according to the amount of light exposure, the planarization layer 117 having different thicknesses according to areas may be formed at one time. The planarization layer 117 may be patterned. The first contact hole CNT1 through which a part of the electrode layer E is exposed and the second contact hole CNT2 through which a part of the pad electrode PE is exposed may be formed in the inorganic protective layer PVX by using the patterned planarization layer 117.

Figure 8B:
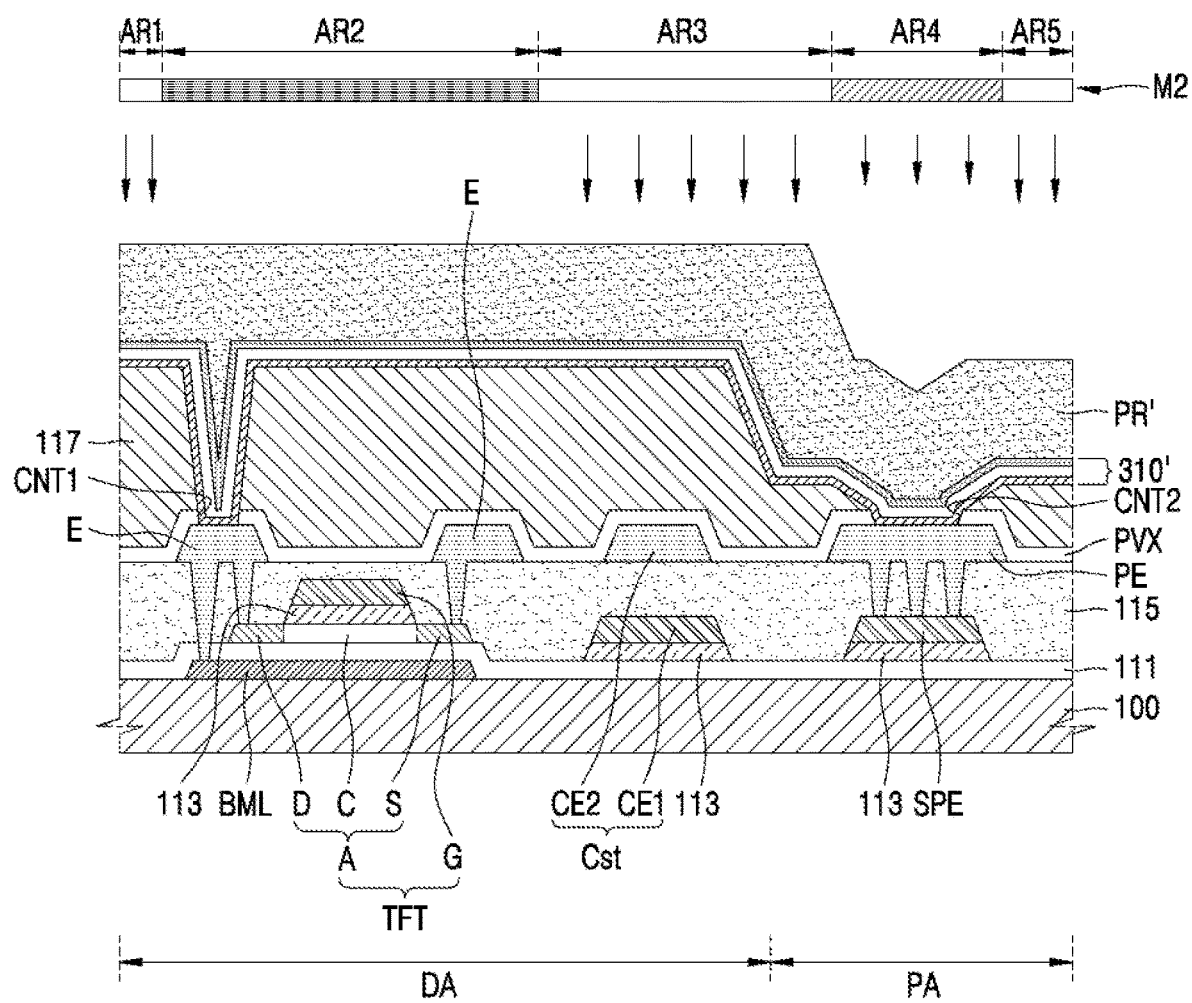

Referring to FIG. 8B, the pre-pixel electrode layer 310' and a photoresist layer PR' are sequentially formed on the planarization layer 117.

The photoresist layer PR' may include a positive photoresist, and may be formed by applying a positive photoresist solution (not shown) to the pre-pixel electrode layer 310' by using any of various methods such as spin coating, spraying, or dipping.

A second mask M2 may be located over the photoresist layer PR'. The second mask M2 may adjust the amount of light exposure of the photoresist layer PR' in each area. For example, the amount of light exposure of the photoresist layer PR' in the fourth area AR4 of the second mask M2 may be adjusted to be less than that in the first area AR1, the third area AR3, and the fifth area AR5 of the second mask M2. For example, the second mask M2 may be a half-tone mask or a slit mask. In some embodiments, the second area AR2 of the second mask M2 may be shielded so that the photoresist layer PR' is not exposed to light.

Figure 8C:
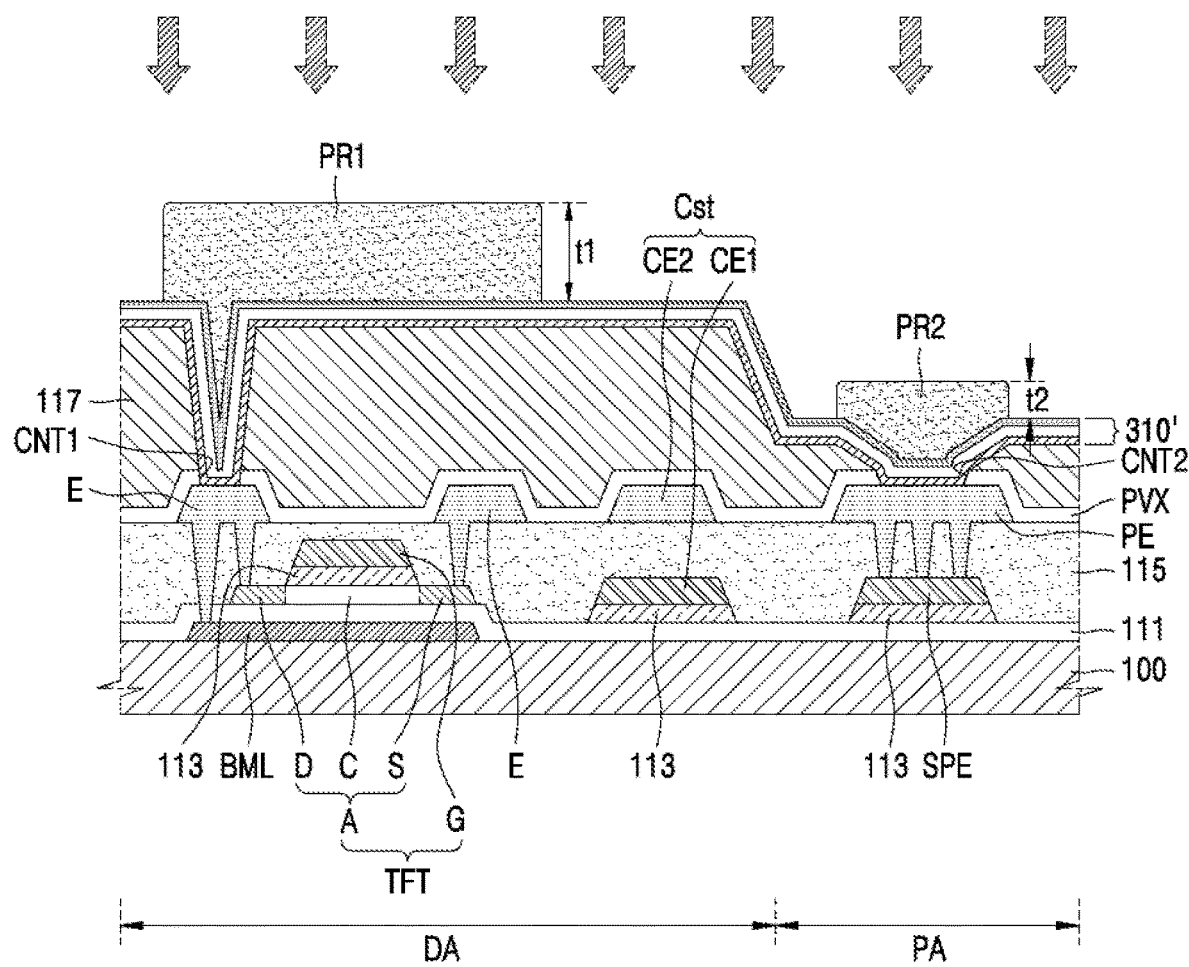

The photoresist layer PR' may be exposed at different amounts of light exposure according to areas through the second mask M2, and a part of the photoresist layer PR' may be removed by using a developing process. Because the amount of the photoresist layer PR' that is removed varies according to the amount of light exposure, a first photoresist pattern PR1 and a second photoresist pattern PR2 having different thicknesses according to areas may be formed at the same time. As shown in FIG. 8C, a thickness t1 of the first photoresist pattern PR1 which is disposed on the display area DA may be greater than a thickness t2 of the second photoresist pattern PR2 which is disposed on the peripheral area PA.

Although the photoresist layer PR' includes the positive photoresist in FIG. 8B, the photoresist layer PR' may include a negative photoresist. Unlike in a case where the photoresist layer PR' includes the positive photoresist, a thickness of the photoresist layer PR' remaining after the developing process increases as the amount of light exposure of the photoresist layer PR' increases.

Figure 8D:
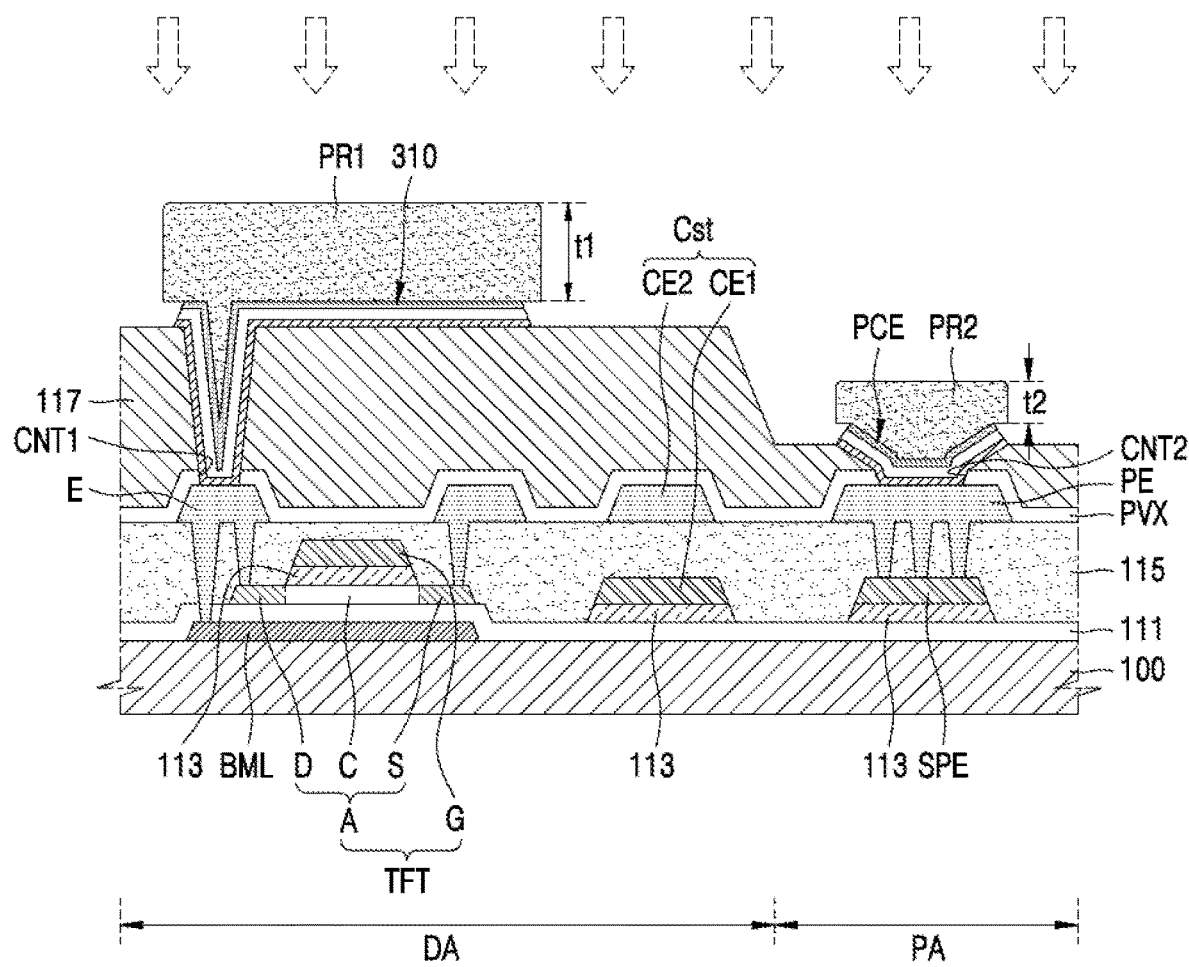

Referring to FIGS. 8C and 8D, the pixel electrode 310 and the pad connection electrode PCE are formed on the planarization layer 117. The pixel electrode 310 and the pad connection electrode PCE may be formed by patterning the pre-pixel electrode layer 310'. The pre-pixel electrode layer 310' is deposited on an entire top surface of the planarization layer 117, and the first photoresist pattern PR1 and the second photoresist pattern PR2 are formed on the pre-pixel electrode layer 310'. The first photoresist pattern PR1 is disposed on the display area DA, and the second photoresist pattern PR2 is disposed on the peripheral area PA.

Next, the pixel electrode 310 and the pad connection electrode PCE are formed by etching the pre-pixel electrode layer 310' by using the first photoresist pattern PR1 and the second photoresist pattern PR2. The pixel electrode 310 and the pad connection electrode PCE may be formed by depositing the pre-pixel electrode layer 310' and performing a mask process and an etching process. For example, the etching process may be a wet etching process.

After the pixel electrode 310 and the pad connection electrode PCE are formed, the first photoresist pattern PR1 and the second photoresist pattern PR2 are not removed and an etching process for removing the planarization layer 117 which is disposed on the peripheral area PA is performed by using the first photoresist pattern PR1 and the second photoresist pattern PR2. For example, the etching process may be a dry etching process.

Figure 8E:
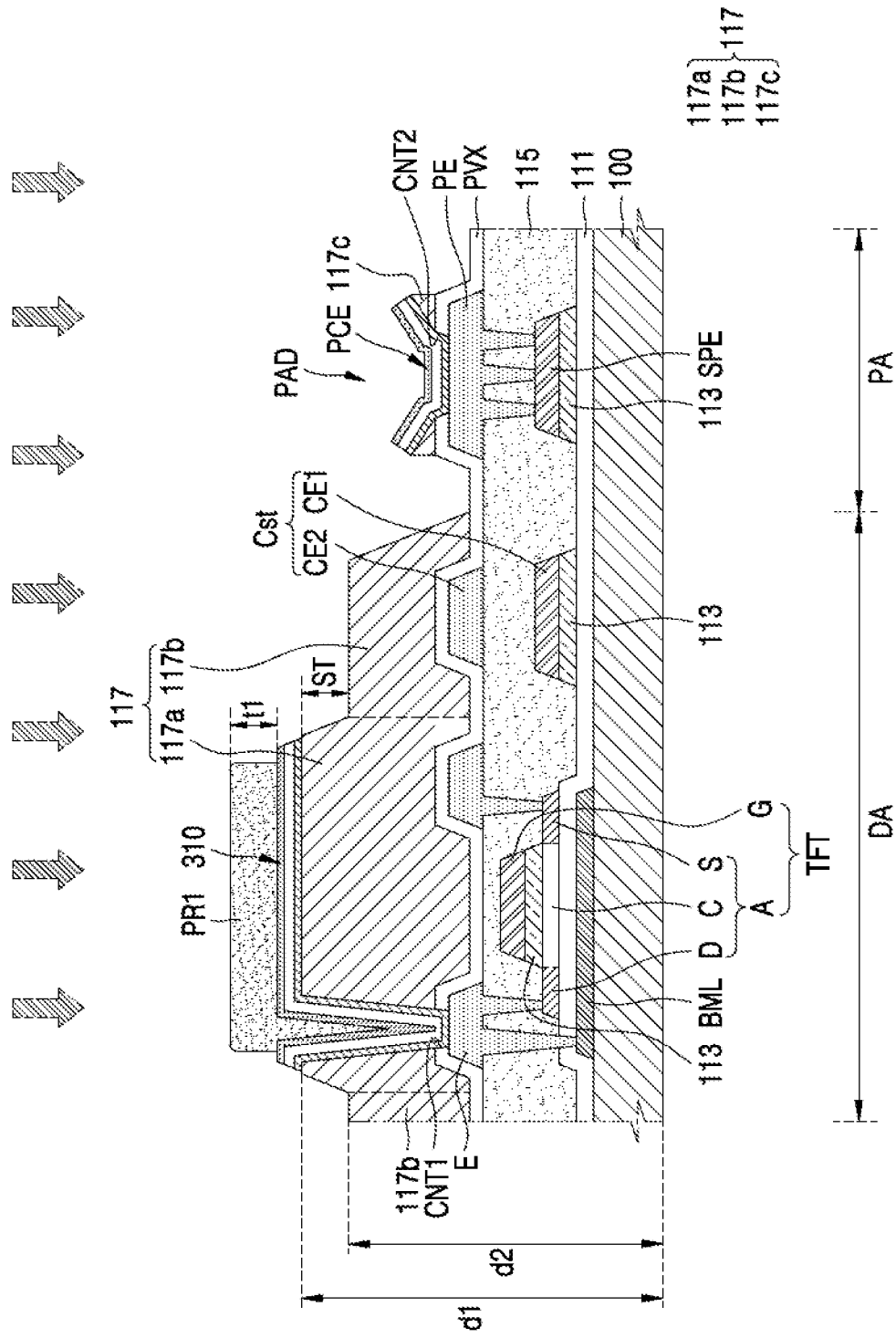

Referring to FIG. 8E, the first portion 117a of the planarization layer 117 may correspond to a portion protected by the first photoresist pattern PR1 during the etching process, and the second portion 117b of the planarization layer 117 may correspond to a portion not protected by the first photoresist pattern PR1 or the second photoresist pattern PR2 during the etching process. A top surface of the planarization layer 117 may have the stepped portion ST between the first portion 117a and the second portion 117b due to the first photoresist pattern PR1. A vertical distance d1 between the substrate 100 and a top surface of the first portion 117a may be greater than a vertical distance d2 between the substrate 100 and a top surface of the second portion 117b. A part of the first photoresist pattern PR1 may be etched during the etching process, and thus the thickness t1 of the first photoresist pattern PR1 may also be reduced.

A portion of a third portion 117c of the planarization layer 117 which is disposed on the peripheral area PA which is not protected by the second photoresist pattern PR2 is removed. In contrast, a portion of the third portion 117c of the planarization layer 117 which is disposed on the peripheral area PA, and which is protected by the second photoresist pattern PR2, remains. As shown in FIG. 8E, the second photoresist pattern PR2 may be entirely etched and removed during the etching process. Etching of a part of the third portion 117c of the planarization layer 117 and removing of the second photoresist pattern PR2 may be simultaneously performed.

As a comparative example, an etching process for removing a planarization layer which is disposed a peripheral area may be performed before a pixel electrode is formed. When a foreign material exists on a surface of the planarization layer, a stepped portion may be formed between a portion on which the foreign material exists and a portion on which the foreign material does not exist during the etching process. When a light-emitting device is located on the surface of the planarization layer having the stepped portion, a short may occur between the pixel electrode and a counter electrode, thereby resulting in dark spots on a display panel. Because the surface of the planarization layer is not protected during the etching process, a surface roughness of the planarization layer may be increased. When the pixel electrode is located on the surface of the planarization layer having the increased surface roughness, a reflectance of external light may be reduced, and luminous efficiency may be reduced.

However, according to an embodiment, after the pixel electrode 310 is formed, the first photoresist pattern PR1 and the second photoresist pattern PR2 are not removed, and an etching process for removing the planarization layer 117 which is disposed on the peripheral area PA may be performed. A surface of the planarization layer 117 on which the pixel electrode 310 is located may be protected by the first photoresist pattern PR1. Accordingly, a stepped portion due to a foreign material is not formed on the surface of the planarization layer 117, and a surface roughness of the planarization layer 117 is not increased. Dark spots are not formed on a display panel, a reflectance of external light is not reduced, and luminous efficiency is not reduced. Because there is no planarization layer 117 remaining in the peripheral area PA due to the etching process, an external moisture penetration path is blocked, thereby reducing the risk of a reliability problem such as degradation of the light-emitting device.

Next, an etching process may be performed in a state where the first photoresist pattern PR1 is not removed. For example, the etching process may be a wet etching process.

Figure 8F:
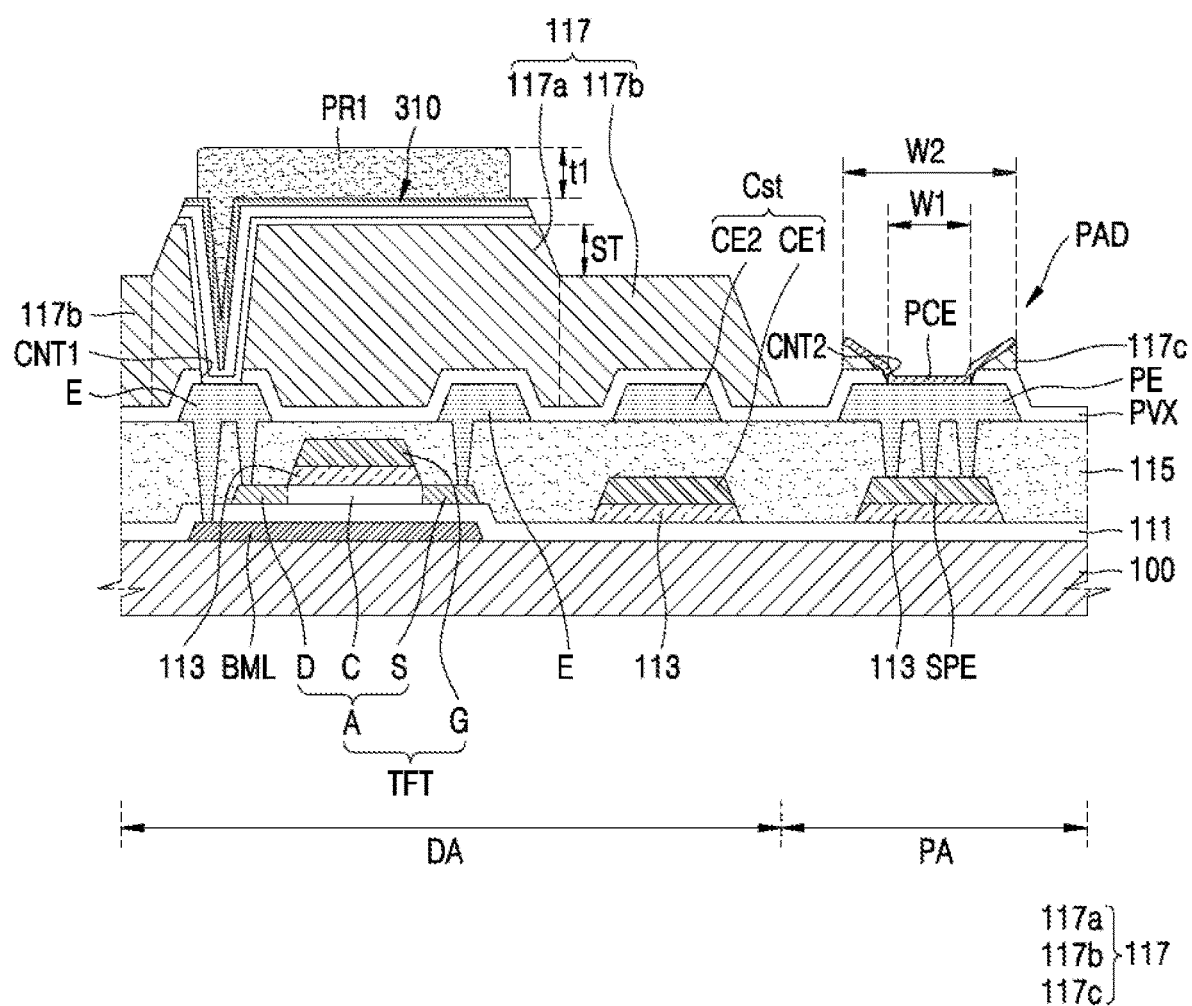

Referring to FIG. 8F, from among three films of the pad connection electrode PCE, two films other than a film adjacent to the pad electrode PE may be removed through an etching process. The pad connection electrode PCE may be formed of a single film.

As a comparative example, a pad connection electrode may be maintained as three films. When the pad connection electrode includes three films, the pad connection electrode PCE may be formed of ITO/Ag/ITO. The pad connection electrode PCE may be exposed without being covered by an insulating layer. The silver of the pad connection electrode PCE having a high reaction rate may be exposed and there is a risk of forming an electrical short circuit with a neighboring electrode.

However, according to an embodiment, when two of three films of the pad connection electrode PCE are removed, only ITO exists in the exposed pad connection electrode PCE and the risk of a short with a neighboring electrode is prevented.

In an embodiment, as shown in FIG. 8F, a width W2 of the pad connection electrode PCE in one direction may be greater than a width W1 of the pad electrode PE exposed through the second contact hole CNT2. As described with reference to FIG. 6A, a contact area between the pad unit PAD and the terminal portion PCB-P increases. Accordingly, poor contact between the pad unit PAD and the terminal portion PCB-P may be reduced, and the risk of defects during operation of the display apparatus 1 may be reduced.

Figure 8G:
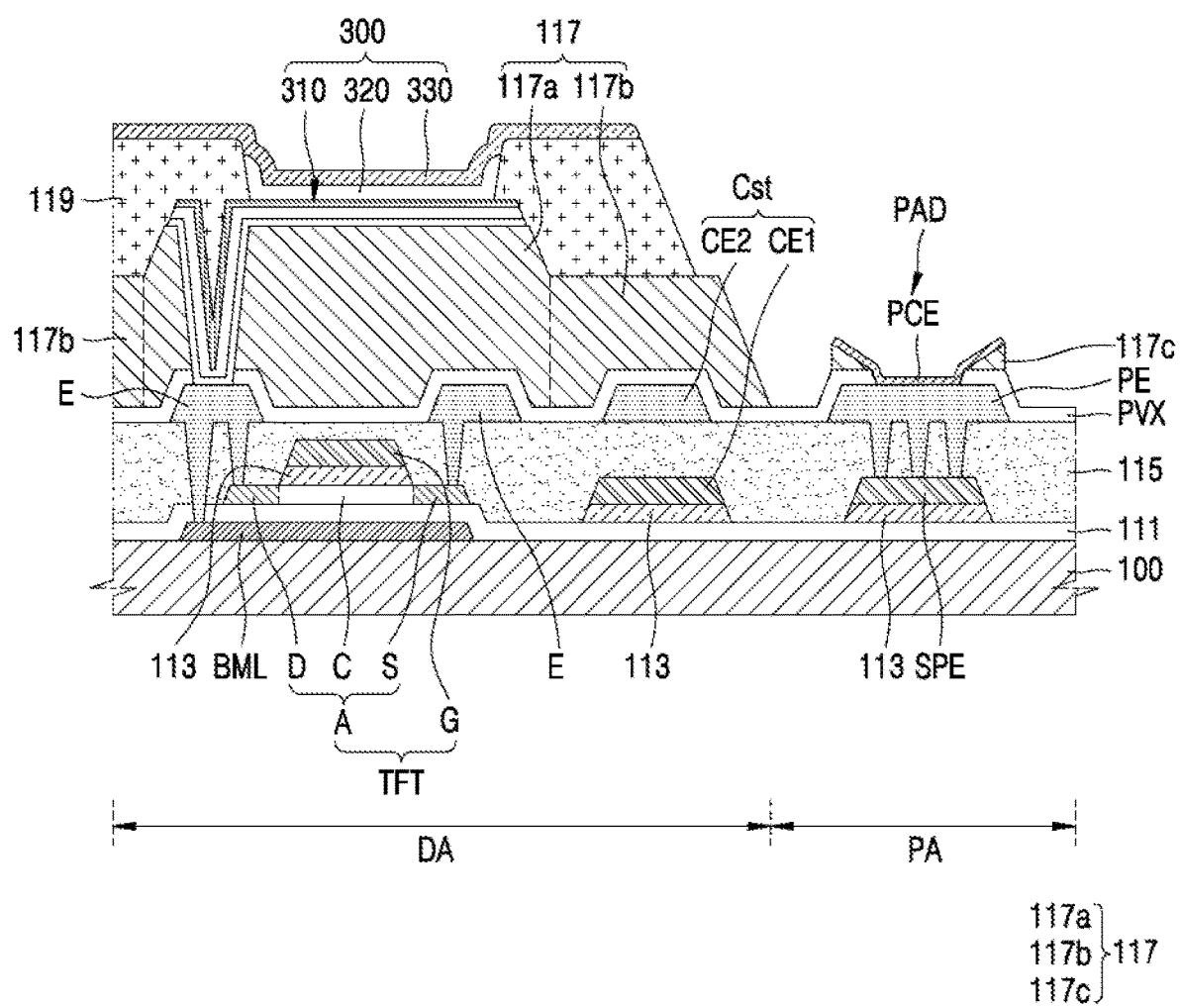

Referring to FIG. 8G, after the first photoresist pattern PR1 is removed, the pixel-defining film 119 covering an edge of the pixel electrode 310 and having an opening through which a central portion of the pixel electrode 310 is exposed is formed on an entire top surface of the planarization layer 117. The pixel-defining film 119 may be formed of at least one organic insulating material selected from the group consisting of polyimide, polyamide, an acrylic resin, benzocyclobutene, and a phenolic resin by using spin coating or the like.

The intermediate layer 320 is formed on the pixel electrode 310, that is, in the opening of the pixel-defining film 119. The intermediate layer 320 may include a low-molecular-weight material or a high-molecular-weight material. The intermediate layer 320 may be formed by using vacuum deposition, screen printing, inkjet printing, or laser-induced thermal imaging (LITI).

The intermediate layer 320 of the light-emitting device 300 may include an organic emission layer. The organic emission layer may include an organic material including a fluorescent or phosphorescent material emitting red light, green light, blue light, or white light. The organic emission layer may be formed of a low-molecular-weight organic material or a high-molecular-weight organic material. A functional layer such as a hole transport layer (HTL), a hole injection layer (HIL), an electron transport layer (ETL), or an electron injection layer (EIL) may be selectively further located under or over the organic emission layer. The intermediate layer 320 may be disposed on each of a plurality of pixel electrodes 310. However, the present disclosure is not limited thereto. Various modifications may be made. For example, the intermediate layer 320 may include an integrated layer over the plurality of pixel electrodes 310.

Next, the counter electrode 330 may be formed to correspond to the plurality of light-emitting devices 300. The counter electrode 330 may be formed to cover the display area DA of the substrate 100 through an open mask. The counter electrode 330 may be formed by using a deposition method such as CVD, PECVD, LPCVD, PVD, sputtering, or ALD.

Figure 9:
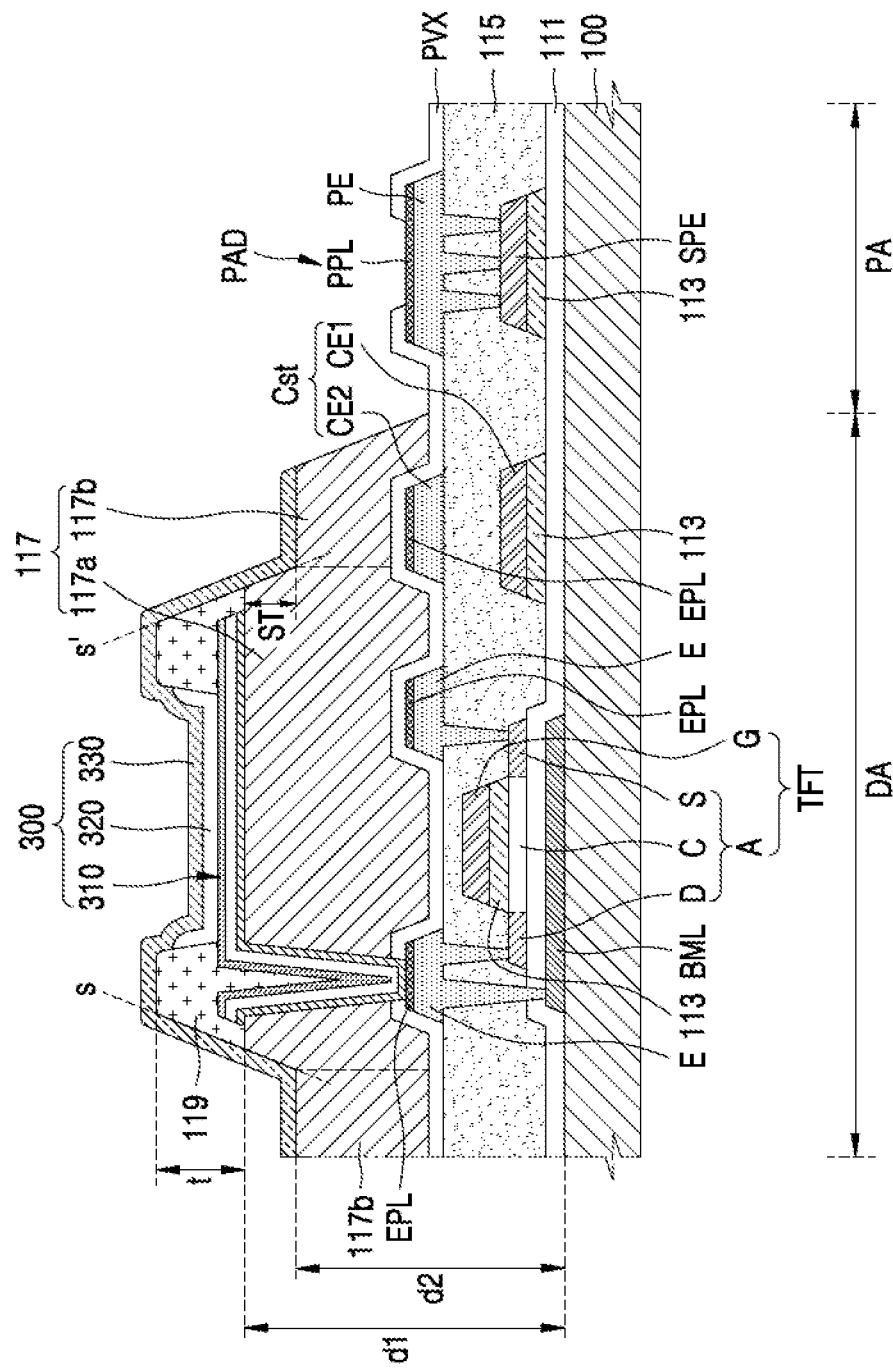
FIG. 9 is a cross-sectional view of a display apparatus according to an embodiment of the present inventive concept.

FIG. 9 is a cross-sectional view of a display apparatus according to an embodiment.

Referring to FIG. 9, the display apparatus 1 (see FIG. 1) includes the thin-film transistor TFT which is located on the display area DA the substrate 100, and the pad unit PAD which is located on the peripheral area PA of the substrate 100. The display apparatus 1 includes the planarization layer 117 as an insulating layer located on the thin-film transistor TFT and exposing the pad unit PAD, and the planarization layer 117 includes the first portion 117a, the second portion 117b, and a third portion between the first portion 117a and the second portion 117b. A top surface of the planarization layer 117 may have the stepped portion ST between the first portion 117a and the second portion 117b. For example, the top surface of the planarization layer 117 includes a first top surface of the first portion 117a, a second top surface of the second portion 117b, and a connecting surface of the third portion. The connecting surface of the third portion may connect the first top surface of the first portion 117a and the second top surface of the second portion 117b. The first top surface of the first portion of may be higher than the second top surface of the second portion, and the connecting surface is sloped.

The pixel-defining film 119 may be located on the planarization layer 117. A side surface of the planarization layer 117 and a side surface of the pixel-defining film 119 may be etched surfaces on the same plane (i.e., may be coplanar with each other). A side surface of the first portion 117a of the planarization layer 117 and a side surface of the pixel-defining film 119 may be etched surfaces on the same plane.

Elements included in the display apparatus 1 will be described according to a stacked structure with reference to FIG. 9.

The substrate 100 may include a glass material, a ceramic material, a metal material, or a flexible or bendable material. The substrate 100 may have a single or multi-layer structure, and when the substrate 100 has a multi-layer structure, the substrate 100 may further include an inorganic layer. In some embodiments, the substrate 100 may have a structure including an organic material, an inorganic material, and an organic material.

The buffer layer 111 may reduce or block penetration of a foreign material, moisture, or external air from the bottom of the substrate 100 and may planarize the substrate 100.

A barrier layer (not shown) may be further provided between the substrate 100 and the buffer layer 111. The barrier layer may prevent or minimize impurities from the substrate 100, etc. from penetrating into the semiconductor layer A.

The semiconductor layer A may be located on the buffer layer 111. The semiconductor layer A may include an oxide semiconductor material. The semiconductor layer A may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer A may be an InSnZnO (ITZO) semiconductor layer or an InGaZnO (IGZO) semiconductor layer. Because an oxide semiconductor has a wide band gap (of about 3.1 eV), a high carrier mobility, and low leakage current, a voltage drop is not large even when a driving time is long. Accordingly, a luminance change due to a voltage drop is not large even during low-frequency operation.

The semiconductor layer A may include the channel region C, and the source region S and the drain region D respectively located on opposite sides of the channel region C. The semiconductor layer A may have a single or multi-layer structure.

The conductive layer BML may be located between the substrate 100 and the buffer layer 111. The conductive layer BML may overlap the channel region C of the semiconductor layer A.

The conductive layer BML may overlap the semiconductor layer A including an oxide semiconductor material. Because the semiconductor layer A including the oxide semiconductor material is vulnerable to light, the conductive layer BML may prevent device characteristics of the thin-film transistor TFT including an oxide semiconductor material from being changed due to photocurrent occurring on the semiconductor layer A due to external light incident on the substrate 100. The conductive layer BML may be connected to the drain region D. Although the conductive layer BML is connected to the drain region D in FIG. 9, the conductive layer BML may be connected to the source region S.

The gate insulating layer 113 may be located on the semiconductor layer A. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

As shown in FIG. 9, the gate insulating layer 113 may be patterned to overlap a part of the semiconductor layer A. The gate insulating layer 113 may be patterned to expose the source region S and the drain region D.

A portion of the semiconductor layer A overlapping the gate insulating layer 113 may be the channel region C. The source region S and the drain region D may be subjected to a conductivity increasing process such as plasma treatment, and a portion of the semiconductor layer A overlapping the gate insulating layer 113 (i.e., the channel region C) is not exposed to the plasma treatment and thus has properties different from those of the source region S and the drain region D. Using the gate electrode G located on the gate insulating layer 113 as a self-alignment mask during the plasma treatment of the semiconductor layer A, the channel region C that is not subjected to the plasma treatment may be formed at a position overlapping the gate insulating layer 113, and the source region S and the drain region D that are subjected to the plasma treatment may be respectively formed on opposite sides of the channel region C.

In another embodiment, the gate insulating layer 113 is not patterned to overlap a part of the semiconductor layer A, and may be located on an entire surface of the substrate 100 to cover the semiconductor layer A.

The gate electrode G may be located on the gate insulating layer 113 to at least partially overlap the semiconductor layer A. The first electrode CE1 of the storage capacitor Cst and the auxiliary pad electrode SPE may be located on the gate insulating layer 113.

In an embodiment, the storage capacitor Cst may include the first electrode CE1 and the second electrode CE2, and does not overlap the thin-film transistor TFT and may be separately located as shown in FIG. 9. Alternatively, the storage capacitor Cst may overlap the thin-film transistor TFT. For example, the gate electrode G of the thin-film transistor TFT may function as the first electrode CE1 of the storage capacitor Cst.

The interlayer insulating layer 115 may cover the semiconductor layer A, the gate electrode G, the first electrode CE1 of the storage capacitor Cst, and the auxiliary pad electrode SPE.

A source electrode, a drain electrode, a data line (not shown), the second electrode CE2 of the storage capacitor Cst, and the pad electrode PE may be located on the interlayer insulating layer 115.

Each of the source electrode and the drain electrode may be connected to the source region S or the drain region D of the semiconductor layer A through a contact hole. The conductive layer BML and the source region S or the drain region D of the semiconductor layer A may be connected through a contact hole formed in the buffer layer 111 and the interlayer insulating layer 115.

The second electrode CE2 and the first electrode CE1 of the storage capacitor Cst overlap each other with the interlayer insulating layer 115 therebetween to form a capacitance. The interlayer insulating layer 115 may function as a dielectric layer of the storage capacitor Cst.

The pad electrode PE may be connected to the auxiliary pad electrode SPE through a contact hole formed in the interlayer insulating layer 115. Although three contact holes are used to connect the pad electrode PE to the auxiliary pad electrode SPE in FIG. 9, more or fewer contact holes may be used. Although the auxiliary pad electrode SPE is illustrated in FIG. 9, the auxiliary pad electrode SPE may be omitted.

The electrode protective layer EPL may be located on the source electrode, the drain electrode, and the second electrode CE2 of the storage capacitor Cst, and the pad protective layer PPL may be located on the pad electrode PE.

Each of the source electrode, the drain electrode, and the second electrode CE2 of the storage capacitor Cst, and the pad electrode PE may be patterned along with the electrode protective layer EPL and the pad protective layer PPL. Accordingly, because a separate mask for patterning the electrode protective layer EPL and the pad protective layer PPL is not required, the number of masks may be reduced.

The source electrode, the drain electrode, and the second electrode CE2 of the storage capacitor Cst, and the pad electrode PE may be covered by the inorganic protective layer PVX.

The planarization layer 117 is located to cover the source electrode, the drain electrode, the data line, and the second electrode CE2 of the storage capacitor Cst, and the planarization layer 117 has a contact hole for connecting the thin-film transistor TFT to the pixel electrode 310.

The planarization layer 117 may have or may be formed of a single or multi-layer structure including an organic material, to provide a flat top surface.

The planarization layer 117 may include the first portion 117a located on the thin-film transistor TFT and the second portion 117b extending from the first portion 117a to a side. A top surface of the planarization layer 117 may have the stepped portion ST between the first portion 117a and the second portion 117b. For example, the top surface of the planarization layer 117 includes a first top surface of the first portion 117a, a second top surface of the second portion 117b, and a connecting surface of the third portion. The connecting surface of the third portion may connect the first top surface of the first portion 117a and the second top surface of the second portion 117b. The first top surface of the first portion 117a of may be higher than the second top surface of the second portion 117b, and the connecting surface is sloped. A vertical distance d1 between a top surface of the substrate 100 and a top surface of the first portion 117a may be different from a vertical distance d2 between the top surface of the substrate 100 and a top surface of the second portion 117b. For example, as shown in FIG. 9, the vertical distance d1 between the top surface of the substrate 100 and the top surface of the first portion 117a may be greater than the vertical distance d2 between the top surface of the substrate 100 and the top surface of the second portion 117b.

The planarization layer 117 may expose the pad unit PAD. For example, the planarization layer 117 is not disposed on the peripheral area PA, and does not overlap the pad unit PAD.

As a comparative example, a planarization layer may remain on an outer portion of a display panel. The planarization layer remaining on the outer portion of the display panel may act as an external moisture penetration path, thereby causing a reliability problem such as degradation of a light-emitting device.

The light-emitting device 300 is located on the planarization layer 117. The light-emitting device 300 includes the pixel electrode 310, the intermediate layer 320 including an organic emission layer, and the counter electrode 330.

In an embodiment, the pixel electrode 310 may overlap only the first portion 117a of the planarization layer 117. As described above, the top surface of the planarization layer 117 may have the stepped portion ST between the first portion 117a and the second portion 117b extending from the first portion 117a. As shown in FIG. 9, the stepped portion ST may be formed not only between the first portion 117a and the second portion 117b extending to the peripheral area PA but also between the first portion 117a and the second portion 117b extending to the display area DA. The first portion 117a may correspond to a portion of the planarization layer 117 having a relatively large vertical distance between the substrate 100 and the top surface of the planarization layer 117, and the pixel electrode 310 may be located on the first portion 117a.

The pixel-defining film 119 may be located on the planarization layer 117. The pixel-defining film 119 may cover an edge of the pixel electrode 310 and may have an opening through which a part of the pixel electrode 310 is exposed. The pixel-defining film 119 may increase a distance between the edge of the pixel electrode 310 and the counter electrode 330 over the pixel electrode 310 to prevent an arc or the like from occurring on the edge of the pixel electrode 310.

In an embodiment, as shown in FIG. 9, the planarization layer 117 and the pixel-defining film 119 may have the same etched surfaces s and s'. As described below with reference to FIG. 12G, the planarization layer 117 and the pixel-defining film 119 may be simultaneously formed by using the same etching process, and may include the etched surfaces s and s' which may be coplanar with each other. A part of the planarization layer 117 may be etched by using the pixel-defining film 119 as a mask, and an outer surface of the pixel-defining film 119 and a side surface of the planarization layer 117 may be located on the etched surfaces s and s' which may be coplanar with each other. An outer surface of the pixel-defining film 119 and a side surface of the first portion 117a of the planarization layer 117 may be located on the etched surfaces s and s' which may be coplanar with each other.

The outer surface of the pixel-defining film 119 and the side surface of the planarization layer 117 may be located on the same plane. The outer surface of the pixel-defining film 119 and the side surface of the first portion 117a of the planarization layer 117 may be located on the same plane. The outer surface of the pixel-defining film 119 and the side surface of the planarization layer 117 may be formed without a stepped portion. The outer surface of the pixel-defining film 119 and the side surface of the planarization layer 117 may be formed without a boundary.

The pixel-defining film 119 may overlap the first portion 117a of the planarization layer 117. In a plane view, a boundary of the pixel-defining film 119 may correspond to a boundary of the first portion 117a of the planarization layer 117.

When the pixel-defining film 119 and the first portion 117a of the planarization layer 117 have the etched surfaces s and s' which may be coplanar with each other, the pixel-defining film 119 may be disposed on the first portion 117a. The pixel-defining film 119 may be disposed on the first portion 117a, and is not located on the second portion 117b. A portion of the pixel-defining film 119 corresponding to the second portion 117b may be removed. An insulating layer formed of an organic material may be removed by an amount corresponding to a value (t+(d1−d2)) obtained by adding a thickness t of the pixel-defining film 119 to the stepped portion ST of the planarization layer 117. Because the planarization layer 117 and the pixel-defining film 119 adjacent to the light-emitting device 300 are partially removed, a volume of an organic material in the display apparatus 1 may be reduced and thus outgassing of the organic material may be minimized. Accordingly, even when the display apparatus 1 is exposed to sunlight for a long time, decomposition of the organic material due to the sunlight may be prevented or minimized, thereby preventing defects such as pixel shrinkage due to outgassing. The reliability of the display apparatus 1 may be improved.

The intermediate layer 320 may be located in an opening formed by the pixel-defining film 119, and may include an organic emission layer. The organic emission layer may include an organic material including a fluorescent or phosphorescent material emitting red light, green light, blue light, or white light. The organic emission layer may be formed of a low-molecular-weight organic material or a high-molecular-weight organic material. A functional layer such as a hole transport layer (HTL), a hole injection layer (HIL), an electron transport layer (ETL), or an electron injection layer (EIL) may be selectively further located under or over the organic emission layer.

The counter electrode 330 may be a light-transmitting electrode or a reflective electrode. In some embodiments, the counter electrode 330 may be a transparent or semi-transparent electrode, and may include a metal thin film having a low work function including Li, Ca, LiF/Ca, LiF/Al, Al, Ag, Mg, or a compound thereof. A transparent conductive oxide (TCO) film including ITO, IZO, ZnO, or $In_2O_3$ may be further located on the metal thin film. The counter electrode 330 may be located over the display area DA, and may be located on the intermediate layer 320 and the pixel-defining film 119. The counter electrode 330 may be integrally formed with a plurality of light-emitting devices 300 to correspond to a plurality of pixel electrodes 310.

Because an organic light-emitting device may be easily damaged by external moisture or oxygen, the thin-film encapsulation layer 400 may cover and protect the organic light-emitting device as described below with reference to FIG. 18. The thin-film encapsulation layer 400 may include a first inorganic encapsulation layer 410, an organic encapsulation layer 420, and a second inorganic encapsulation layer 430. As described above, an insulating layer formed of an organic material may be removed from a portion corresponding to the second portion 117b of the planarization layer 117. The organic encapsulation layer 420 may be further located as much as the insulating layer is removed. Because a thickness of the organic encapsulation layer 420 may be increased by an amount by which the insulating layer is removed, it is difficult for a foreign material introduced from the outside to reach the counter electrode 330. When the foreign material introduced from the outside reaches the counter electrode 330, degradation of the light-emitting device 300 may occur. However, degradation of the light-emitting device 300 may be prevented due to the organic encapsulation layer 420 having the increased thickness. A problem that the thin-film encapsulation layer 400 is damaged by the foreign material introduced from the outside and the light-emitting device 300 is degraded due to damage to the thin-film encapsulation layer 400 may be prevented.

Figure 10:
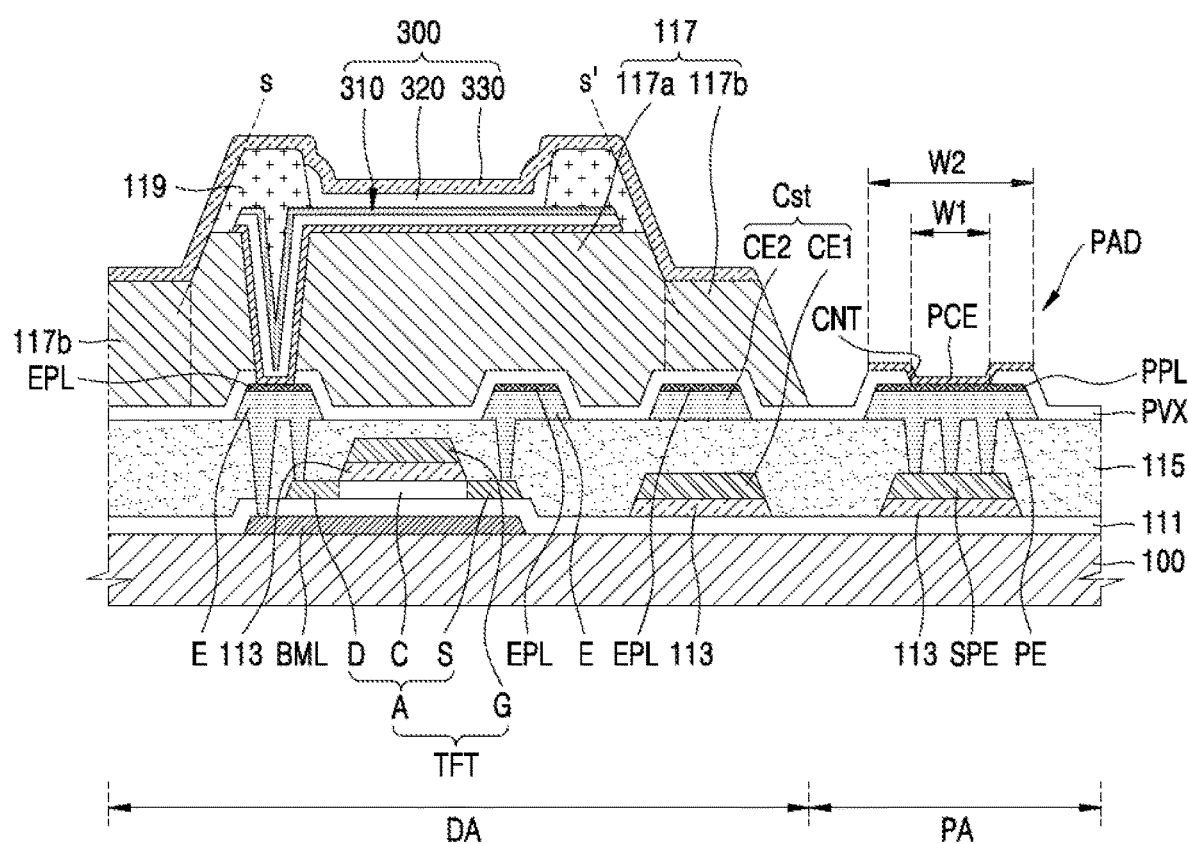
FIG. 10 is a cross-sectional view of a display apparatus according to an embodiment of the present inventive concept.
Figure 11:
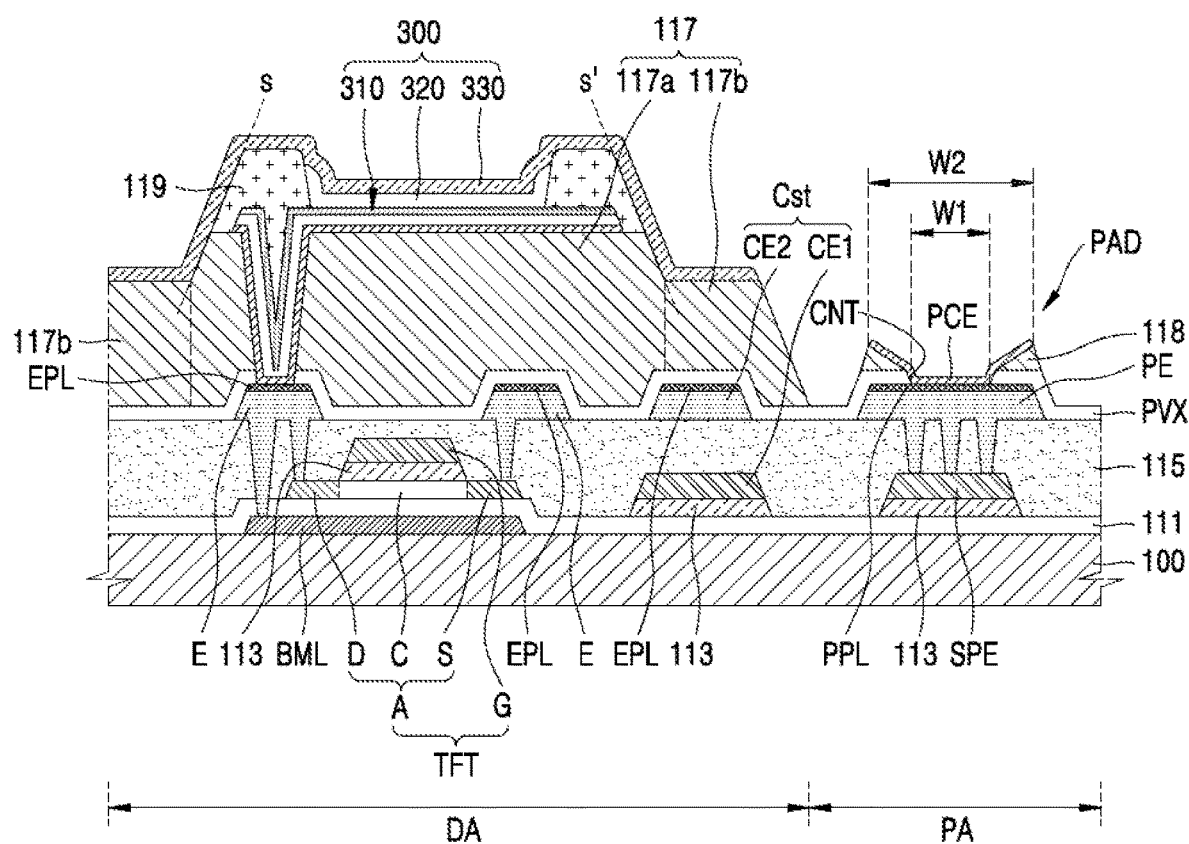
FIG. 11 is a cross-sectional view of a display apparatus according to an embodiment of the present inventive concept.

FIGS. 10 and 11 are cross-sectional views of a display apparatus according to an embodiment. In FIGS. 10 and 11, the same elements as those in FIG. 9 are denoted by the same reference numerals, and thus a repeated description thereof will be omitted.

Referring to FIG. 10, the display apparatus 1 includes the thin-film transistor TFT and the storage capacitor Cst which is located on the display area DA of the substrate 100, and the pad unit PAD which is located on the peripheral area PA of the substrate 100.

Unlike in FIG. 9, as shown in FIG. 10, the pad connection electrode PCE may be located on the pad electrode PE. The pad connection electrode PCE may include or may be formed of at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The pad connection electrode PCE may include or may be formed of the same material as that of at least a part of the pixel electrode 310. In an embodiment, the pixel electrode 310 may include three films, and the pad connection electrode PCE may be formed of a single film. For example, the three films of the pixel electrode 310 may be formed of ITO/Ag/ITO, and the single film of the pad connection electrode PCE may be formed of ITO.

The pad connection electrode PCE may at least partially contact the pad electrode PE. Although the pad connection electrode PCE and the pad electrode PE are electrically connected through the pad protective layer PPL in FIG. 10, the pad protective layer PPL may be omitted and the pad connection electrode PCE and the pad electrode PE may contact each other. The contact hole CNT through which at least a part of the pad electrode PE is exposed may be formed in the inorganic protective layer PVX, and a part of the pad connection electrode PCE may contact the pad electrode PE in the contact hole CNT. In an embodiment, as shown in FIG. 10, a width W2 of the pad connection electrode PCE in one direction may be greater than a width W1 of the pad electrode PE exposed through the contact hole CNT. In an embodiment, a width of a top surface of the pad protective layer PPL in one direction may be equal to or less than a width of the contact hole CNT of the inorganic protective layer PVX.

As described with reference to FIG. 1, a printed circuit board or a driver IC chip may be attached to the pad unit PAD. A contact width between the pad unit PAD and the printed circuit board or the driver IC chip increases from the width W1 of the pad electrode PE exposed through the contact hole CNT to the width W2 of the pad connection electrode PCE. A contact area between the pad unit PAD and the printed circuit board or the driver IC chip increases. Accordingly, poor contact between the pad unit PAD and the printed circuit board or the driver IC chip may be reduced, and the risk of defects during operation of the display apparatus 1 may be reduced.

In an embodiment, as shown in FIG. 10, a part of the pad connection electrode PCE may contact a top surface of the inorganic protective layer PVX. The part of the pad connection electrode PCE may contact the top surface of the inorganic protective layer PVX and may be formed in a shape corresponding to a shape of the top surface of the inorganic protective layer PVX.

In another embodiment, as shown in FIG. 11, the display apparatus 1 may further include the insulating layer 118 located on the inorganic protective layer PVX corresponding to the peripheral area PA and including or being formed of the same material as that of the planarization layer 117.

The insulating layer 118 may be located between the pad electrode PE and the pad connection electrode PCE, and may at least partially overlap the pad connection electrode PCE. A surface of the insulating layer 118 overlapping the pad connection electrode PCE may be inclined. A surface of the inorganic protective layer PVX and the surface of the insulating layer 118 parallel to the substrate 100 may have a certain angle therebetween. A surface of the pad connection electrode PCE overlapping the insulating layer 118 may be inclined along the insulating layer 118. In an embodiment, the pad connection electrode PCE may include a first part which contacts the pad electrode PE, and a second part which is spaced apart from the pad electrode PE. The insulating layer 118 may be disposed between a top surface of the pad electrode PE and a bottom surface of the second part of the pad connection electrode PCE. A top surface of insulating layer 118 may contact the bottom surface of the second part of the pad connection electrode PCE, and may be inclined along the bottom surface of the second part of the pad connection electrode PCE.

Although the electrode protective layer EPL and the pad protective layer PPL are illustrated in FIGS. 10 and 11, the electrode protective layer EPL and the pad protective layer PPL may be omitted.

Although a display apparatus has been mainly described, the present disclosure is not limited thereto. For example, a method of manufacturing the display apparatus may also fall within the scope of the present disclosure.

FIGS. 12A through 12H are cross-sectional views sequentially illustrating a method of manufacturing a display apparatus according to an embodiment. In detail, FIGS. 12A through 12H are cross-sectional views sequentially illustrating a method of manufacturing a display apparatus according to an embodiment based on FIG. 9. In FIGS. 12A through 12H, the same elements as those in FIG. 9 are denoted by the same reference numerals, and thus a repeated description thereof will be omitted.

Figure 12A:
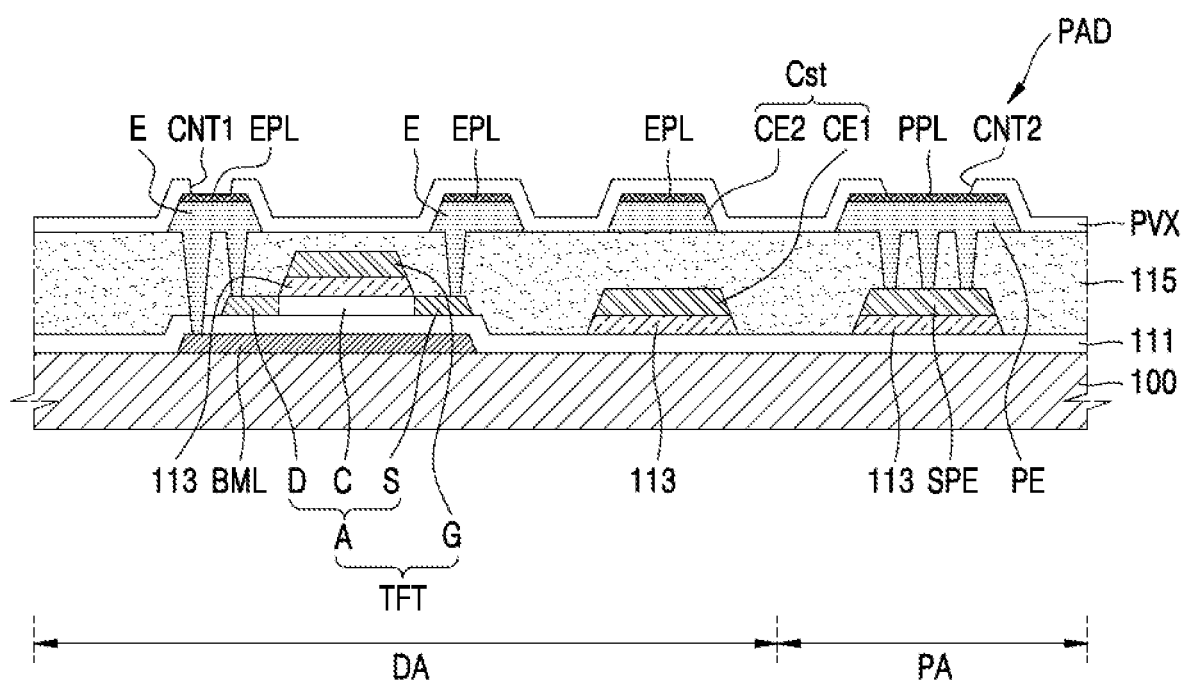
FIGS. 12A through 12H are cross-sectional views sequentially illustrating a method of manufacturing a display apparatus according to an embodiment of the present inventive concept.

Referring to FIG. 12A, first, the conductive layer BML, the buffer layer 111, the semiconductor layer A, the gate insulating layer 113, the gate electrode G, the first and second electrodes CE1 and CE2 of the storage capacitor Cst, the auxiliary pad electrode SPE, the interlayer insulating layer 115, the electrode layer E, the pad electrode PE, the electrode protective layer EPL, the pad protective layer PPL, and the inorganic protective layer PVX are sequentially formed on the substrate 100.

The conductive layer BML may be formed by patterning a pre-conductive layer (not shown). The pre-conductive layer may include a conductive material including molybdenum (Mo), aluminum (Al), copper (Cu), or titanium (Ti), and may have a single or multi-layer structure including the above material.

The buffer layer 111 may include silicon oxide ($SiO_2$) or silicon nitride ($SiN_x$), and may be formed by using a deposition method such as chemical vapor deposition (CVD) or sputtering.

The semiconductor layer A may be located on the buffer layer 111. The semiconductor layer A may be formed by patterning a pre-semiconductor layer (not shown). The pre-semiconductor layer may include an oxide semiconductor, and may be deposited by using CVD.

The gate insulating layer 113 and the gate electrode G may be located on the semiconductor layer A, and the gate insulating layer 113, the first electrode CE1 of the storage capacitor Cst, and the auxiliary pad electrode SPE may be located on the buffer layer 111.

The gate insulating layer 113, the first electrode CE1 of the storage capacitor Cst, and the auxiliary pad electrode SPE may be formed by patterning a pre-gate insulating layer (not shown) and a pre-metal layer (not shown).

The pre-gate insulating layer may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by using a deposition method such as, but not limited to, CVD or sputtering.

The pre-metal layer may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, plasma-enhanced CVD (PECVD), low-pressure CVD (LPCVD), physical vapor deposition (PVD), sputtering, or atomic layer deposition (ALD).

Plasma treatment is performed when the pre-gate insulating layer is patterned, and a portion of the semiconductor layer A exposed without overlapping the gate electrode G is subjected to a conductivity increasing process during the plasma treatment. As a result, the source region S and the drain region D exposed during the plasma treatment become conductive, and the channel region C overlapping the gate electrode G has properties different from those of the source region S and the drain region D.

The interlayer insulating layer 115 is formed on the gate electrode G, the first electrode CE1 of the storage capacitor Cst, and the auxiliary pad electrode SPE. After the interlayer insulating layer 115 is formed, contact holes passing through the interlayer insulating layer 115 and exposing parts of the conductive layer BML, the semiconductor layer A, and the auxiliary pad electrode SPE are formed.

The electrode layer E, the second electrode CE2 of the storage capacitor Cst, and the pad electrode PE are formed on the interlayer insulating layer 115. The electrode protective layer EPL and the pad protective layer PPL are formed on the electrode layer E, the second electrode CE2 of the storage capacitor Cst, and the pad electrode PE. The electrode layer E, the second electrode CE2 of the storage capacitor Cst, the pad electrode PE, the electrode protective layer EPL, and the pad protective layer PPL may be formed by sequentially depositing a pre-electrode layer (not shown) and a pre-protective layer (not shown) on an entire top surface of the interlayer insulating layer 115 and performing a mask process and an etching process. The electrode layer E, the second electrode CE2 of the storage capacitor Cst, and the pad electrode PE may be patterned along with the electrode protective layer EPL and the pad protective layer PPL. Accordingly, because a separate mask for patterning the electrode protective layer EPL and the pad protective layer PPL is not required, the number of masks may be reduced.

The inorganic protective layer PVX is formed on the electrode layer E, the second electrode CE2 of the storage capacitor Cst, and the pad electrode PE. The inorganic protective layer PVX may be an inorganic insulating film formed of an inorganic material, and may be formed by using a deposition method such as, but not limited to, CVD, PECVD, LPCVD, PVD, sputtering, or ALD.

After the inorganic protective layer PVX is formed, the first contact hole CNT1 and the second contact hole CNT2 through which the electrode protective layer EPL and the pad protective layer PPL are respectively partially exposed may be formed through a separate mask.

Figure 12B:
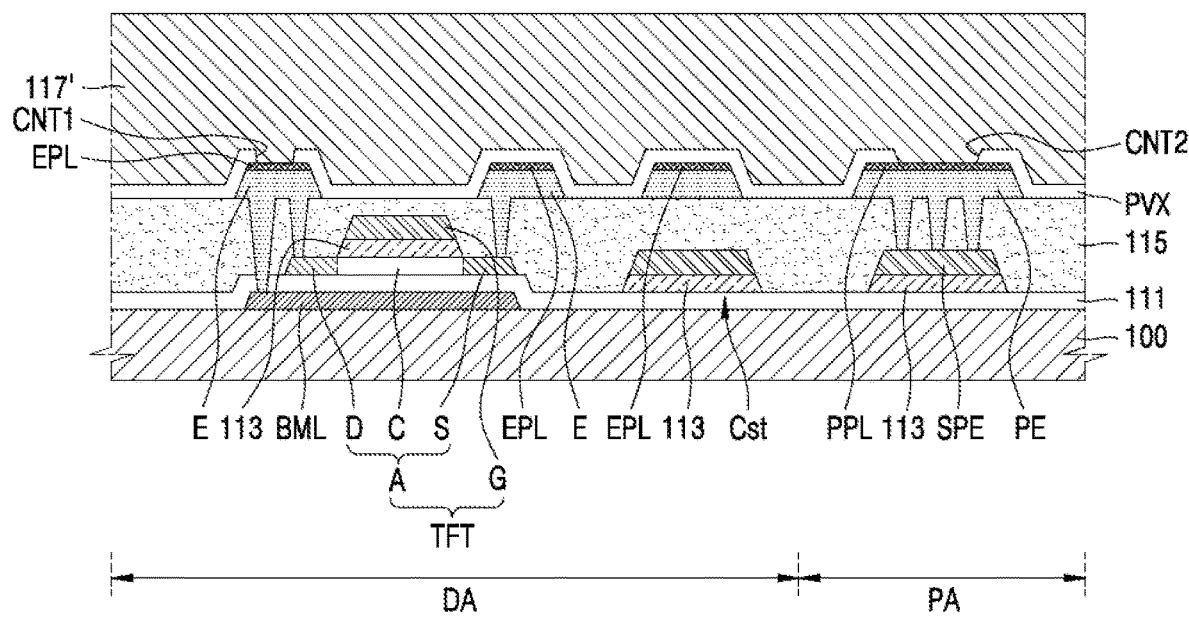

Referring to FIG. 12B, the planarization material layer 117' is located on the inorganic protective layer PVX. The planarization material layer 117' may include a positive photoresist, and may be formed by applying a positive photoresist solution (not shown) to the inorganic protective layer PVX by using any of various methods such as spin coating, spraying, or dipping. Before the planarization material layer 117' is applied to a top surface of the inorganic protective layer PVX, a process of polishing the top surface of the inorganic protective layer PVX to which the planarization material layer 117' is to be applied may be additionally performed.

The first mask M1 may be located over the planarization material layer 117'. The first area AR1 and the third area AR3 of the first mask M1 may be shielded so that the planarization material layer 117' is not exposed to light, and the second area AR2 and the fourth area AR4 of the first mask M1 are not shielded so that the planarization material layer 117' is exposed to light.

The planarization material layer 117' may be exposed in each area through the first mask M1, and the planarization layer 117 may be formed by removing a part of the planarization material layer 117' through a developing process. The planarization layer 117 may have a single or multi-layer structure including an organic material or an inorganic material. A degree of adhesion of the planarization layer 117 to the inorganic protective layer PVX may be increased through a curing and drying process. The curing and drying process may include a heat treatment process. After the planarization layer 117 is formed, chemical mechanical polishing may be performed to provide a flat top surface.

Although the planarization material layer 117' includes the positive photoresist in FIG. 12B, the planarization material layer 117' may include or may be formed of a negative photoresist. Unlike in a case where the planarization material layer 117' includes the positive photoresist, a portion of the planarization material layer 117' which is exposed to light remains after the developing process.

Figure 12C:
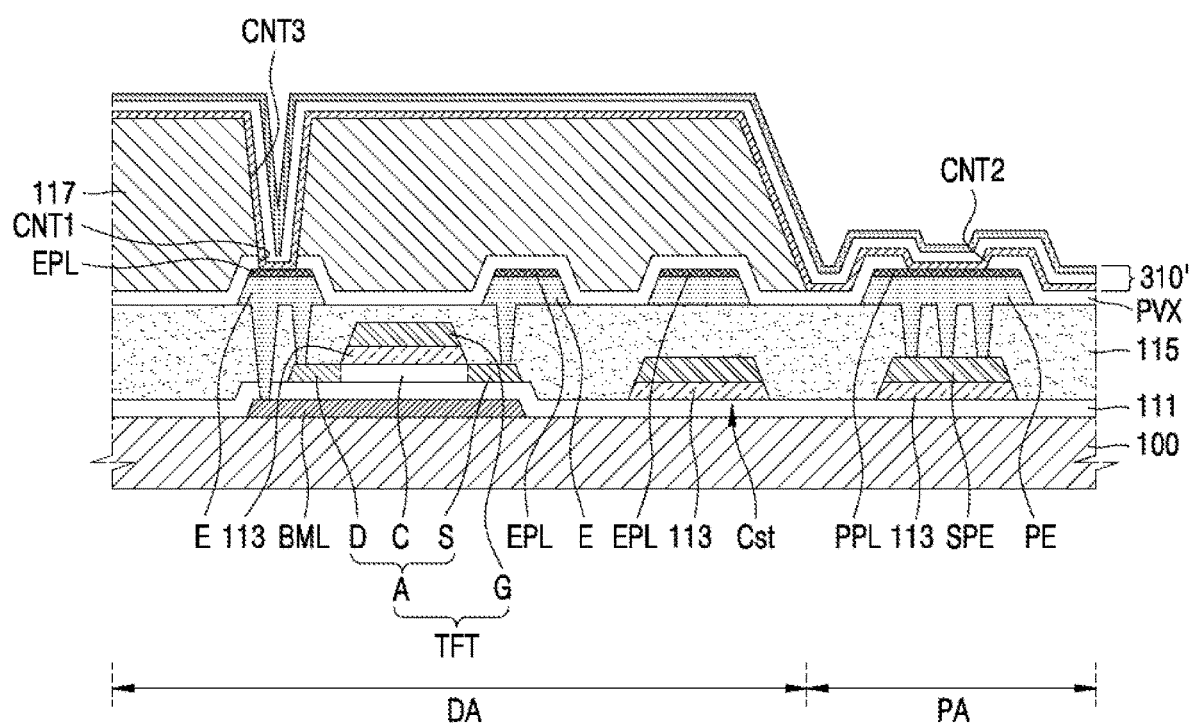

Referring to FIG. 12C, the planarization layer 117 may have the third contact hole CNT3 through which the electrode protective layer EPL is partially exposed to correspond to a portion exposed to light due to the second portion AR2 of the first mask M1. The planarization layer 117 may be formed so that the pad unit PAD is exposed to correspond to a portion exposed to light due to the fourth area AR4 of the first mask M1. After the planarization layer 117 is formed, the pixel electrode material layer 310' is formed on the planarization layer 117.

Figure 12D:
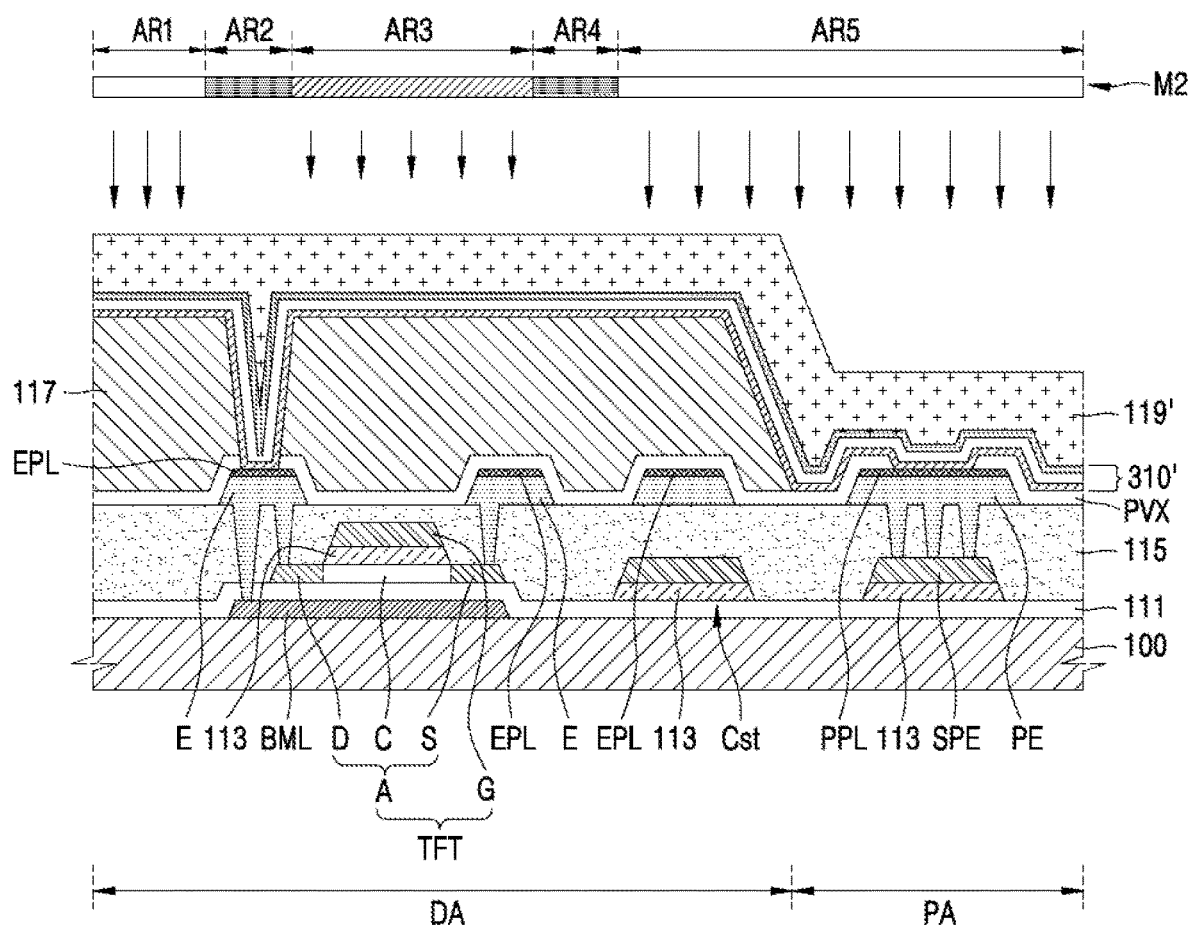

Referring to FIG. 12D, a pixel-defining film material layer 119' is formed on the pixel electrode material layer 310'. The pixel-defining film material layer 119' may include a positive photoresist, and may be formed by applying a positive photoresist solution (not shown) to the pixel electrode material layer 310' by using any of various methods such as spin coating, spraying, or dipping.

The second mask M2 may be located over the pixel-defining film material layer 119'. The second mask M2 may adjust the amount of light exposure of the pixel-defining film material layer 119' in each area. For example, the amount of light exposure of the pixel-defining film material layer 119' in the third area AR3 of the second mask M2 may be adjusted to be less than that in the first area AR1 and the fifth area AR5 of the second mask M2. For example, the second mask M2 may be a half-tone mask or a slit mask. In some embodiments, the second area AR2 and the fourth area AR4 of the second mask M2 may be shielded so that the pixel-defining film material layer 119' is not exposed to light.

The pixel-defining film material layer 119' may be exposed at different amounts of light exposure according to areas through the second mask M2, and a part of the pixel-defining film material layer 119' may be removed by using a developing process. Because the amount of the pixel-defining film material layer 119' that is removed varies according to the amount of light exposure, a pre-pixel-defining film 119$p$ having different thicknesses according to areas may be formed at one time.

Figure 12E:
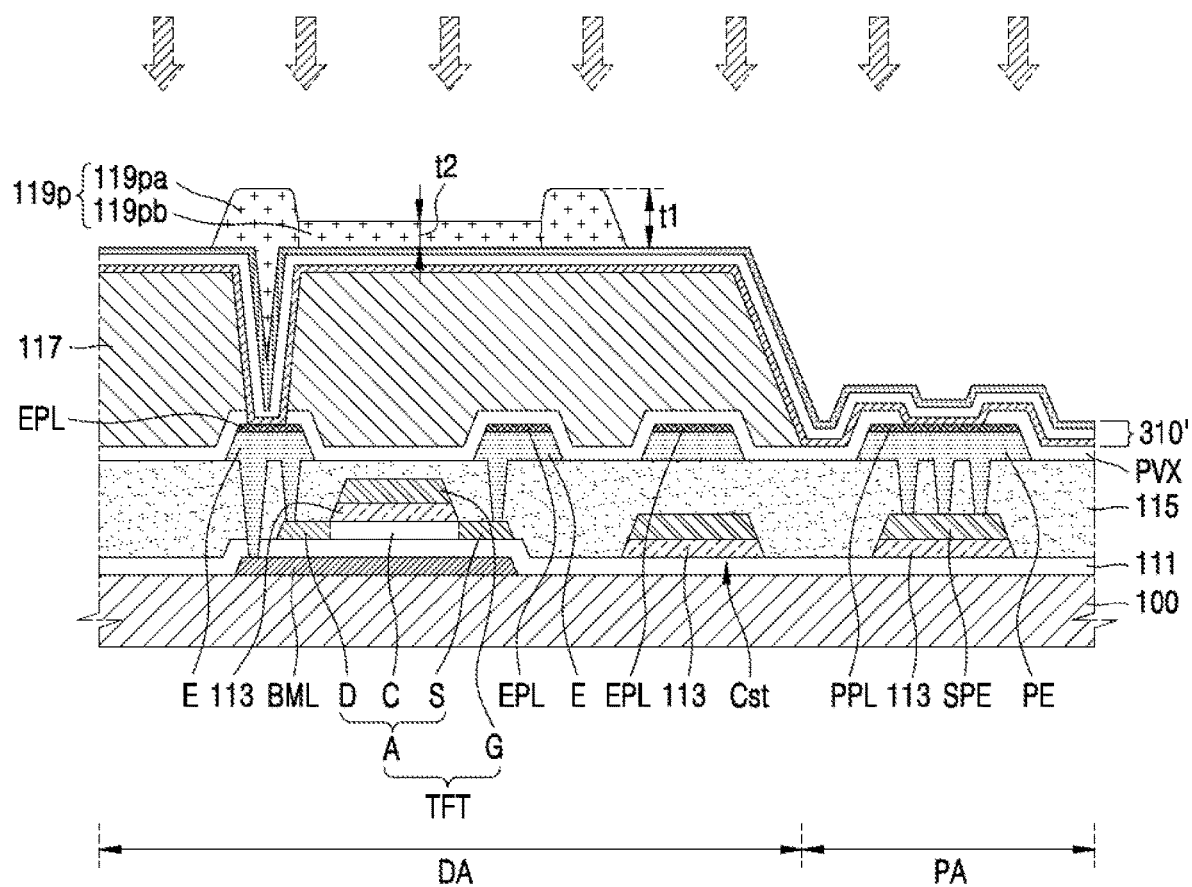

For example, as shown in FIG. 12E, the pre-pixel-defining film 119$p$ may include a first pre-pixel-defining film 119$pa$ and a second pre-pixel-defining film 119$pb$ surrounded by the first pre-pixel-defining film 119$pa$. The first pre-pixel-defining film 119$pa$ corresponds to a portion of the pixel-defining film material layer 119' that is not exposed to light and is not removed due to the second area AR2 and the fourth area AR4 of the second mask M2. The second pre-pixel-defining film 119$pb$ corresponds to a portion of the pixel-defining film material layer 119' that is exposed at an adjusted amount of light exposure and is partially removed due to the third area AR3 of the second mask M2. A thickness t1 of the first pre-pixel-defining film 119$pa$ may be greater than a thickness t2 of the second pre-pixel-defining film 119$pb$.

Although the pixel-defining film material layer 119' includes the positive photoresist in FIG. 12D, the pixel-defining film material layer 119' may include a negative photoresist. Unlike in a case where the pixel-defining film material layer 119' includes the positive photoresist, a thickness of the pixel-defining film material layer 119' remaining after a developing process increases as the amount of light exposure of the pixel-defining film material layer 119' increases.

Figure 12F:
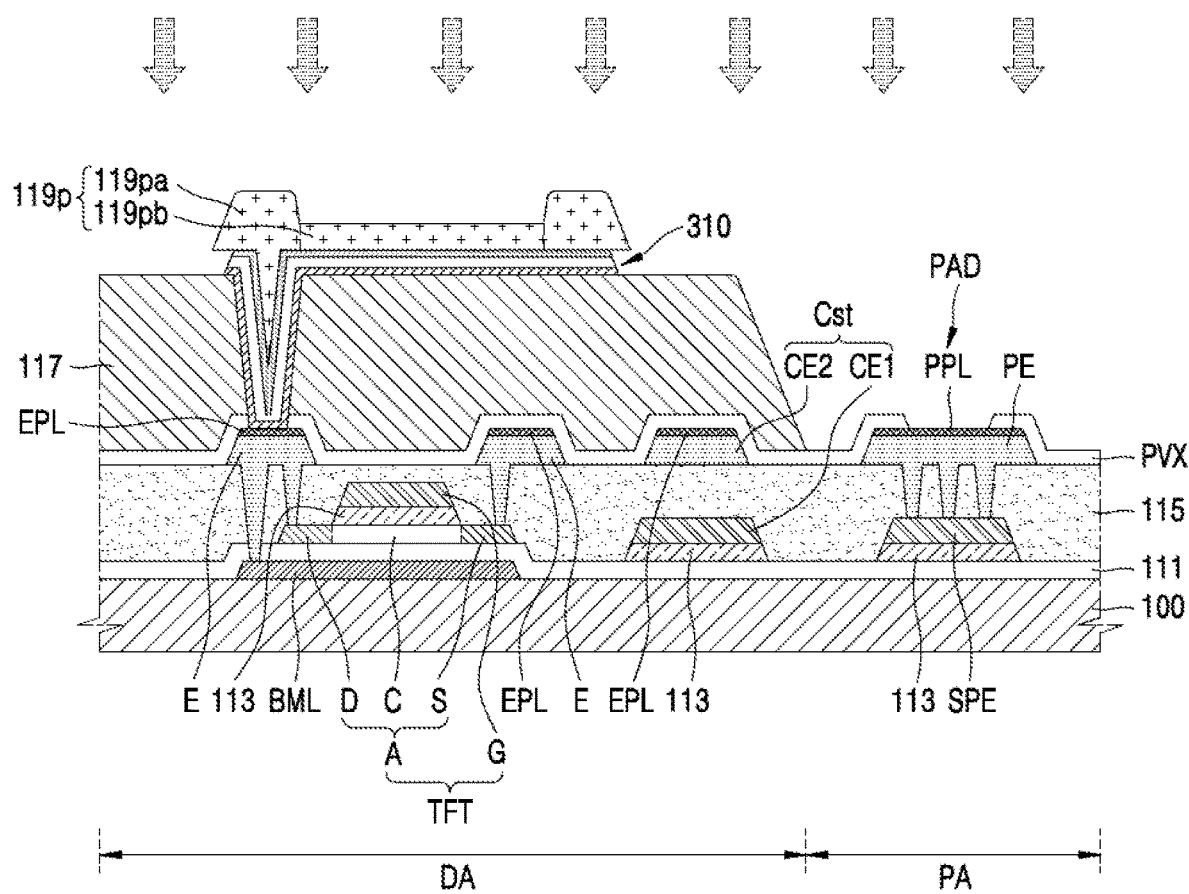

Referring to FIGS. 12E and 12F, the pixel electrode material layer 310' is etched by using the pre-pixel-defining film 119$p$ formed on the pixel electrode material layer 310', to form the pixel electrode 310. The pixel electrode 310 may be formed by depositing the pixel electrode material layer 310' and performing a mask process and an etching process. For example, the etching process may be a wet etching process.

The number of times the etching process is performed may vary according to conditions of the etching process. For example, the etching process may include a first etching process and a second etching process. The etching process may be performed twice in total. After the first etching process, the pixel electrode material layer 310' not protected by the pre-pixel-defining film 119p may remain as a single film or two films. After the second etching process, the pixel electrode material layer 310' not protected by the pre-pixel-defining film 119p may be removed. Alternatively, the pixel electrode material layer 310' may be removed by performing only the first etching process.

Because the third contact hole CNT3 through which a part of the electrode layer E is exposed is formed in the planarization layer 117, the pixel electrode 310 may be electrically connected to the thin-film transistor TFT through the first contact hole CNT1 and the third contact hole CNT3.

Referring to FIG. 12F, a curing process of the pre-pixel-defining film 119p may be performed. In FIG. 12D, after the pre-pixel-defining film 119p is formed, a first curing process may be performed. After the pixel electrode 310 is formed, a second curing process may be performed. First curing process conditions and second curing process conditions may be different from each other.

Figure 12G:
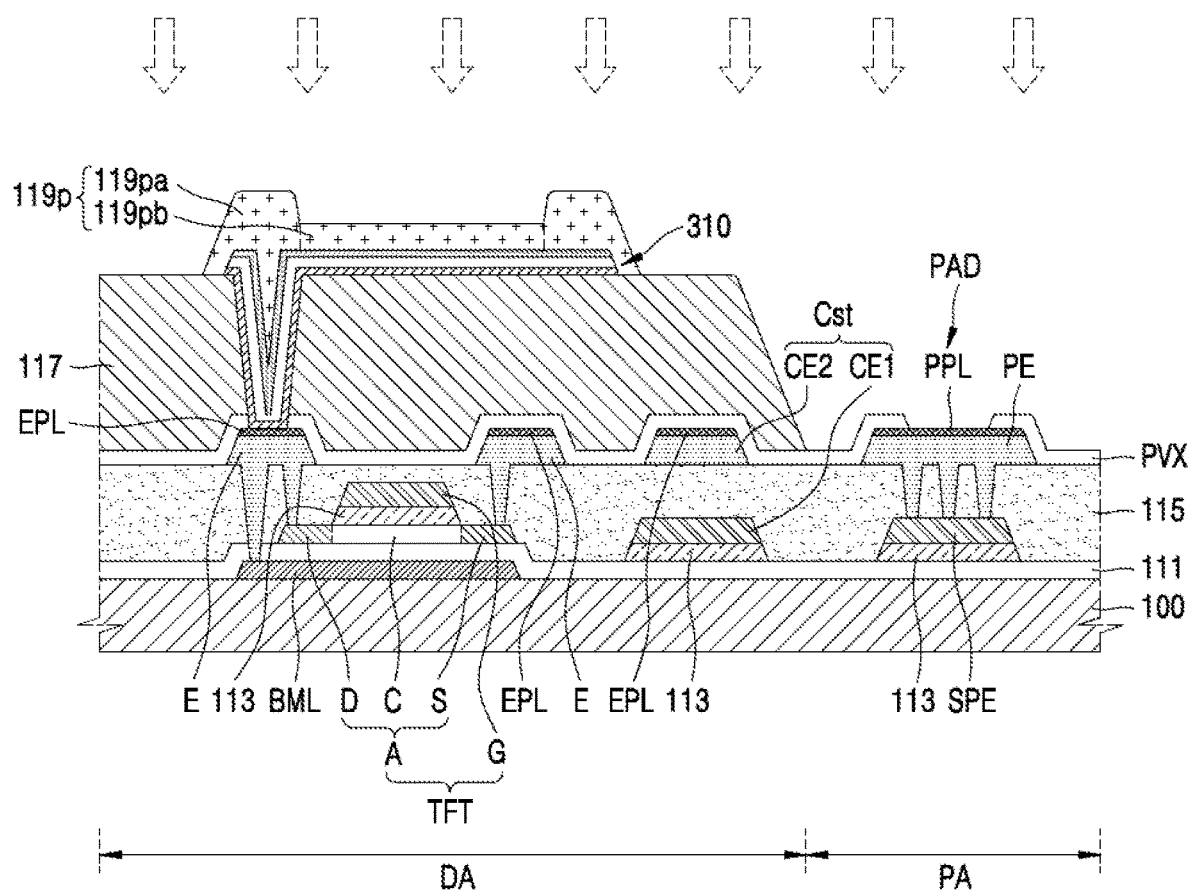

When the curing process of the pre-pixel-defining film 119p is performed under the first curing process conditions, the pre-pixel-defining film 119p may have fluidity even after the curing process of the pre-pixel-defining film 119p. Accordingly, after the pixel electrode 310 is patterned, when the second curing process is performed on the pre-pixel-defining film 119p by changing curing process conditions, the pre-pixel-defining film 119p surrounds a side surface of the pixel electrode 310 as shown in FIG. 12G. The pre-pixel-defining film 119p partially reflows during the curing process, to surround the side surface of the pixel electrode 310. Because the side surface of the pixel electrode 310 is not exposed to the outside due to the pre-pixel-defining film 119p, silver (Ag) that has high reducibility and is contained in the pixel electrode 310 may be prevented from reacting with external particles.

Figure 12H:
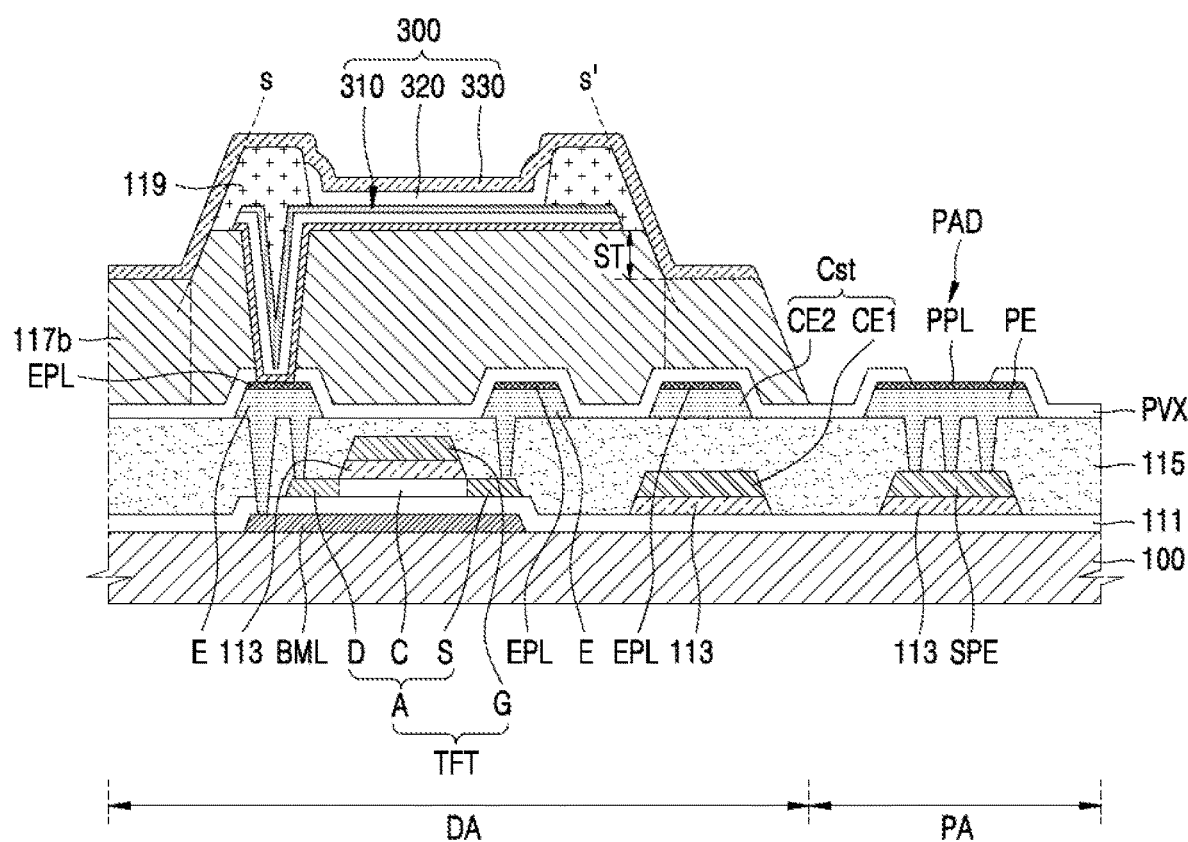

Referring to FIGS. 12G and 12H, in order to expose a part of the pixel electrode 310, an etching process of removing the second pre-pixel-defining film 119pb is performed. The pixel-defining film 119 may be formed by removing the second pre-pixel-defining film 119pb from the pre-pixel-defining film 119p. For example, the etching process may be a dry etching process.

The first portion 117a of the planarization layer 117 may correspond to a portion protected by the pre-pixel-defining film 119p during the etching process, and the second portion 117b of the planarization layer 117 may correspond to a portion not protected by the pre-pixel-defining film 119p during the etching process. A top surface of the planarization layer 117 may have the stepped portion ST between the first portion 117a and the second portion 117b due to the pre-pixel-defining film 119p.

When the second pre-pixel-defining film 119pb is etched, the first pre-pixel-defining film 119pa and the first portion 117a of the planarization layer 117 may also be partially etched. As a result, the planarization layer 117 and the pixel-defining filmi 119 may have the etched surfaces s and s' which may be coplanar with each other. An outer surface of the pixel-defining film 119 and a side surface of the planarization layer 117 may be located on the etched surfaces s and s' which may be coplanar with each other.

Because the pixel electrode 310 is formed by using the pre-pixel-defining film 119p as an etch mask as shown in FIG. 12F and the first portion 117a of the planarization layer 117 is formed by using the pre-pixel-defining film 119p as an etch mask as shown in FIGS. 12G and 12H, a planar shape of the pixel-defining film 119 may be transferred to a planar shape of the pixel electrode 310 and a planar shape of the first portion 117a. As shown in FIG. 12H, an edge of the pixel electrode 310 and a side wall of the first portion 117a may be coplanar with each other. In an embodiment, the edge of the pixel electrode 310 and the side wall of the first portion 117a may be connected to each other, and the connected edge of the pixel electrode 310 and the side wall of the first portion 117a may form a plane which is inclined relative a top surface of the photoresist pattern PR. An edge of the pixel electrode 310 and a side wall of the pixel-defining film 119 may also be coplanar with each other.

Referring to FIG. 12H, the intermediate layer 320 is formed on the pixel electrode 310, that is, in an opening of the pixel-defining film 119. The intermediate layer 320 may include a low-molecular-weight material or a high-molecular-weight material. The intermediate layer 320 may be formed by using vacuum deposition, screen printing, inkjet printing, or laser-induced thermal imaging (LITI).

The intermediate layer 320 of the light-emitting device may include an organic emission layer. The organic emission layer may include an organic material including a fluorescent or phosphorescent material emitting red light, green light, blue light, or white light. The organic emission layer may be formed of a low-molecular-weight organic material or a high-molecular-weight organic material. A functional layer such as a hole transport layer (HTL), a hole injection layer (HIL), an electron transport layer (ETL), or an electron injection layer (EIL) may be selectively further located under or over the organic emission layer. The intermediate layer 320 may correspond to each of a plurality of pixel electrodes 310. However, the present disclosure is not limited thereto. Various modifications may be made. For example, the intermediate layer 320 may include an integrated layer over the plurality of pixel electrodes 310.

Next, the counter electrode 330 is formed to correspond to a plurality of light-emitting devices 300. The counter electrode 330 may be formed to cover the display area DA of the substrate 100 through an open mask. The counter electrode 330 may be formed by using a deposition method such as CVD, PECVD, LPCVD, PVD, sputtering, or ALD.

Figure 13A:
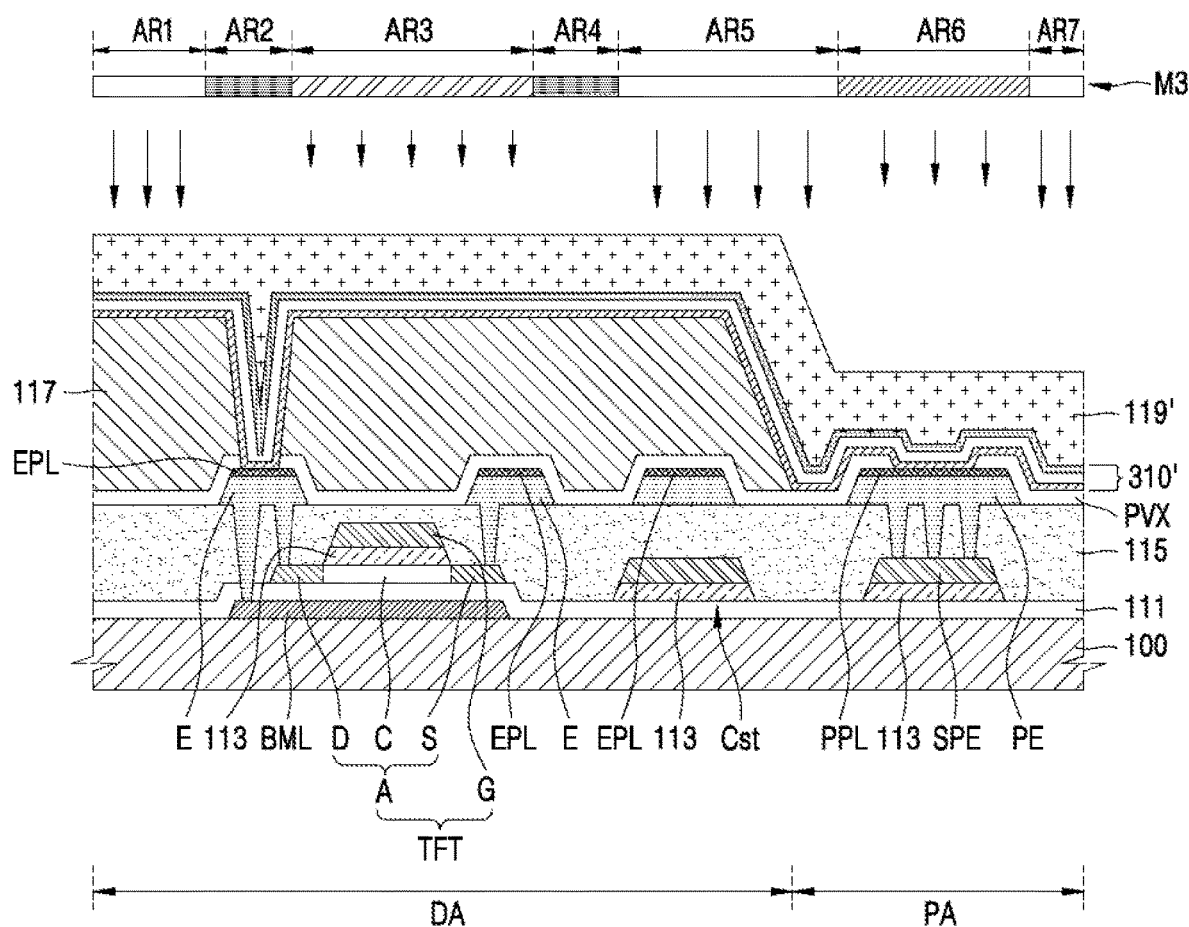
FIGS. 13A through 13G are cross-sectional views sequentially illustrating a method of manufacturing a display apparatus according to an embodiment of the present inventive concept.

FIGS. 13A though 13G are cross-sectional views sequentially illustrating a method of manufacturing a display apparatus according to an embodiment. In detail, FIGS. 13A through 13G are cross-sectional views sequentially illustrating a method of manufacturing a display apparatus according to an embodiment based on FIG. 10. In FIGS. 13A through 13G, the same elements as those in FIG. 10 are denoted by the same reference numerals, and thus a repeated description thereof will be omitted.

Referring to FIG. 13A, the pixel electrode material layer 310' and the pixel-defining film material layer 119' are sequentially formed on the planarization layer 117. Before the pixel electrode material layer 310' and the pixel-defining film material layer 119' are sequentially formed, a process of forming the thin-film transistor TFT, the pad electrode PE, and the planarization layer 117 may be the same as that of FIGS. 12A and 12B.

A third mask M3 may be located over the pixel-defining film material layer 119'. The third mask M3 may adjust the amount of light exposure of the pixel-defining film material layer 119' in each area. For example, the amount of light exposure of the pixel-defining film material layer 119' in the third area AR3 and the sixth area AR6 of the third mask M3 may be adjusted to be less than that in the first area AR1, the fifth area AR5, and a seventh area AR7 of the third mask M3. The amount of light exposure of the pixel-defining film material layer 119' in the third area AR3 of the third mask M3 may be adjusted to be less than that in the sixth area AR6 of the third mask M3. The amount of light exposure of the pixel-defining film material layer 119' corresponding to the third area AR3 of the third mask M3 may be the smallest. For example, the third mask M3 may be a half-tone mask or a slit mask. In some embodiments, the second area AR2 and the fourth area AR4 of the third mask M3 may be shielded so that the pixel-defining film material layer 119' is not exposed to light.

The pixel-defining film material layer 119' may be exposed at different amounts of light exposure according to areas through the third mask M3, and a part of the pixel-defining film material layer 119' may be removed by using a developing process. Because the amount of the pixel-defining film material layer 119' that is removed varies according to the amount of light exposure, the pre-pixel-defining film 119p and the photoresist pattern PR having different thicknesses according to areas may be formed at one time.

Figure 13B:
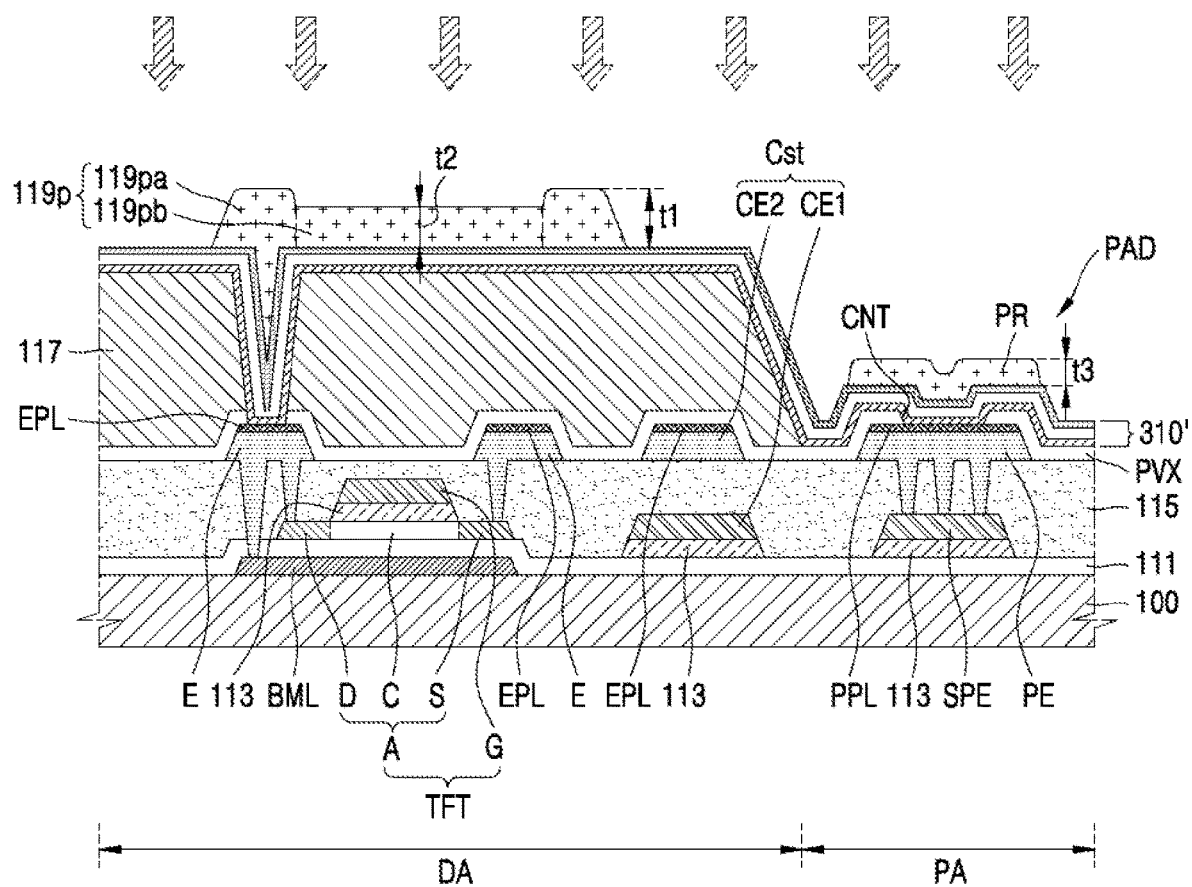

For example, as shown in FIG. 13B, the pre-pixel-defining film 119p may be formed in the display area DA, and the photoresist pattern PR may be formed in the peripheral area PA. The pre-pixel-defining film 119p may include the first pre-pixel-defining film 119pa and the second pre-pixel-defining film 119pb surrounded by the first pre-pixel-defining film 119pa. Because the photoresist pattern PR and the pre-pixel-defining film 119p as the pixel-defining film material layer 119' may be simultaneously formed, the photoresist pattern PR and the pre-pixel-defining film 119p may include the same material as each other.

The first pre-pixel-defining film 119pa corresponds to a portion of the pixel-defining film material layer 119' that is not exposed to light and is not removed due to the second area AR2 and the fourth area AR4 of the third mask M3. The second pre-pixel-defining film 119pb corresponds to a portion of the pixel-defining film material layer 119' that is exposed at the smallest amount of light exposure and is least removed due to the third area AR3 of the third mask M3. The photoresist pattern PR corresponds to a portion of the pixel-defining film material layer 119' that is exposed at a more amount of light exposure due to the sixth area AR6 of the third mask M3 than that due to the third area AR3 of the third mask M3 and thus is more removed than the second pre-pixel-defining film 119pb.

A thickness t1 of the first pre-pixel-defining film 119pa may be greater than a thickness t2 of the second pre-pixel-defining film 119pb. The thickness t2 of the second pre-pixel-defining film 119pb may be greater than a thickness t3 of the photoresist pattern PR. The thicknesses t1 and t2 of the pre-pixel-defining film 119p may each be greater than the thickness t3 of the photoresist pattern PR.

Although the pixel-defining film material layer 119' includes a positive photoresist in FIG. 13A, the pixel-defining film material layer 119' may include a negative photoresist. Unlike in a case where the pixel-defining film material layer 119' includes the positive photoresist, a thickness of the pixel-defining film material layer 119' remaining after a developing process increases as the amount of light exposure of the pixel-defining film material layer 119' increases.

Figure 13C:
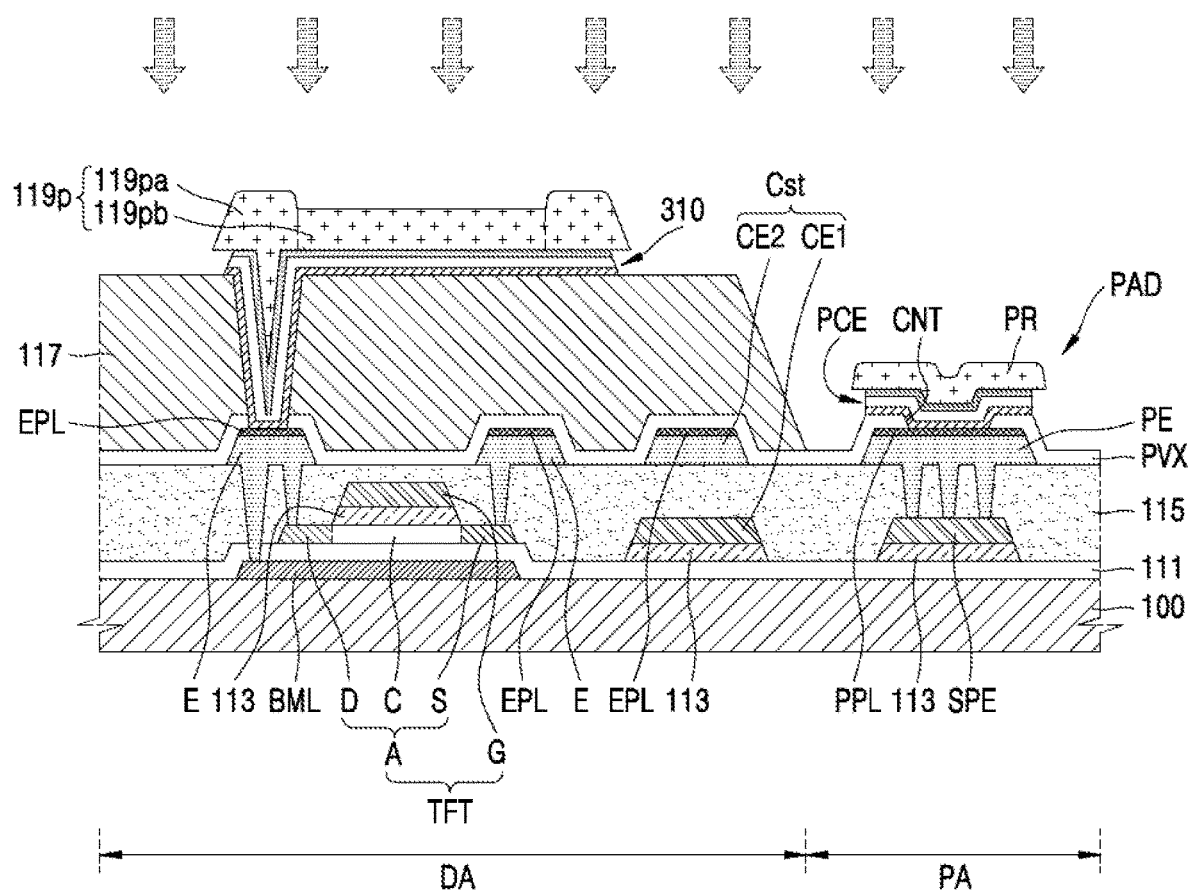

Referring to FIGS. 13B and 13C, the pixel electrode material layer 310' is etched by using the pre-pixel-defining film 119p and the photoresist pattern PR formed on the pixel electrode material layer 310', to form the pixel electrode 310 and the pad connection electrode PCE. The pixel electrode 310 and the pad connection electrode PCE may be formed by depositing the pixel electrode material layer 310' and performing a mask process and an etching process. For example, the etching process may be a wet etching process.

Figure 13D:
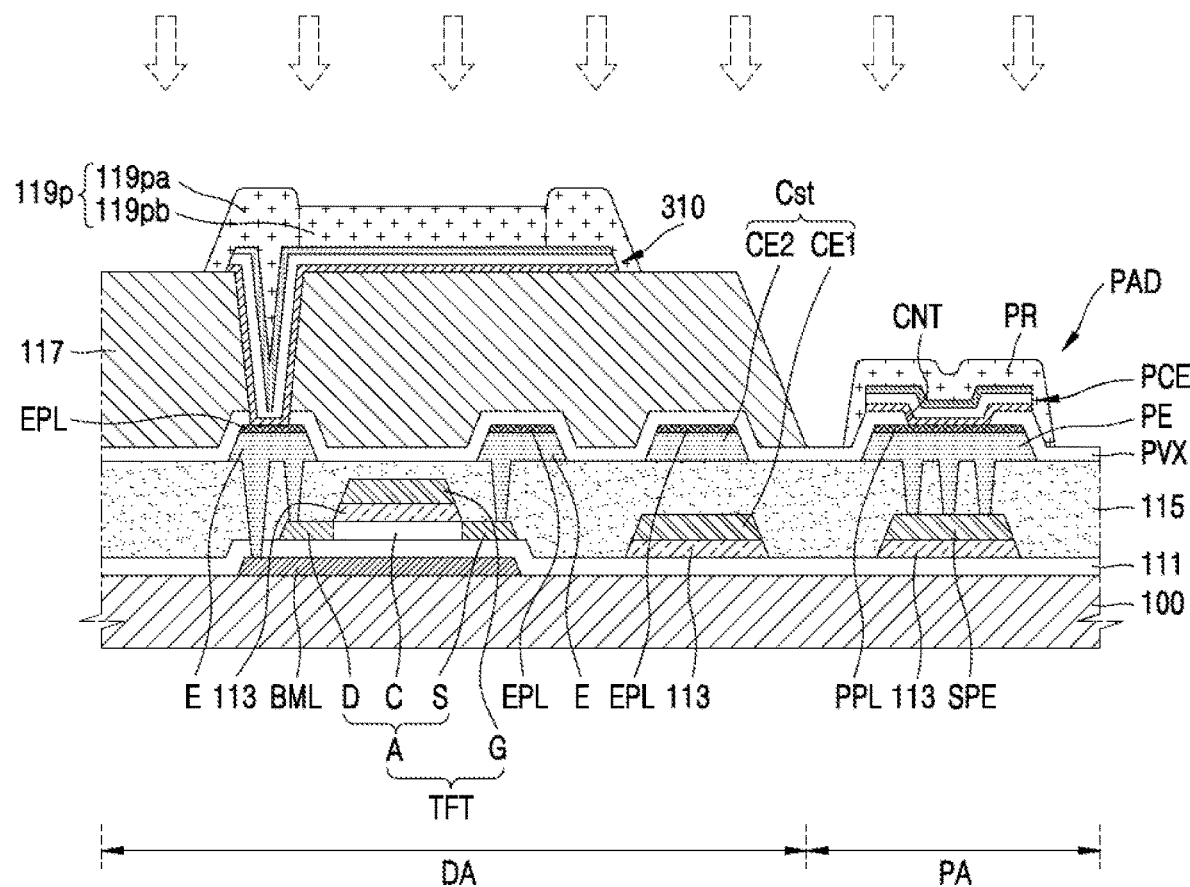

Referring to FIGS. 13C and 13D, a curing process of the pre-pixel-defining film 119p may be performed. After the pixel electrode 310 is patterned, when the curing process of the pre-pixel-defining film 119p is performed, a side surface of the pixel electrode 310 is surrounded by the pre-pixel-defining film 119p as shown in FIG. 13D. The pre-pixel-defining film 119p partially reflows during the curing process, to surround the side surface of the pixel electrode 310. Because the side surface of the pixel electrode 30 is not exposed to the outside due to the pre-pixel-defining film 119p, silver (Ag) that has high reducibility and is contained in the pixel electrode 310 may be prevented from reacting with external particles.

Although the pre-pixel-defining film 119p is described, the photoresist pattern PR may also be subjected to the curing process. A part of the photoresist pattern PR reflows, to surround a side surface of the pad connection electrode PCE.

Figure 13E:
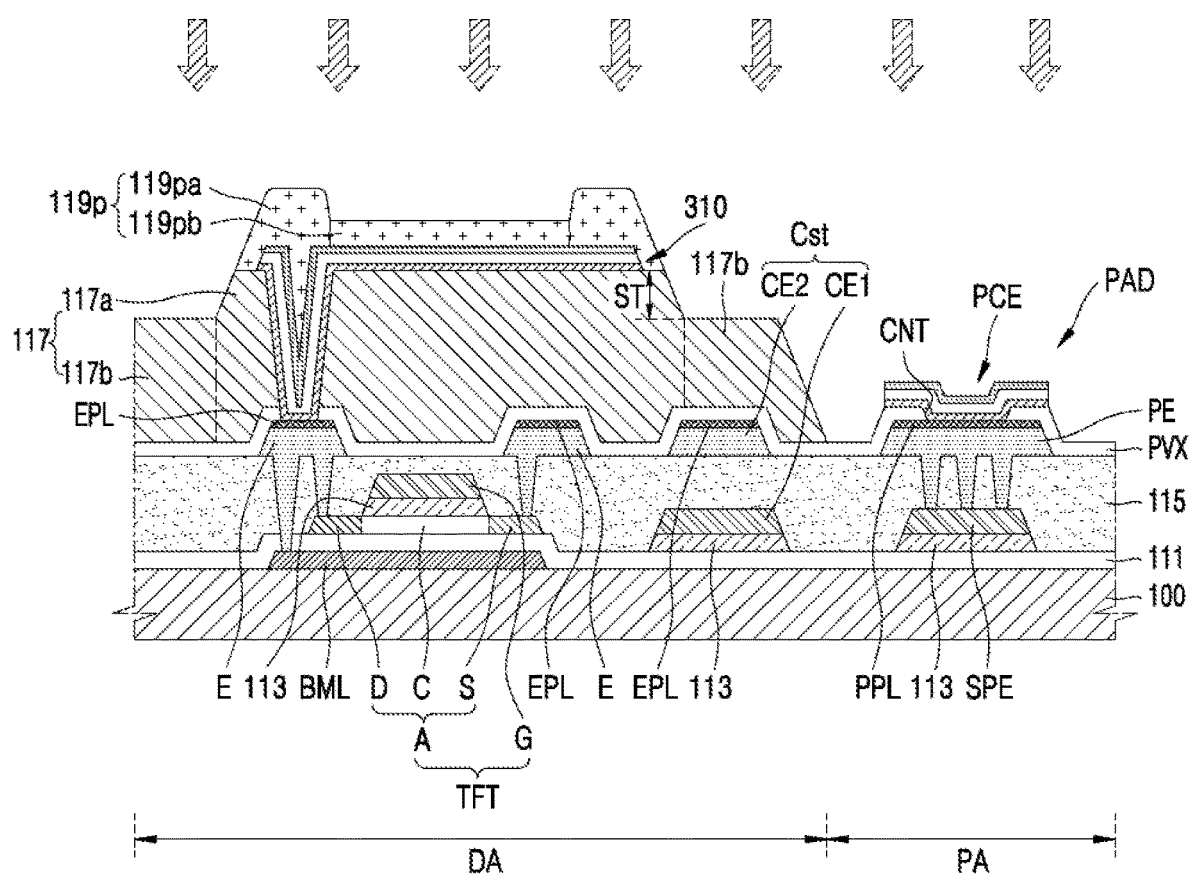

Referring to FIGS. 13D and 13E, an etching process for removing the photoresist pattern PR is performed. For example, the etching process may be a dry etching process.

The first portion 117a of the planarization layer 117 may correspond to a portion protected by the pre-pixel-defining film 119p during the etching process, and the second portion 117b of the planarization layer 117 may correspond to a portion not protected by the pre-pixel-defining film 119p during the etching process. A top surface of the planarization layer 117 may have the stepped portion ST between the first portion 117a and the second portion 117b due to the pre-pixel-defining film 119p. A part of the pre-pixel-defining film 119p may be etched during the etching process, thereby reducing a total thickness of the pre-pixel-defining film 119p.

Next, an etching process may be performed in a state where the pre-pixel-defining film 119p is not removed. For example, the etching process may be a wet etching process.

Figure 13F:
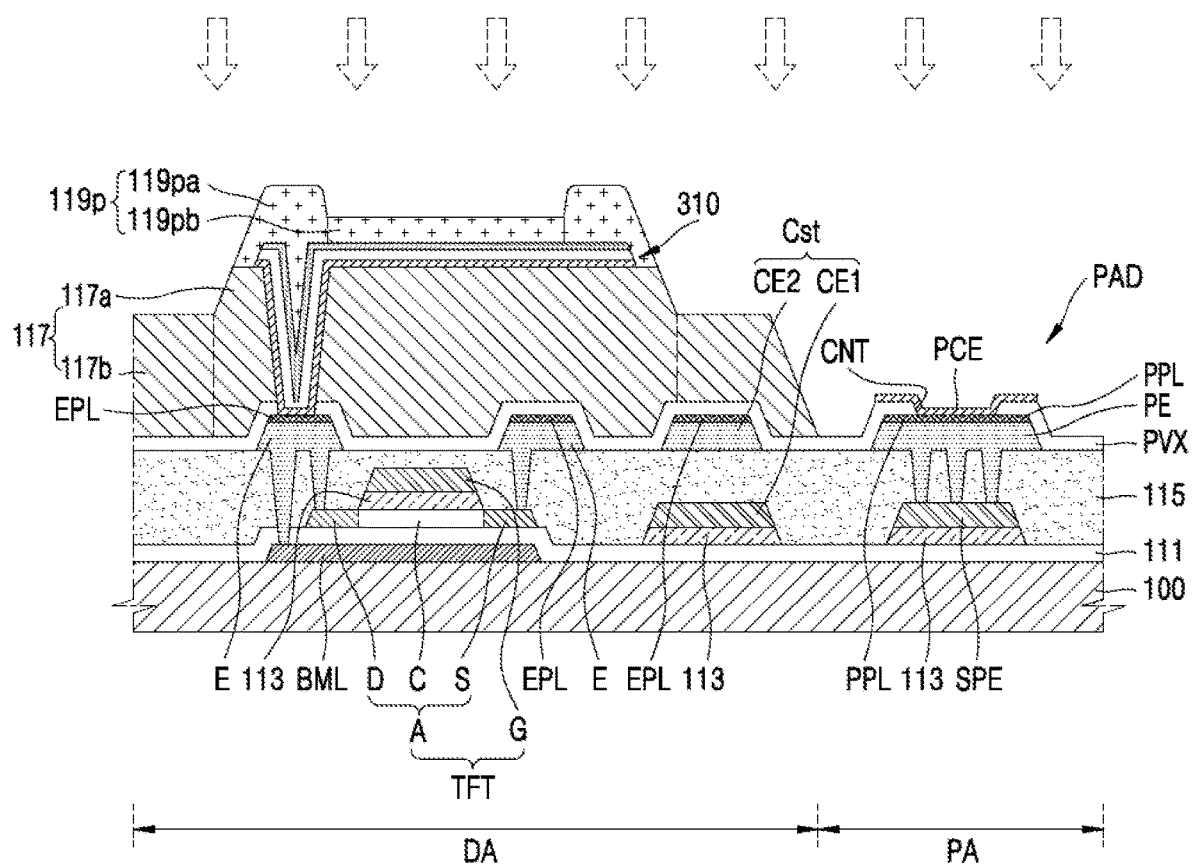

Referring to FIG. 13F, from among three films of the pad connection electrode PCE, two films other than a film adjacent to the pad electrode PE may be removed through an etching process. The pad connection electrode PCE may be formed of a single film.

As a comparative example, a pad connection electrode may be maintained as three films. When the pad connection electrode PE has three films, the pad connection electrode PCE may be formed of ITO/Ag/ITO. The pad connection electrode PCE may be exposed without being covered by an insulating layer. The silver (Ag) of the pad connection electrode PCE having a high reaction rate is exposed, and thus there is a risk of forming an electrical short circuit with a neighboring electrode.

However, according to an embodiment, when two of three films of the pad connection electrode PCE are removed, only ITO exists in the exposed pad connection electrode PCE and the risk of a short with a neighboring electrode is prevented.

Next, an etching process for removing the second pre-pixel-defining film 119pb is performed to expose a part of the pixel electrode 310. The pixel-defining film 119 may be formed by removing the second pre-pixel-defining film 119pb from the pre-pixel-defining film 119p. For example, the etching process may be a dry etching process.

When the second pre-pixel-defining film 119pb is etched, the first pre-pixel-defining film 119pa and the first portion 117a of the planarization layer 117 may also be partially etched. As a result, the planarization layer 117 and the pixel-defining film 119 may have the etched surfaces s and s' which may be coplanar with each other. An outer surface of the pixel-defining film 119 and a side surface of the planarization layer 117 may be located on the etched surfaces s and s' which may be coplanar with each other.

Figure 13G:
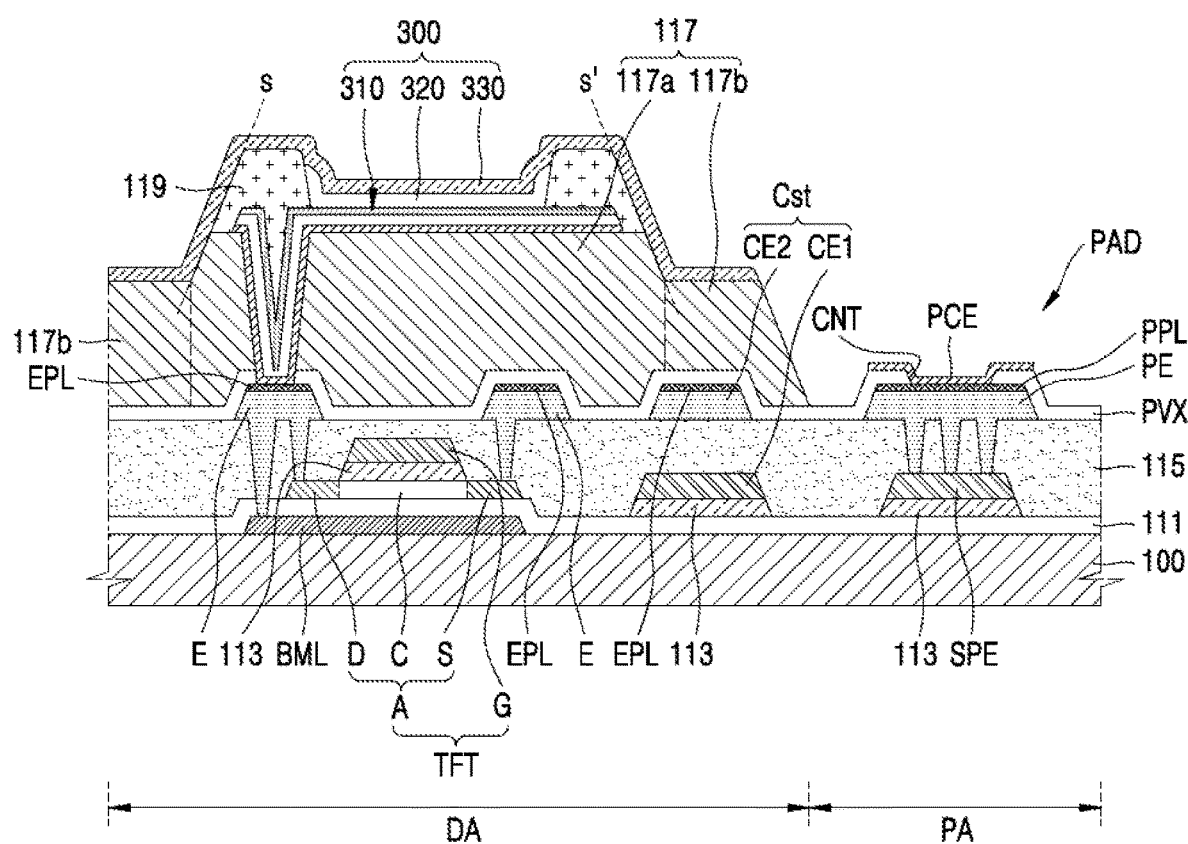

Because the pixel electrode 310 is formed by using the pre-pixel-defining film 119p as an etch mask as shown in FIG. 13C and the first portion 117a of the planarization layer 117 is formed by using the pre-pixel-defining film 119p as an etch mask as shown in FIGS. 13F and 13G, a planar shape of the pre-pixel-defining film 119p may be transferred to a planar shape of the pixel electrode 310 and a planar shape of the first portion 117a. As shown in FIG. 13G, an edge of the pixel electrode 310 and a side wall of the first portion 117a may be coplanar with each other. In an embodiment, the edge of the pixel electrode 310 and the side wall of the first portion 117a may be connected to each other, and the connected edge of the pixel electrode 310 and the side wall of the first portion 117a may form a plane which is inclined relative a top surface of the photoresist pattern PR. An edge of the pixel electrode 310 and a side wall of the pixel-defining film 119 may also be coplanar with each other.

Next, the intermediate layer 320 is formed in an opening of the pixel-defining film 119, and the counter electrode 330 is formed on the intermediate layer 320.

FIGS. 14A through 14I are cross-sectional views sequentially illustrating a method of manufacturing a display apparatus according to an embodiment. In detail, FIGS. 14A through 14I are cross-sectional views sequentially illustrating a method of manufacturing a display apparatus according to an embodiment based on FIG. 9. In FIGS. 14A through 14I, the same elements as those in FIGS. 9 and 12A through 12H are denoted by the same reference numerals, and thus a repeated description thereof will be omitted.

Figure 14A:
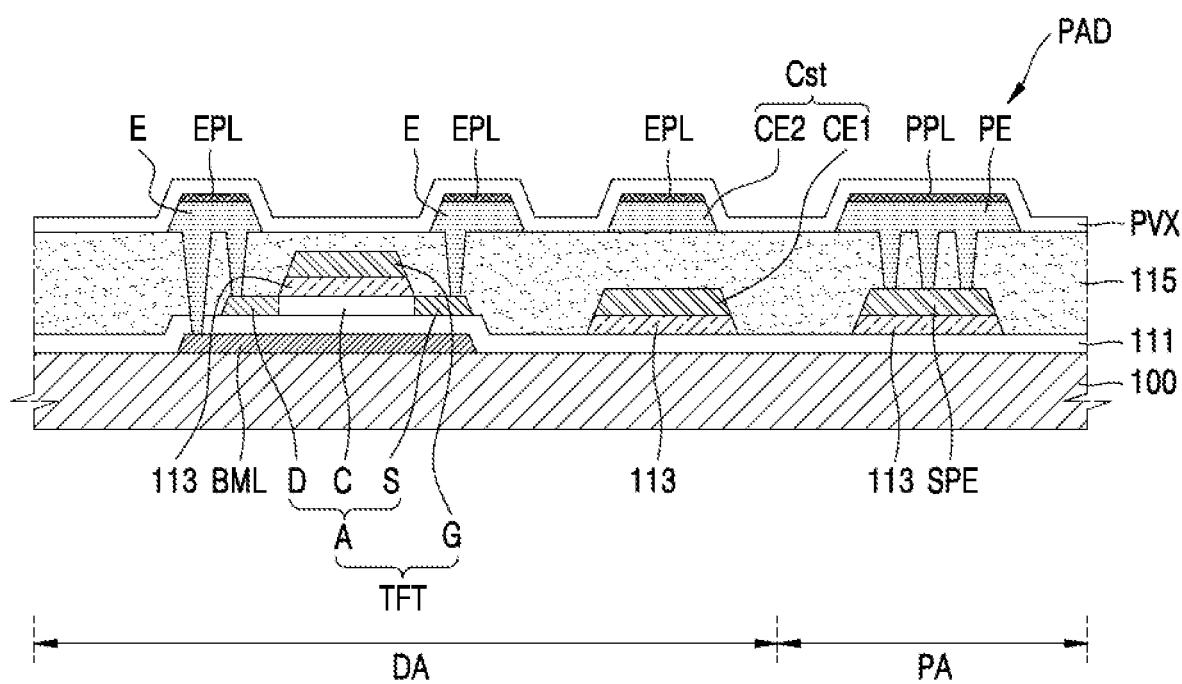
FIGS. 14A through 14I are cross-sectional views sequentially illustrating a method of manufacturing a display apparatus according to an embodiment of the present inventive concept.
Figure 14B:
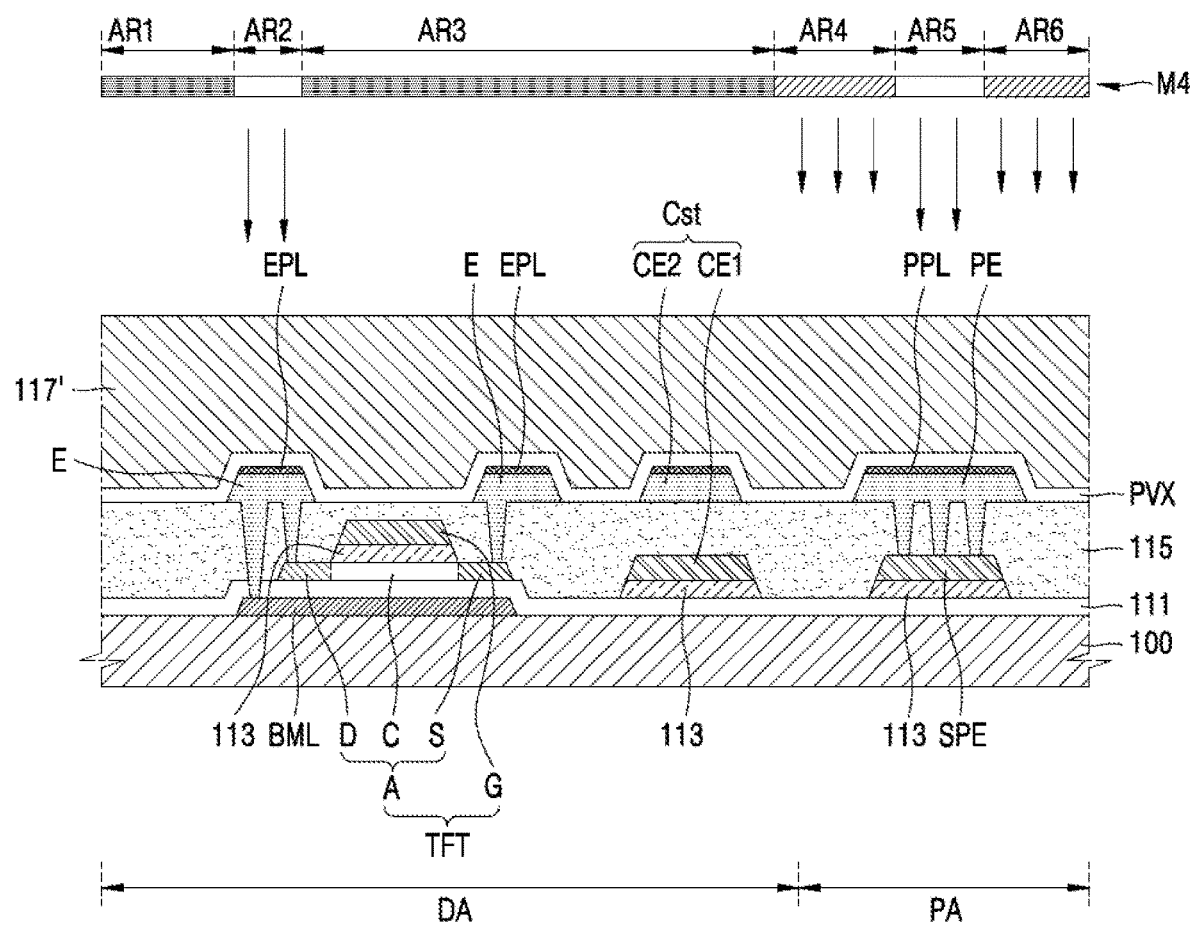
Figure 14C:
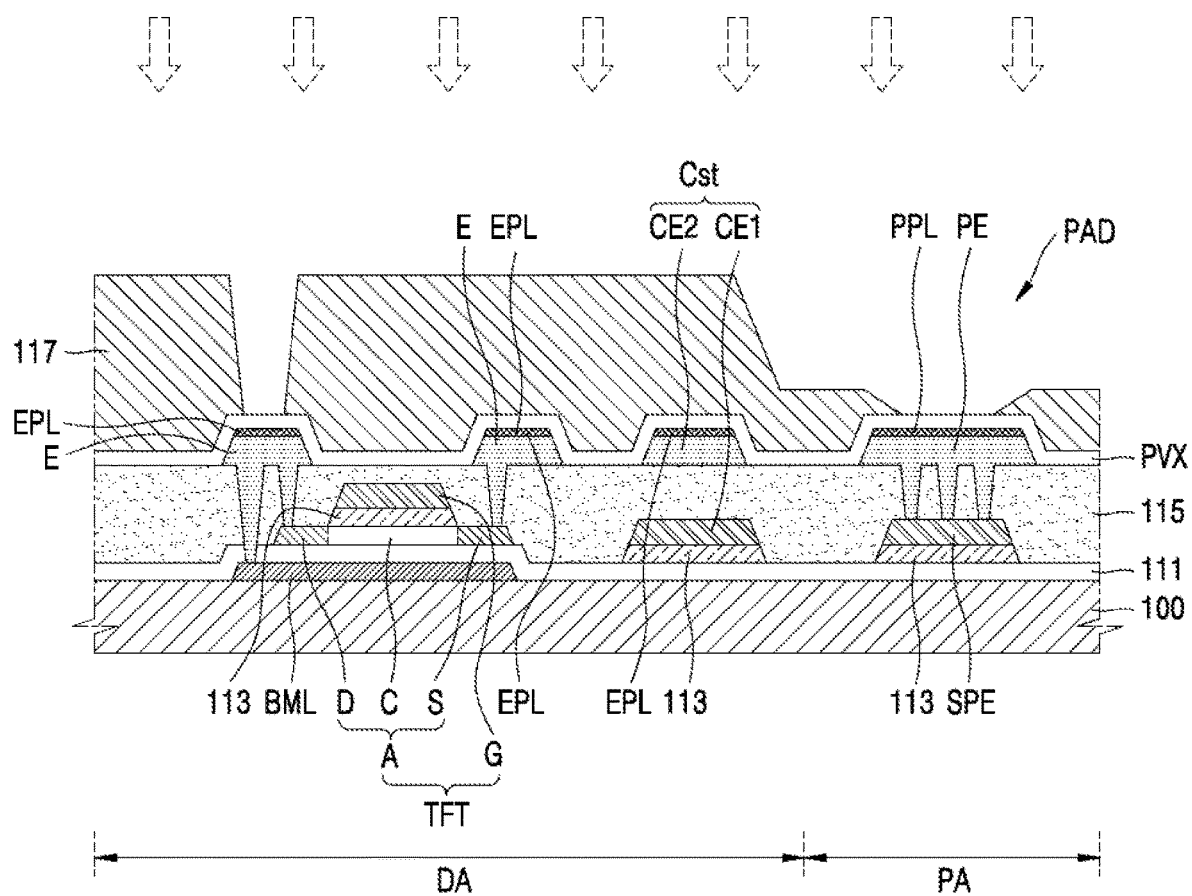

Referring to FIG. 14A, first, the conductive layer BML, the buffer layer 111, the semiconductor layer A, the gate insulating layer 113, the gate electrode G, the first and second electrodes CE1 and CE2 of the storage capacitor Cst, the auxiliary pad electrode SPE, the interlayer insulating layer 115, the electrode layer E, the pad electrode PE, the electrode protective layer EPL, the pad protective layer PPL, and the inorganic protective layer PVX are sequentially formed on the substrate 100. A process of forming the inorganic protective layer PVX from the conductive layer BML is the same as that described with reference to FIG. 12A. However, after the inorganic protective layer PVX is formed, instead of forming contact holes through which the electrode protective layer EPL and the pad protective layer PPL are respectively partially exposed through a separate mask, contact holes may be formed by using the planarization layer 117 as shown in FIGS. 14B and 14C. As a result, contact holes formed in the inorganic protective layer PVX may be formed without a separate mask.

Referring to FIG. 14B, the planarization material layer 117' may be located on the inorganic protective layer PVX. A fourth mask M4 may be located over the planarization material layer 117'. The fourth mask M4 may adjust the amount of light exposure of the planarization material layer 117' in each area. For example, the amount of light exposure of the planarization material layer 117' in the fourth area AR4 of the fourth mask M4 may be adjusted to be less than that in the second area AR2 and the fifth area AR5 of the fourth mask M4. The amount of light exposure of the planarization material layer 117' in the sixth area AR6 of the fourth mask M4 may be adjusted to be less than that in the second area AR2 and the fifth area AR5 of the fourth mask M4. For example, the fourth mask M4 may be a half-tone mask or a slit mask. In some embodiments, the first area AR1 and the third area AR3 of the fourth mask M4 may be shielded so that the planarization material layer 117' is not exposed to light.

The planarization material layer 117' may be exposed at different amounts of light exposure according to areas through the fourth mask M4, and a part of the planarization material layer 117' may be removed through a developing process. Because the amount of the planarization material layer 117' that is removed varies according to the amount of light exposure, the planarization layer 117 having different thicknesses according to areas may be formed at one time. As shown in FIG. 14C, a thickness of the planarization layer 117 which is disposed on the display area DA may be greater than a thickness of the planarization layer 117 which is disposed on the peripheral area PA. Next, a degree of adhesion of the planarization layer 117 to the inorganic protective layer PVX may be increased through a curing and drying process. The curing and drying process may include a heat treatment process.

Although the planarization material layer 117' includes a positive photoresist in FIG. 14B, the planarization material layer 117' may include or may be formed of a negative photoresist. Unlike in a case where the planarization material layer 117' includes the positive photoresist, a thickness of the planarization layer 117 remaining after a curing process increases as the amount of light exposure of the planarization material layer 117' increases.

Figure 14D:
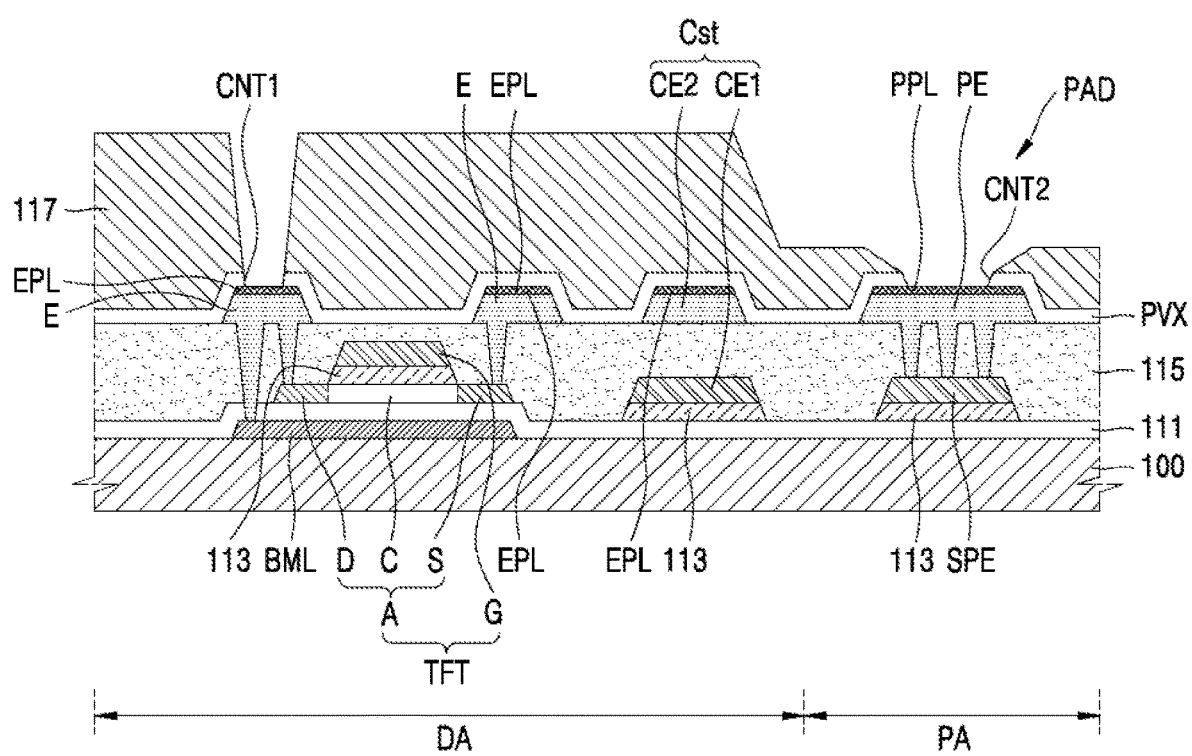

Referring to FIGS. 14C and 14D, the first contact hole CNT1 through which a part of the electrode layer E is exposed and the second contact hole CNT2 through which a part of the pad electrode PE is exposed are formed in the inorganic protective layer PVX by using the patterned planarization layer 117. The first contact hole CNT1 and the second contact hole CNT2 are formed by using an etching process of partially etching the inorganic protective layer PVX. For example, the etching process of partially etching the inorganic protective layer PVX may be a dry etching process. Although not shown in FIG. 14D, a part of the planarization layer 117 may also be removed, thereby reducing a thickness of the planarization layer 117.

Figure 14E:
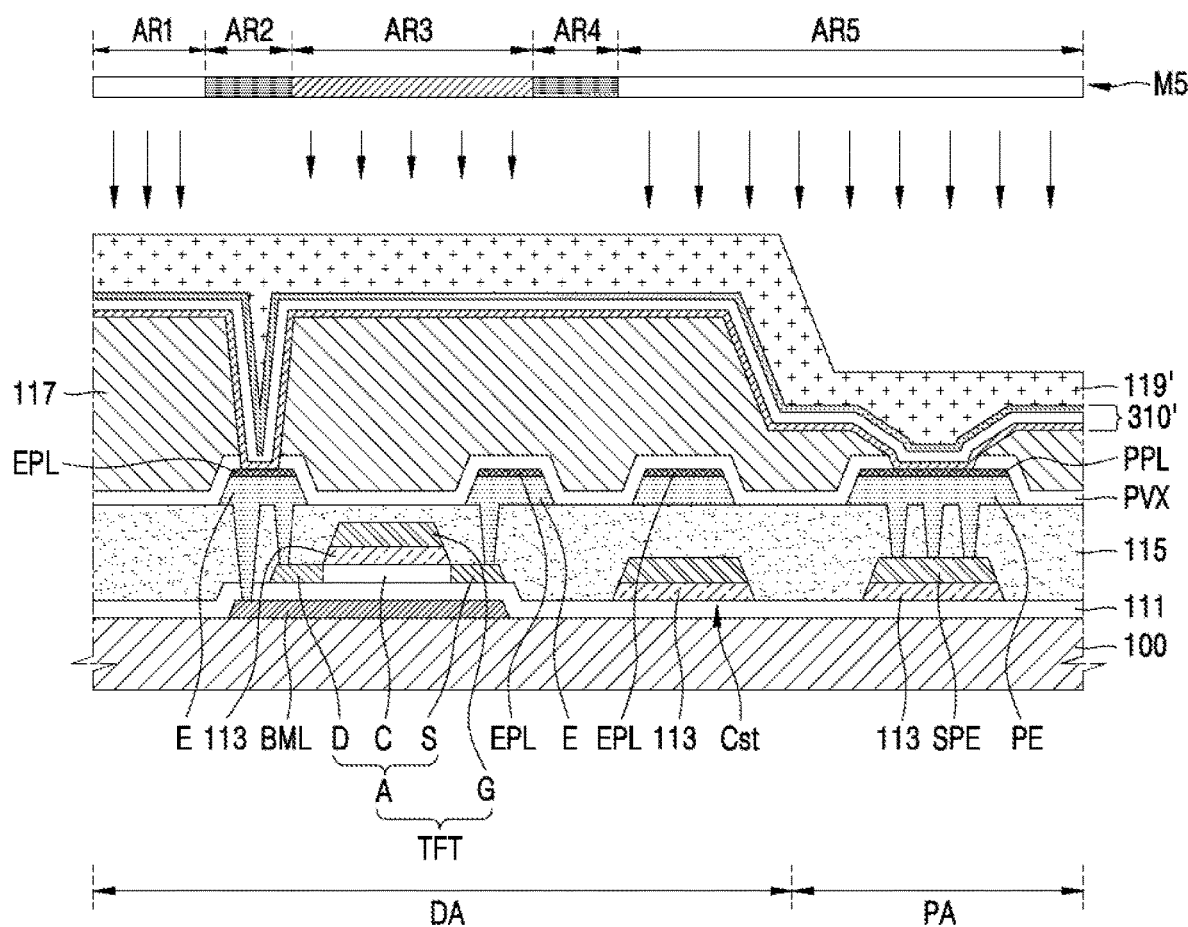
Figure 14F:
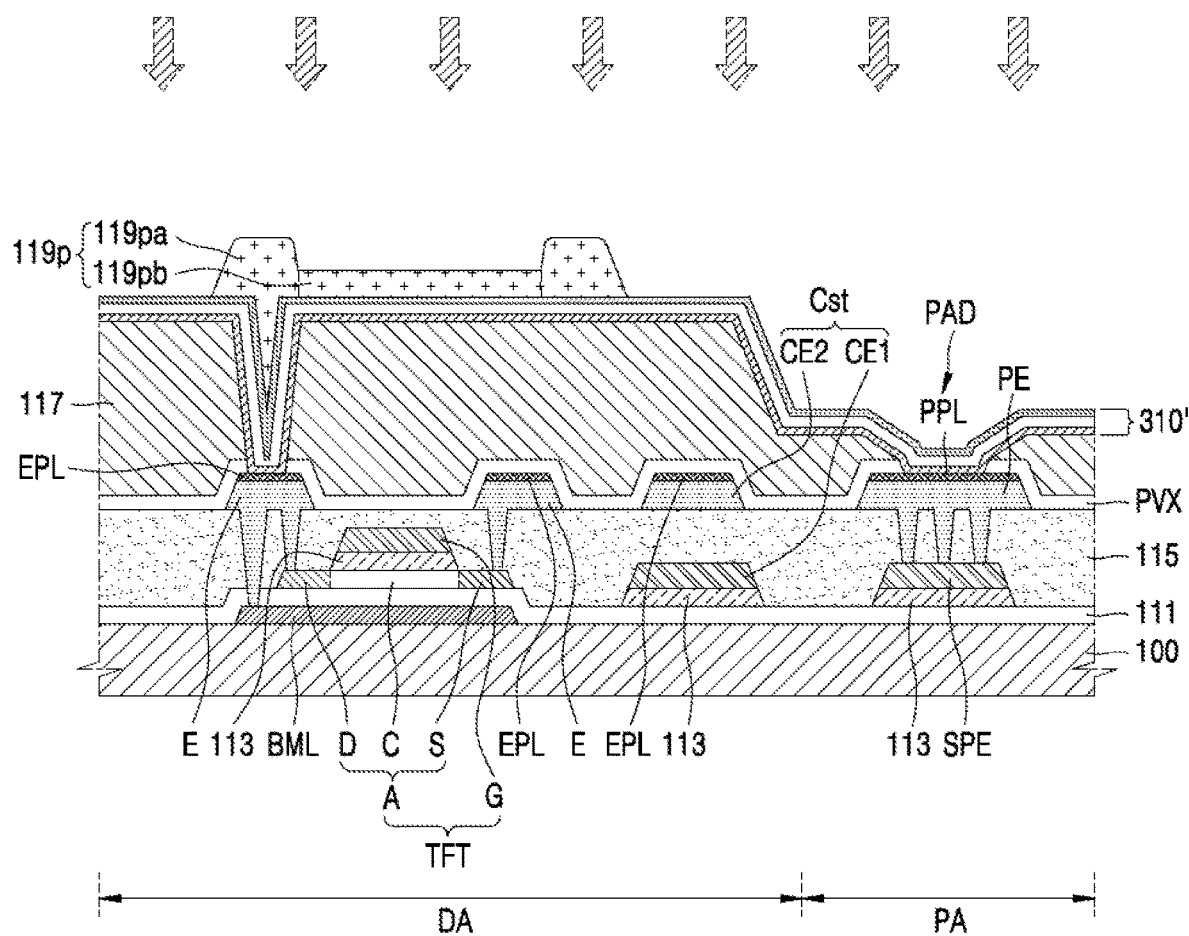
Figure 14G:
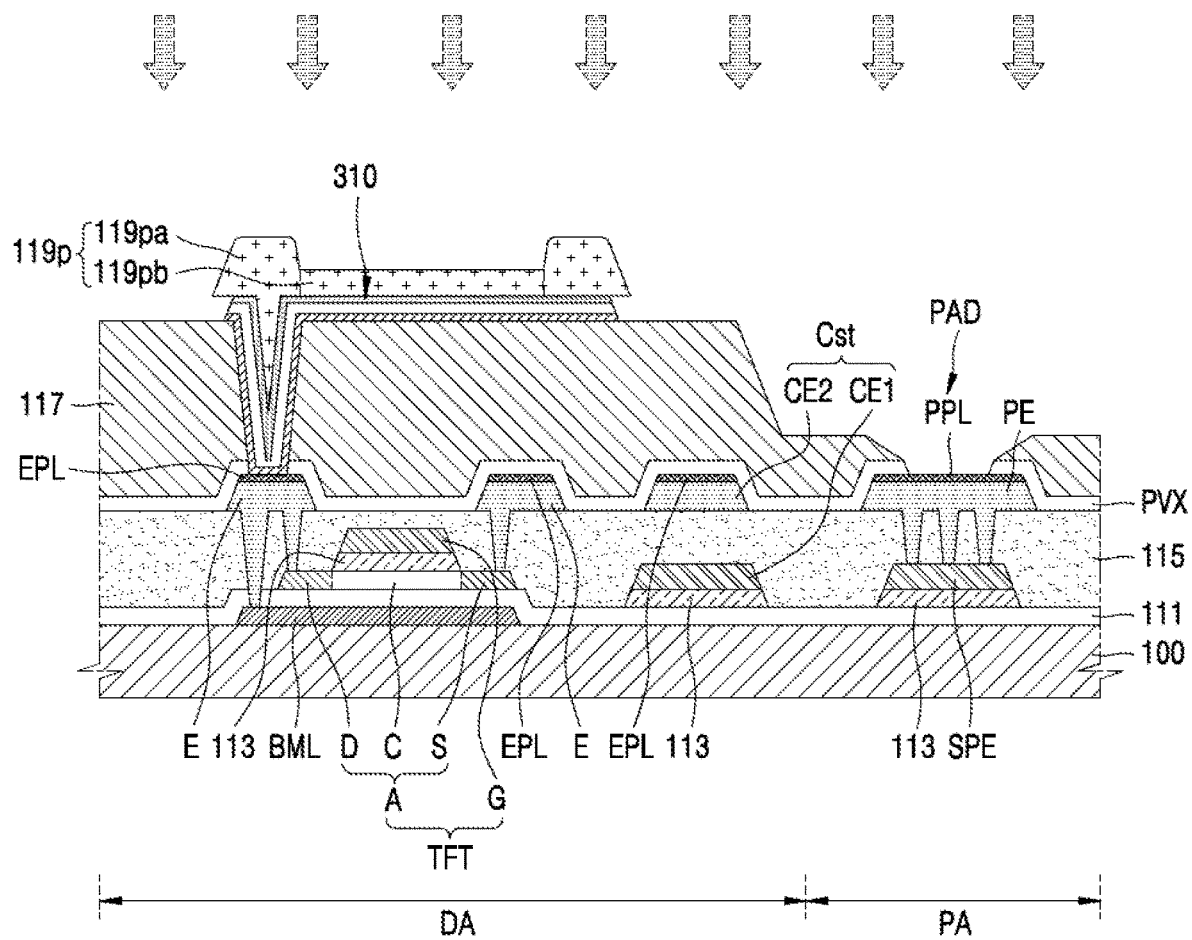
Figure 14H:
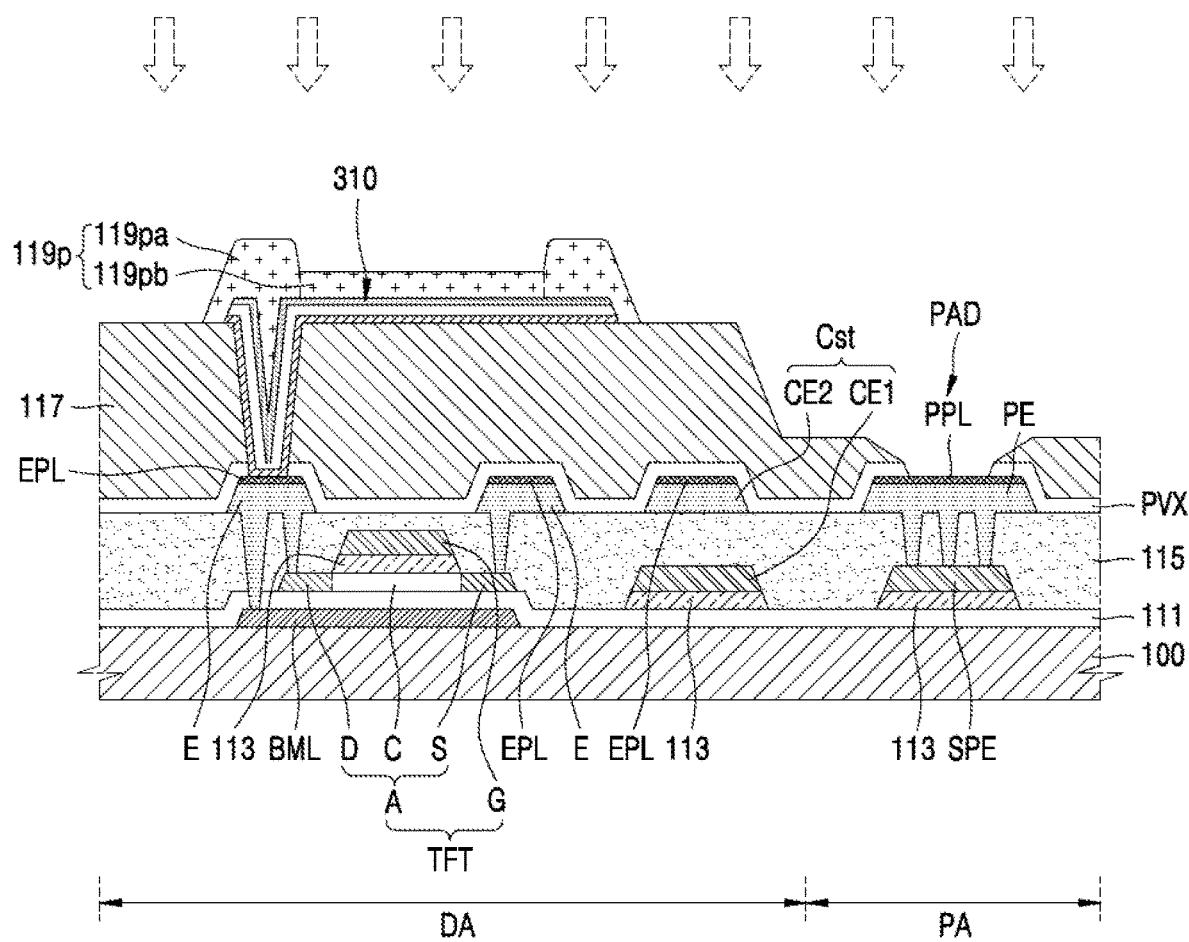
Figure 14I:
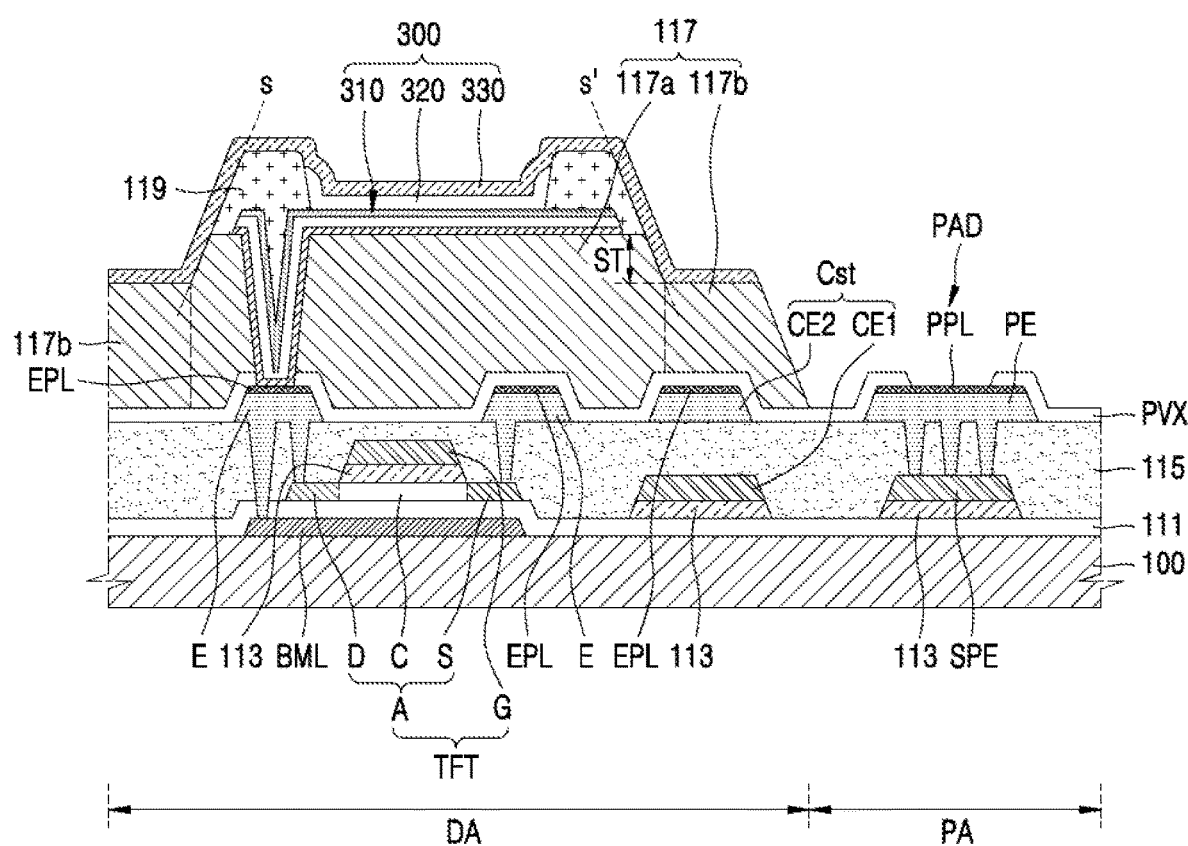

Referring to FIGS. 14E through 14I, the pixel electrode material layer 310' and the pixel-defining film material layer 119' are sequentially formed on the planarization layer 117 (see FIG. 14E). The pre-pixel-defining film 119p having different thicknesses according to areas may be formed at one time through a fifth mask M5 located over the pixel-defining film material layer 119' (see FIG. 14F). Next, the pixel electrode material layer 310' is etched by using the pre-pixel-defining film 119p formed on the pixel electrode material layer 310', to form the pixel electrode 310 (see FIGS. 14F and 14G). The pre-pixel-defining film 119p may surround a side surface of the pixel electrode 310 by performing a curing process on the pre-pixel-defining film 119p (see FIGS. 14G and 14H). An etching process of removing the second pre-pixel-defining film 119pb for exposing a part of the pixel electrode 310 is performed (see FIG. 14H). The pixel-defining film 119 may be formed by etching the second pre-pixel-defining film 119pb. Detailed information has been described with reference to FIGS. 12D through 12H, and thus a repeated description will be omitted in FIGS. 14E through 14I.

The first portion 117a of the planarization layer 117 may correspond to a portion protected by the pre-pixel-defining film 119p during the etching process of the second pre-pixel-defining film 119pb, and the second portion 117b of the planarization layer 117 may correspond to a portion not protected by the pre-pixel-defining film 119p during the etching process of the second pre-pixel-defining film 119pb. A top surface of the planarization layer 117 may have the stepped portion ST between the first portion 117a and the second portion 117b due to the pre-pixel-defining film 119p. The planarization layer 117 and the pixel-defining film 119 may have the same etched surface which is formed in the same etching process. Because the planarization layer 117 corresponding to the peripheral area PA is not protected by the pre-pixel-defining film 119p during the etching process, the planarization layer 117 corresponding to the peripheral area PA may be removed.

FIGS. 15A through 15G are cross-sectional views sequentially illustrating a method of manufacturing a display apparatus according to an embodiment. In detail, FIGS. 15A through 15G are cross-sectional views sequentially illustrating a method of manufacturing a display apparatus according to an embodiment based on FIG. 11. In FIGS. 15A through 15G, the same elements as those in FIGS. 11 and 13A through 13G are denoted by the same reference numerals, and thus a repeated description thereof will be omitted.

Figure 15A:
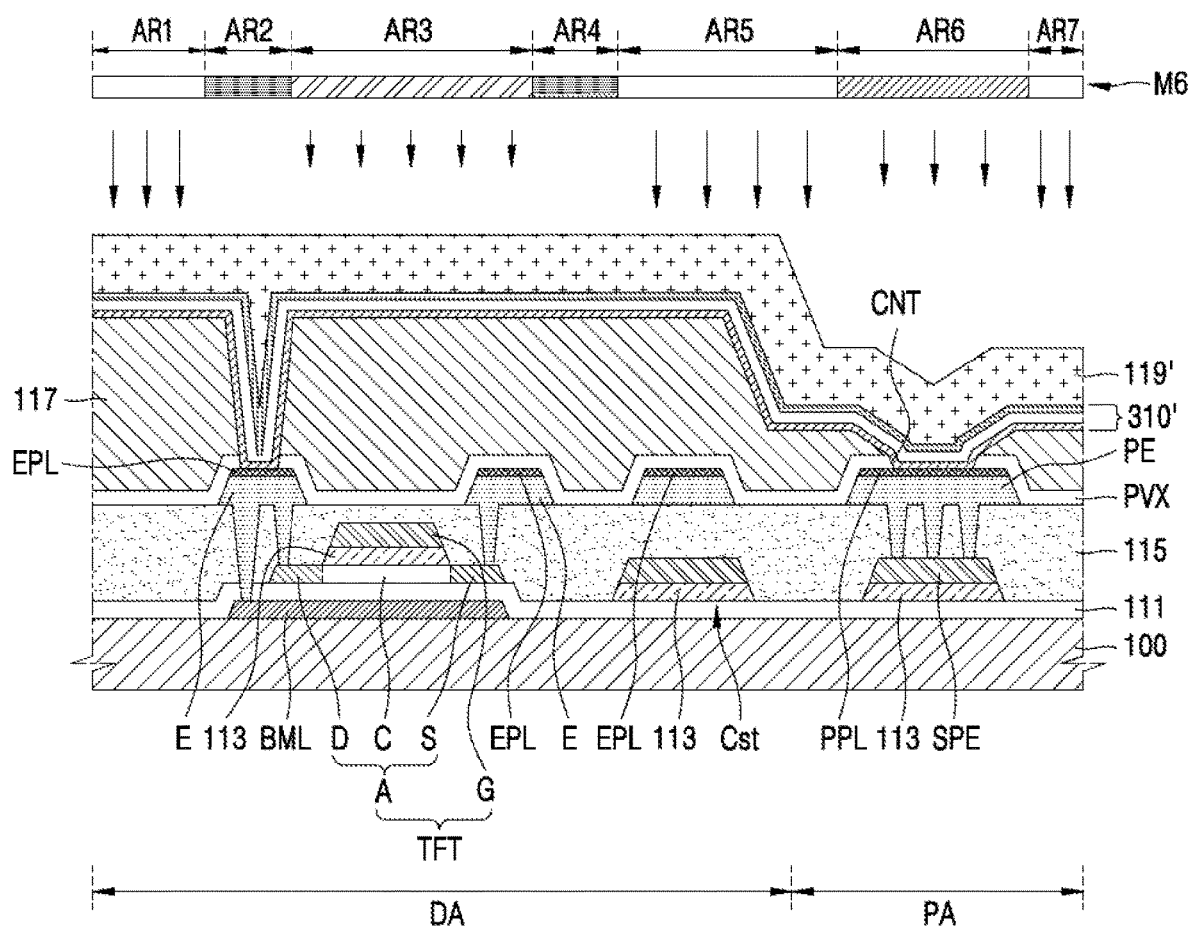
FIGS. 15A through 15G are cross-sectional views sequentially illustrating a method of manufacturing a display apparatus according to an embodiment of the present inventive concept.

Referring to FIG. 15A, the pixel electrode material layer 310' and the pixel-defining film material layer 119' are sequentially formed on the planarization layer 117. Before the pixel electrode material layer 310' and the pixel-defining film material layer 119' are sequentially formed, a process of forming the thin-film transistor TFT, the pad electrode PE, and the planarization layer 117 may be the same as that of FIGS. 14A through 14D.

Figure 15B:
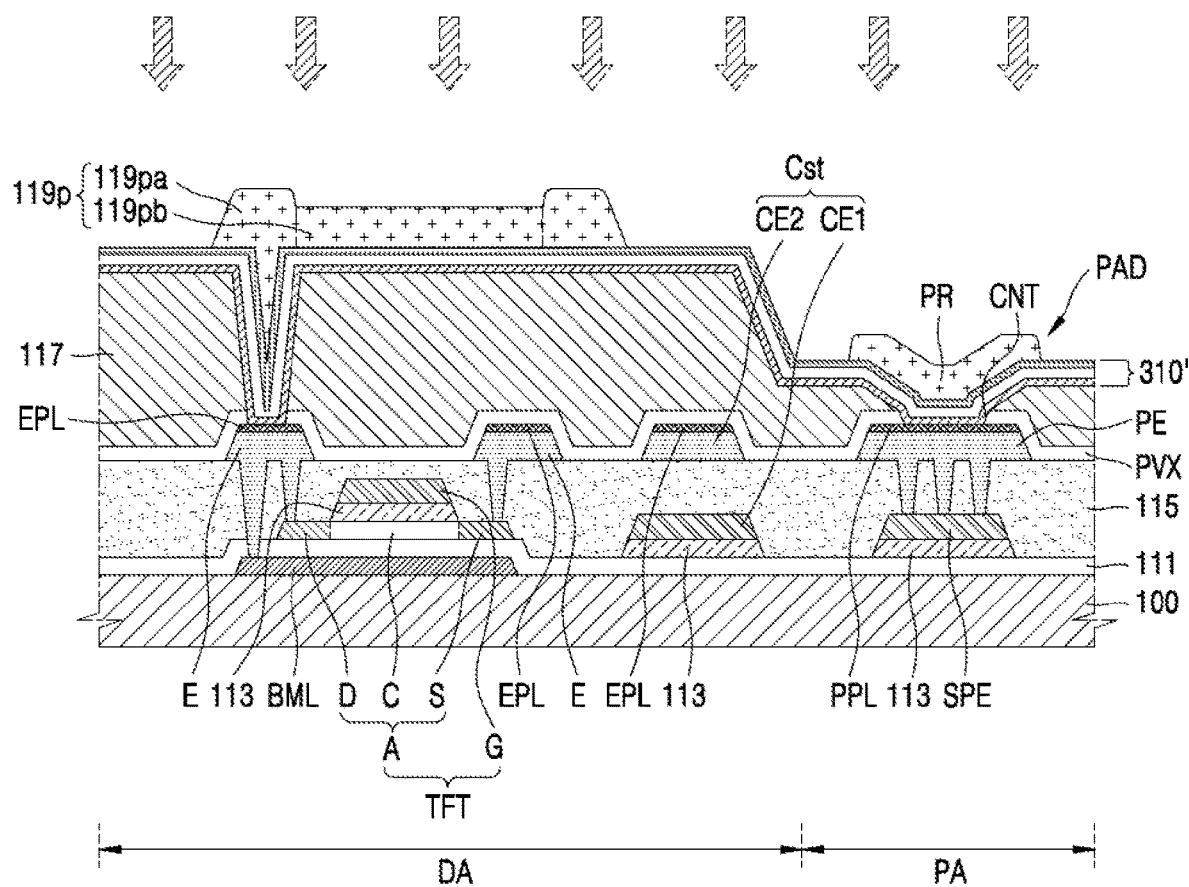
Figure 15C:
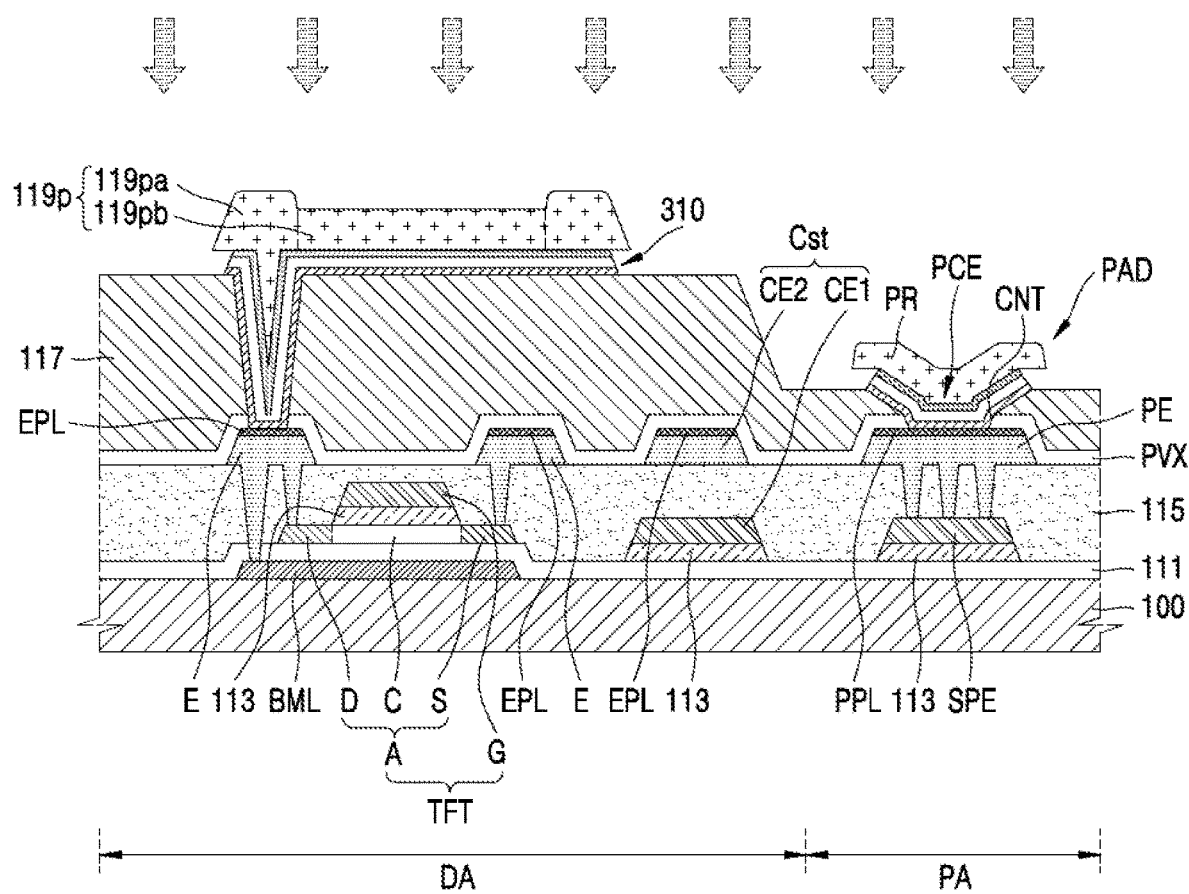
Figure 15D:
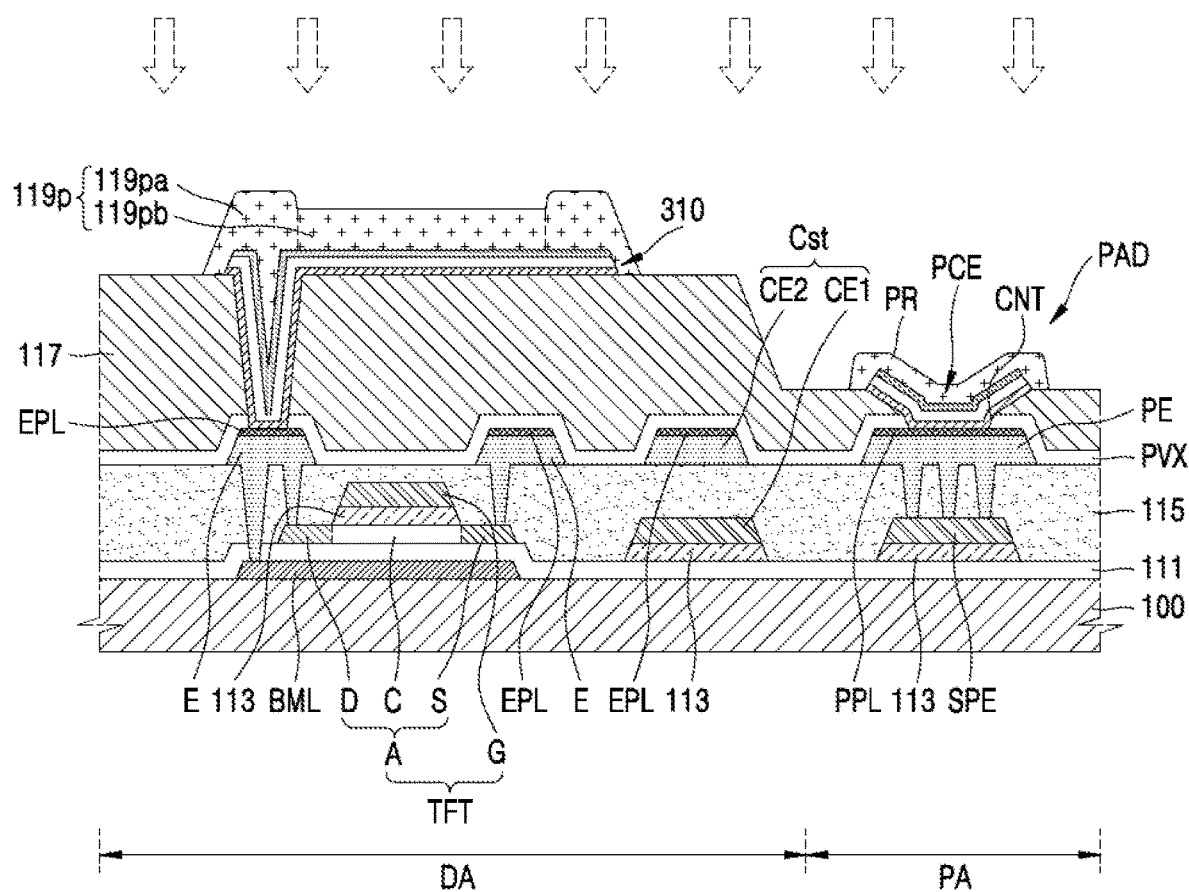

Referring to FIGS. 15A through 15G, the pre-pixel-defining film 119p and the photoresist pattern PR having different thicknesses according to areas may be formed at one time through a sixth mask M6 located over the pixel-defining film material layer 119' (see FIG. 15B). Next, the pixel electrode material layer 310' is etched by using the pre-pixel-defining film 119p and the photoresist pattern PR formed on the pixel electrode material layer 310', to form the pixel electrode 310 and the pad connection electrode PCE (see FIGS. 15B and 15C). The pre-pixel-defining film 119p may surround a side surface of the pixel electrode 310 by performing a curing process on the pre-pixel-defining film 119p (see FIGS. 15C and 15D). An etching process for removing the photoresist pattern PR is performed (see FIG. 15E).

Figure 15E:
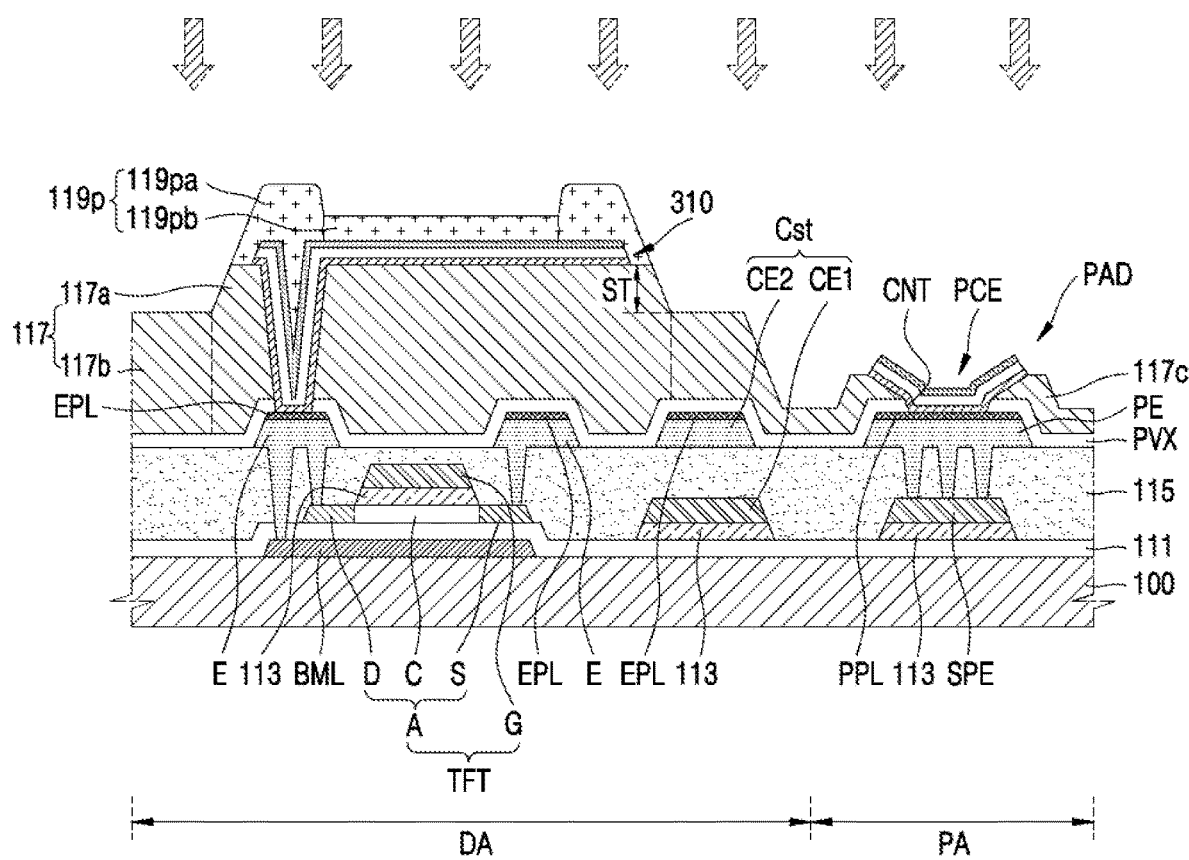

The planarization layer 117 may have the stepped portion ST during the etching process. A portion of the third portion 117c of the planarization layer 117 corresponding to the peripheral area PA which is not protected by the photoresist pattern PR is removed. In contrast, a portion of the third portion 117c of the planarization layer 117 corresponding to the peripheral area PA which is protected by the photoresist pattern PR remains. As shown in FIG. 15E, the photoresist pattern PR may be entirely etched and removed during the etching process. Etching of a part of the third portion 117c of the planarization layer 117 and removing of the photoresist pattern PR may be simultaneously performed.

Figure 15F:
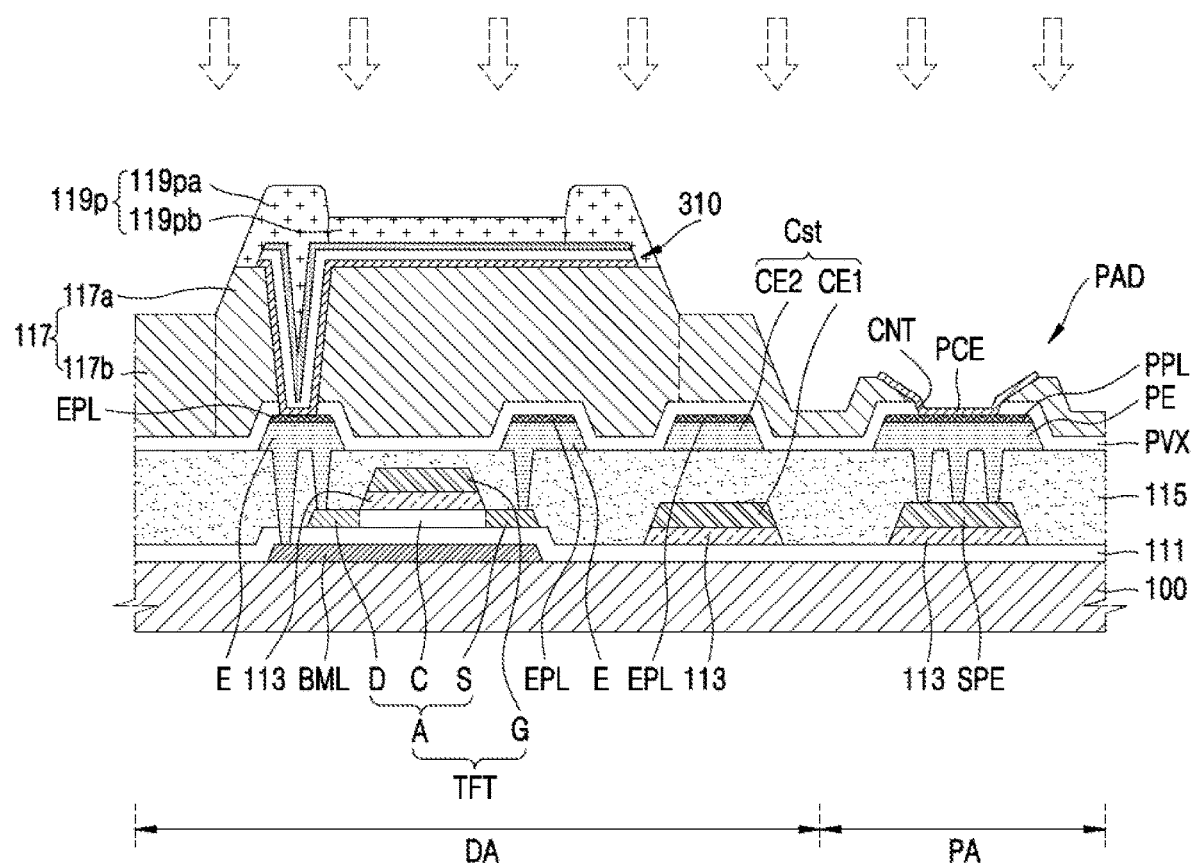
Figure 15G:
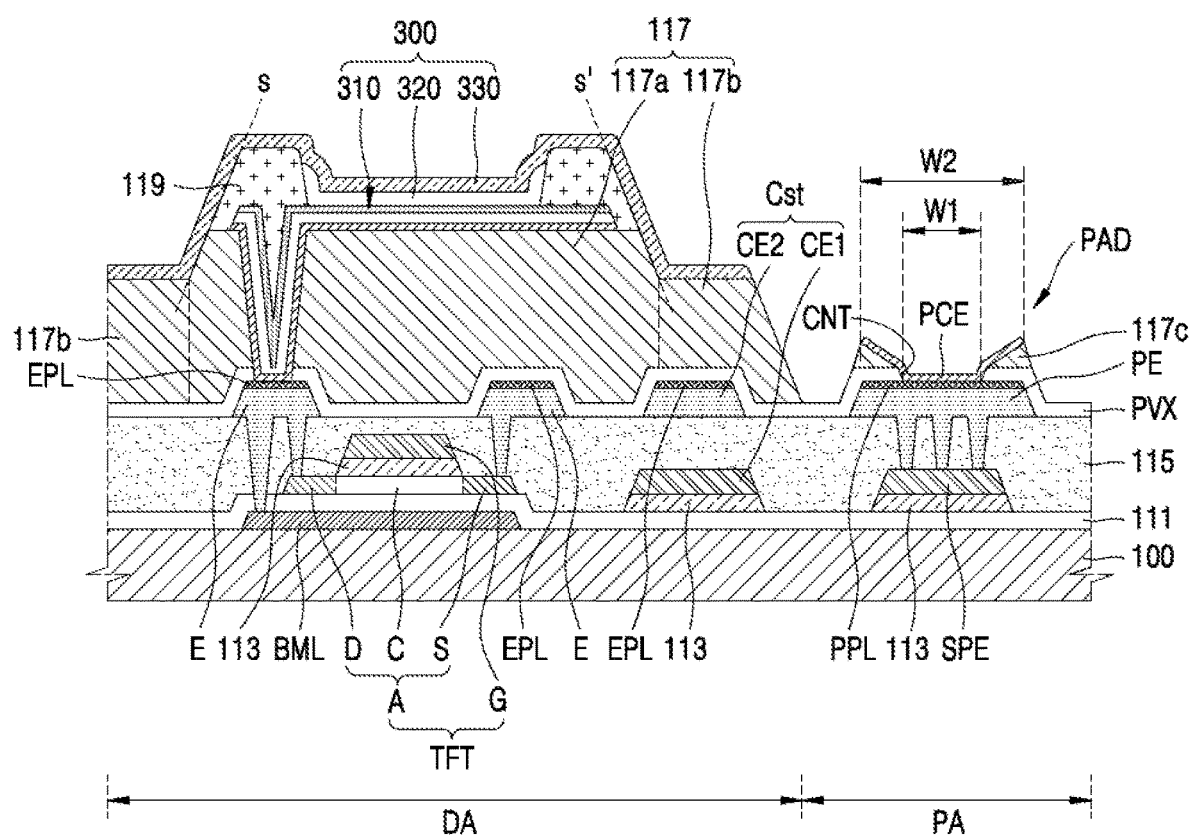

Next, an etching process may be performed so that the pad connection electrode PCE has a single film in a state where the pre-pixel-defining film 119p is not removed (see FIGS. 15E and 15F). An etching process for removing the second pre-pixel-defining film 119pb is performed to expose a part of the pixel electrode 310 (see FIGS. 15F and 15G). The pixel-defining film 119 may be formed by removing the second pre-pixel-defining film 119pb. Detailed information has been described with reference to FIGS. 13A through 13G, and thus a repeated description will be omitted in FIGS. 15A through 15G.

Figure 16:
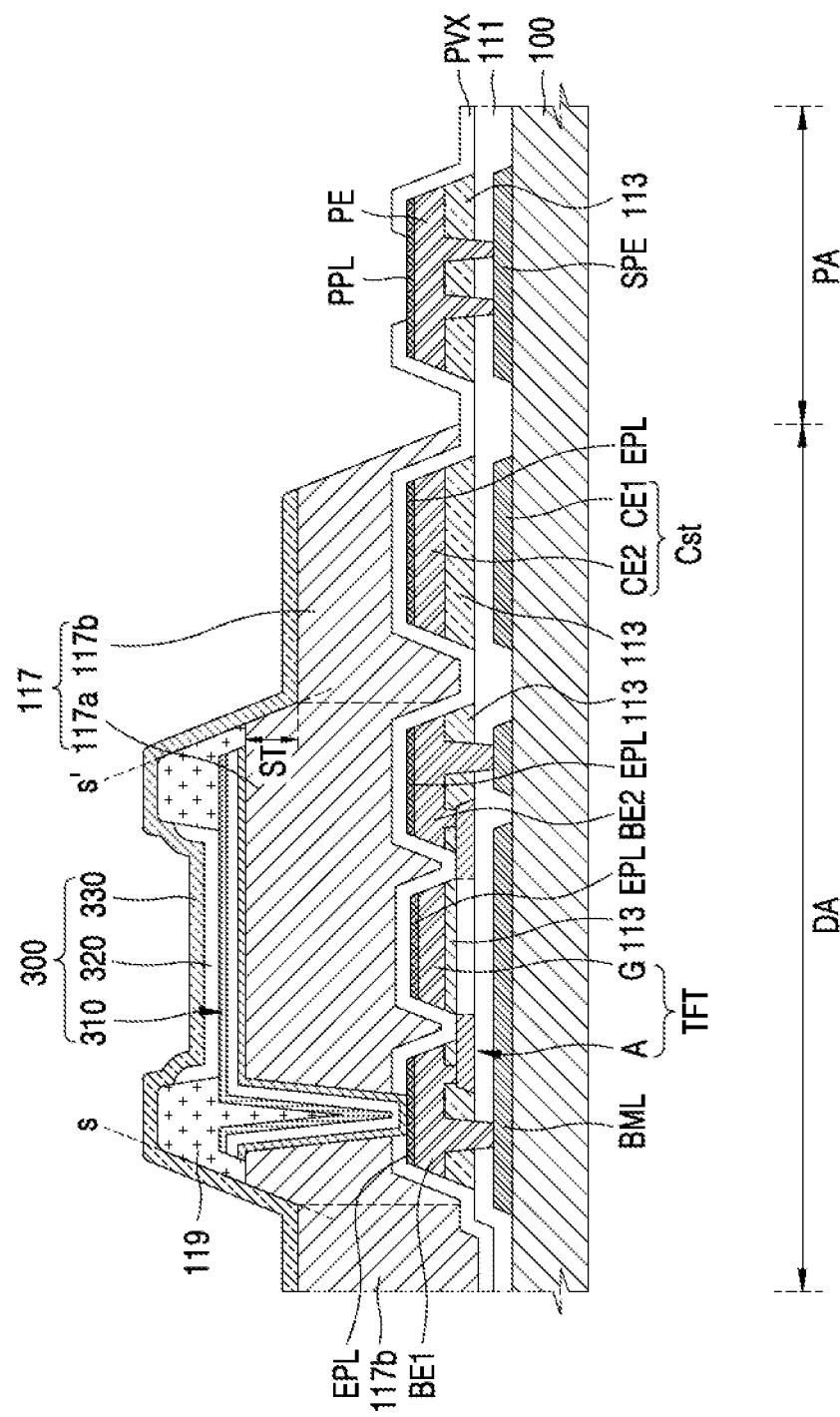
FIG. 16 is a cross-sectional view of a display apparatus according to an embodiment of the present inventive concept.
Figure 17:
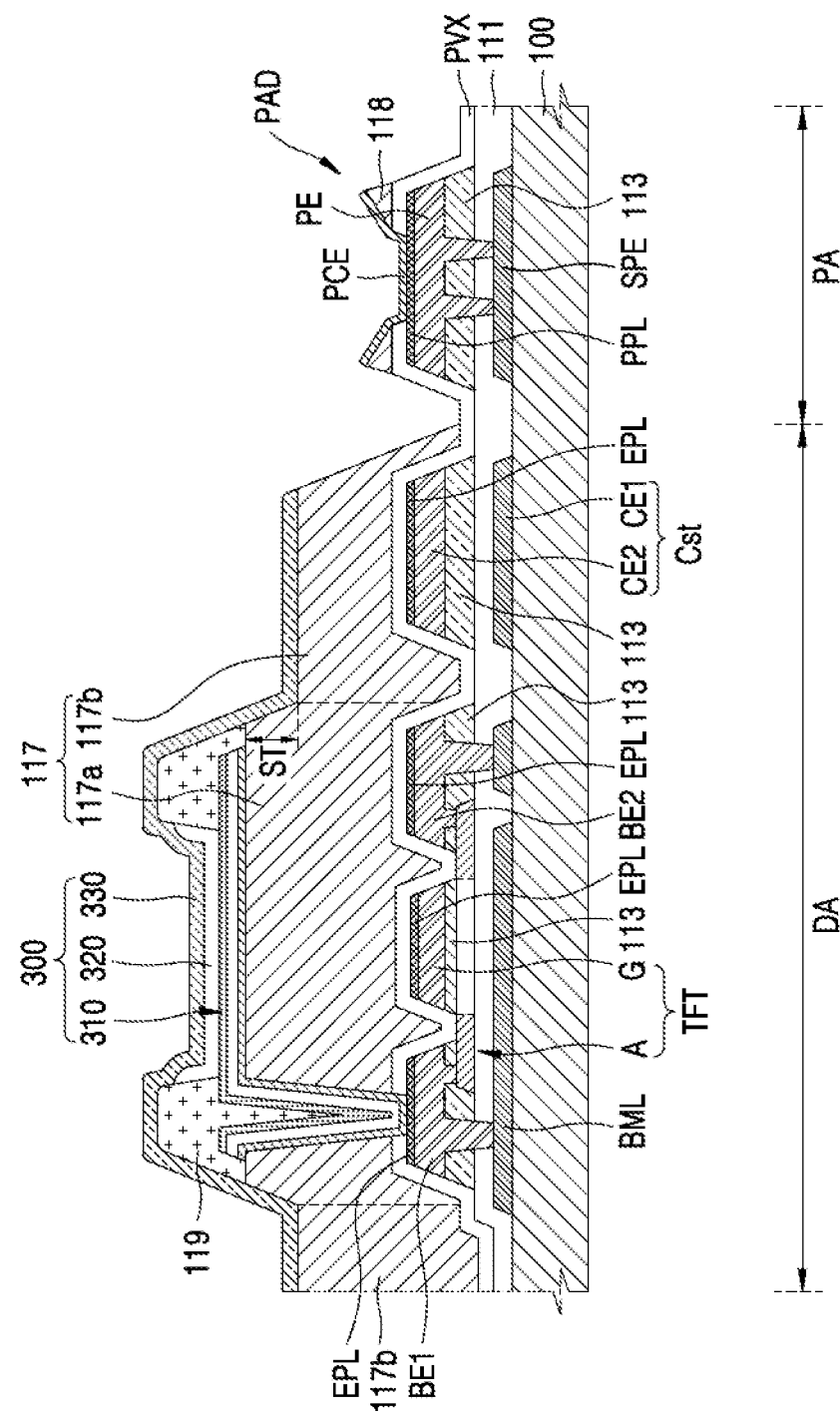
FIG. 17 is a cross-sectional view of a display apparatus according to an embodiment of the present inventive concept.

FIGS. 16 and 17 are cross-sectional views of a display apparatus according to an embodiment. FIGS. 16 and 17 correspond to a modified embodiment of FIGS. 9 and 11. In FIGS. 16 and 17, the same elements as those in FIGS. 9 and 11 are denoted by the same reference numerals, and thus a repeated description thereof will be omitted.

Referring to FIG. 16, the display apparatus 1 (see FIG. 1) includes the thin-film transistor TFT which is located on the display area DA of the substrate 100, and the pad unit PAD which is located on the peripheral area PA of the substrate 100. The display apparatus 1 includes the planarization layer 117 as an insulating layer located on the thin-film transistor TFT and exposing the pad unit PAD, and the planarization layer 117 includes the first portion 117a, the second portion 117b, and the third portion between the first portion 117a and the second portion 117b. A top surface of the planarization layer 117 may have the stepped portion ST between the first portion 117a and the second portion 117b.

The pixel-defining film 119 may be located on the planarization layer 117. A side surface of the planarization layer 117 and a side surface of the pixel-defining film 119 may be etched surfaces on the same plane. A side surface of the first portion 117a of the planarization layer 117 and a side surface of the pixel-defining film 119 may be etched surfaces on the same plane.

Elements included in the display apparatus 1 will be described in detail according to a stacked structure with reference to FIG. 16.

The buffer layer 111 may be located on the substrate 100. A barrier layer (not shown) may be further provided between the substrate 100 and the buffer layer 111. The conductive layer BML, the electrode layer E, the first electrode CE1 of the storage capacitor Cst, and the auxiliary pad electrode SPE may be located between the substrate 100 and the buffer layer 111. Unlike in FIGS. 9 and 11, the electrode layer E and the conductive layer BML are not located on different layers. Because the conductive layer BML, the electrode layer E, the first electrode CE1, and the auxiliary pad electrode SPE are located on the same layer, the conductive layer BML, the electrode layer E, the first electrode CE1 of the storage capacitor Cst, and the auxiliary pad electrode SPE may be simultaneously formed by patterning one metal layer. Accordingly, the number of masks for manufacturing the display apparatus 1 may be reduced.

The semiconductor layer A may be located on the buffer layer 111. The gate insulating layer 113 may be located on the semiconductor layer A. As shown in FIG. 16, the gate insulating layer 113 may be patterned to overlap a part of the semiconductor layer A.

The gate electrode G may be located on the gate insulating layer 113 to at least partially overlap the semiconductor layer A. A first bridge electrode BE1, a second bridge electrode BE2, the second electrode CE2 of the storage capacitor Cst, and the pad electrode PE may be located on the gate insulating layer 113.

The first bridge electrode BE1 may be connected to the conductive layer BML and the semiconductor layer A through contact holes respectively formed in the gate insulating layer 113 and the buffer layer 111. The conductive layer BML and the semiconductor layer A may be electrically connected to each other through the first bridge electrode BE1.

The second bridge electrode BE2 may be connected to the electrode layer E and the semiconductor layer A through contact holes respectively formed in the gate insulating layer 113 and the buffer layer 111. The electrode layer E and the semiconductor layer A may be electrically connected to each other through the second bridge electrode BE2.

The first electrode CE1 and the second electrode CE2 of the storage capacitor Cst may overlap each other with the gate insulating layer 113 and the buffer layer 111 therebetween. The gate insulating layer 113 and the buffer layer 111 may each function as a dielectric layer of the storage capacitor Cst. Although the second electrode CE2 of the storage capacitor Cst includes the same material as that of the gate electrode G in FIG. 16, the second electrode CE2 of the storage capacitor Cst may include or may be formed of the same material as that of the semiconductor layer A. The second electrode CE2 of the storage capacitor Cst and the semiconductor layer A may be located on the same layer.

The electrode protective layer EPL may be located on the gate electrode G, the first bridge electrode BE1, the second bridge electrode BE2, and the second electrode CE2 of the storage capacitor Cst, and the pad protective layer PPL may be located on the pad electrode PE.

The gate electrode G, the first bridge electrode BE1, the second bridge electrode BE2, and the second electrode CE2 of the storage capacitor Cst, and the pad electrode PE may be covered by the inorganic protective layer PVX.

The planarization layer 117 is located on the inorganic protective layer PVX, and has a contact hole for connecting the thin-film transistor TFT to the pixel electrode 310. The planarization layer 117 may expose the pad unit PAD. For example, the planarization layer 117 is not disposed on the peripheral area PA, and does not overlap the pad unit PAD.

The light-emitting device 300 is located on the planarization layer 117. The light-emitting device 300 includes the pixel electrode 310, the intermediate layer 320 including an organic emission layer, and the counter electrode 330.

The pixel-defining film 119 may be located on the planarization layer 117. The pixel-defining film 119 may cover an edge of the pixel electrode 310 and may have an opening through which a part of the pixel electrode 310 is exposed. The planarization layer 117 and the pixel-defining film 119 may have the same etched surfaces s and s' which may be formed in the same etching process.

In an embodiment, as shown in FIG. 17, the pad connection electrode PCE may be located on the pad electrode PE. The display apparatus 1 may further include the insulating layer 118 located on the inorganic protective layer PVX corresponding to the peripheral area PA and including or being formed of the same material as that of the planarization layer 117. The insulating layer 118 may be located between the pad electrode PE and the pad connection electrode PCE, and may at least partially overlap the pad connection electrode PCE. A surface of the insulating layer 118 overlapping the pad connection electrode PCE may be inclined.

To manufacture the display apparatus 1 according to an embodiment of FIGS. 16 and 17 is manufactured, a method of manufacturing a display apparatus of FIGS. 14B through 14I and 15A through 15G may be used.

Figure 18:
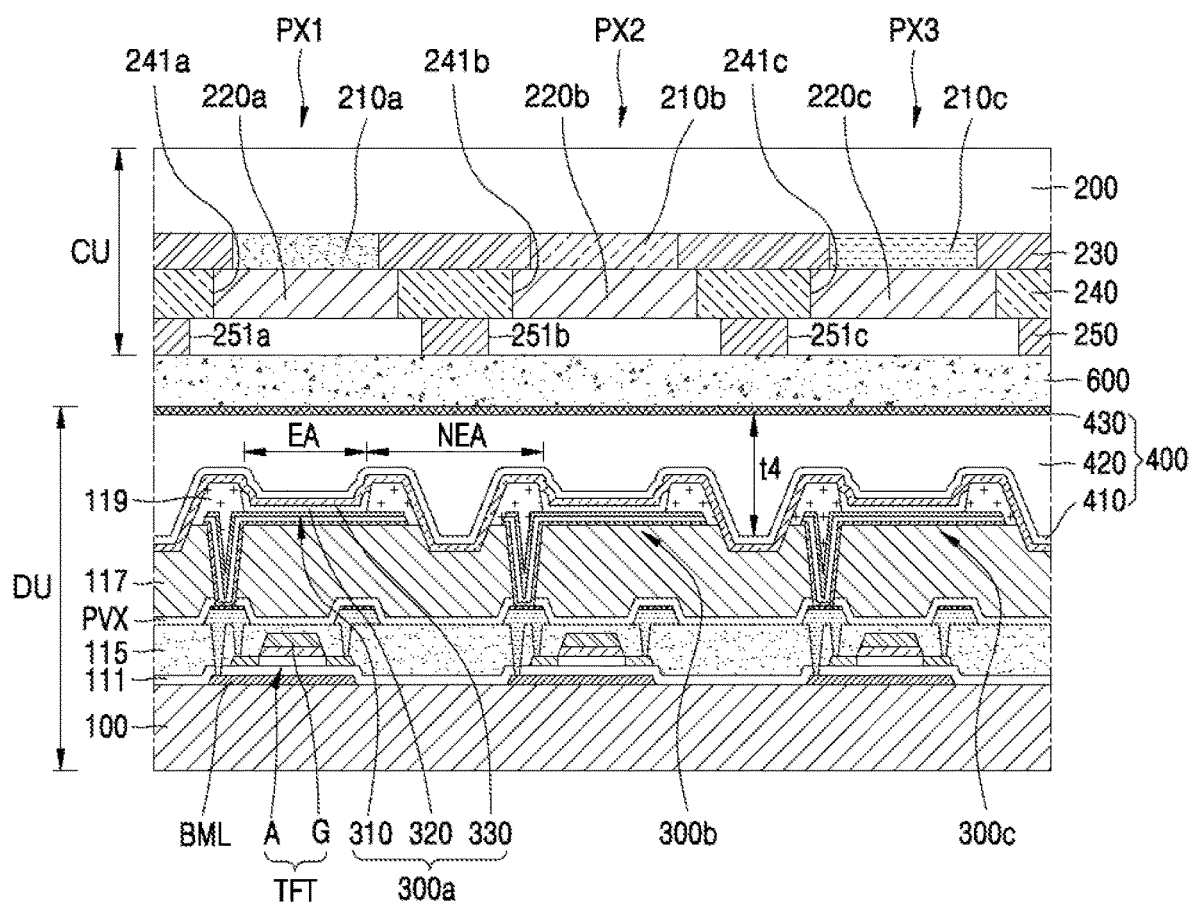
FIG. 18 is a cross-sectional view of a display apparatus according to an embodiment of the present inventive concept.

FIG. 18 is a cross-sectional view of a display apparatus according to an embodiment. In FIG. 18, the same elements as those in FIG. 9 are denoted by the same reference numerals, and thus a repeated description thereof will be omitted.

Referring to FIG. 18, at least one thin-film transistor TFT and a display device connected to the at least one thin-film transistor TFT may be disposed on the display area DA of the display apparatus 1 (see FIG. 1) according to an embodiment.

The display apparatus 1 according to the present embodiment includes first through third pixels PX1, PX2, and PX3 in the display area DA. However, this is merely an example, and the display apparatus 1 may include more pixels. Although the first through third pixels PX1, PX2, and PX3 are adjacent to one another in FIG. 18, the present disclosure is not limited thereto. Elements such as other wirings may be located between the first through third pixels PX1, PX2, and PX3. Accordingly, for example, the first pixel PX1 and the second pixel PX2 are not adjacent to each other. In FIG. 18, cross-sections of the first through third pixels PX1, PX2, and PX3 are not cross-sections in the same direction.

Each of the first through third pixels PX1, PX2, and PX3 includes an emission area EA. The emission area EA may be an area where light is generated and is emitted to the outside. A non-emission area NEA may be located between the emission areas EA, and the emission areas EA may be divided by the non-emission area NEA.

The first through third pixels PX1, PX2, and PX3 may emit light of different colors. For example, the first pixel PX1 may emit red light, the second pixel PX2 may emit green light, and the third pixel PX3 may emit blue light. In a plan view, the emission areas EA may have any of various polygonal shapes or a circular shape, and may be arranged in any of various patterns such as a stripe pattern or a pentile pattern.

The display apparatus 1 according to the present embodiment may include the first quantum dot layer 220a, the second quantum dot layer 220b, and the transmitting layer 220c to respectively correspond to the emission areas EA. The first quantum dot layer 220a, the second quantum dot layer 220b, and the transmitting layer 220c may include quantum dots and metal nano-particles.

For example, the first pixel P1 may include the first quantum dot layer 220a, the second pixel PX2 may include the second quantum dot layer 220b, and the third pixel PX3 may include the transmitting layer 220c.

In the present embodiment, average sizes of quantum dots included in the first quantum dot layer 220a and the second quantum dot layer 220b may be different from each other.

The display apparatus 1 according to an embodiment will be described in detail according to a stacking order of FIG. 18.

The substrate 100 (hereinafter, referred to as lower substrate) may include a glass material, a ceramic material, a metal material, or a flexible or bendable material. A barrier layer (not shown) may be further provided between the lower substrate 100 and the buffer layer 111.

The conductive layer BML may be located on the lower substrate 100, and the semiconductor layer A may be located on the buffer layer 111. The gate electrode G may be located on the semiconductor layer A to at least partially overlap the semiconductor layer A, with the gate insulating layer 113 therebetween.

The interlayer insulating layer 115 may cover the gate electrode G. A source electrode and a drain electrode may be located on the interlayer insulating layer 115.

The planarization layer 117 may be located on the source electrode and the drain electrode, and the first through third light-emitting devices 300a, 300b, and 300c may be located on the planarization layer 117. Each of the first through third light-emitting devices 300a, 300b, and 300c commonly includes the pixel electrode 310, the intermediate layer 320 including an organic emission layer, and the counter electrode 330.

The pixel-defining film 119 may be located on the planarization layer 117. In an embodiment, as shown in FIG. 18, the planarization layer 117 and the pixel-defining film 119 may have the same etched surfaces s and s' which are formed in the same etching process. The planarization layer 117 and the pixel-defining film 119 may be simultaneously formed by using the same etching process, and may include the same etched surfaces s and s'. A part of the planarization layer 117 may be etched by using the pixel-defining film 119 as a mask, and an outer surface of the pixel-defining film 119 and a side surface of the planarization layer 117 may be located on the etched surfaces s and s' which are coplanar with each other. An outer surface of the pixel-defining film 119 and a side surface of the first portion 117a of the planarization layer 117 may be located on the etched surfaces s and s' which are coplanar with each other.

When the pixel-defining film 119 and the first portion 117a of the planarization layer 117 have the etched surfaces s and s' which are coplanar with each other, the pixel-defining film 119 may be disposed on the first portion 117a. In an embodiment, the pixel-defining film 119 may be disposed on the first portion 117a, and is not disposed on the second portion 117b. A portion of the pixel-defining film 119 corresponding to the second portion 117b may be removed. An insulating layer formed of an organic material may be removed by an amount corresponding to a value obtained by adding a thickness t of the pixel-defining film 119 to the stepped portion ST of the planarization layer 117. Because the pixel-defining film 119 and the planarization layer 117 adjacent to the light-emitting device 300 are partially removed, a volume of an organic material in the display apparatus 1 may be reduced and outgassing of the organic material may be minimized. Accordingly, even when the display apparatus 1 is exposed to sunlight for a long time, decomposition of the organic material due to the sunlight may be prevented or minimized, thereby preventing defects such as pixel shrinkage due to outgassing. The reliability of the display apparatus 1 may be improved.

Because the first through third light-emitting devices 300a, 300b, and 300c may be easily damaged by external moisture or oxygen, the first through third light-emitting devices 300a, 300b, and 300c may be covered and protected by the thin-film encapsulation layer 400. The thin-film encapsulation layer 400 may cover the display area DA and may extend to the outside of the display area DA. The thin-film encapsulation layer 400 includes at least one organic encapsulation layer and at least one inorganic encapsulation layer. For example, the thin-film encapsulation layer 400 may include the first inorganic encapsulation layer 410, the organic encapsulation layer 420, and the second inorganic encapsulation layer 430.

The first inorganic encapsulation layer 410 may cover the counter electrode 330 and may include silicon oxide, silicon nitride, and/or silicon trioxynitride. Although not shown in FIG. 18, other layers such as a capping layer may be located between the first inorganic encapsulation layer 410 and the counter electrode 330 when necessary. Because the first inorganic encapsulation layer 410 is formed along a structure under the first inorganic encapsulation layer 410, a top surface of the first inorganic encapsulation layer 410 is not flat. The organic encapsulation layer 420 covers the first inorganic encapsulation layer 410, and unlike the first inorganic encapsulation layer 410, the organic encapsulation layer 420 may have a substantially flat top surface.

Even when cracks occur in the thin-film encapsulation layer 400, the cracks are not connected with each other between the first inorganic encapsulation layer 410 and the organic encapsulation layer 420 or between the organic encapsulation layer 420 and the second inorganic encapsulation layer 430 due to the multi-layer structure. Accordingly, the formation of a path through which external moisture or oxygen penetrates into the display area DA may be prevented or minimized.

As described above, an insulating layer formed of an organic material may be removed from a portion corresponding to the second portion 117b of the planarization layer 117. The organic encapsulation layer 420 may be further located as much as the insulating layer is removed. Because a thickness t4 of the organic encapsulation layer 420 may be increased by an amount by which the insulating layer is removed, it is difficult for a foreign material introduced from the outside to reach the counter electrode 330, thereby preventing degradation of the light-emitting device 300. A problem that the thin-film encapsulation layer 400 is damaged by the foreign material introduced from the outside and the light-emitting device 300 is degraded due to damage to the thin-film encapsulation layer 400 may be prevented.

The upper substrate 200 may be located over the lower substrate 100, and the counter electrode 330 may be located between the upper substrate 200 and the lower substrate 100. The upper substrate 200 may include glass, metal, or a polymer resin. When the upper substrate 200 is flexible or bendable, the upper substrate 200 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the upper substrate 200 may have a multi-layer structure including two layers each including a polymer resin and a barrier layer including an inorganic material such as silicon oxide, silicon nitride, or silicon oxynitride and located between the two layers.

A light-shielding layer 230 is located on a bottom surface of the upper substrate 200 facing the lower substrate 100. The light-shielding layer 230 has openings respectively corresponding to the first through third light-emitting devices 300a, 300b, and 300c, and the first through third filter layers 210a, 210b, and 210c are respectively located in the openings. The light-shielding layer 230 that is a black matrix may be a layer for improving color sharpness and contrast. The light-shielding layer 230 may include at least one of a black pigment, a black dye, and black particles. In some embodiments, the light-shielding layer 230 may include a material such as Cr or $CrO_X$, $Cr/CrO_X$, $Cr/CrO_X/CrN_Y$, a resin (carbon pigment or RGB mixed pigment), graphite, or a non-Cr based material.

The first filter layer 210a may pass therethrough only light having a wavelength ranging from about 630 nm to about 780 nm, the filter layer 210b may pass therethrough only light having a wavelength ranging from about 495 nm to about 570 nm, and the filter layer 210c may pass therethrough only light having a wavelength ranging from about 450 nm to about 495 nm. The first through third filter layers 210a, 210b, and 210c may reduce reflection of external light in the display apparatus 1.

A first upper insulating layer 240 is located on the light-shielding layer 230. The first upper insulating layer 240 has a 1-1$^{th}$ opening 241a corresponding to the first light-emitting device 300a, a 1-2$^{th}$ opening 241b corresponding to the second light-emitting device 300b, and a 1-3$^{th}$ opening 241c corresponding to the third light-emitting device 300c. The first quantum dot layer 220a is located in the 1-1$^{th}$ opening 241a, the second quantum dot layer 220b is located in the 1-2$^{th}$ opening 241b, and the transmitting layer 220c is located in the 1-3$^{th}$ opening 241c. The first quantum dot layer 220a and the second quantum dot layer 220b may be formed by using inkjet printing.

The first upper insulating layer 240 may include, for example, an organic material. When necessary, the first upper insulating layer 240 may include a light-shielding material to function as a light-shielding layer. The light-shielding material may include at least one of, for example, a black pigment, a black dye, black particles, and metal particles. In an embodiment, the first upper insulating layer 240 may have a blue color.

The first quantum dot layer 220a may convert light of a first wavelength band generated by the intermediate layer 320 on the pixel electrode 310 into light of a second wavelength band. For example, when light having a wavelength ranging from about 450 nm to about 495 nm is generated by the intermediate layer 320 on the pixel electrode 310, the first quantum dot layer 220a may convert the light into light having a wavelength ranging from about 630 nm to about 780 nm. Accordingly, in the first pixel PX1, the light having the wavelength ranging from about 630 nm to about 780 nm is emitted through the upper substrate 200 to the outside.

The second quantum dot layer 220b may convert light of the first wavelength band generated by the intermediate layer 320 on the pixel electrode 310 into light of a third wavelength band. For example, when light having a wavelength ranging from about 450 nm to about 495 nm is generated by the intermediate layer 320 on the pixel electrode 310, the second quantum dot layer 220 may convert the light into light having a wavelength ranging from about 495 nm to about 570 nm. Accordingly, in the second pixel PX2, the light having the wavelength ranging from about 495 nm to about 570 nm is emitted through the upper substrate 200 to the outside.

Each of the first quantum dot layer 220a and the second quantum dot layer 220b may be formed by dispersing quantum dots in a resin. The quantum dots include a semiconductor material such as cadmium sulfide (CdS), cadmium telluride (CdTe), zinc sulfide (ZnS), or indium phosphide (InP). The quantum dots may have a size of several nanometers, and a wavelength of light after conversion varies according to the size of the quantum dots. Any light-transmitting material may be used as the resin of the first quantum dot layer 220a and the second quantum dot layer 220b. For example, a polymer resin such as acryl, benzocyclobutene (BCB), or hexamethyldisiloxane (HMDSO) may be used as a material for forming the first quantum dot layer 220a and the second quantum dot layer 220b.

In the third pixel PX3, light having a first wavelength generated by the intermediate layer 320 may be emitted to the outside without wavelength conversion. Accordingly, the third pixel PX3 does not include a quantum dot layer. Because a quantum dot layer is not required in the 1-3$^{th}$ opening 241c, the transmitting layer 220c formed of a light-transmitting resin may be located in the 1-3$^{th}$ opening 241c. The transmitting layer 220c may include acryl, BCB, or HMDSO. When necessary, unlike in FIG. 18, the transmitting layer 220c is not located in the 1-3$^{th}$ opening 241c.

In the display apparatus 1 according to the present embodiment, light of the second wavelength band is emitted to the outside in the first pixel PX1, light of the third wavelength band is emitted to the outside in the second pixel PX2, and light of the first wavelength band is emitted to the outside in the third pixel PX3. Accordingly, the display apparatus 1 according to the present embodiment may display a full-color image.

A second upper insulating layer 250 is located on the first upper insulating layer 240. The second upper insulating layer 250 has a 2-1$^{th}$ opening 251a corresponding to the 1-1$^{th}$ opening 241a, a 2-2$^{th}$ opening 251b corresponding to the 1-2$^{th}$ opening 241b, and a 2-3$^{th}$ opening 251c corresponding to the 1-3$^{th}$ opening 241c.

The first quantum dot layer 220a and the second quantum dot layer 220b respectively located in the 1-1$^{th}$ opening 241a and the 1-2$^{th}$ opening 241b may be formed by using inkjet printing, and the 2-1$^{th}$ opening 251a and the 2-2$^{th}$ opening 251b may be paths through which ink sprayed via a nozzle falls and moves during the inkjet printing. The ink moving through the second upper insulating layer 250 including the 2-1$^{th}$ opening 251a and the 2-2$^{th}$ opening 251b may reach the 1-1$^{th}$ opening 241a and the 1-2$^{th}$ opening 241b, to form the first quantum dot layer 220a and the second quantum dot layer 220b.

The second upper insulating layer 250 may include a light-shielding material. For example, the light-shielding material may include at least one of a black pigment, a black dye, black particles, and metal particles. In an embodiment, the second upper insulating layer 250 may have a blue color. Although the first upper insulating layer 240 may also include a light-shielding material as described above, in order to form the first quantum dot layer 220a and the second quantum dot layer 220b by using inkjet printing, materials of the first upper insulating layer 240 and the second upper insulating layer 250 may be different from each other.

For example, the second upper insulating layer 250, which is a path through which ink sprayed via a nozzle moves during inkjet printing, may include a material having no affinity for the ink. The first upper insulating layer 240 in which the first quantum dot layer 220a and the second quantum dot layer 220b are formed by accumulating ink may include a material having affinity for the ink.

Although both the first upper insulating layer 240 and the second upper insulating layer 250 are illustrated in FIG. 18, the second upper insulating layer 250 may be omitted and only the first upper insulating layer 240 may be located on the upper substrate 200.

A filler 600 may be further located between the lower substrate 100 and the upper substrate 200. The filler 600 may function as a buffer against external pressure, etc. The filler 600 may include an organic material such as methyl silicone, phenyl silicone, or polyimide. However, the present disclosure is not limited thereto, and the filler 600 may include an organic sealant such as a urethane-based resin, an epoxy-based resin, or an acrylic resin, or an inorganic sealant such as silicon.

Figure 19:
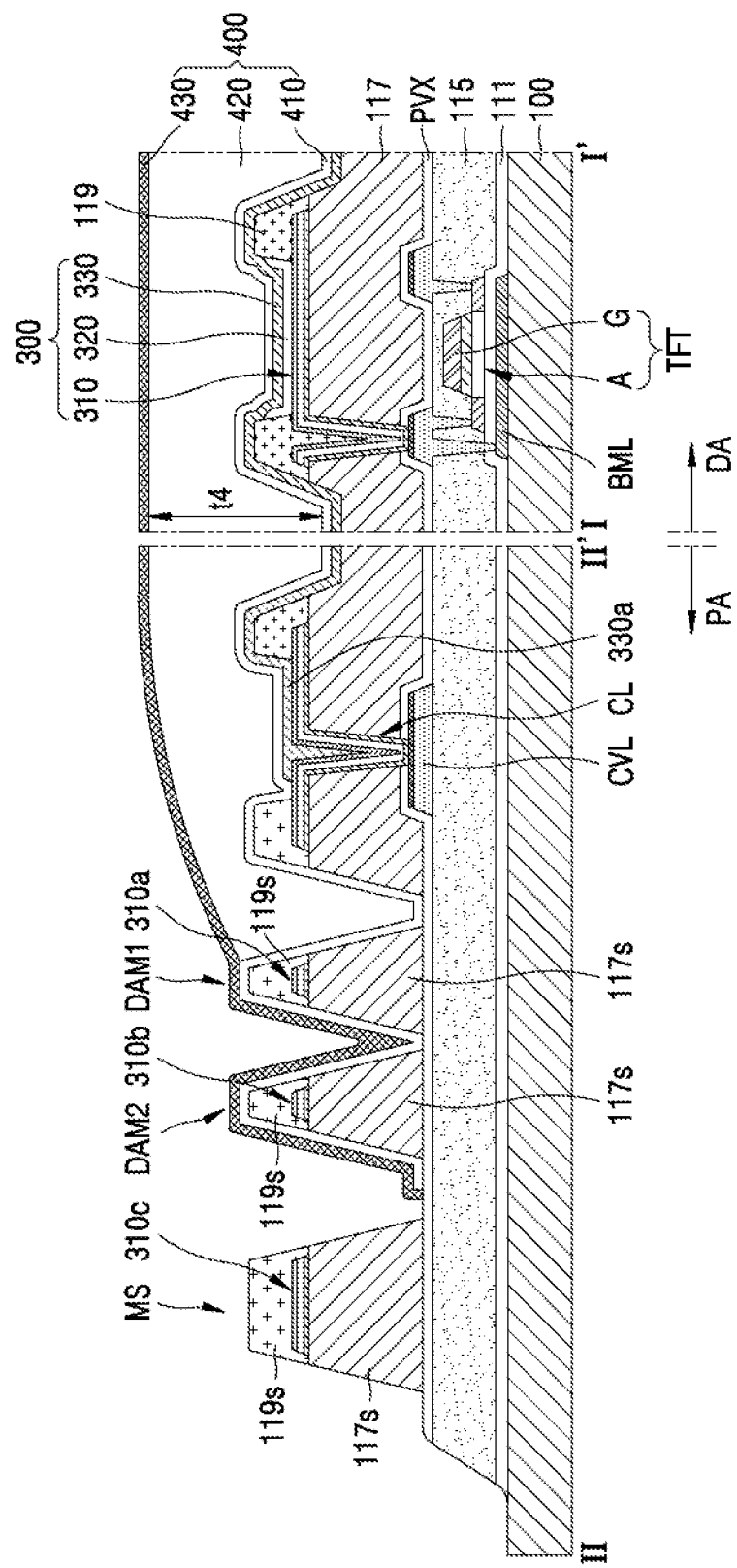
FIG. 19 is a cross-sectional view of a display apparatus according to an embodiment of the present inventive concept.

FIG. 19 is a cross-sectional view of a display apparatus according to an embodiment. In detail, FIG. 19 is a cross-sectional view of the display apparatus of FIG. 1, taken along lines I-I' and In FIG. 19, the same elements as those in FIG. 9 are denoted by the same reference numerals, and thus a repeated description thereof will be omitted.

Referring to FIG. 19, the display apparatus 1 includes the display area DA and the peripheral area PA. The substrate 100 may include portions corresponding to the display area DA and the peripheral area PA.

In the display area DA of FIG. 19, the conductive layer BML, the thin-film transistor TFT, and the light-emitting device 300 may be located on the substrate 100, which has been described in detail with reference to FIG. 9.

The thin-film encapsulation layer 400 may be located on the light-emitting device 300. The thin-film encapsulation layer 400 may cover the entire display area DA, and may extend to the peripheral area PA to cover a part of the peripheral area PA. The thin-film encapsulation layer 400 may extend to the outside of a common voltage supply line CVL.

The thin-film encapsulation layer 400 may include the first inorganic encapsulation layer 410, the second inorganic encapsulation layer 430, and the organic encapsulation layer 420 located between the first inorganic encapsulation layer 410 and the second inorganic encapsulation layer 430.

A part 330a of the counter electrode 330 may extend to the peripheral area PA and may overlap the common voltage supply line CVL. A connection wiring CL may be located between the part 330a of the counter electrode 330 and the common voltage supply line CVL. The connection wiring CL may electrically connect the common voltage supply line CVL to the counter electrode 330 to transmit a common voltage to the counter electrode 330.

Although not shown in FIG. 19, a driving circuit area may be disposed on the peripheral area PA. For example, a gate driving circuit unit may be located in the driving circuit area. The gate driving circuit unit may include thin-film transistors, and may include a wiring connected to the thin-film transistors.

The buffer layer 111, the interlayer insulating layer 115, and the inorganic protective layer PVX may extend to the peripheral area PA.

A first dam portion DAM1, a second dam portion DAM2, and a mask support MS may be located on the inorganic protective layer PVX corresponding to the peripheral area PA. The first dam portion DAM1, the second dam portion DAM2, and the mask support MS may surround an outer portion of the display area DA in a plan view. The first dam portion DAM1 may surround an outer portion of the display area DA, the second dam portion DAM2 may surround an outer portion of the first dam portion DAM1, and the mask support MS may surround an outer portion of the second dam portion DAM2.

The first dam portion DAM1 and the second dam portion DAM2 may prevent the organic encapsulation layer 420 of the thin-film encapsulation layer 400 from overflowing to the outside of the substrate 100. The mask support MS may support an open mask used to form the counter electrode 330, etc.

The first inorganic encapsulation layer 410 and the second inorganic encapsulation layer 430 of the thin-film encapsulation layer 400 may partially overlap the first dam portion DAM1 and the second dam portion DAM2. However, as shown in FIG. 19, the first inorganic encapsulation layer 410 and the second inorganic encapsulation layer 430 do not overlap the mask support MS.

Each of the first dam portion DAM1, the second dam portion DAM2, and the mask support MS may have a two-layer structure. Each of the first dam portion DAM1, the second dam portion DAM2, and the mask support MS may include first and second peripheral insulating layers 117s and 119s respectively including or being formed of the same materials as those of the planarization layer 117 and the pixel-defining film 119. The first and second peripheral insulating layers 117s and 119s of the first dam portion DAM1, the second dam portion DAM2, and the mask support MS may be located on the same layers as the planarization layer 117 and the pixel-defining film 119.

Peripheral electrode layers 310a, 310b, and 310c may be respectively located between the first and second peripheral insulating layers 117s and 119s of the first dam portion DAM1, the second dam portion DAM2, and the mask support MS. Each of the peripheral electrode layers 310a, 310b, and 310c may include or may be formed of the same material as that of the pixel electrode 310. Each of the peripheral electrode layers 310a, 310b, and 310c may be located on the same layer as the pixel electrode 310. Each of the peripheral electrode layers 310a, 310b, and 310c may be surrounded by the second peripheral insulating layer 119s.

The first peripheral insulating layer 117s and the second peripheral insulating layer 119s may have the same etched surface which is formed in the same etching process. A side surface of the first peripheral insulating layer 117s and a side surface of the second peripheral insulating layer 119s may be located on the same etched surface.

A width of the mask support MS may be greater than a width of the first dam portion DAM1. The width of the mask support MS may be greater than a width of the second dam portion DAM2. For example, the width of the mask support MS may be about 4 to 6 times greater than the width of the first dam portion DAM1.

The pixel-defining film 119 and the planarization layer 117 included in the display apparatus 1 according to an embodiment may have the same etched surface. Because a thickness t4 of the organic encapsulation layer 420 of the thin-film encapsulation layer 400 may be increased by an amount by which the pixel-defining film 119 and the planarization layer 117 are etched and removed, it is difficult for a foreign material introduced from the outside to reach the counter electrode 330, thereby preventing degradation of the light-emitting device 300. A problem that the thin-film encapsulation layer 400 is damaged by the foreign material introduced from the outside and the light-emitting device 300 is degraded due to damage to the thin-film encapsulation layer 400 may be prevented.

A volume of an organic material in the display apparatus 1 may be reduced, and outgassing of the organic material may be minimized.

Figure 20A:
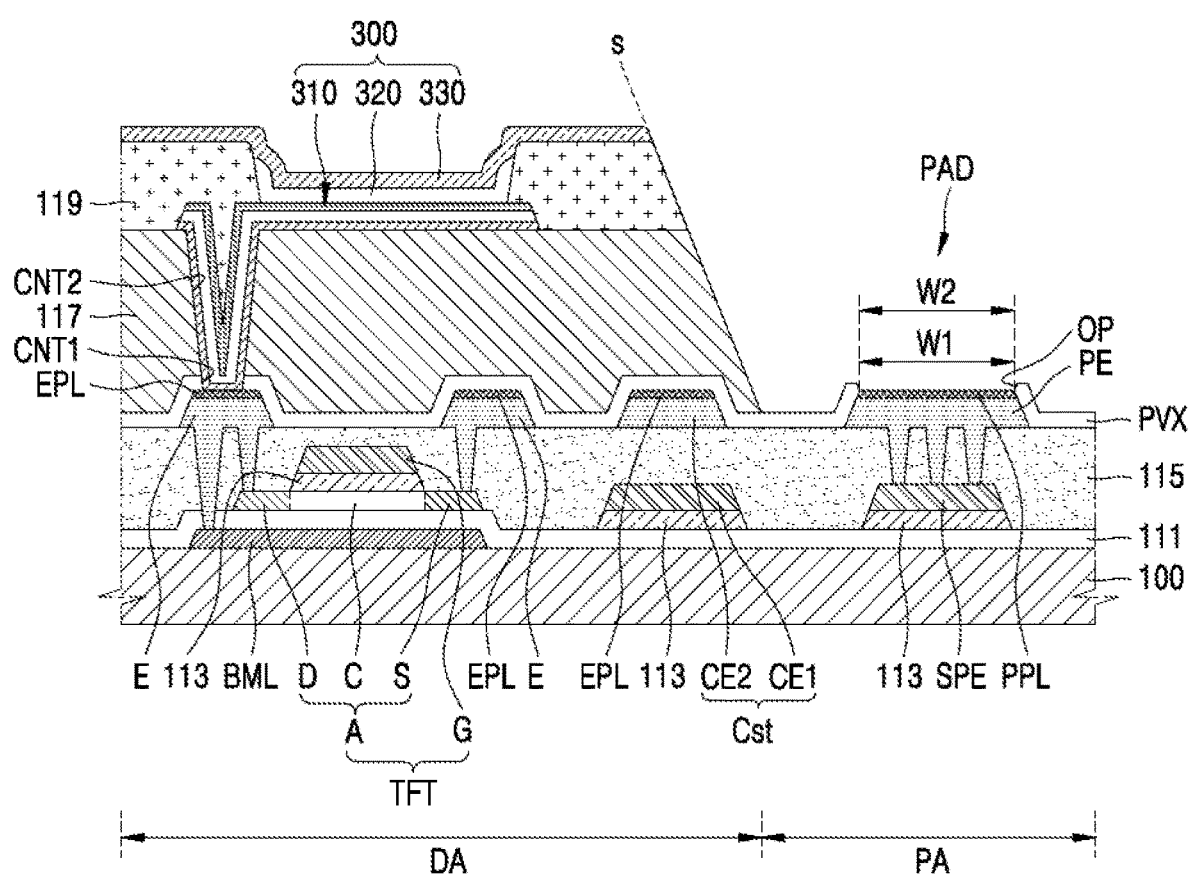
FIG. 20A is a cross-sectional view of a display apparatus according to an embodiment of the present inventive concept.

FIG. 20A is a cross-sectional view of a display apparatus according to an embodiment.

Referring to FIG. 20A, the display apparatus 1 (see FIG. 1) includes the thin-film transistor TFT which is located on the display area DA of the substrate 100, and the pad unit PAD which is located on the peripheral area PA of the substrate 100.

The display apparatus 1 includes the planarization layer 117 as an insulating layer located on the thin-film transistor TFT and exposing the pad unit PAD, and the pixel-defining film 119 located on the planarization layer 117. A side surface of the planarization layer 117 and a side surface of the pixel-defining film 119 adjacent to the peripheral area PA may be matched to each other. This may mean that the side surface of the planarization layer 117 and the side surface of the pixel-defining film 119 adjacent to the peripheral area PA are located on the same plane (i.e., are coplanar with each other). The side surface of the planarization layer 117 and the side surface of the pixel-defining film 119 adjacent to the peripheral area PA may be etched surfaces on the same plane formed by using the same etching process.

Elements included in the display apparatus 1 will be described in detail according to a stacked structure with reference to FIG. 20A.

The substrate 100 may include a glass material, a ceramic material, a metal material, or a flexible or bendable material. The substrate 100 may have a single or multi-layer structure including the above material, and when the substrate 100 has a multi-layer structure, the substrate 100 may further include an inorganic layer. In some embodiments, the substrate 100 may have a structure including an organic material, an inorganic material, and an organic material.

The buffer layer 111 may reduce or block penetration of a foreign material, moisture, or external air from the bottom of the substrate 100 and may planarize the substrate 100.

A barrier layer (not shown) may be further provided between the substrate 100 and the buffer layer 111. The barrier layer may prevent or minimize impurities from the substrate 100, etc. from penetrating into the semiconductor layer A.

The semiconductor layer A may be located on the buffer layer 111. The semiconductor layer A may include an oxide semiconductor material. The semiconductor layer A may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer A may be an InSnZnO (ITZO) semiconductor layer or an InGaZnO (IGZO) semiconductor layer.

The semiconductor layer A may include the channel region C, and the source region S and the drain region D respectively located on opposite sides of the channel region C. The semiconductor layer A may have a single or multi-layer structure.

The conductive layer BML may be located between the substrate 100 and the buffer layer 111. The conductive layer BML may overlap the channel region C of the semiconductor layer A. The conductive layer BML may include a conductive material including molybdenum (Mo), aluminum (Al), copper (Cu), or titanium (Ti), and may have a single or multi-layer structure including the above material. For example, the conductive layer BML may have a multi-layer structure including Ti/Al/Ti.

The conductive layer BML may overlap the semiconductor layer A including an oxide semiconductor material. Because the semiconductor layer A including the oxide semiconductor material is vulnerable to light, the conductive layer BML may prevent device characteristics of the thin-film transistor TFT including an oxide semiconductor material from being changed due to photocurrent occurring on the semiconductor layer A due to external light incident on the substrate 100. The conductive layer BML may be connected to the drain region D. Although the conductive layer BML is connected to the drain region D in FIG. 20A, the conductive layer BML may be connected to the source region S.

The gate insulating layer 113 may be located on the semiconductor layer A. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

As shown in FIG. 20A, the gate insulating layer 113 may be patterned to overlap a part of the semiconductor layer A. The gate insulating layer 113 may be patterned to expose the source region S and the drain region D.

A portion of the semiconductor layer A overlapping the gate insulating layer 113 may be the channel region C. The source region S and the drain region D may be subjected to a conductivity increasing process such as plasma treatment, and a portion of the semiconductor layer A overlapping the gate insulating layer 113 (i.e., the channel region C) is not exposed to the plasma treatment and thus has properties different from those of the source region S and the drain region D. Using the gate electrode G located on the gate insulating layer 113 as a self-alignment mask during the plasma treatment of the semiconductor layer A, the channel region C that is not subjected to the plasma treatment may be formed at a position overlapping the gate insulating layer 113 and the source region S and the drain region D that are subjected to the plasma treatment may be respectively formed on opposite sides of the channel region C.

In another embodiment, the gate insulating layer 113 is not patterned to overlap a part of the semiconductor layer A, and may be located on an entire surface of the substrate 100 to cover the semiconductor layer A.

The gate electrode G may be located on the gate insulating layer 113 to at least partially overlap the semiconductor layer A. The first electrode CE1 of the storage capacitor Cst and the auxiliary pad electrode SPE may be located on the gate insulating layer 113.

In an embodiment, the storage capacitor Cst may include the first electrode CE1 and the second electrode CE2, and does not overlap the thin-film transistor TFT and may be separately located as shown in FIG. 20A. Alternatively, the storage capacitor Cst may overlap the thin-film transistor TFT. For example, the gate electrode G of the thin-film transistor TFT may function as the first electrode CE1 of the storage capacitor Cst.

The interlayer insulating layer 115 may cover the semiconductor layer A, the gate electrode G, the first electrode CE1 of the storage capacitor Cst, and the auxiliary pad electrode SPE.

The electrode layer E, the second electrode CE2 of the storage capacitor Cst, and the pad electrode PE may be located on the interlayer insulating layer 115. The electrode layer E may be a source electrode, a drain electrode, or a data line.

The electrode layer E may be connected to the source region S or the drain region D of the semiconductor layer A through a contact hole. The conductive layer BML and the source region S or the drain region D of the semiconductor layer A may be connected through a contact hole formed in the buffer layer 111 and the interlayer insulating layer 115.

The second electrode CE2 of the storage capacitor Cst overlaps the first electrode CE1 with the interlayer insulating layer 115 therebetween to form a capacitance. The interlayer insulating layer 115 may function as a dielectric layer of the storage capacitor Cst.

The pad electrode PE may be connected to the auxiliary pad electrode SPE through a contact hole formed in the interlayer insulating layer 115. Although three contact holes are used to connect the pad electrode PE to the auxiliary pad electrode SPE in FIG. 20A, more or fewer contact holes may be used. Although the auxiliary pad electrode SPE is illustrated in FIG. 20A, the auxiliary pad electrode SPE may be omitted.

The electrode protective layer EPL may be located on the electrode layer E and the second electrode CE2 of the storage capacitor Cst, and the pad protective layer PPL may be located on the pad electrode PE.

Each of the electrode protective layer EPL and the pad protective layer PPL may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The electrode layer E, the second electrode CE2 of the storage capacitor Cst, and the pad electrode PE may be patterned along with the electrode protective layer EPL and the pad protective layer PPL. Accordingly, because a separate mask for patterning the electrode protective layer EPL and the pad protective layer PPL is not required, the number of masks may be reduced.

Because the pad electrode PE and the pad protective layer PPL may be patterned together, a side surface of the pad electrode PE and a side surface of the pad protective layer PPL may be matched to each other. The pad electrode PE and the pad protective layer PPL may be simultaneously formed by using the same etching process, and may include the same etched surface. The side surface of the pad electrode PE and the side surface of the pad protective layer PPL may be located on the same etched surface. Although the pad electrode PE and the pad protective layer PPL have been described, the same description may apply to the electrode layer E and the electrode protective layer PEL, and the second electrode CE2 of the storage capacitor Cst and the electrode protective layer EPL.

The electrode layer E, the second electrode CE2 of the storage capacitor Cst, and the pad electrode PE may be covered by an inorganic insulating layer (the inorganic protective layer PVX). The inorganic protective layer PVX may be an inorganic insulating film formed of an inorganic material. Polysiloxane, silicon nitride, silicon oxide, or silicon oxynitride may be used as the inorganic material. The inorganic protective layer PVX may have a single or multilayer structure including silicon nitride ($SiN_x$) and silicon oxide ($SiO_x$). The inorganic protective layer PVX may be employed to cover and protect some wirings located on the interlayer insulating layer 115.

The inorganic protective layer PVX may include the first contact hole CNT1 for connecting the thin-film transistor TFT to the pixel electrode 310 and an opening OP through which the pad unit PAD is exposed.

A width W1 of a top surface of the pad unit PAD in one direction may be the same as a width W2 of the opening OP. In detail, a width W1 of a top surface of the pad protective layer PPL in one direction may be the same as the width W2 of the opening OP. The top surface of the pad protective layer PPL may be exposed through the opening OP formed in the inorganic protective layer PVX. As shown in FIG. 20A, the top surface of the pad protective layer PPL may be entirely exposed through the opening OP.

As described with reference to FIG. 1, a printed circuit board or a driver IC chip may be attached to the pad unit PAD. A contact width between the pad unit PAD and the printed circuit board or the driver IC chip may vary according to a size of the opening OP formed in the inorganic protective layer PVX. As shown in FIG. 20A, when the top surface of the pad protective layer PPL is entirely exposed through the opening OP, a contact area between the pad unit PAD and the printed circuit board or the driver IC chip may be maximized. Accordingly, poor contact between the pad unit PAD and the printed circuit board or the driver IC chip may be reduced, and the risk of defects during operation of the display apparatus 1 may be reduced.

The planarization layer 117 may cover the electrode layer E and the second electrode CE2 of the storage capacitor Cst, and the planarization layer 117 may have a second contact hole for connecting the thin-film transistor TFT to the pixel electrode 310.

The planarization layer 117 may have a single or multi-layer structure including an organic material, to provide a flat top surface. The planarization layer 117 may expose the pad unit PAD. For example, the planarization layer 117 is not disposed on the peripheral area PA and does not overlap the pad unit PAD.

As a comparative example, a planarization layer may remain on an outer portion of a display panel. The planarization layer remaining on the outer portion of the display panel may act as an external moisture penetration path, thereby causing a reliability problem such as degradation of a light-emitting device.

The light-emitting device 300 is located on the planarization layer 117. The light-emitting device 300 includes the pixel electrode 310, the intermediate layer 320 including an organic emission layer, and the counter electrode 330.

The pixel-defining film 119 may be located on the planarization layer 117. The pixel-defining film 119 may cover an edge of the pixel electrode 310 and may have an opening through which a part of the pixel electrode 310 is exposed. The pixel-defining film 119 may increase a distance between the edge of the pixel electrode 310 and the counter electrode 330 over the pixel electrode 310, to prevent an arc or the like from occurring on the edge of the pixel electrode 310.

In an embodiment, as shown in FIG. 20A, the planarization layer 117 and the pixel-defining film 119 may have the same etched surface s. As described below with reference to FIGS. 22I and 22J, the planarization layer 117 and the pixel-defining film 119 may be simultaneously formed by using the same etching process, and may include the same etched surface s.

A side surface of the planarization layer 117 and an outer surface of the pixel-defining film 119 adjacent to the peripheral area PA may be located on the same etched surface s. The side surface of the planarization layer 117 and the outer surface of the pixel-defining film 119 adjacent to the peripheral area PA may be located on the same plane (i.e., may be coplanar with each other). The side surface of the planarization layer 117 and the outer surface of the pixel-defining film 119 adjacent to the peripheral area PA may be formed without a stepped portion, and may be formed without a boundary. The side surface of the planarization layer 117 and the outer surface of the pixel-defining film 119 adjacent to the peripheral area PA may be matched to each other.

The intermediate layer 320 may be located in an opening formed by the pixel-defining film 119, and may include an organic emission layer.

The counter electrode 330 may be a light-transmitting electrode or a reflective electrode. In some embodiments, the counter electrode 330 may be a transparent or semi-transparent electrode, and may include a metal thin film having a low work function including Li, Ca, LiF/Ca, LiF/Al, Al, Ag, Mg, or a compound thereof. A transparent conductive oxide (TCO) film including ITO, IZO, ZnO, or $In_2O_3$ may be further located on the metal thin film. The counter electrode 330 may be located over the display area DA, and may be located on the intermediate layer 320 and the pixel-defining film 119. The counter electrode 330 may be integrally formed with a plurality of light-emitting devices 300 to correspond to a plurality of pixel electrodes 310.

Because an organic light-emitting device may be easily damaged by external moisture or oxygen, the thin-film encapsulation layer 400 may cover and protect the organic light-emitting device as described below with reference to FIG. 24. The thin-film encapsulation layer 400 may include the first inorganic encapsulation layer 410, the organic encapsulation layer 420, and the second inorganic encapsulation layer 430.

Figure 20B:
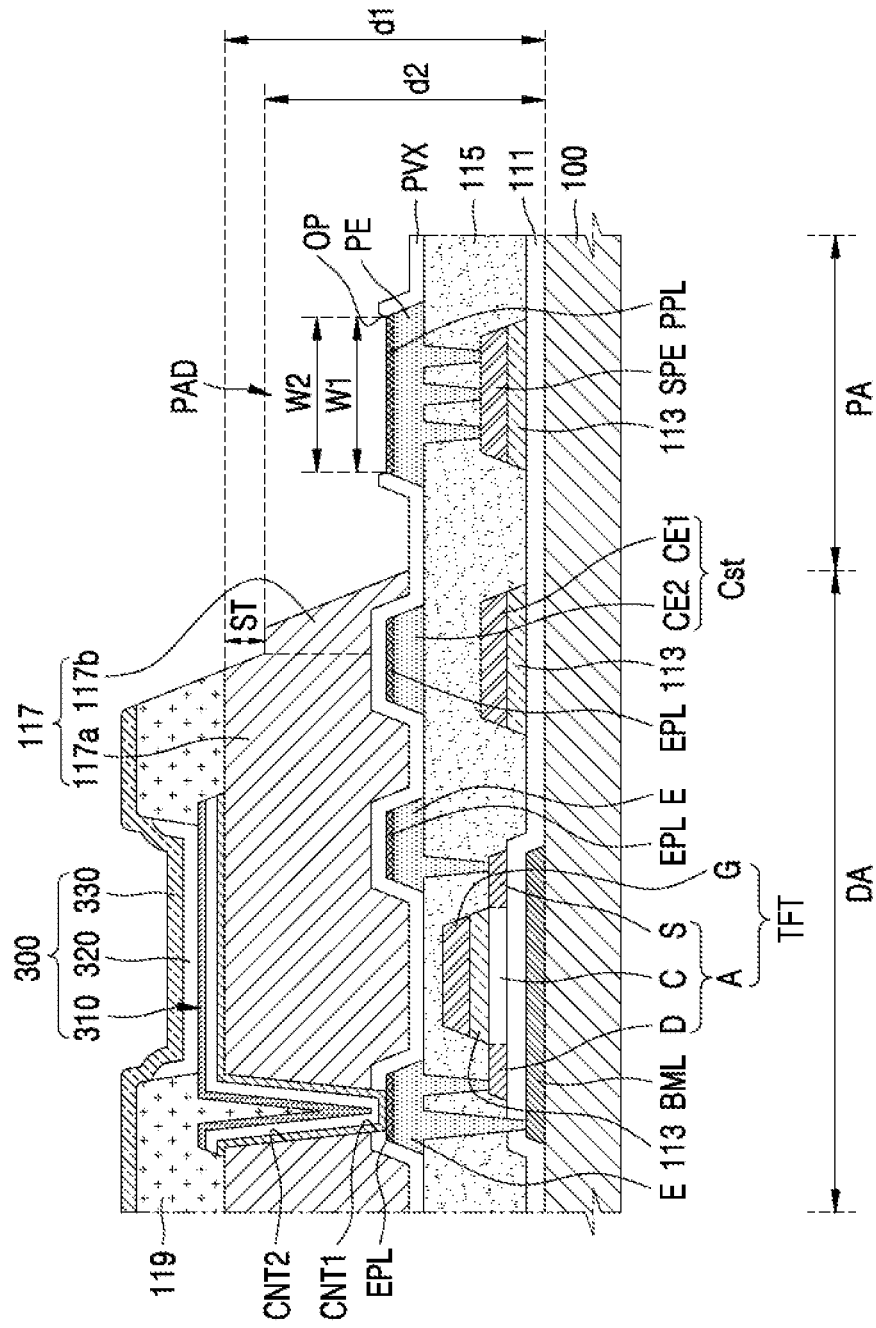
FIG. 20B is a cross-sectional view of a display apparatus according to an embodiment of the present inventive concept.
Figure 21:
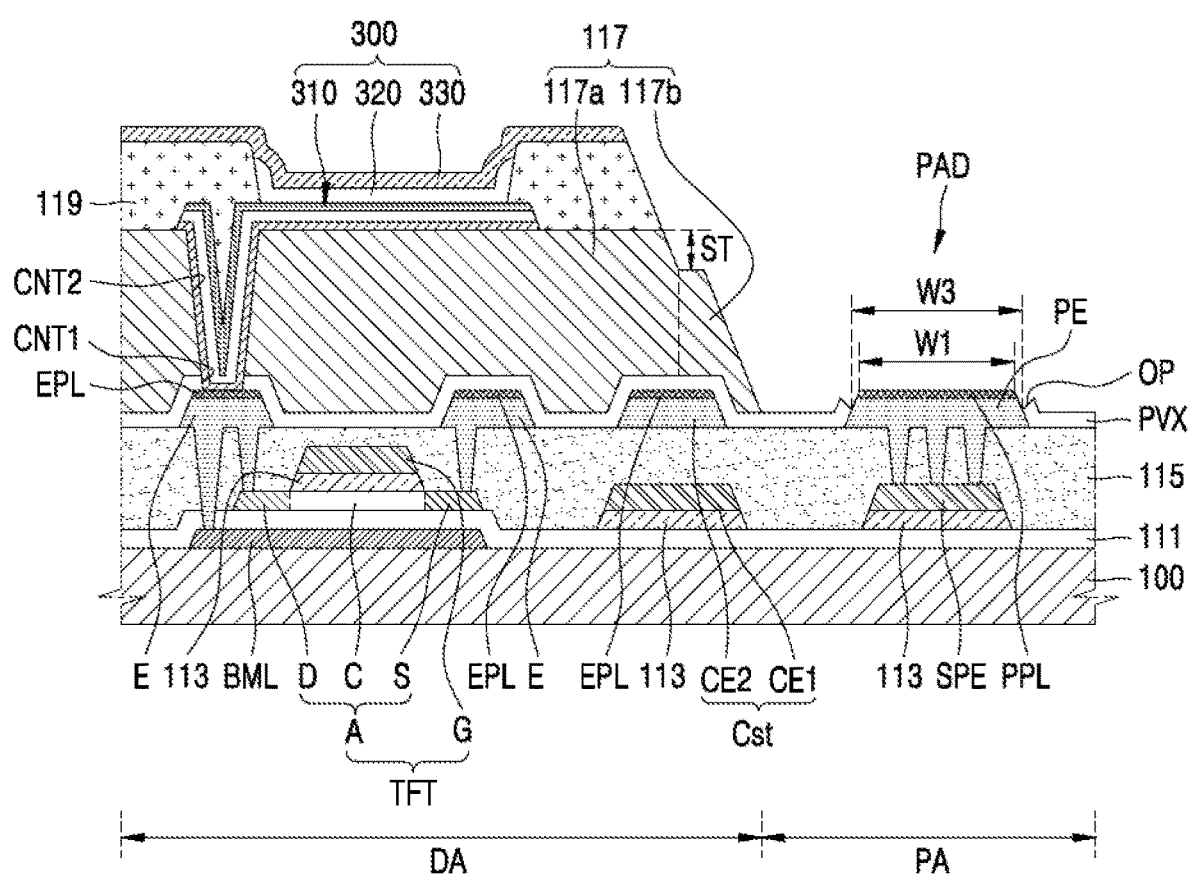
FIG. 21 is a cross-sectional view of a display apparatus according to an embodiment of the present inventive concept.

FIGS. 20B and 21 are cross-sectional views of a display apparatus according to an embodiment. In FIGS. 20B and 21, the same elements as those in FIG. 20A are denoted by the same reference numerals, and thus a repeated description thereof will be omitted. FIG. 20B is a modified embodiment of FIG. 20A, and is different from FIG. 20A in a structure of the planarization layer 117. FIG. 21 is a modified embodiment of FIG. 20A, and is different from FIG. 20A in a structure of the inorganic protective layer PVX. The same description as that made with reference to FIG. 20A will not be provided, and the following will focus on a difference.

Referring to FIG. 20B, the planarization layer 117 may include the first portion 117a located on the thin-film transistor TFT, the second portion 117b, and a third portion between the first portion 117a and the second portion 117b. The second portion 117b may extend from the third portion to the peripheral area PA. A top surface of the planarization layer 117 may have the stepped portion ST between the first portion 117a and the second portion 117b. For example, the top surface of the planarization layer 117 includes a first top surface of the first portion 117a, a second top surface of the second portion 117b, and a connecting surface of the third portion. The connecting surface of the third portion may connect the first top surface of the first portion 117a and the second top surface of the second portion 117b. The first top surface 117a of the first portion of may be higher than the second top surface of the second portion 117b, and the connecting surface is sloped.

A vertical distance d1 between a top surface of the substrate 100 and a top surface of the first portion 117a may be different from a vertical distance d2 between the top surface of the substrate 100 and a top surface of the second portion 117b. For example, as shown in FIG. 20B, the vertical distance d1 between the top surface of the substrate 100 and the top surface of the first portion 117a may be greater than the vertical distance d2 between the top surface of the substrate 100 and the top surface of the second portion 117b.

The first portion 117a of the planarization layer 117 and the pixel-defining film 119 may have the same etched surface. As described below with reference to FIGS. 23C and 23D, the first portion 117a of the planarization layer 117 and the pixel-defining film 119 may be simultaneously formed by using the same etching process, and may include the same etched surface.

A side surface of the first portion 117a of the planarization layer 117 and an outer surface of the pixel-defining film 119 adjacent to the peripheral area PA may be located on the same etched surface. The side surface of the first portion 117a of the planarization layer 117 and the outer surface of the pixel-defining film 119 adjacent to the peripheral area PA may be located on the same plane. The side surface of the first portion 117a of the planarization layer 117 and the outer surface of the pixel-defining film 119 adjacent to the peripheral area PA may be formed without a stepped portion, and may be formed without a boundary. The side surface of the first portion 117a of the planarization layer 117 and the outer surface of the pixel-defining film 119 adjacent to the peripheral area PA may be matched to each other.

Referring to FIG. 21, a width W1 of a top surface of the pad unit PAD in one direction may be less than a width W3 of the opening OP. In detail, a width W1 of a top surface of the pad protective layer PPL in one direction may be less than the width W3 of the opening OP.

A top surface of the pad protective layer PPL and a side surface of the pad protective layer PPL may be exposed through the opening OP formed in the inorganic protective layer PVX. As shown in FIG. 21, the top surface and the side surface of the pad protective layer PPL may be entirely exposed through the opening OP. A side surface of the pad electrode PE may be partially exposed through the opening OP.

As described with reference to FIG. 1, a printed circuit board or a driver IC chip may be attached to the pad unit PAD. A contact width between the pad unit PAD and the printed circuit board or the driver IC chip may vary according to a size of the opening OP formed in the inorganic protective layer PVX. As shown in FIG. 21, when the top surface and the side surface of the pad protective layer PPL are entirely exposed through the opening OP, a contact area between the pad unit PAD and the printed circuit board or the driver IC chip may be maximized. Accordingly, poor contact between the pad unit PAD and the printed circuit board or the driver IC chip may be reduced, and the risk of defects during operation of the display apparatus 1 may be reduced.

Although a display apparatus has been mainly described, the present disclosure is not limited thereto. For example, a method of manufacturing the display apparatus may also fall within the scope of the present disclosure.

FIGS. 22A through 22J are cross-sectional views sequentially illustrating a method of manufacturing a display apparatus according to an embodiment. In FIGS. 22A through 22J, the same elements as those illustrated in FIG. 20A are denoted by the same reference numerals, and thus a repeated description thereof will be omitted.

Figure 22A:
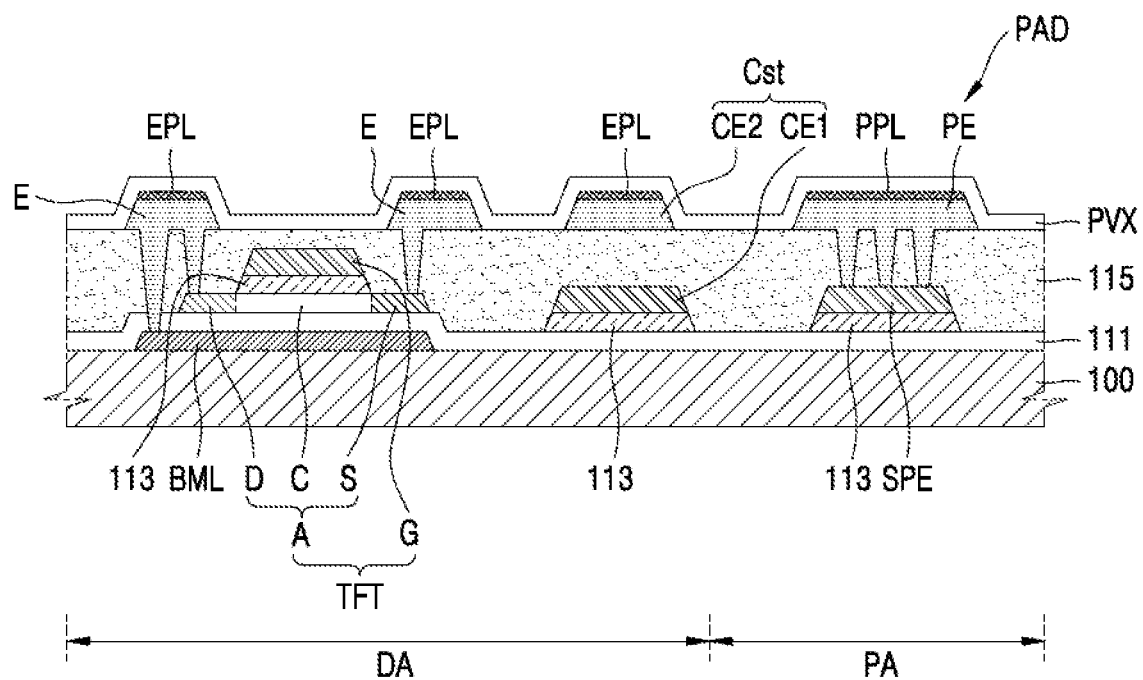
FIGS. 22A through 22J are cross-sectional views sequentially illustrating a method of manufacturing a display apparatus according to an embodiment of the present inventive concept.

Referring to FIG. 22A, first, the conductive layer BML, the buffer layer 111, the semiconductor layer A, the gate insulating layer 113, the gate electrode G, the first and second electrodes CE1 and CE2 of the storage capacitor Cst, the auxiliary pad electrode SPE, the interlayer insulating layer 115, the electrode layer E, the pad electrode PE, the electrode protective layer EPL, the pad protective layer PPL, and the inorganic protective layer PVX are sequentially formed on the substrate 100.

The conductive layer BML may be formed by patterning a pre-conductive layer (not shown). The pre-conductive layer may include a conductive material including molybdenum (Mo), aluminum (Al), copper (Cu), or titanium (Ti), and may have a single or multi-layer structure including the above material.

The buffer layer 111 may include silicon oxide ($SiO_2$) or silicon nitride ($SiN_x$), and may be formed by using a deposition method such as chemical vapor deposition (CVD) or sputtering.

The semiconductor layer A may be located on the buffer layer 111. The semiconductor layer A may be formed by patterning a pre-semiconductor layer (not shown). The pre-semiconductor layer may include an oxide semiconductor, and may be deposited by using CVD.

The gate insulating layer 113 and the gate electrode G may be located on the semiconductor layer A, and the gate insulating layer 113, the first electrode CE1 of the storage capacitor Cst, and the auxiliary pad electrode SPE may be located on the buffer layer 111.

The gate insulating layer 113, the gate electrode G, the first electrode CE1 of the storage capacitor Cst, and the auxiliary pad electrode SPE may be formed by patterning a pre-gate insulating layer (not shown) and a pre-metal layer (not shown).

The pre-gate insulating layer may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by using a deposition method such as, but not limited to, CVD or sputtering.

The pre-metal layer may have a single or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may be formed by using a deposition method such as, but not limited to, CVD, plasma-enhanced CVD (PECVD), low-pressure CVD (LPCVD), physical vapor deposition (PVD), sputtering, or atomic layer deposition (ALD).

Plasma treatment is performed the pre-gate insulating layer is patterned, and a portion of the semiconductor layer exposed without overlapping the gate electrode G is subjected to a conductivity increasing process during the plasma treatment. As a result, the source region S and the drain region D exposed during the plasma treatment become conductive, and the channel region C overlapping the gate electrode G has properties different from those of the source region S and the drain region D.

The interlayer insulating layer 115 is formed on the gate electrode G, the first electrode CE1 of the storage capacitor Cst, and the auxiliary pad electrode SPE. After the interlayer insulating layer 115 is formed, contact holes passing through the interlayer insulating layer 115 and respectively exposing parts of the conductive layer BML, the semiconductor layer A, and the auxiliary pad electrode SPE are formed.

The electrode layer E, the second electrode CE2 of the storage capacitor Cst, and the pad electrode PE are formed on the interlayer insulating layer 115. The electrode protective layer EPL and the pad protective layer PPL are formed on the electrode layer E, the second electrode CE2 of the storage capacitor Cst, and the pad electrode PE.

The electrode layer E, the second electrode CE2 of the storage capacitor Cst, the pad electrode PE, the electrode protective layer EPL, and the pad protective layer PPL may be formed by sequentially depositing a pre-electrode layer (not shown) and a pre-protective layer (not shown) on an entire top surface of the interlayer insulating layer 115 and performing a mask process and an etching process. The electrode layer E, the second electrode CE2 of the storage capacitor Cst, the pad electrode PE may be patterned along with the electrode protective layer EPL and the pad protective layer PPL. Accordingly, because a separate mask for patterning the electrode protective layer EPL and the pad protective layer PPL is not required, the number of masks may be reduced.

The inorganic protective layer PVX is formed on the electrode layer E, the second electrode CE2 of the storage capacitor Cst, and the pad electrode PE. The inorganic protective layer PVX may be an inorganic insulating film formed of an inorganic material, and may be formed by using a deposition method such as, but not limited, CVD, PECVD, LPCVD, PVD, sputtering, or ALD.

Figure 22B:
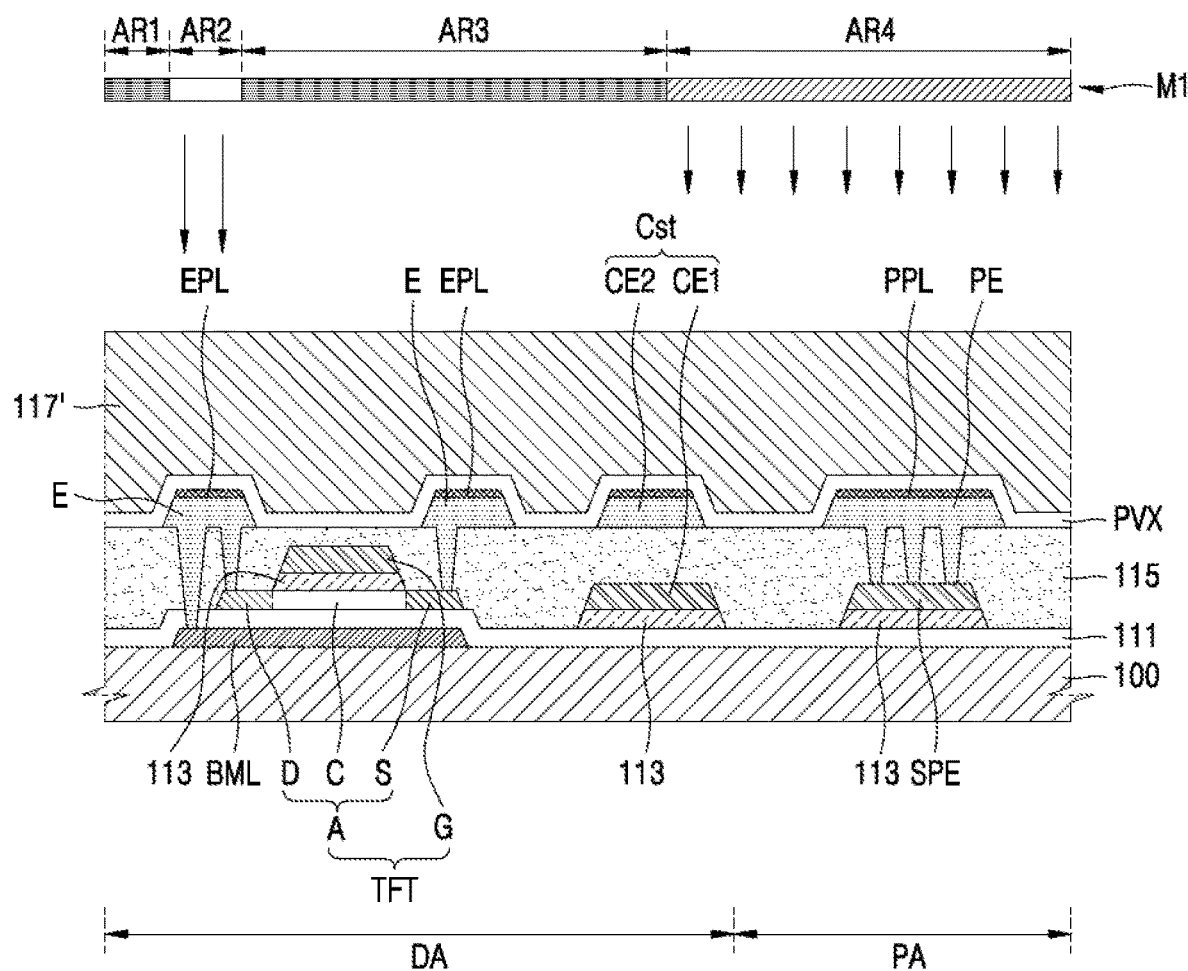

Referring to FIG. 22B, the planarization material layer 117' may be located on the inorganic protective layer PVX. The first mask M1 may be located on the planarization material layer 117'. The first mask M1 may adjust the amount of light exposure of the planarization material layer 117' in each area. For example, the amount of light exposure of the planarization material layer 117' in the fourth area AR4 of the first mask M1 may be adjusted to be less than that in the second area AR2 of the first mask M1. For example, the first mask M1 may be a half-tone mask or a slit mask. In some embodiments, the first area AR1 and the third area AR3 of the first mask M1 may be shielded so that the planarization material layer 117' is not exposed to light.

The planarization material layer 117' may be exposed at different amounts of light exposure according to areas through the first mask M1, and a part of the planarization material layer 117' may be removed by using a developing process. Because the amount of the planarization material layer 117' that is removed varies according to the amount of light exposure, a pre-insulating layer (hereinafter, pre-planarization layer 117p) having different thicknesses according to areas may be formed at one time.

Figure 22C:
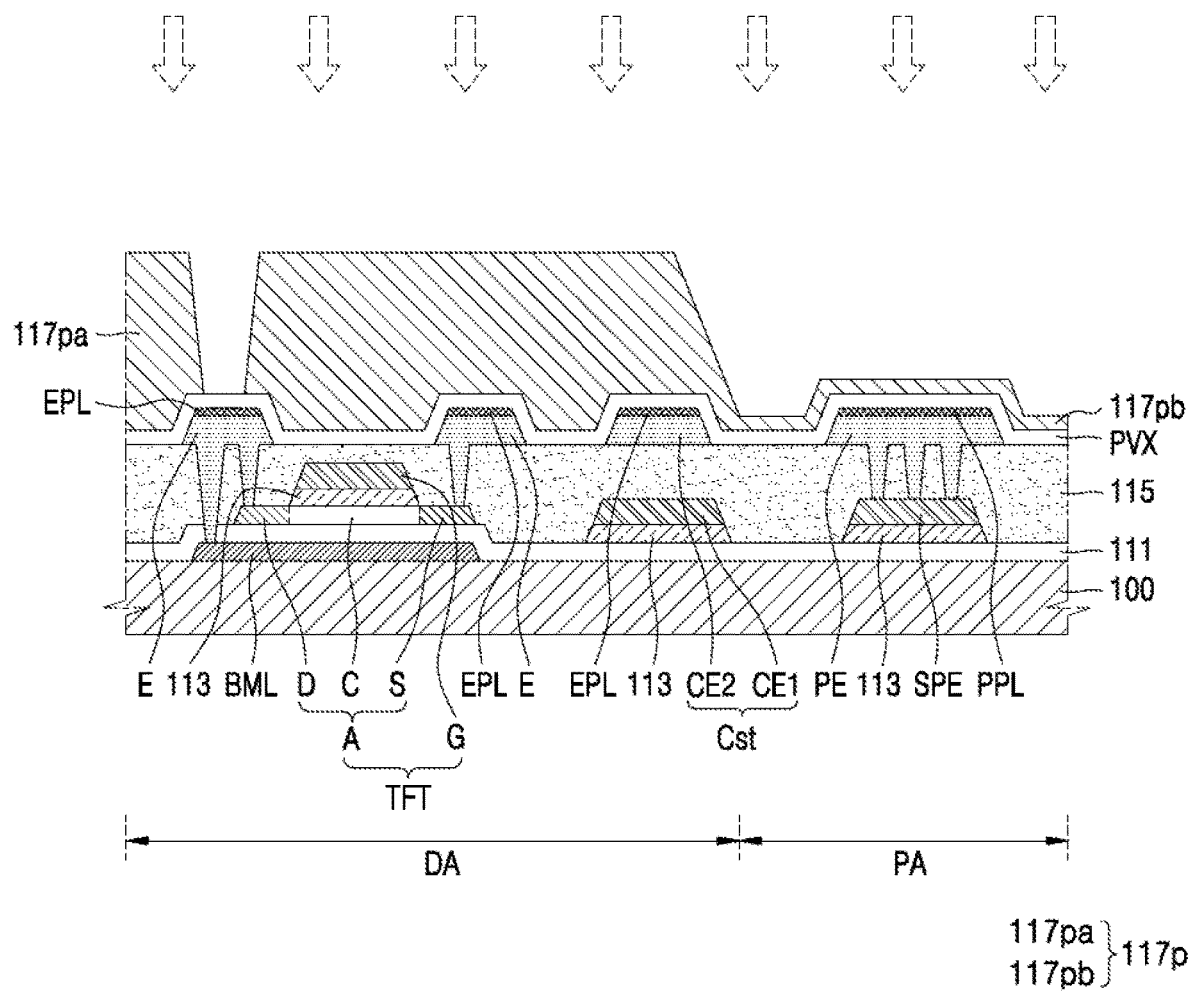

As shown in FIG. 22C, the pre-planarization layer 117p may include a first pre-planarization layer 117pa which is disposed on the display area DA and a second pre-planarization layer 117pb which is disposed on the peripheral area PA. A thickness of the first pre-planarization layer 117pa may be greater than a thickness of the second pre-planarization layer 117pb.

After the pre-planarization layer 117p is formed by removing a part of the planarization material layer 117', a curing and drying process may be performed on the pre-planarization layer 117p. A degree of adhesion of the pre-planarization layer 117p to the inorganic protective layer PVX may be increased through the curing and drying process. The curing and drying process may include a heat treatment process.

Although the planarization material layer 117' includes a positive photoresist in FIG. 22B, the planarization material layer 117' may include a negative photoresist. Unlike in a case where the planarization material layer 117' includes the positive photoresist, a thickness of the pre-planarization layer 117p remaining after a developing process increases as the amount of light exposure of the planarization material layer 117' increases.

Figure 22D:
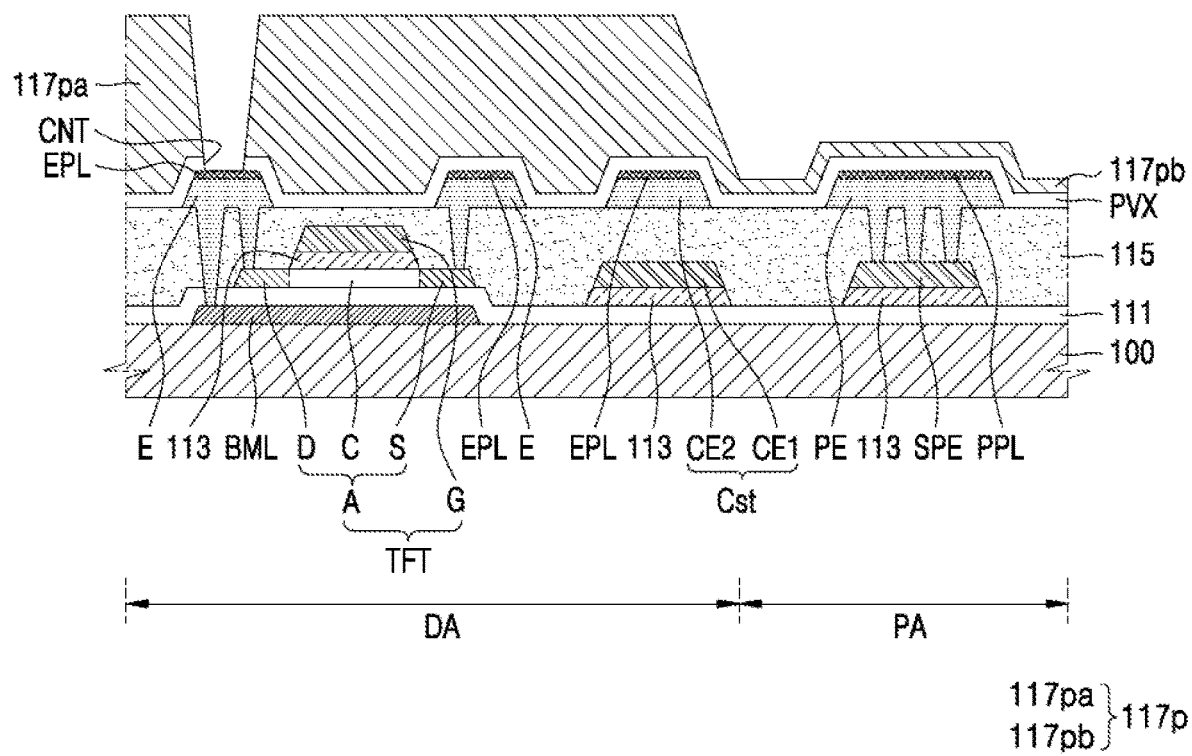

Referring to FIGS. 22C and 22D, a contact hole CNT through which a part of the electrode layer E is exposed is formed in the inorganic protective layer PVX by using the patterned pre-planarization layer 117p. The contact hole CNT is formed by using an etching process of partially etching the inorganic protective layer PVX. For example, the etching process of partially etching the inorganic protective layer PVX may be a dry etching process. Although not shown in FIG. 22D, a part of the pre-planarization layer 117p may also be removed, thereby reducing a thickness of the pre-planarization layer 117p.

Figure 22E:
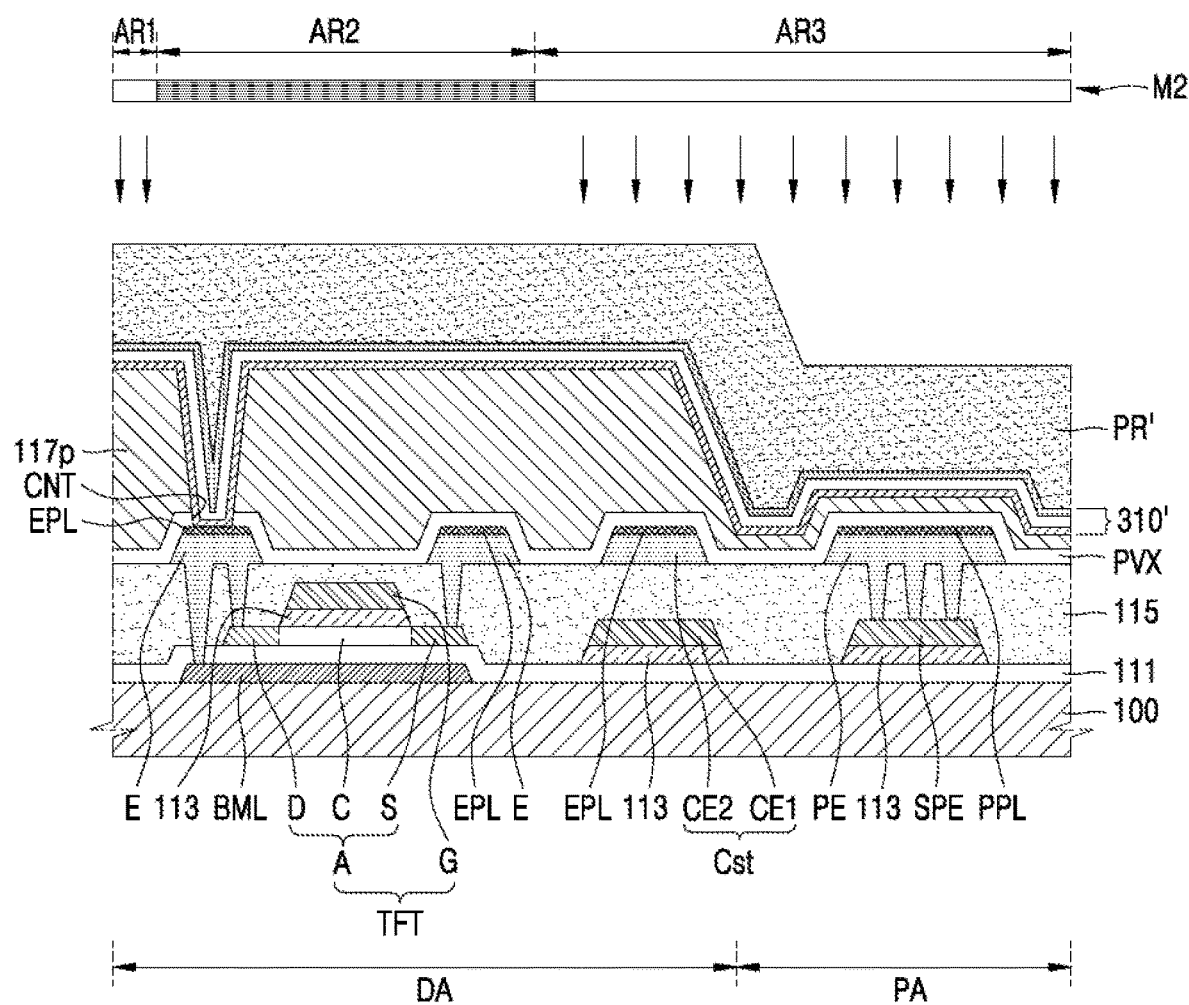

Referring to FIG. 22E, the pixel electrode material layer 310' and the photoresist layer PR' are sequentially formed on the pre-planarization layer 117p.

The photoresist layer PR' may include a positive photoresist, and may be formed by applying a positive photoresist solution (not shown) to the pixel electrode material layer 310' by using any of various methods such as spin coating, spraying, or dipping.

The second mask M2 may be located over the photoresist layer PR'. The second mask M2 may adjust the amount of light exposure of the photoresist layer PR' in each area. For example, the second area AR2 of the second mask M2 may be shielded so that the photoresist layer PR' is not exposed to light. The first area AR1 and the third area AR3 of the second mask M2 are not shielded so that the photoresist layer PR' is exposed to light.

Figure 22F:
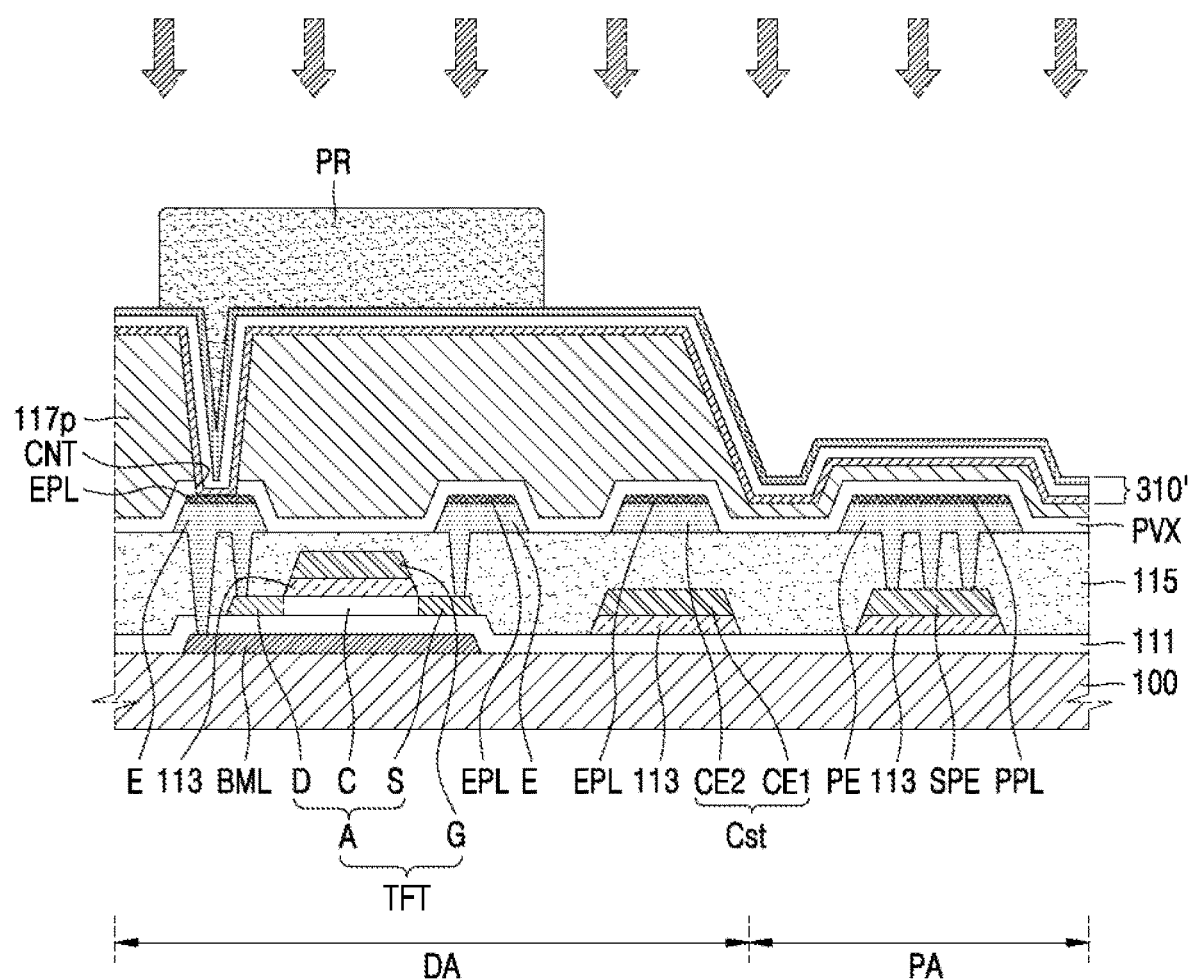

The photoresist layer PR' corresponding to the first area AR1 and the third area AR3 may be exposed to light through the second mask M2, and a part of the photoresist layer PR' may be removed through a developing process, to form the photoresist pattern PR as shown in FIG. 22F.

Although the photoresist layer PR' includes the positive photoresist in FIG. 22E, the photoresist layer PR' may include a negative photoresist. Unlike in a case where the photoresist layer PR' includes the positive photoresist, a portion of the photoresist layer PR' that is not exposed to light corresponds to a portion removed after a developing process.

Figure 22G:
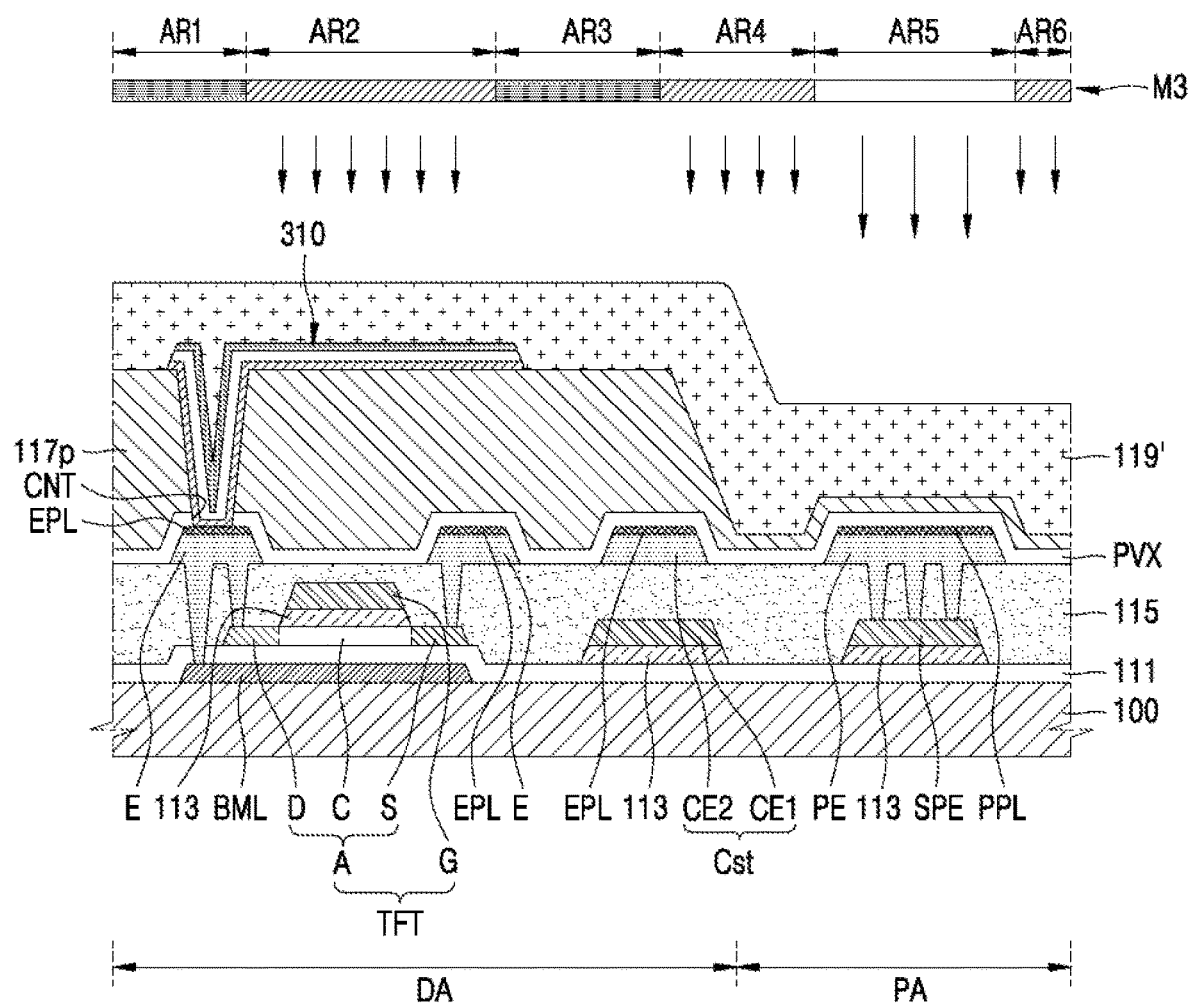

Referring to FIGS. 22F and 22G, the pixel electrode material layer 310 is etched by using the photoresist pattern PR formed on the pixel electrode material layer 310', to form the pixel electrode 310. The pixel electrode 310 may be formed by depositing the pixel electrode material layer 310' and performing a mask process and an etching process. For example, the etching process may be a wet etching process.

Because contact holes through which a part of the electrode layer E is exposed are formed in the pre-planarization layer 117p and the inorganic protective layer PVX, the pixel electrode 310 may be electrically connected to the thin-film transistor TFT through the contact holes.

As a comparative example, an opening through which a pad unit is partially exposed may be formed when contact holes for electrically connecting a pixel electrode to a thin-film transistor are formed. After the opening through which the pad unit is partially exposed is formed, a wet etching process for forming the pixel electrode may be performed. The pad unit PAD exposed through the opening may be affected by the wet etching process, and thus a crack or a fine seam may occur on a surface of a portion of the pad unit. The surface of the part of the pad unit may be damaged. Copper (Cu) of the pad unit may be eroded, thereby resulting in poor contact of the pad unit.

However, as shown in FIG. 22F, because the pad protective layer PPL and the pad electrode PE are protected by the pre-planarization layer 117p when an etching process for forming the pixel electrode 310 is performed, a surface of the pad unit PAD may be safely protected. Accordingly, poor contact of the pad unit PAD may be prevented. Because the pad protective layer PPL and the pad electrode PE are protected by the pre-planarization layer 117p, the pad unit PAD may be protected regardless of whether the etching process for forming the pixel electrode 310 is performed once or twice.

Referring to FIG. 22G, after the pixel electrode 310 is formed, the pixel-defining film material layer 119' is formed on the pixel electrode 310 and the pre-planarization layer 117p. The pixel-defining film material layer 119' may include a positive photoresist, and may be formed by applying a positive photoresist solution to the pixel electrode 310 and the pre-planarization layer 117p by using any of various methods such as spin coating, spraying, or dipping.

The third mask M3 may be located over the pixel-defining film material layer 119'. The third mask M3 may adjust the amount of light exposure of the pixel-defining film material layer 119' in each area. For example, the amount of light exposure of the pixel-defining film material layer 119' in the second area AR2, the fourth area AR4, and the sixth area AR6 of the third mask M3 may be adjusted to be less than that in the fifth area AR5 of the third mask M3. For example, the third mask M3 may be a half-tone mask or a slit mask.

In some embodiments, the first area AR1 and the third area AR3 of the third mask M3 may be shielded so that the pixel-defining film material layer 119' is not exposed to light.

The pixel-defining film material layer 119' may be exposed at different amounts of light exposure according to areas through the third mask M3, and a part of the pixel-defining film material layer 119' may be removed through a developing process. Because the amount of the pixel-defining film material layer 119' that is removed varies according to the amount of light exposure, the pre-pixel-defining film 119p having different thicknesses according to areas may be formed at one time.

Figure 22H:
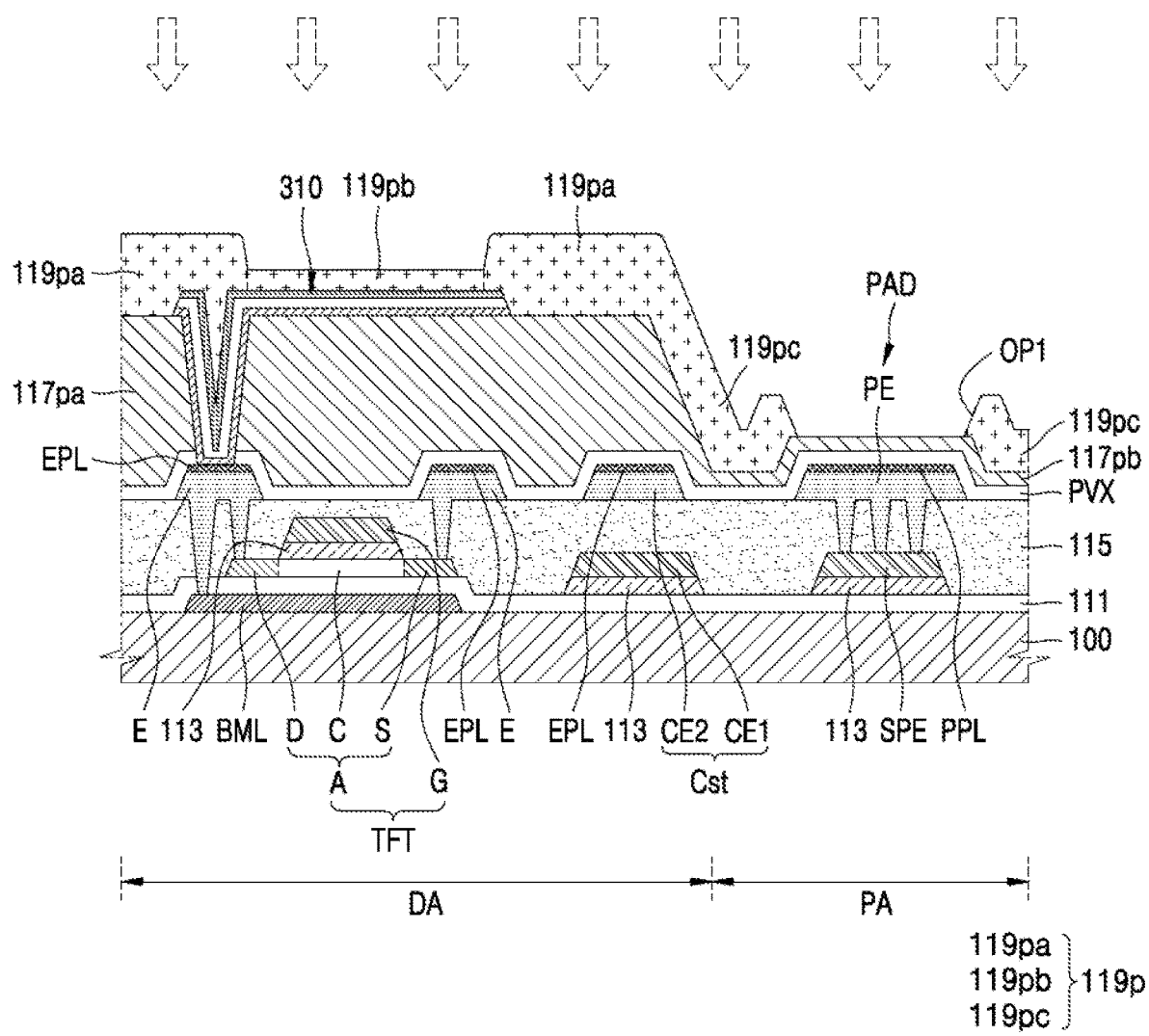

For example, as shown in FIG. 22H, the pre-pixel-defining film 119p may include the first pre-pixel-defining film 119pa, the second pre-pixel-defining film 119pb surrounded by the first pre-pixel-defining film 119pa, and a third pre-pixel-defining film 119pc corresponding to the peripheral area PA.

The second pre-pixel-defining film 119pb may protect a surface of the pixel electrode 310 in a subsequent process. Alternatively, the second pre-pixel-defining film 119pb may be omitted. When the second area AR2 of the third mask M3 is opened and the pixel-defining film material layer 119' is exposed at the largest amount of light exposure, the pixel-defining film material layer 119' corresponding to the second area AR2 of the third mask M3 may be entirely removed.

The first pre-pixel-defining film 119pa corresponds to a portion of the pixel-defining film material layer 119' that is not exposed to light and is not removed due to the first area AR1 and the third area AR3 of the third mask M3. The second pre-pixel-defining film 119pb corresponds to a portion of the pixel-defining film material layer 119' that is exposed at an adjusted amount of light exposure and is partially removed due to the second area AR2 of the third mask M3. The third pre-pixel-defining film 119pc corresponds to a portion of the pixel-defining material layer 119' that is exposed at an adjusted amount of light exposure and is partially removed due to the fourth area AR4 and the sixth area AR6 of the third mask M3.

A thickness of the first pre-pixel-defining film 119pa may be greater than a thickness of the second pre-pixel-defining film 119pb. The thickness of the first pre-pixel-defining film 119pa may be greater than a thickness of the third pre-pixel-defining film 119pc. The thickness of the second pre-pixel-defining film 119pb may be the same as or different from the thickness of the third pre-pixel-defining film 119pc. For example, as shown in FIG. 22H, the thickness of the third pre-pixel-defining film 119pc may be greater than the thickness of the second pre-pixel-defining film 119pb.

The pre-pixel-defining film 119p may have a first opening OP1 corresponding to the pad unit PAD. The first opening OP1 corresponds to a portion of the pixel-defining film material layer 119' that is exposed at the largest amount of light exposure and is entirely removed due to the fifth area AR5 of the third mask M3.

Although the pixel-defining film material layer 119' includes the positive photoresist in FIG. 22G, the pixel-defining film material layer 119' may include a negative photoresist. Unlike in a case where the pixel-defining film material layer 119' includes the positive photoresist, a thickness of the pixel-defining film material layer 119' remaining after a developing process increases as the amount of light exposure of the pixel-defining film material layer 119' increases.

Figure 22I:
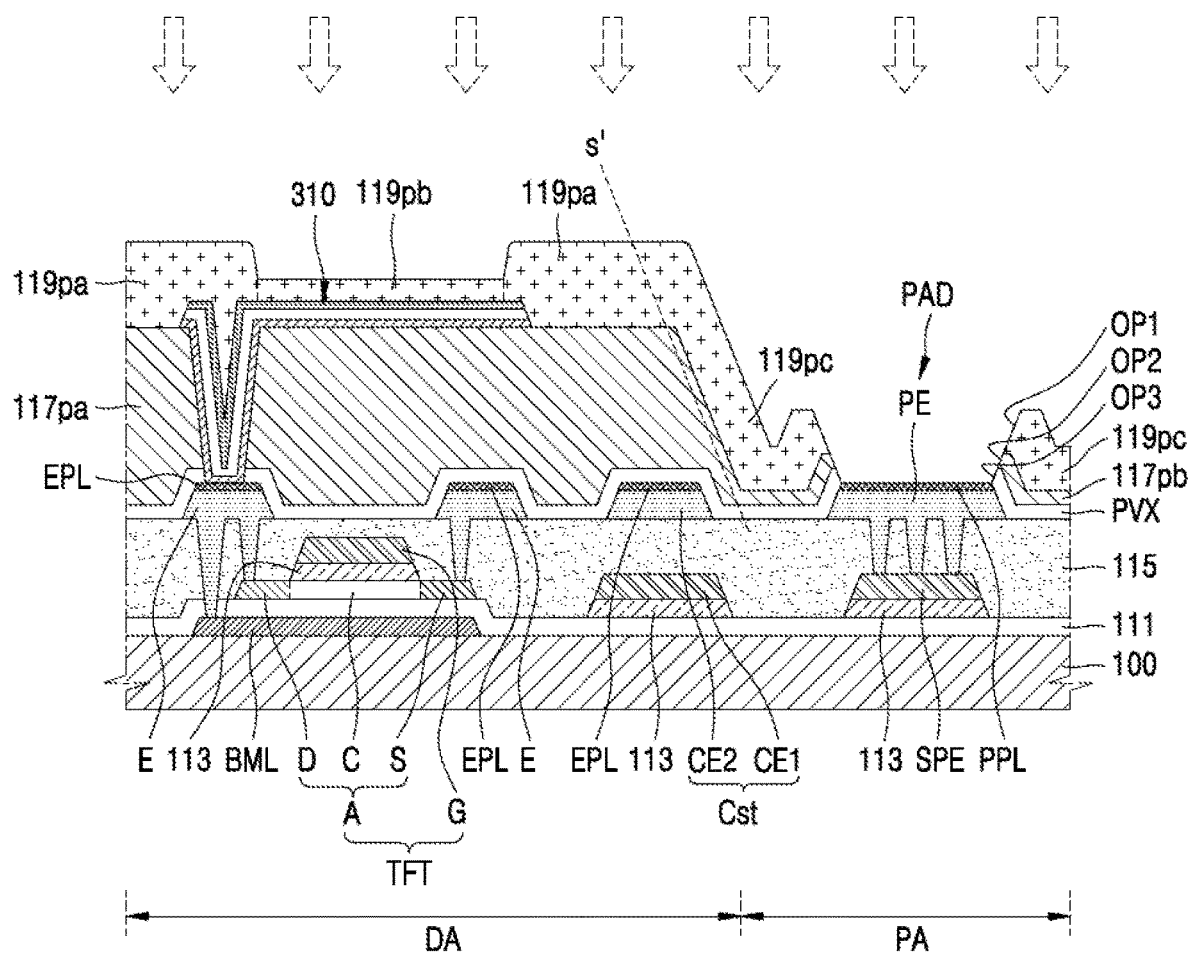

Referring to FIGS. 22H and 22I, a second opening OP2 and a third opening OP3 through which a top surface of the pad unit PAD is exposed are respectively formed in the pre-planarization layer 117p and the inorganic protective layer PVX by using the patterned pre-pixel-defining film 119p. The second opening OP2 and the third opening OP3 are formed through an etching process of partially etching the pre-planarization layer 117p and the inorganic protective layer PVX. For example, the etching process of partially etching the pre-planarization layer 117p and the inorganic protective layer PVX may be a dry etching process. Although not shown in FIG. 22I, a part of the pre-pixel-defining film 119p may also be removed, thereby reducing a thickness of the pre-pixel-defining film 119p.

Figure 22J:
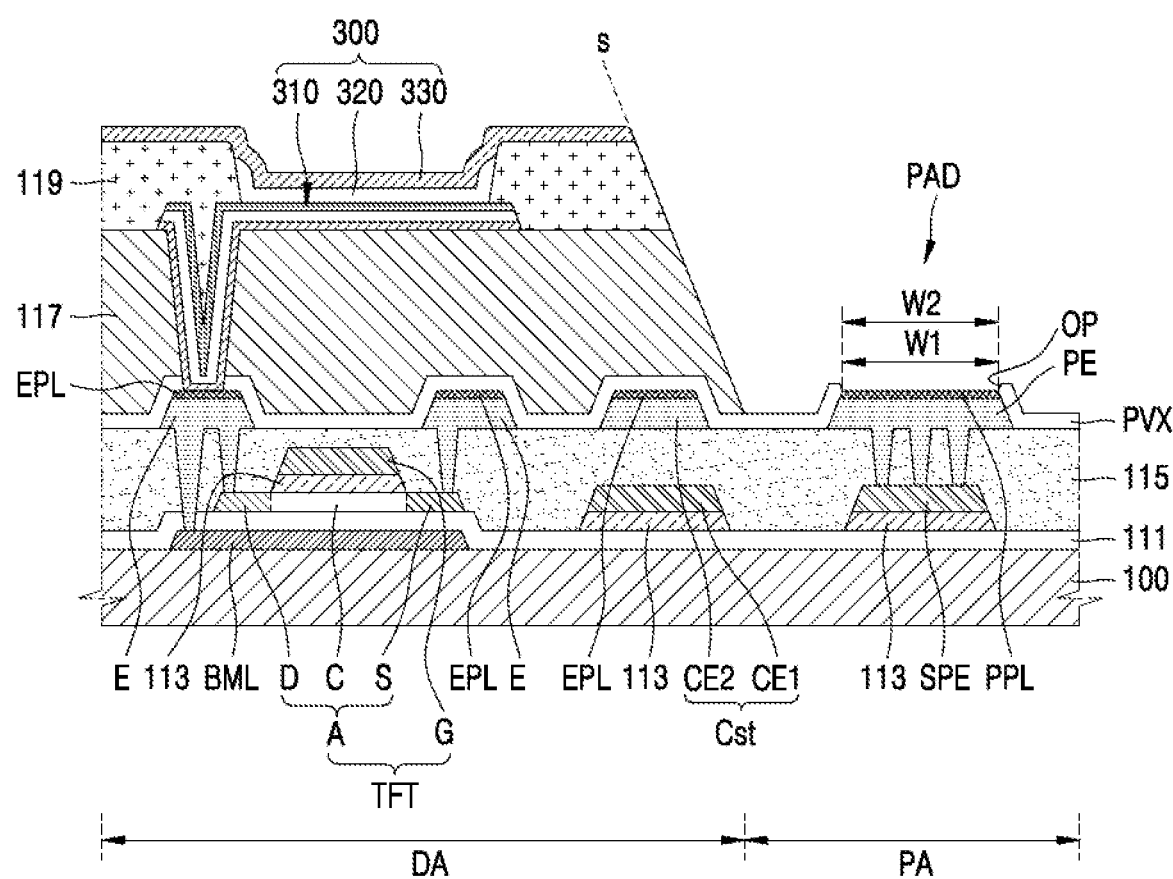

Referring to FIGS. 22I and 22J, an etching process of removing the second pre-pixel-defining film 119pb, the third pre-pixel-defining film 119pc, and the second pre-planarization layer 117pb is performed. For example, the etching process may be a dry etching process.

The planarization layer 117 may be formed by removing the second pre-planarization layer 117pb from the pre-planarization layer 117p.

The pixel-defining film 119 may be formed by removing the second pre-pixel-defining film 119pb and the third pre-pixel-defining film 119pc from the pre-pixel-defining film 119p. A part of the pixel electrode 310 may be exposed by removing the second pre-pixel-defining film 119pb. The pixel-defining film 119 may have an opening through which a part of the pixel electrode 310 is exposed.

When the etching process of removing the second pre-pixel-defining film 119pb, the third pre-pixel-defining film 119pc, and the second pre-planarization layer 117pb is performed, a part of the first pre-pixel-defining film 119pa and a part of the first pre-planarization layer 117pa may also be etched. For example, as shown in FIG. 22I, a part of the first pre-pixel-defining film 119pa and a part of the first pre-planarization layer 117pa located on a virtual surface s' close to the peripheral area PA may be etched.

As shown in FIG. 22J, the planarization layer 117 and the pixel-defining film 119 may have the same etched surface s. An outer surface of the pixel-defining film 119 and a side surface of the planarization layer 117 adjacent to the peripheral area PA may be located on the same etched surface s. The same etched surface s may correspond to the virtual surface s' of FIG. 22I.

As shown in FIG. 22I, because the planarization layer 117 is formed by using the pre-pixel-defining film 119p as an etch mask, a planar shape of the pixel-defining film 119 may be transferred to a planar shape of the planarization layer 117. As shown in FIG. 22J, a side wall of the planarization layer 117 and a side wall of the pixel-defining film 119 adjacent to the peripheral area PA may be coplanar with each other. In an embodiment, the side wall of the planarization layer 117 and the side wall of the pixel-defining film 119 adjacent to the peripheral area PA may be connected to each other, and the connected side walls of the planarization layer 117 and the pixel-defining film 119 may form a plane which is inclined relative a top surface of the pixel-defining film 119.

Referring to FIG. 22J, the intermediate layer 320 is formed on the pixel electrode 310, that is, in the opening of the pixel-defining film 119. The intermediate layer 320 may include a low-molecular-weight material or a high-molecular-weight material. The intermediate layer 320 may be formed by using vacuum deposition, screen printing, inkjet printing, or laser-induced thermal imaging (LITI).

The intermediate layer 320 of the light-emitting device 300 may include an organic emission layer. The organic emission layer may include an organic material including a fluorescent or phosphorescent material emitting red light, green light, blue light, or white light.

The counter electrode 330 may be formed to correspond to a plurality of light-emitting devices 300. The counter electrode 330 may be formed to cover the display area DA of the substrate 100 through an open mask. The counter electrode 330 may be formed by using a deposition method such as CVD, PECVD, LPCVD, PVD, sputtering, or ALD.

FIGS. 23A through 23D are cross-sectional views sequentially illustrating a method of manufacturing a display apparatus according to an embodiment. FIGS. 23A through 23D are a modified embodiment of FIGS. 22G through 22J, and are different from FIGS. 22G through 22J in a structure of the planarization layer 117. The same description as that made with reference to FIGS. 22G through 22J will not be provided, and the following will focus on a difference.

Figure 23A:
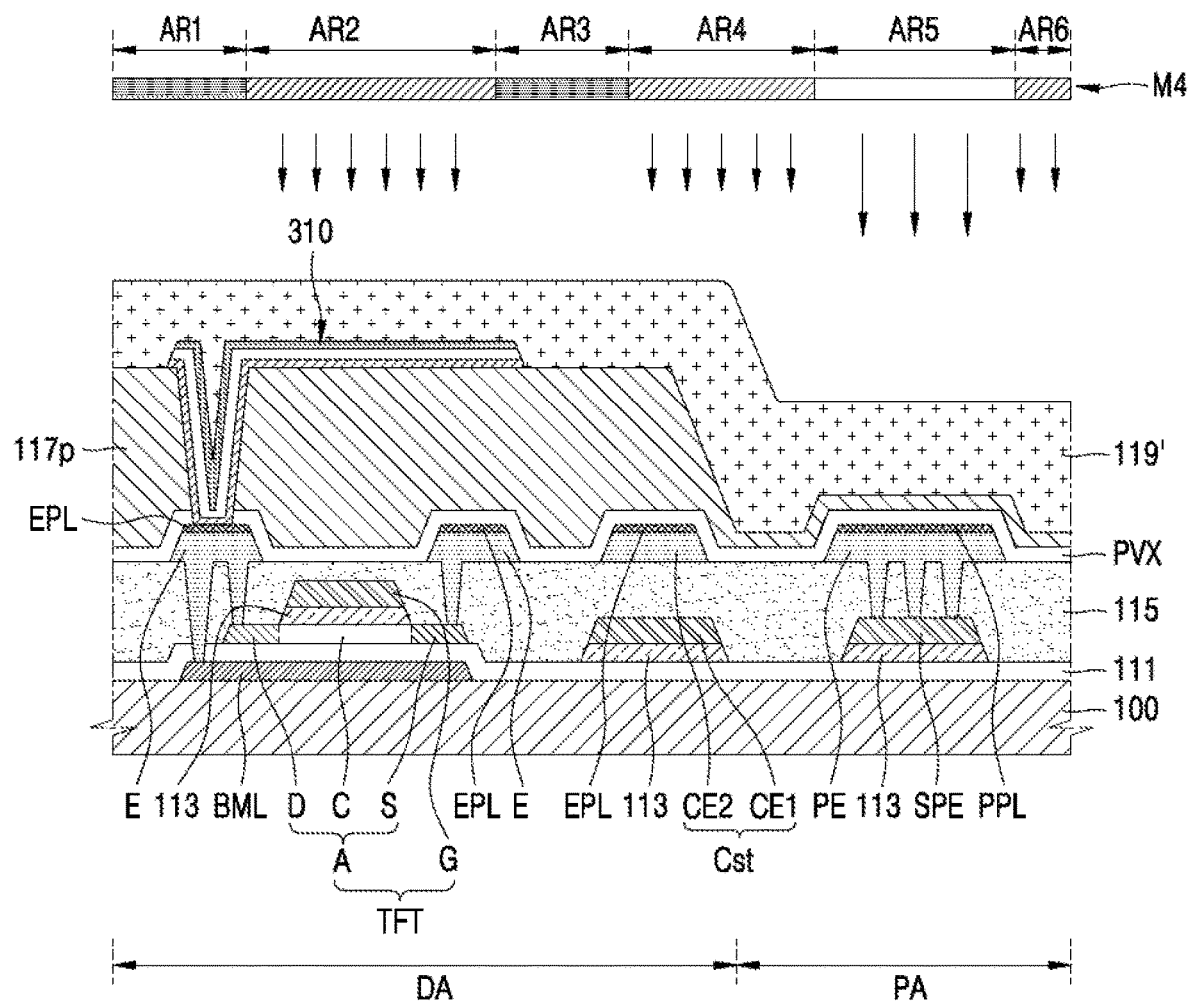
FIGS. 23A through 23D are cross-sectional views sequentially illustrating a method of manufacturing a display apparatus according to an embodiment of the present inventive concept.

Referring to FIG. 23A, after the pixel electrode 310 is formed, the pixel-defining film material layer 119' is formed on the pixel electrode 310 and the pre-planarization layer 117p. The pixel-defining film material layer 119' may include a positive photoresist, and may be formed by applying a positive photoresist solution to the pixel electrode 310 and the pre-planarization layer 117p by using any of various methods such as spin coating, spraying, or dipping.

The fourth mask M4 may be located over the pixel-defining film material layer 119'. The fourth mask M4 may adjust the amount of light exposure of the pixel-defining film material layer 119' in each area. For example, the fourth mask M4 may be a half-tone mask or a slit mask. In some embodiments, the first area AR1 and the third area AR3 of the fourth mask M4 may be shielded so that the pixel-defining film material layer 119' is not exposed to light.

The pixel-defining film material layer 119' may be exposed at different amounts of light exposure according to areas through the fourth mask M4, and a part of the pixel-defining film material layer 119' may be removed through a developing process. Because the amount of the pixel-defining film material layer 119' that is removed varies according to the amount of light exposure, the pre-pixel-defining film 119p having different thicknesses according to areas may be formed at one time.

Figure 23B:
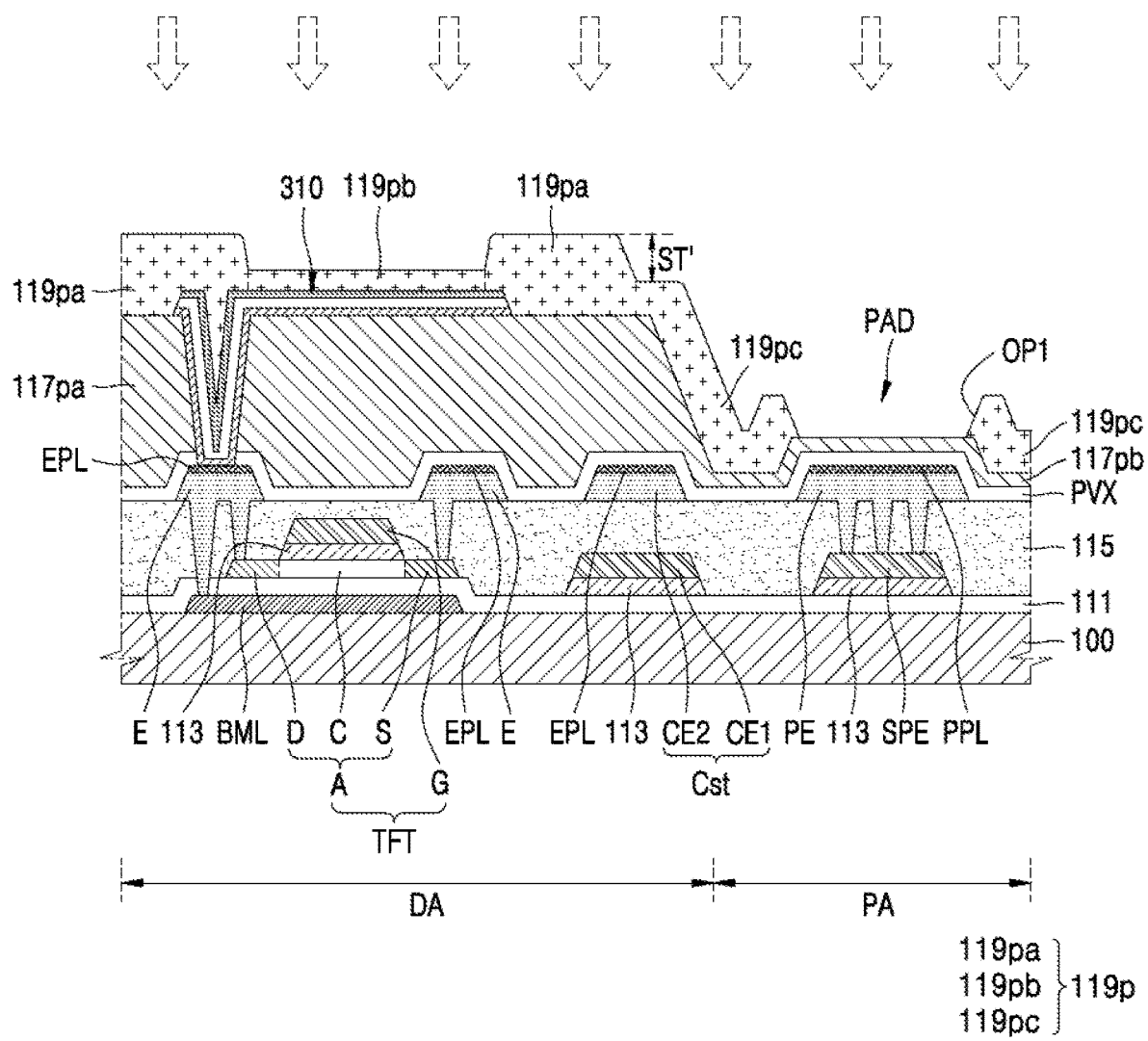

For example, as shown in FIG. 23B, the pre-pixel-defining film 119p may include the first pre-pixel-defining film 119pa, the second pre-pixel-defining film 119pb surrounded by the first pre-pixel-defining film 119pa, and the third pre-pixel-defining film 119pc corresponding to the peripheral area PA.

A thickness of the first pre-pixel-defining film 119pa may be greater than a thickness of the second pre-pixel-defining film 119pb. The thickness of the first pre-pixel-defining film 119pa may be greater than a thickness of the third pre-pixel-defining film 119pc. The thickness of the second pre-pixel-defining film 119pb may be the same as or different from the thickness of the third pre-pixel-defining film 119pc. For example, as shown in FIG. 23B, the thickness of the third pre-pixel-defining film 119pc may be greater than the thickness of the second pre-pixel-defining film 119pb.

A stepped portion ST' may be formed at a boundary between the first pre-pixel-defining film 119pa and the third pre-pixel-defining film 119pc. A distance between a top surface of the substrate 100 and a top surface of the first pre-pixel-defining film 119pa may be different from a distance between the top surface of the substrate 100 to a top surface of the third pre-pixel-defining film 119pc due to the pre-planarization layer 117p, and the stepped portion ST may be formed between the first pre-pixel-defining film 119pa and the third pre-pixel-defining film 119pc.

Figure 23C:
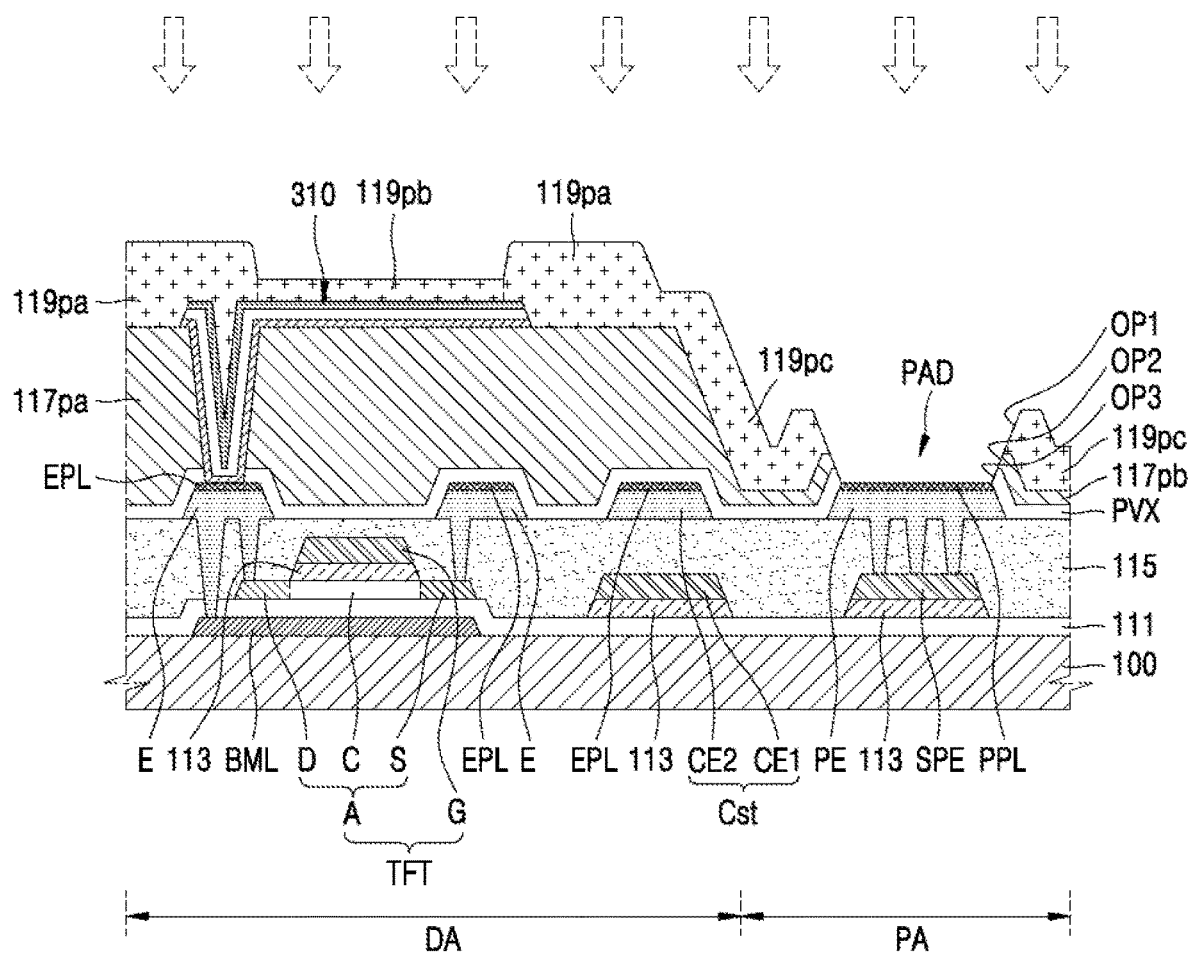

Referring to FIGS. 23B and 23C, the second opening OP2 and the third opening OP3 through which a top surface of the pad unit PAD is exposed are respectively formed in the pre-planarization layer 117p and the inorganic protective layer PVX by using the patterned pre-pixel-defining film 119p. The second opening OP2 and the third opening OP3 are formed through an etching process of partially etching the pre-planarization layer 117p and the inorganic protective layer PVX. For example, the etching process of partially etching the pre-planarization layer 117p and the inorganic protective layer PVX may be a dry etching process. Although not shown in FIG. 23C, a part of the pre-pixel-defining film 119p may also be removed, thereby reducing a thickness of the pre-pixel-defining film 119p.

Figure 23D:
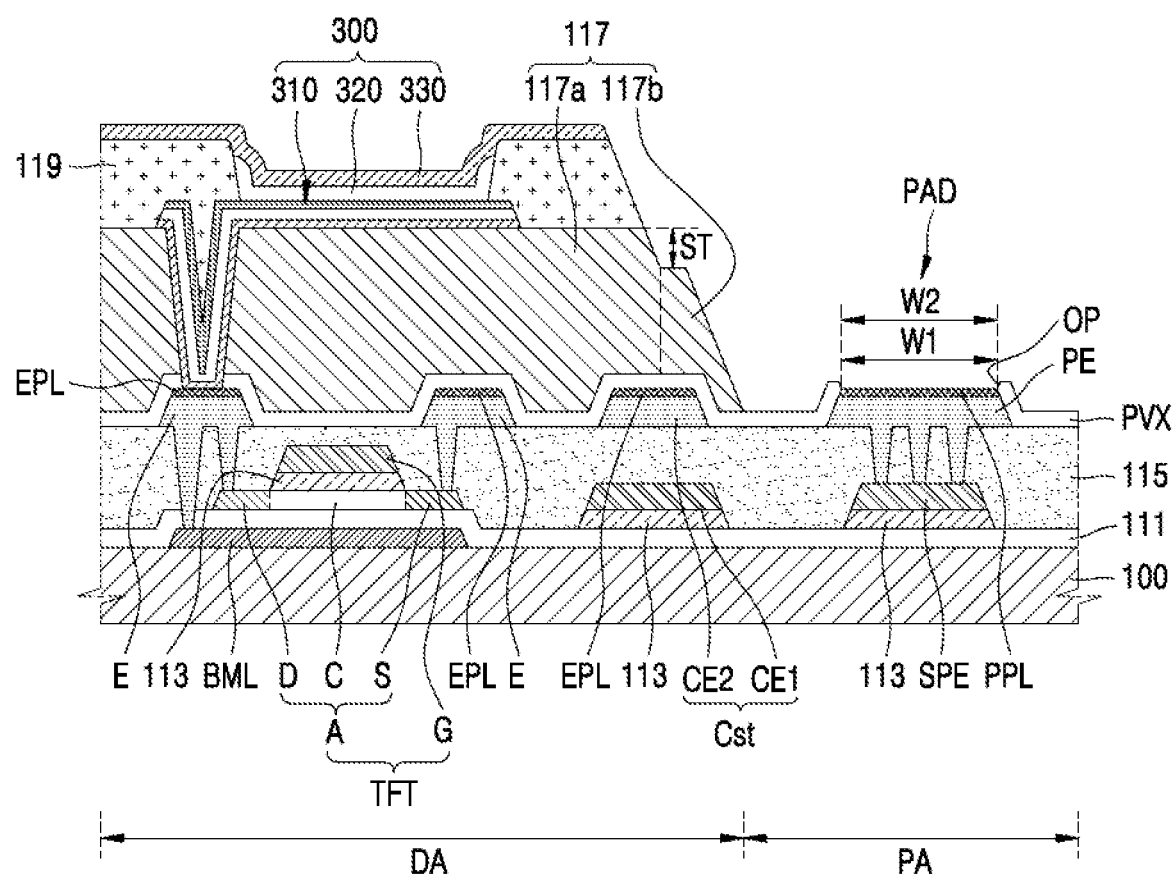

Referring to FIGS. 23C and 23D, an etching process of removing the second pre-pixel-defining film 119pb, the third pre-pixel-defining film 119pc, and the second pre-planarization layer 117pb is performed. For example, the etching process may be a dry etching process.

When the etching process of removing the second pre-pixel-defining film 119pb, the third pre-pixel-defining film 119pc, and the second pre-planarization layer 117pb is performed, a part of the first pre-pixel-defining film 119pa and a part of the first pre-planarization layer 117pa may also be etched.

As shown in FIG. 23D, the planarization layer 117 may include the first portion 117a located on the thin-film transistor TFT and the second portion 117b extending from the first portion 117a to the peripheral area PA. A top surface of the planarization layer 117 may have the stepped portion ST between the first portion 117a and the second portion 117b.

The first portion 117a of the planarization layer 117 and the pixel-defining film 119 may have the same etched surface. An outer surface of the pixel-defining film 119 and a side surface of the first portion 117a of the planarization layer 117 adjacent to the peripheral area PA may be matched to each other.

Referring to FIG. 23D, the intermediate layer 320 is formed on the pixel electrode 310, that is, in an opening of the pixel-defining film 119. The intermediate layer 320 of the light-emitting device 300 may include an organic emission layer. Next, the counter electrode 330 is formed to correspond to a plurality of light-emitting devices 300. The counter electrode 330 may be formed to cover the display area DA of the substrate 100 through an open mask.

Figure 24:
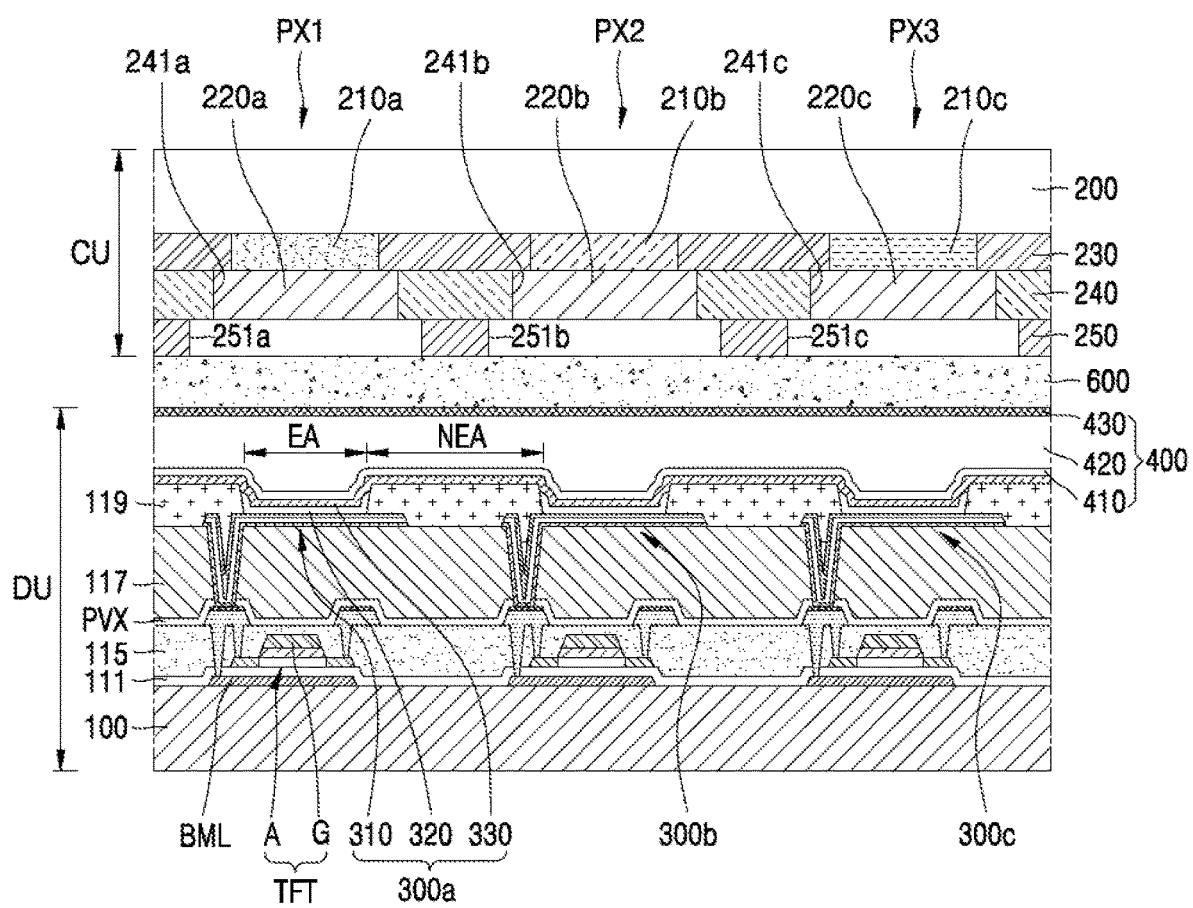
FIG. 24 is a cross-sectional view of a display apparatus according to an embodiment of the present inventive concept.

FIG. 24 is a cross-sectional view of a display apparatus according to an embodiment. In FIG. 24, the same elements as those in FIG. 20A are denoted by the same reference numerals, and a repeated description thereof will be omitted.

Referring to FIG. 24, at least one thin-film transistor TF and a display device connected to the at least one thin-film transistor TFT may be disposed on the display area DA of the display apparatus 1 (see FIG. 1) according to an embodiment.

The display apparatus 1 includes the first through third pixels PX1, PX2, and PX3 in the display area DA. However, this is merely an example, and the display apparatus 1 may include more pixels. Although the first through third pixels PX1, PX2, and PX3 are adjacent to one another in FIG. 24, the present disclosure is not limited thereto. Elements such as other wirings may be located between the first through third pixels PX1, PX2, and PX3. Accordingly, for example, the first pixel PX1 and the second pixel PX2 are not adjacent to each other. In FIG. 24, cross-sections of the first through third pixels PX1, PX2, and PX3 are not cross-sections in the same direction.

Each of the first through third pixels PX1, PX2, and PX3 includes the emission area EA. The emission area EA may be an area where light is generated and is emitted to the outside. The non-emission area NEA may be located between the emission areas EA and the emission areas EA may be divided by the non-emission area NEA.

The first through third pixels PX1, PX2, and PX3 may emit light of different colors. For example, the first pixel PX1 may emit red light, the second pixel PX2 may emit green light, and the third pixel PX3 may emit blue light. In a plan view, the emission areas EA may have any of various polygonal shapes or a circular shape, and may be arranged in any of various patterns such as a stripe pattern or a pentile pattern.

The display apparatus 1 may include the first quantum dot layer 220a, the second quantum dot layer 220b, and the transmitting layer 220c to respectively correspond to the emission areas EA. The first quantum dot layer 220a, the second quantum dot layer 220b, and the transmitting layer 220c may include quantum dots and metal nano-particles.

For example, the first pixel P1 may include the first quantum dot layer 220a, the second pixel PX2 may include the second quantum dot layer 220b, and the third pixel PX3 may include the transmitting layer 220c.

In the present embodiment, average sizes of quantum dots included in the first quantum dot layer 220a and the second quantum dot layer 220b may be different from each other.

The display apparatus 1 according to an embodiment will be described in detail according to a stacking order of FIG. 24.

The substrate 100 (hereinafter, referred to as lower substrate) may include a glass material, a ceramic material, a metal material, or a flexible or bendable material. A barrier layer (not shown) may be further provided between the lower substrate 100 and the buffer layer 111.

The conductive layer BML may be located on the lower substrate 100, and the semiconductor layer A may be located on the buffer layer 111. The gate electrode G may be located on the semiconductor layer A to at least partially overlap the semiconductor layer A, with the gate insulating layer 113 therebetween.

The interlayer insulating layer 115 may cover the gate electrode G. A source electrode and a drain electrode may be located on the interlayer insulating layer 115.

The planarization layer 117 may be located on the source electrode and the drain electrode, and the first through third light-emitting devices 300a, 300b, and 300c may be located on the planarization layer 117. Each of the first through third light-emitting devices 300a, 300b, and 300c commonly includes the pixel electrode 310, the intermediate layer 320 including an organic emission layer, and the counter electrode 330. The pixel-defining film 119 may be located on the planarization layer 117.

Because the first through third light-emitting devices 300a, 300b, and 300c may be easily damaged by external moisture or oxygen, the first through third light-emitting devices 300a, 300b, and 300c may be covered and protected by the thin-film encapsulation layer 400. The thin-film encapsulation layer 400 may cover the display area DA and may extend to the outside of the display area DA. The thin-film encapsulation layer 400 includes at least one organic encapsulation layer and at least one inorganic encapsulation layer. For example, the thin-film encapsulation layer 400 may include the first inorganic encapsulation layer 410, the organic encapsulation layer 420, and the second inorganic encapsulation layer 430.

The first inorganic encapsulation layer 410 may cover the counter electrode 330 and may include silicon oxide, silicon nitride, and/or silicon trioxynitride. Although not shown in FIG. 24, other layers such as a capping layer may be located between the first inorganic encapsulation layer 410 and the counter electrode 330 when necessary. Because the first inorganic encapsulation layer 410 is formed along a structure under the first inorganic encapsulation layer 410, a top surface of the first inorganic encapsulation layer 410 is not flat. The organic encapsulation layer 420 covers the first inorganic encapsulation layer 410, and unlike the first inorganic encapsulation layer 410, the organic encapsulation layer 420 may have a substantially flat top surface.

Even when cracks occur in the thin-film encapsulation layer 400, the cracks are not connected with each other between the first inorganic encapsulation layer 410 and the organic encapsulation layer 420 or between the organic encapsulation layer 420 and the second inorganic encapsulation layer 430 due to the multi-layer structure. Accordingly, the formation of a path through which external moisture or oxygen penetrates into the display area DA may be prevented or minimized.

The upper substrate 200 may be located over the lower substrate 100, and the counter electrode 330 may be located between the upper substrate 200 and the lower substrate 100.

The light-shielding layer 230 is located on a bottom surface of the upper substrate 200 facing the lower substrate 100. The light-shielding layer 230 has openings respectively corresponding to the first through third light-emitting devices 300a, 300b, and 300c, and the first through third filter layers 210a, 210b, and 210c are respectively located in the openings. The light-shielding layer 230 that is a black matrix may be a layer for improving color sharpness and contrast. The light-shielding layer 230 may include at least one of a black pigment, a black dye, and black particles. In some embodiments, the light-shielding layer 230 may include a material such as Cr or $CrO_X$, $Cr/CrO_X$, $Cr/CrO_X/CrN_Y$, a resin (carbon pigment, RGB mixed pigment), graphite, or a non-Cr based material.

The first filter layer 210a may pass therethrough only light having a wavelength ranging from about 630 nm to about 780 nm, the second filter layer 210b may pass therethrough only light having a wavelength ranging from about 495 nm to about 570 nm, and the third filter layer 210c may pass therethrough only light having a wavelength ranging from about 450 nm to about 495 nm. The first through third filter layers 210a, 210b, and 210c may reduce reflection of external light in the display apparatus 1.

The first upper insulating layer 240 is located on the light-shielding layer 230. The first upper insulating layer 240 has the $1\text{-}1^{th}$ opening 241a corresponding to the first light-emitting device 300a, the $1\text{-}2^{th}$ opening 241b corresponding to the second light-emitting device 300b, and the $1\text{-}3^{th}$ opening 241c corresponding to the third light-emitting device 300c. The first quantum dot layer 220a is located in the $1\text{-}1^{th}$ opening 241a, the second quantum dot layer 220b is located in the $1\text{-}2^{th}$ opening 241b, and the transmitting layer 220c is located in the $1\text{-}3^{th}$ opening 241c. The first quantum dot layer 220a and the second quantum dot layer 220b may be formed by using inkjet printing.

The first upper insulating layer 240 may include, for example, an organic material. When necessary, the first upper insulating layer 240 may include a light-shielding material to function as a light-shielding layer. The light-shielding material may include at least one of, for example, a black pigment, a black dye, black particles, and metal particles. In an embodiment, the first upper insulating layer 240 may have a blue color.

The first quantum dot layer 220a may convert light of a first wavelength band generated by the intermediate layer 320 on the pixel electrode 310 into light of a second wavelength band. For example, when light having a wavelength ranging from about 450 nm to about 495 nm is generated by the intermediate layer 320 on the pixel electrode 310, the first quantum dot layer 220a may convert the light into light having a wavelength ranging from about 630 nm to about 780 nm. Accordingly, in the first pixel PX1, the light having the wavelength ranging from about 630 nm to about 780 nm is emitted through the upper substrate 200 to the outside.

The second quantum dot layer 220b may convert light of the first wavelength band generated by the intermediate layer 320 on the pixel electrode 310 into light of a third wavelength band. For example, when light having a wavelength ranging from about 450 nm to about 495 nm is generated by the intermediate layer 320 on the pixel electrode 310, the second quantum dot layer 220b may convert the light into light having a wavelength ranging from about 495 nm to about 570 nm. Accordingly, in the second pixel PX2, the light having the wavelength ranging from about 495 nm to about 570 nm is emitted through the upper substrate 200 to the outside.

Each of the first quantum dot layer 220a and the second quantum dot layer 220b may be formed by dispersing quantum dots in a resin. The quantum dots include a semiconductor material such as cadmium sulfide (CdS), cadmium telluride (CdTe), zinc sulfide (ZnS), or indium phosphide (InP). The quantum dots may have a size of several nanometers, and a wavelength of light after conversion varies according to the size of the quantum dots. Any light-transmitting material may be used as the resin of the first quantum dot layer 220a and the second quantum dot layer 220b. For example, a polymer resin such as acryl, benzocyclobutene (BCB), or hexamethyldisiloxane (HMDSO) may be used as a material for forming the first quantum dot layer 220a and the second quantum dot layer 220b.

In the third pixel PX3, light having a first wavelength generated by the intermediate layer 320 may be emitted to the outside without wavelength conversion. Accordingly, the third pixel PX3 does not include a quantum dot layer. Because a quantum dot layer is not required in the $1\text{-}3^{th}$ opening 241c, the transmitting layer 220c formed of a light-transmitting resin may be located in the $1\text{-}3^{th}$ opening 241c. The transmitting layer 220c may include an organic material such as acryl, BCB, or HMDSO. When necessary, unlike in FIG. 24, the transmitting layer 220c is not located in the $1\text{-}3^{th}$ opening 241c.

In the display apparatus according to the present embodiment, light of the second wavelength band is emitted to the outside in the first pixel PX1, light of the third wavelength band is emitted to the outside in the second pixel PX2, and light of the first wavelength band is emitted to the outside in the third pixel PX3. Accordingly, the display apparatus 1 according to the present embodiment may display a full-color image.

The second upper insulating layer 250 is located on the first upper insulating layer 240. The second upper insulating layer 250 has the $2\text{-}1^{th}$ opening 251a corresponding to the $1\text{-}1^{th}$ opening 241a, the $2\text{-}2^{th}$ opening 251b corresponding to the $1\text{-}2^{th}$ opening 241b, and the opening 251c corresponding to the $1\text{-}3^{th}$ opening 241c.

The first quantum dot layer 220a and the second quantum dot layer 220b respectively located in the 1-1$^{th}$ opening 241a and the 1-2$^{th}$ opening 241b may be formed by using inkjet printing, and the 2-1$^{th}$ opening 251a and the 2-2$^{th}$ opening 251b may be paths through which ink sprayed via a nozzle falls and moves during the inkjet printing. Ink moving through the second upper insulating layer 250 including the 2-1$^{th}$ opening 251a and the 2-2$^{th}$ opening 251b may reach the 1-1$^{th}$ opening 241a and the 1-2$^{th}$ opening 241b, and may form the first quantum dot layer 220a and the second quantum dot layer 220b.

The second upper insulating layer 250 may include a light-shielding material. For example, the light-shielding material may include at least one of a black pigment, a black dye, black particles, and metal particles. In an embodiment, the second upper insulating layer 250 may have a blue color. Although the first upper insulating layer 240 may also include a light-shielding material as described above, in order to form the first quantum dot layer 220a and the second quantum dot layer 220b by using inkjet printing, materials of the second upper insulating layer 250 and the 240 may be different from each other.

For example, the second upper insulating layer 250, which is a passage through which ink sprayed via a nozzle moves during inkjet printing, may include a material having no affinity for the ink. The first upper insulating layer 240 in which the first quantum dot layer 220a and the second quantum dot layer 220b are formed by accumulating ink may include a material having affinity for the ink.

Although both the first upper insulating layer 240 and the second upper insulating layer 250 are illustrated in FIG. 24, the second upper insulating layer 250 may be omitted and only the first upper insulating layer 240 may be located on the upper substrate 200.

The filler 600 may be further located between the lower substrate 100 and the upper substrate 200. The filler 600 may function as a buffer against external pressure, etc. The filler 600 may include an organic material such as methyl silicone, phenyl silicone, or polyimide. However, the present disclosure is not limited thereto, and the filler 600 may include an organic sealant such as a urethane-based resin, an epoxy-based resin, or an acrylic resin, or an inorganic sealant such as silicon.

Figure 25:
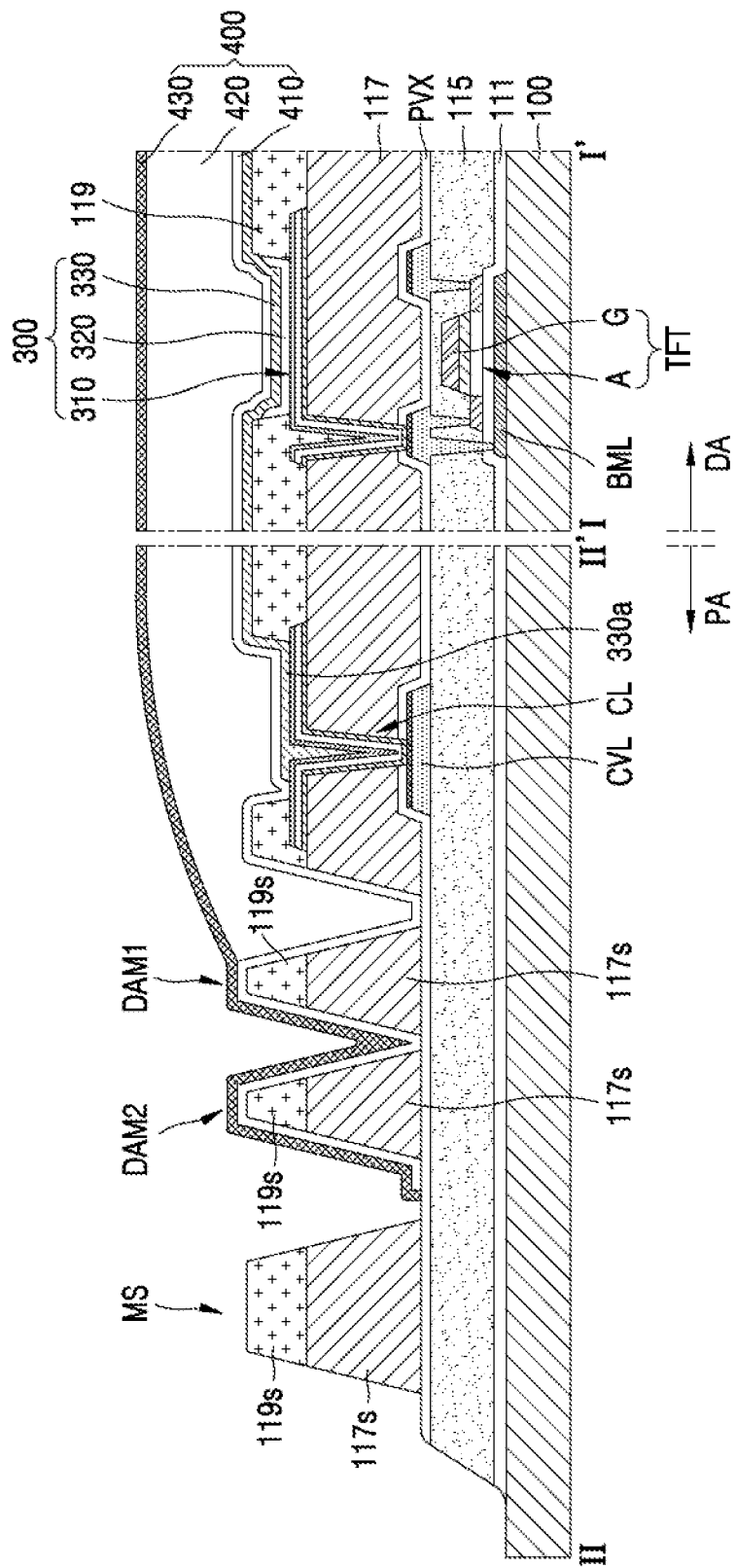
FIG. 25 is a cross-sectional view of a display apparatus according to an embodiment of the present inventive concept.

FIG. 25 is a cross-sectional view of a display apparatus according to an embodiment. In detail, FIG. 25 is a cross-sectional view of the display apparatus of FIG. 1, taken along lines I-I' and In FIG. 25, the same elements as those in FIG. 20A are denoted by the same reference numerals, and thus a repeated description thereof will be omitted.

Referring to FIG. 25, the display apparatus 1 includes the display area DA and the peripheral area PA. The substrate 100 may include portions corresponding to the display area DA and the peripheral area PA.

In the display area DA of FIG. 25, the conductive layer BML, the thin-film transistor TFT, and the light-emitting device 300 may be located on the substrate 100, which has been described in detail with reference to FIG. 20A.

The thin-film encapsulation layer 400 may be located on the light-emitting device 300. The thin-film encapsulation layer 400 may cover the entire display area DA, and may extend to the peripheral area PA to cover a part of the peripheral area PA. The thin-film encapsulation layer 400 may extend to the outside of the common voltage supply line CVL.

The thin-film encapsulation layer 400 may include the first inorganic encapsulation layer 410, the second inorganic encapsulation layer 430, and the organic encapsulation layer 420 located between the first inorganic encapsulation layer 410 and the second inorganic encapsulation layer 430.

The part 330a of the counter electrode 330 may extend to the peripheral area PA and may overlap the common voltage supply line CVL. The connection wiring CL may be located between the part 330a of the counter electrode 330 and the common voltage supply line CVL. The connection wiring CL may electrically connect the common voltage supply line CVL to the counter electrode 330 to transmit a common voltage to the counter electrode 330.

Although not shown in FIG. 25, a driving circuit area may be disposed on the peripheral area PA. For example, a gate driving circuit unit may be located in the driving circuit area. The gate driving circuit unit may include thin-film transistors, and may include a wiring connected to the thin-film transistors.

The buffer layer 111, the interlayer insulating layer 115, and the inorganic protective layer PVX may extend to the peripheral area PA.

The first dam portion DAM1, the second dam portion DAM2, and the mask support MS may be located on the inorganic protective layer PVX corresponding to the peripheral area PA. The first dam portion DAM1, the second dam portion DAM2, and the mask support MS may surround an outer portion of the display area DA in a plan view. The first dam portion DAM1 may surround an outer portion of the display area DA, the second dam portion DAM2 may surround an outer portion of the first dam portion DAM1, and the mask support MS may surround an outer portion of the second dam portion DAM2.

The first dam portion DAM1 and the second dam portion DAM2 may prevent the organic encapsulation layer 420 of the thin-film encapsulation layer 400 from overflowing to the outside of the substrate 100. The mask support MS may support an open mask used to form the counter electrode 330, etc.

The first inorganic encapsulation layer 410 and the second inorganic encapsulation layer 430 of the thin-film encapsulation layer 400 may partially overlap the first dam portion DAM1 and the second dam portion DAM2. However, as shown in FIG. 25, the first inorganic encapsulation layer 410 and the second inorganic encapsulation layer 430 do overlap the mask support MS.

The first dam portion DAM1, the second dam portion DAM2, and the mask support MS may have a two-layer structure. Each of the first dam portion DAM1, the second dam portion DAM2, and the mask support MS may include the first peripheral insulating layer 117s including or being formed of the same material as that of the planarization layer 117 and the second peripheral insulating layer 119s including being formed of the same material as that of the pixel-defining film 119. The first peripheral insulating layer 117s and the second peripheral insulating layer 119s of the first dam portion DAM1, the second dam portion DAM2, and the mask support MS may be located on the same layers as the planarization layer 117 and the pixel-defining film 119.

The first peripheral insulating layer 117s and the second peripheral insulating layer 119s may have the same etched surface. A side surface of the first peripheral insulating layer 117s and a side surface of the second peripheral insulating layer 119s may be located on the same etched surface. The side surface of the first peripheral insulating layer 117s and the side surface of the second peripheral insulating layer 119s may be matched to each other. The side surface of the first peripheral insulating layer 117s and the side surface of the second peripheral insulating layer 119s may be located on the same plane. The side surface of the first peripheral insulating layer 117s and the side surface of the second peripheral insulating layer 119s may be formed without a stepped portion, and may be formed without a boundary.

A width of the mask support MS may be greater than a width of the first dam portion DAM1. The width of the mask support MS may be greater than a width of the second dam portion DAM2. For example, the width of the mask support MS may be about 4 to 6 times greater than the width of the first dam portion DAM1.

According to an embodiment, there may be provided a display apparatus and a method of manufacturing the same which may prevent damage to a surface of an insulating layer on which a pixel electrode is located, may prevent degradation of a light-emitting device due to damage to a thin-film encapsulation layer, and may protect a surface of a pad unit and prevent damage to the surface of the pad unit by forming an opening through which the pad unit is exposed after an etching process for forming the pixel electrode. However, the present disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
   a substrate comprising a display area and a peripheral area surrounding the display area;
   a thin-film transistor disposed on the display area of the substrate;
   a pad unit disposed on the peripheral area of the substrate;
   a first insulating layer covering the thin-film transistor, exposing the pad unit, and comprising an organic material;
   a second insulating layer disposed on the peripheral area, wherein, when viewed in a plan view, an entirety of the second insulating layer overlaps a portion of the pad unit and is separated from the first insulating layer;
   a light-emitting device disposed on the first insulating layer, electrically connected to the thin-film transistor, and comprising a pixel electrode, an intermediate layer, and a counter electrode; and
   a pixel-defining film disposed on a top surface of the first insulating layer and covering an edge of the pixel electrode,
   wherein a bottom surface of the pixel-defining film directly contacts the top surface of the first insulating layer, opposite side surfaces of the first insulating layer are respectively lower than opposite side surfaces of the pixel-defining film in a vertical direction that is perpendicular to an upper surface of the substrate, and the opposite side surfaces of the first insulating layer and the opposite side surfaces of the pixel-defining film are coplanar and directly connected with each other, respectively,
   wherein the first insulating layer comprises a first portion, a second portion, and a third portion between the first portion and the second portion,
   wherein the top surface of the first insulating layer comprises a first topmost surface of the first portion, a second topmost surface of the second portion, and a connecting surface of the third portion,
   wherein the first topmost surface of the first portion is higher than the second topmost surface of the second portion,
   wherein the connecting surface connects the first topmost surface and the second topmost surface with each other and is sloped, and
   wherein, when viewed in the plan view, the connecting surface is disposed between the first topmost surface of the first portion and the second topmost surface of the second portion, and
   wherein the first portion of the first insulating layer comprises the organic material.

2. The display apparatus of claim 1, wherein a vertical distance between the substrate and the first topmost surface of the first portion is greater than a vertical distance between the substrate and the second topmost surface of the second portion.

3. The display apparatus of claim 2,
   wherein the connecting surface corresponds to one of the opposite side surfaces of the first insulating layer.

4. The display apparatus of claim 2,
   wherein the pixel electrode and the pixel-defining film are disposed on the first top surface of the first portion of the first insulating layer.

5. The display apparatus of claim 1,
   wherein the second insulating layer is formed of the same material as a material of the first insulating layer,
   wherein the pad unit comprises a pad electrode, and a pad connection electrode disposed on the pad electrode and at least partially contacting the pad electrode, and
   wherein the second insulating layer is disposed between the pad electrode and the pad connection electrode and at least partially overlaps the pad connection electrode.

6. The display apparatus of claim 5,
   wherein the pad connection electrode of the pad unit includes a first part which contacts the pad electrode, and a second part which is spaced apart from the pad electrode,
   wherein the second insulating layer is disposed between a top surface of the pad electrode and a bottom surface of the second part of the pad connection electrode,
   wherein a top surface of the second insulating layer contacts the bottom surface of the second part of the pad connection electrode, and is inclined along the bottom surface of the second part of the pad connection electrode.

7. The display apparatus of claim 6, further comprising:
   a third insulating layer disposed on the pad electrode and having a contact hole through which the first part of the pad connection electrode contacts a part of the pad electrode,
   wherein the first part of the pad connection electrode contacts a portion of the third insulating layer which is exposed by the contact hole.

8. The display apparatus of claim 7,
   wherein the second part of the pad connection electrode is outside the contact hole of the third insulating layer.

9. The display apparatus of claim 5,
   wherein the pixel electrode comprises three films, and
   wherein the pad connection electrode is formed of a single film.

10. The display apparatus of claim 1, further comprising:
a dam portion disposed on the peripheral area, and comprising a first peripheral insulating layer, a second peripheral insulating layer disposed on the first peripheral insulating layer, and a peripheral electrode layer disposed between the first peripheral insulating layer and the second peripheral insulating layer.

11. The display apparatus of claim 10,
wherein a side surface of the first peripheral insulating layer and a side surface of the second peripheral insulating layer are coplanar with each other.

* * * * *